US012713827B2

(12) United States Patent
Kim et al.

(10) Patent No.: US 12,713,827 B2
(45) Date of Patent: Aug. 18, 2026

(54) ORGANOMETALLIC COMPOUND AND ORGANIC LIGHT-EMITTING DEVICE INCLUDING THE SAME

(71) Applicant: Samsung Electronics Co., Ltd., Suwon-si (KR)

(72) Inventors: Hwang Suk Kim, Suwon-si (KR); Minsik Min, Suwon-si (KR); Hyejin Bae, Suwon-si (KR); Soonok Jeon, Suwon-si (KR); Yeon Sook Chung, Seoul (KR); Hyesung Choi, Seoul (KR); Hosuk Kang, Suwon-si (KR); Jong Soo Kim, Hanam-si (KR); Joonghyuk Kim, Seoul (KR); Jun Chwae, Seoul (KR); Sangyeon Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1088 days.

(21) Appl. No.: 17/849,829

(22) Filed: Jun. 27, 2022

(65) Prior Publication Data

US 2023/0107905 A1 Apr. 6, 2023

(30) Foreign Application Priority Data

Jun. 30, 2021 (KR) ........................ 10-2021-0085768
Jun. 21, 2022 (KR) ........................ 10-2022-0075681

(51) Int. Cl.
*H10K 85/30* (2023.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC .............. H10K 85/346; C07F 15/0086; C09K 2211/1029; C09K 2211/1044; C09K 2211/185
See application file for complete search history.

(56) References Cited

U.S. PATENT DOCUMENTS

2018/0375036 A1 12/2018 Chen et al.
2019/0119312 A1 4/2019 Chen et al.
(Continued)

FOREIGN PATENT DOCUMENTS

CN 110615787 A * 12/2019 ........... C07D 471/04
KR 1020200116039 A 10/2020
(Continued)

OTHER PUBLICATIONS

Machine Translation fo CN110615787A (Year: 2019).*
(Continued)

*Primary Examiner* — Jenna N Chandhok
(74) *Attorney, Agent, or Firm* — CANTOR COLBURN LLP

(57) ABSTRACT

Provided are an organometallic compound represented by Formula 1 and an organic light-emitting device including the same:
(Continued)

Formula 1

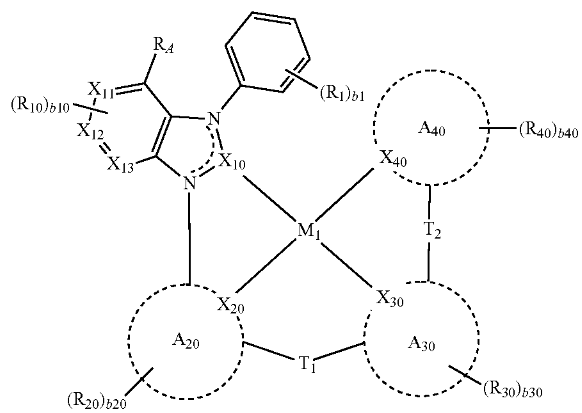

wherein the detailed description of Formula 1 is the same as described in the present specification.

19 Claims, 2 Drawing Sheets

(51) Int. Cl.
*C09K 11/06* (2006.01)
*H10K 50/12* (2023.01)

(52) U.S. Cl.
CPC ................. *C09K 2211/1029* (2013.01); *C09K 2211/1044* (2013.01); *C09K 2211/185* (2013.01); *H10K 50/121* (2023.02)

(56) References Cited

U.S. PATENT DOCUMENTS

| | | | |
|---|---|---|---|
| 2020/0140471 | A1 | 5/2020 | Chen et al. |
| 2020/0216481 | A1 | 7/2020 | Chen et al. |
| 2020/0266366 | A1 | 8/2020 | Bold et al. |
| 2020/0392173 | A1 | 12/2020 | Bae et al. |
| 2020/0395558 | A1 | 12/2020 | Bae et al. |
| 2020/0395559 | A1 | 12/2020 | Bae et al. |
| 2020/0395560 | A1 | 12/2020 | Bae et al. |
| 2021/0043856 | A1 | 2/2021 | Min et al. |
| 2022/0106345 | A1 | 4/2022 | Bae et al. |
| 2022/0119434 | A1 | 4/2022 | Chen et al. |
| 2022/0393117 | A1* | 12/2022 | Chen ...................... C09K 11/06 |

FOREIGN PATENT DOCUMENTS

| | | | |
|---|---|---|---|
| KR | 1020200143237 | A | 12/2020 |
| KR | 1020210017822 | A | 2/2021 |
| KR | 1020220037360 | A | 3/2022 |
| WO | 2002015645 | A1 | 2/2002 |
| WO | 2005019373 | A2 | 3/2005 |

OTHER PUBLICATIONS

Seifert, R., et al., "Chemical degradation mechanisms of highly efficient blue phosphorescent emitters," Organic Elements 14 (2013) pp. 115-123, 9 pgs., Copyright 2012 Elsevier B.V.

* cited by examiner

ORGANOMETALLIC COMPOUND AND ORGANIC LIGHT-EMITTING DEVICE INCLUDING THE SAME

CROSS-REFERENCE TO RELATED APPLICATION

This application claims priority under 35 U.S.C. § 119 to Korean Patent Application Nos. 10-2021-0085768, filed on Jun. 30, 2021, and 10-2022-0075681, filed on Jun. 21, 2022, in the Korean Intellectual Property Office, the contents of which are incorporated by reference herein in their entirety.

BACKGROUND

1. Field

The present disclosure relates to an organometallic compound and an organic light-emitting device including the same.

2. Description of the Related Art

Organic light-emitting devices are self-emissive devices that, as compared with devices of the related art, have wide viewing angles, high contrast ratios, short response times, and excellent characteristics in terms of luminance, driving voltage, and response speed, and produce full-color images.

In an example, an organic light-emitting device includes an anode, a cathode, and an organic layer that is arranged between the anode and the cathode and includes an emission layer. A hole transport region may be arranged between the anode and the emission layer, and an electron transport region may be arranged between the emission layer and the cathode. Holes provided from the anode move toward the emission layer through the hole transport region, and electrons provided from the cathode move toward the emission layer through the electron transport region. The holes and the electrons recombine in the emission layer to produce excitons. These excitons transition from an excited state to a ground state, thereby generating light.

SUMMARY

Provided are a novel organometallic compound and an organic light-emitting device using the same.

Additional aspects will be set forth in part in the description which follows and, in part, will be apparent from the description, or may be learned by practice of the presented embodiments of the disclosure.

According to an aspect of an embodiment, provided is an organometallic compound represented by Formula 1:

Formula 1

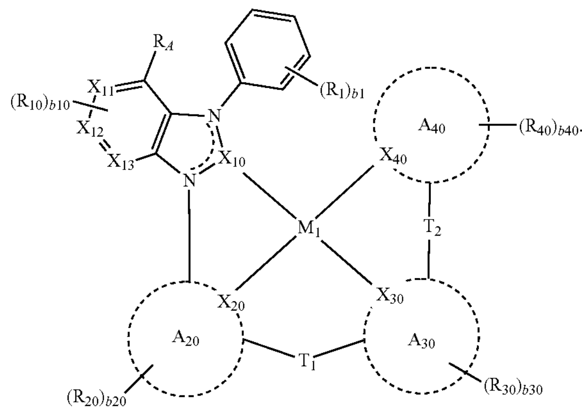

In Formula 1, ring $A_{20}$, ring $A_{30}$, and ring $A_{40}$ are each independently a $C_5$-$C_{30}$ carbocyclic group or a $C_1$-$C_{30}$ heterocyclic group, $X_{10}$ is C, $X_{11}$ to $X_{13}$, $X_{20}$, $X_{30}$, and $X_{40}$ are each independently C or N, $T_1$ and $T_2$ are each independently a single bond, *—N($R_{51}$)—*', *—B($R_{51}$)—*', *—P($R_{51}$)—*', *—C($R_{51}$)($R_{52}$)—*', *—Si($R_{51}$)($R_{52}$)—*', *—Ge($R_{51}$)($R_{52}$)—*', *—C(═O)—*', *—S(═O)—*', *—S(═O)$_2$—*', *—C($R_{51}$)═C($R_{52}$)—*', *—C(═S)—*', or *—C≡C—*', $R_A$ is a substituted phenyl group, a substituted or unsubstituted $C_{10}$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted $C_1$-Coo alkyl group, a substituted or unsubstituted $C_2$-$C_{60}$ alkenyl group, or —Si($Q_3$)($Q_4$)($Q_5$), $R_1$, $R_{10}$, $R_{20}$, $R_{30}$, and $R_{40}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(═O)($Q_8$)($Q_9$), two or more of $R_{10}$, $R_{20}$, $R_{30}$, $R_{40}$, $R_{51}$, and $R_{52}$ are optionally bonded together to form a substituted or unsubstituted $C_5$-$C_{30}$ carbocyclic group or a substituted or unsubstituted $C_1$-$C_{30}$ heterocyclic group, b1 is an integer from 1 to 5, b10 is an integer from 1 to 3, b20, b30, and b40 are each independently an integer from 1 to 10, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Br, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Br, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Br, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, or any combination thereof;

$—N(Q_{31})(Q_{32})$, $—Si(Q_{33})(Q_{34})(Q_{35})$, $—B(Q_{36})(Q_{37})$, or $—P(=O)(Q_{38})(Q_{39})$; or any combination thereof, and $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

According to an aspect of another embodiment, provided is an organic light-emitting device including: a first electrode; a second electrode; and an organic layer arranged between the first electrode and the second electrode and including an emission layer located, wherein the organic layer includes at least one of the organometallic compound.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
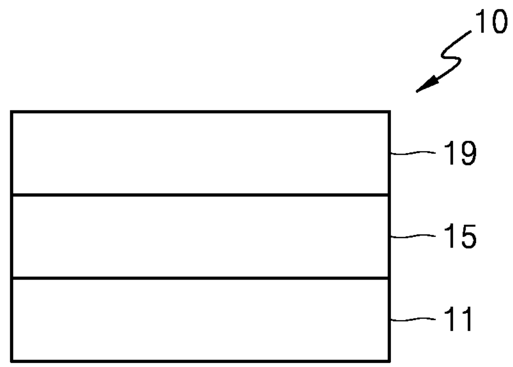
FIG. 1 shows a schematic cross-sectional view of an organic light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded Thus, the regions illustrated in the figures are schematic in nature and their shapes are not intended to illustrate the precise shape of a region and are not intended to limit the scope of the present claims.

An organometallic compound according to an embodiment of the present disclosure may be represented by Formula 1:

Formula 1

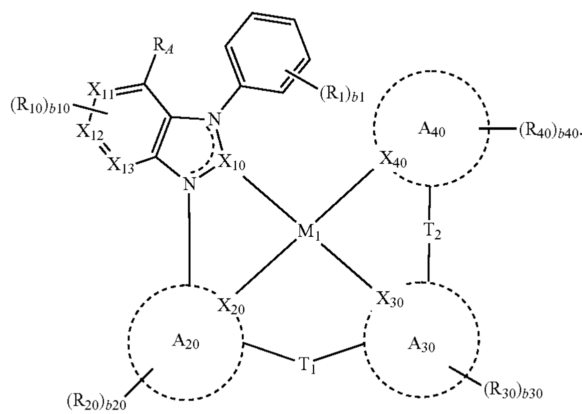

$M_1$ in Formula 1 may be a first-row transition metal of the Periodic Table of Elements, a second-row transition metal of the Periodic Table of Elements, or a third-row transition metal of the Periodic Table of Elements.

For example, $M_1$ may be iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au).

In an embodiment, $M_1$ may be platinum (Pt), palladium (Pd), or gold (Au).

In Formula 1, $X_{10}$ may be carbon (C), and $X_{11}$ to $X_{13}$, $X_{20}$, $X_{30}$, and $X_{40}$ may each independently be C or nitrogen (N).

In an embodiment, $X_{11}$ to $X_{13}$ may each be C.

In an embodiment, $X_{20}$ and $X_{30}$ may each be C, and $X_{40}$ may be N.

In Formula 1, two bonds of a bond between $X_{10}$ and $M_1$, a bond between $X_{20}$ and $M_1$, a bond between $X_{30}$ and $M_1$, and a bond between $X_{40}$ and $M_1$ may each be a coordinate bond, and the other two bonds may each be a covalent bond. Thus, the organometallic compound represented by Formula 1 may be electrically neutral.

In an embodiment, in Formula 1, a bond between $X_{10}$ and $M_1$ may be a coordinate bond.

In an embodiment, in Formula 1, one bond of a bond between $X_{20}$ and $M_1$, a bond between $X_{30}$ and $M_1$, and a bond between $X_{40}$ and $M_1$ may be a coordinate bond, and the other two bonds may each be a covalent bond.

In one or more embodiments, $X_{20}$ and $X_{30}$ may each be C, and $X_{40}$ may be N, a bond between $X_{20}$ and $M_1$ and a bond between $X_{30}$ and $M_1$ may each be a covalent bond, and a bond between $X_{40}$ and $M_1$ may be a coordinate bond.

In an embodiment, a moiety represented by

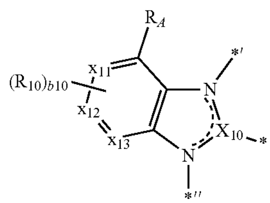

in Formula 1 may be a group represented by one of Formulae A10-1 to A10-5:

A10-1

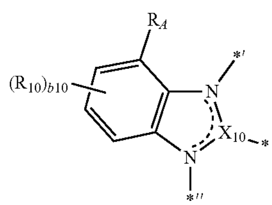

A10-2

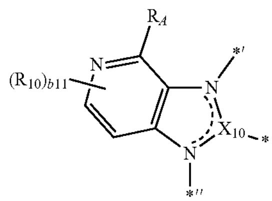

A10-3

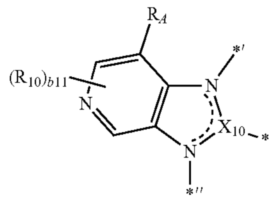

A10-4

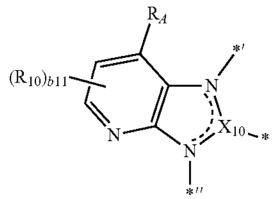

A10-5

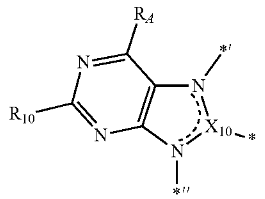

wherein, in Formulae A10-1 to A10-5, $X_{10}$, $R_A$, and $R_{10}$ are respectively the same as those described herein, b10 may be an integer from 1 to 3, b11 may be 1 or 2,

* indicates a binding site to $M_1$ in Formula 1,

*' indicates a binding site to a phenyl group in Formula 1, and

*" indicates a binding site to ring $A_{20}$ in Formula 1.

In one or more embodiments, a moiety represented by

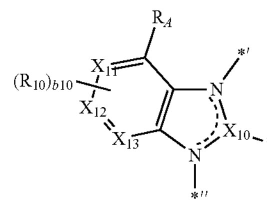

in Formula 1 may be a group represented by one of Formulae A10(1) to A10(8):

A10(1)

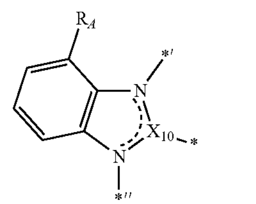

A10(2)

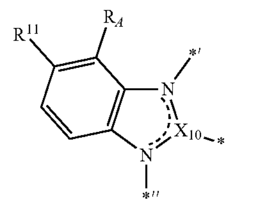

A10(3)

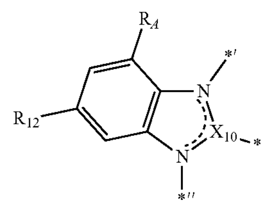

A10(4)

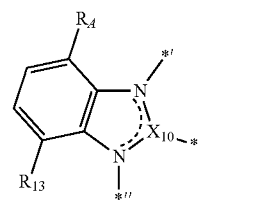

A10(5)

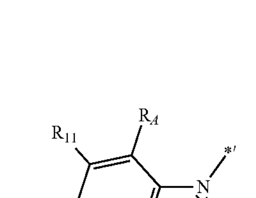

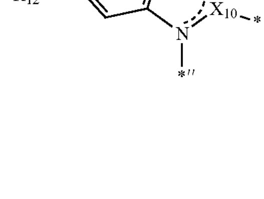

-continued

A10(6)

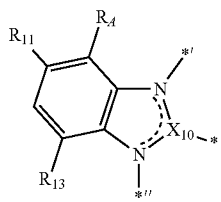

A10(7)

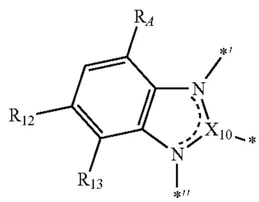

A10(8)

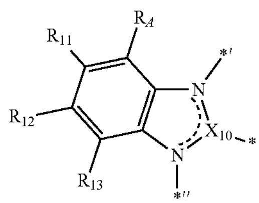

wherein, in Formulae A10(1) to A10(8), $X_{10}$ and $R_A$ are respectively the same as those described herein, $R_{11}$ to $R_{13}$ are each the same as described in connection with $R_{10}$, and $R_{11}$ to $R_{13}$ may each be not hydrogen,

* indicates a binding site to $M_1$ in Formula 1,

*' indicates a binding site to a phenyl group in Formula 1, and

*" indicates a binding site to ring $A_{20}$ in Formula 1.

Ring $A_{20}$, ring $A_{30}$, and ring $A_{40}$ in Formula 1 may each independently be a $C_5$-$C_{30}$ carbocyclic group or a $C_1$-$C_{30}$ heterocyclic group.

For example, ring $A_{20}$, ring $A_{30}$, and ring $A_{40}$ may each independently be i) a first ring, ii) a second ring, iii) a condensed ring in which at least two first rings are condensed, iv) a condensed ring in which at least two second rings are condensed, or v) a condensed ring in which at least one first ring and at least one second ring are condensed, the first ring may be a cyclopentane group, a cyclopentadiene group, a furan group, a thiophene group, a pyrrole group, a silole group, a borole group, a phosphole group, a germole group, a selenophene group, an oxazole group, an isoxazole group, an oxadiazole group, an oxatriazole group, a thiazole group, an isothiazole group, a thiadiazole group, a thiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a cyclohexadiene group, a benzene group, a pyridine group, a pyrimidine group, a pyrazine group, a pyridazine group, a triazine group, an oxazine group, a thiazine group, a dihydropyrazine group, a dihydropyridine group, or a dihydroazasilole group.

In an embodiment, ring $A_{20}$, ring $A_{30}$, and ring $A_{40}$ in Formula 1 may each independently be a cyclopentane group, a cyclopentene group, a cyclohexane group, a cyclohexene group, a cyclohexadiene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a phosphole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $A_{20}$, ring $A_{30}$, and ring $A_{40}$ in Formula 1 may each independently be a benzene group, a naphthalene group, a carbazole group, a fluorene group, a dibenzosilole group, a dibenzothiophene group, a dibenzofuran group, an azacarbazole group, an azafluorene group, an azadibenzosilole group, an azadibenzothiophene group, an azadibenzofuran group, a pyridine group, a pyrimidine group, a pyrazine group, a pyridazine group, a triazine group, a quinoline group, an isoquinoline group, a quinoxaline group, a quinazoline group, a 5,6,7,8-tetrahydroisoquinoline group, or a 5,6,7,8-tetrahydroquinoline group.

In an embodiment, ring $A_{20}$ in Formula 1 may be a group represented by one of Formulae A20(1) to A20(15):

A20(1)

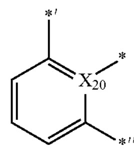

A20(2)

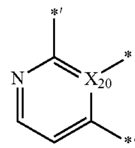

-continued

A20(3)

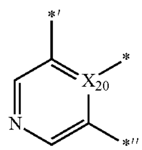

A20(4)

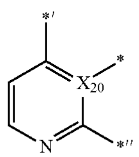

A20(5)

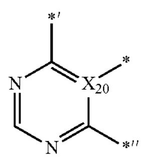

A20(6)

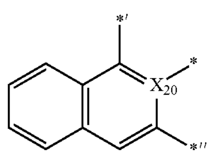

A20(7)

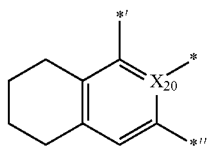

A20(8)

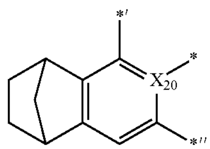

A20(9)

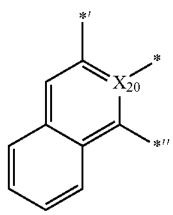

A20(10)

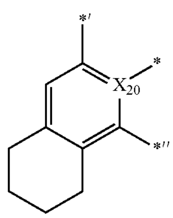

A20(11)

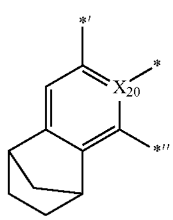

-continued

A20(12)

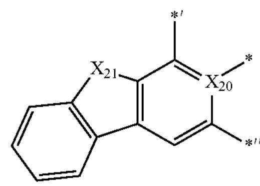

A20(13)

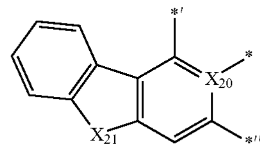

A20(14)

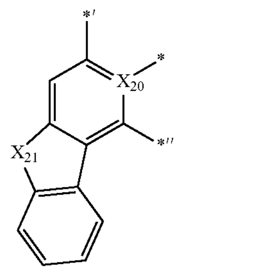

A20(15)

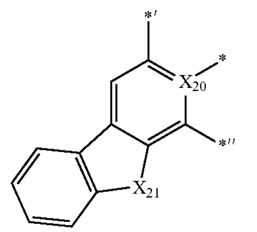

wherein, in Formulae A20(1) to A20(15), $X_{20}$ may be C or N, $X_{21}$ may be O, S, $N(R_{21})$, $C(R_{21})(R_{22})$, or $Si(R_{21})(R_{22})$, and $R_{21}$ and $R_{22}$ are each the same as described in connection with $R_{20}$,

* indicates a binding site to $M_1$ in Formula 1,

*' indicates a binding site to a N atom in Formula 1, and

*" indicates a binding site to $T_1$ in Formula 1.

In an embodiment, ring $A_{30}$ in Formula 1 may be a group represented by one of Formulae A30(1) to A30(12):

A30(1)

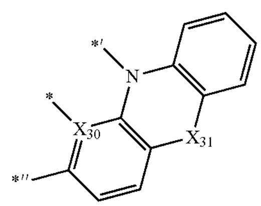

A30(2)

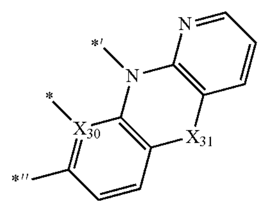

-continued

A30(3)

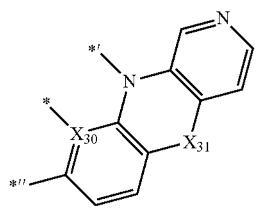

A30(4)

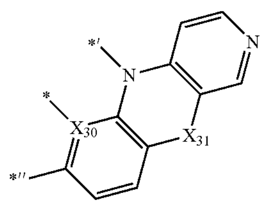

A30(5)

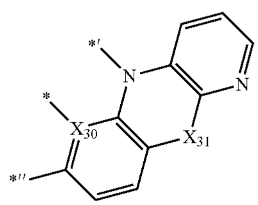

A30(6)

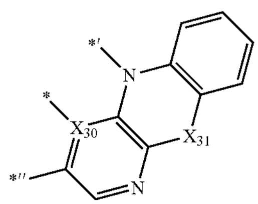

A30(7)

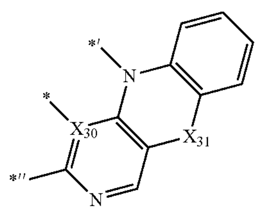

A30(8)

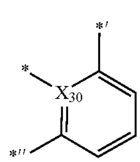

A30(9)

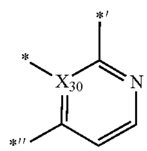

A30(10)

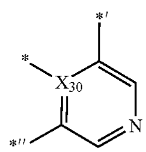

-continued

A30(11)

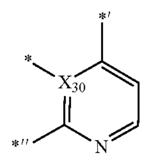

A30(12)

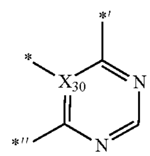

wherein, in Formulae A30(1) to A30(12), $X_{30}$ may be C or N, $X_{31}$ may be a single bond, O, S, $N(R_{31})$, $C(R_{31})(R_{32})$, or $Si(R_{31})(R_{32})$, and $R_{31}$ and $R_{32}$ are each the same as described in connection with $R_{30}$,

* indicates a binding site to $M_1$ in Formula 1,

*' indicates a binding site to $T_2$ in Formula 1, and

*" indicates a binding site to $T_1$ in Formula 1.

In one or more embodiments, a group represented by

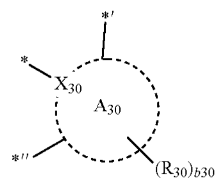

in Formula 1 may be a group represented by one of Formulae A30-1 to A30-16:

A30-1

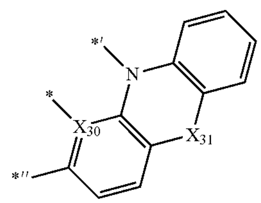

A30-2

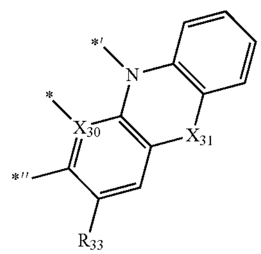

A30-3

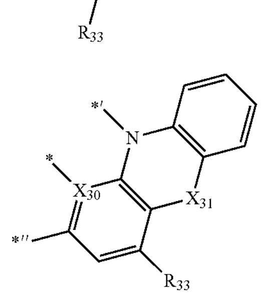

-continued

A30-4

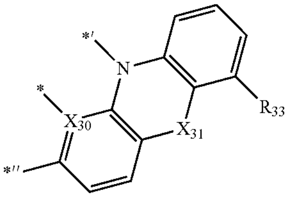

A30-5

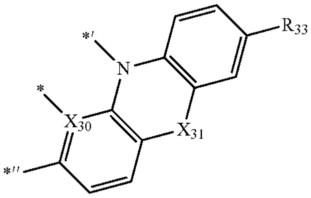

A30-6

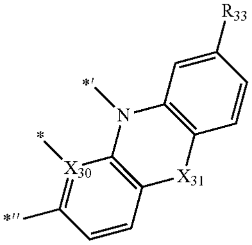

A30-7

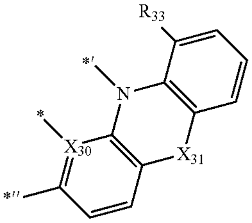

A30-8

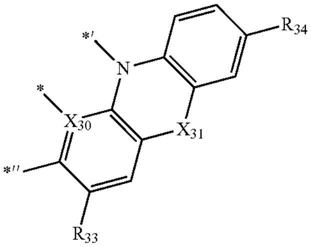

A30-9

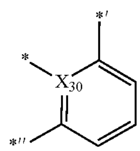

A30-10

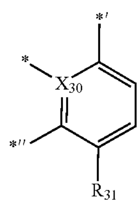

-continued

A30-11

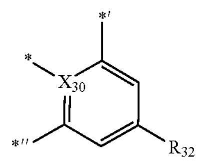

A30-12

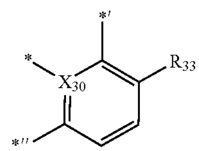

A30-13

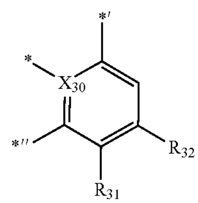

A30-14

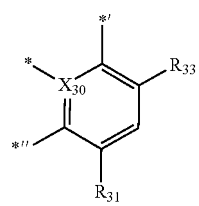

A30-15

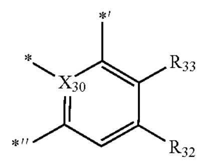

A30-16

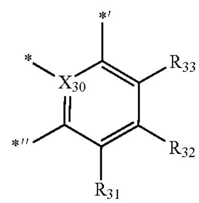

wherein, in Formulae A30-1 to A30-16, $X_{30}$ may be C or N, $X_{31}$ may be a single bond, O, S, $N(R_{31})$, $C(R_{31})(R_{32})$, or $Si(R_{31})(R_{32})$, $R_{31}$ to $R_{34}$ are each the same as described in connection with $R_{30}$, and $R_{31}$ to $R_{34}$ may each not be hydrogen,

* indicates a binding site to $M_1$ in Formula 1,

*' indicates a binding site to $T_2$ in Formula 1, and

*" indicates a binding site to $T_1$ in Formula 1.

In an embodiment, ring $A_{40}$ in Formula 1 may be a group represented by one of Formulae A40(1) to A40(34):

A40(1)

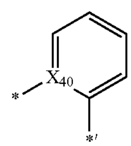

-continued
A40(2)
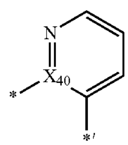
A40(3)
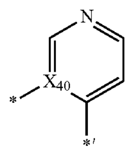
A40(4)
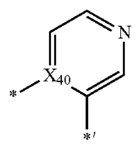
A40(5)
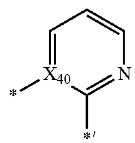
A40(6)
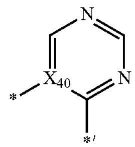
A40(7)
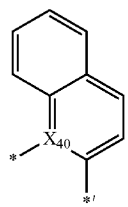
A40(8)
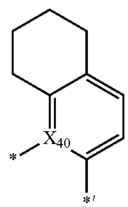
A40(9)
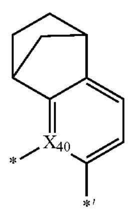
A40(10)
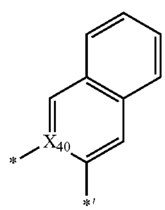
-continued
A40(11)
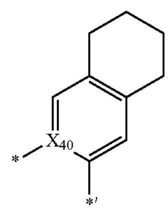
A40(12)
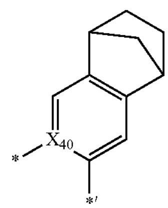
A40(13)
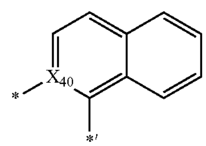
A40(14)
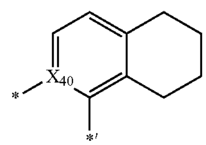
A40(15)
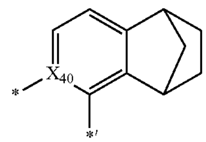
A40(16)
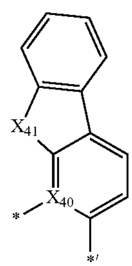
A40(17)
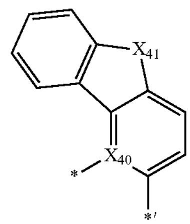
A40(18)
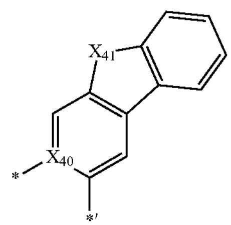

-continued

A40(19)

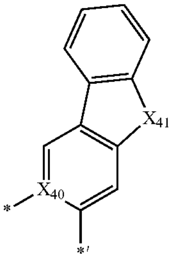

A40(20)

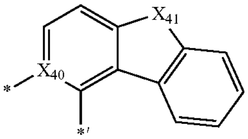

A40(21)

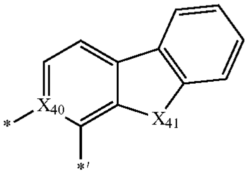

A40(22)

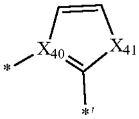

A40(23)

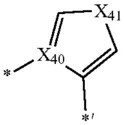

A40(24)

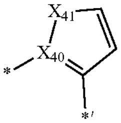

A40(25)

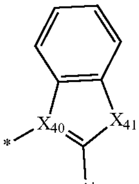

A40(26)

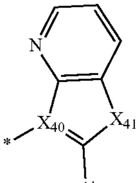

A40(27)

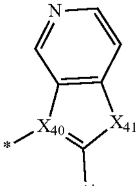

-continued

A40(28)

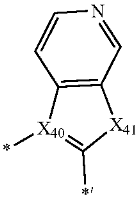

A40(29)

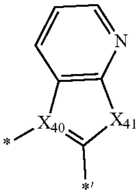

A40(30)

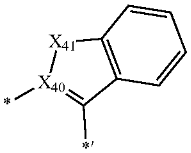

A40(31)

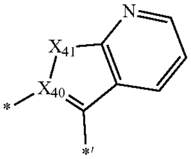

A40(32)

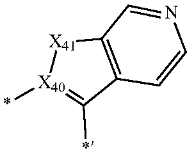

A40(33)

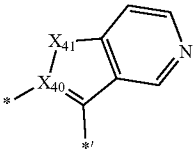

A40(34)

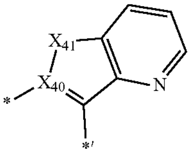

wherein, in Formulae A40(1) to A40(34), $X_{40}$ may be C or N, $X_{41}$ may be O, S, $N(R_{41})$, $C(R_{41})(R_{42})$, or $Si(R_{41})(R_{42})$, and $R_{41}$ and $R_{42}$ are each the same as described in connection with $R_{40}$,

* indicates a binding site to $M_1$ in Formula 1, and

*' indicates a binding site to $T_2$ in Formula 1.

$T_1$ and $T_2$ in Formula 1 may each independently be a single bond, *—$N(R_{51})$—*', *—$B(R_{51})$—*', *—$P(R_{51})$—*', *—$C(R_{51})(R_{52})$—*', *—$Si(R_{51})(R_{52})$—*', *—$Ge(R_{51})(R_{52})$—*', *—S—*', *—Se—*', *—O—*', *—C(═O)—*', *—S(═O)—*', *—$S(═O)_2$—*', *—$C(R_{51})$═$C(R_{52})$—*', *—C(═S)—*', or *—C≡C—*'.

For example, $T_1$ may be *—$N(R_{51})$—*', *—$B(R_{51})$—*', *—$C(R_{51})(R_{52})$—*', *—$Si(R_{51})(R_{52})$—*', *—$Ge(R_{51})(R_{52})$—*', or and $T_2$ may be a single bond or *—$N(R_{51})$—*'.

For example, $T_2$ may be *—N($R_{51}$)—*', and $R_{51}$ may be bonded to at least one of neighboring $R_{30}$ and $R_{40}$ to form a substituted or unsubstituted $C_5$-$C_{30}$ carbocyclic group or a substituted or unsubstituted $C_1$-$C_{30}$ heterocyclic group.

$R_4$ in Formula 1 may be a substituted phenyl group, a substituted or unsubstituted $C_{10}$-$C_{60}$ aryl group, a substituted or unsubstituted heteroaryl group, a substituted or unsubstituted monovalent non-aromatic condensed polycyclic group, a substituted or unsubstituted $C_1$-$C_{60}$ alkyl group, a substituted or unsubstituted $C_2$-$C_{60}$ alkenyl group, or —Si($Q_3$)($Q_4$)($Q_5$).

In an embodiment, $R_4$ in Formula 1 may be:

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof;

a phenyl group substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —Si($Q_{33}$)($Q_{34}$)($Q_{35}$), or any combination thereof;

an adamantanyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an am idino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —Si($Q_{33}$)($Q_{34}$)($Q_{35}$), or any combination thereof; or —Si($Q_3$)($Q_4$)($Q_5$), and $Q_3$ to $Q_5$ and $Q_{33}$ to $Q_{35}$ may each independently be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

In one or more embodiments, $R_4$ in Formula 1 may be:

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, or a tert-pentyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, or any combination thereof;

a phenyl group substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, a $C_1$-$C_{20}$ alkyl group, a $C_1$-$C_{20}$ alkoxy group, a cyclopentyl group, a cyclohexyl group, a phenyl group, a biphenyl group, a naphthyl group, a fluorenyl group, a pyridinyl group, a pyrazinyl group, a pyrimidinyl group, a pyridazinyl group, a carbazolyl group, a benzimidazolyl group, a benzofuranyl group, a benzothiophenyl group, a triazinyl group, a dibenzofuranyl group, a dibenzothiophenyl group, a dibenzosilolyl group, a benzocarbazolyl group, a dibenzocarbazolyl group, an azacarbazolyl group, an azadibenzofuranyl group, an azadibenzothiophenyl group, —$Si(Q_{33})(Q_{34})(Q_{35})$, or any combination thereof;

an adamantanyl group, a naphthyl group, a fluorenyl group, a pyridinyl group, an indolyl group, a carbazolyl group, a benzofuranyl group, a benzothiophenyl group, a dibenzofuranyl group, a dibenzothiophenyl group, or a dibenzosilolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, a $C_1$-$C_{20}$ alkyl group, a $C_1$-$C_{20}$ alkoxy group, a cyclopentyl group, a cyclohexyl group, a phenyl group, a biphenyl group, a naphthyl group, a fluorenyl group, a pyridinyl group, a pyrazinyl group, a pyrimidinyl group, a pyridazinyl group, a carbazolyl group, a benzimidazolyl group, a benzofuranyl group, a benzothiophenyl group, a triazinyl group, a dibenzofuranyl group, a dibenzothiophenyl group, a dibenzosilolyl group, a benzocarbazolyl group, a dibenzocarbazolyl group, an azacarbazolyl group, an azadibenzofuranyl group, an azadibenzothiophenyl group, —$Si(Q_{33})(Q_{34})(Q_{35})$, or any combination thereof; or —$Si(Q_3)(Q_4)(Q_5)$, and $Q_3$ to $Q_5$ and $Q_{33}$ to $Q_{35}$ are respectively the same as those described herein.

In one or more embodiments, $R_4$ in Formula 1 may be:

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, —$Si(Q_3)(Q_4)(Q_5)$, or an adamantanyl group, each unsubstituted or substituted with at least one deuterium; or a group represented by one of Formulae 2-1 to 2-32:

2-1

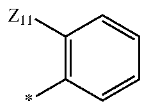

-continued 2-2

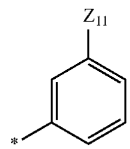

2-3

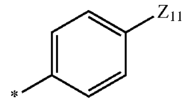

2-4

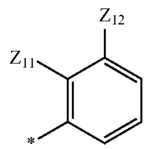

2-5

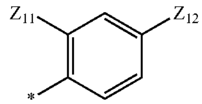

2-6

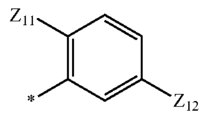

2-7

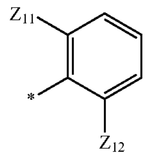

2-8

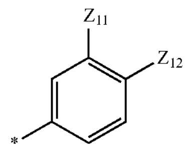

2-9

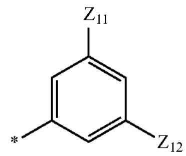

2-10

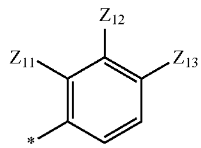

2-11

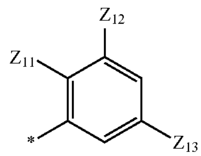

-continued
2-12
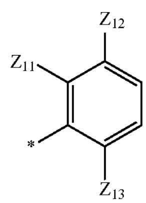
2-13
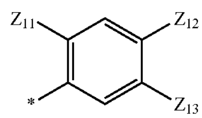
2-14
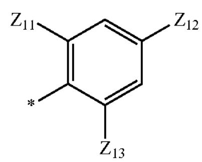
2-15
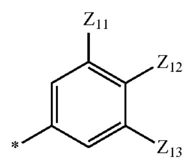
2-16
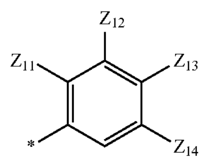
2-17
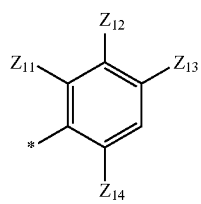
2-18
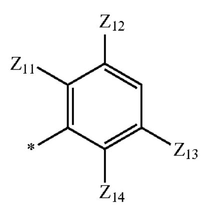
2-19
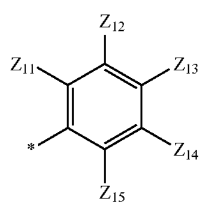
2-20
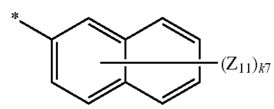
-continued
2-21
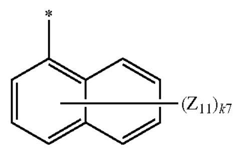
2-22
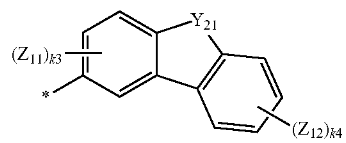
2-23
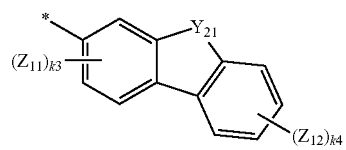
2-24
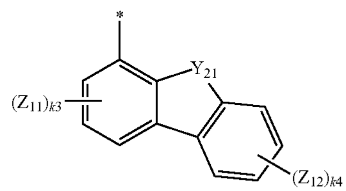
2-25
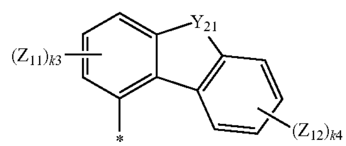
2-26
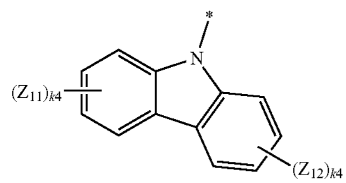
2-27
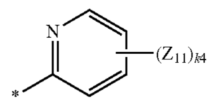
2-28
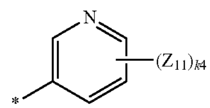
2-29
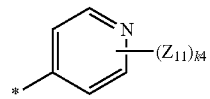
2-30
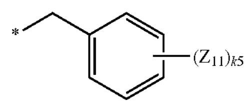
2-31
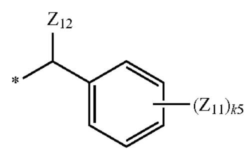

-continued 2-32

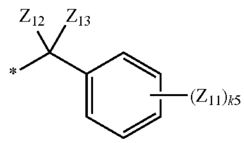

wherein, in Formulae 2-1 to 2-32, $Y_{21}$ may be O, S, $N(Z_{13})$, $C(Z_{13})(Z_{14})$, or $Si(Z_{13})(Z_{14})$, $Z_{11}$ to $Z_{15}$ may each independently be deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, a $C_1$-$C_{20}$ alkyl group, a $C_1$-$C_{20}$ alkoxy group, a cyclopentyl group, a cyclohexyl group, a phenyl group, a biphenyl group, a naphthyl group, a fluorenyl group, a pyridinyl group, a pyrazinyl group, a pyrimidinyl group, a pyridazinyl group, a carbazolyl group, a benzimidazolyl group, a benzofuranyl group, a benzothiophenyl group, a triazinyl group, a dibenzofuranyl group, a dibenzothiophenyl group, a dibenzosilolyl group, a benzocarbazolyl group, a dibenzocarbazolyl group, an azacarbazolyl group, an azadibenzofuranyl group, an azadibenzothiophenyl group, or —$Si(Q_{33})(Q_{34})(Q_{35})$, k3 may be an integer from 0 to 3, k4 may be an integer from 0 to 4, k5 may be an integer from 0 to 5, k7 may be an integer from 0 to 7, $Q_3$ to $Q_5$ and $Q_{33}$ to $Q_{35}$ may each independently be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof, and

* indicates a binding site to a neighboring atom.

In one or more embodiments, $R_A$ in Formula 1 may be —$CD_3$, —$CD_2H$, —$CDH_2$, —$CF_3$, —$CF_2H$, —$CFH_2$, a methyl group, an ethyl group, an n-propyl group, an isopropyl group, an n-butyl group, an isobutyl group, a sec-butyl group, a tert-butyl group, —$Si(Q_3)(Q_4)(Q_5)$, or a group represented by one of Formulae 3-1 to 3-78:

3-1

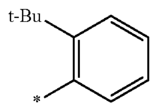

3-2

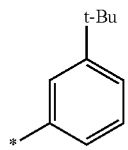

3-3

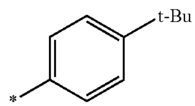

-continued 3-4

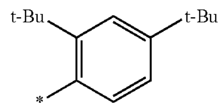

3-5

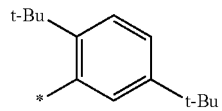

3-6

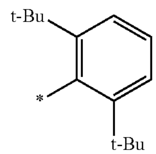

3-7

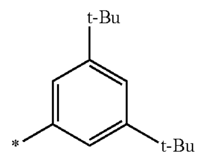

3-8

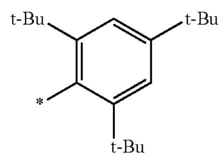

3-9

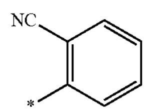

3-10

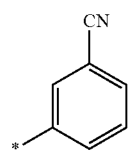

3-11

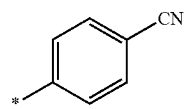

3-12

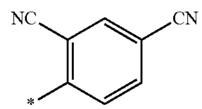

3-13

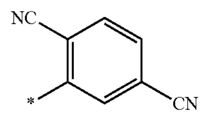

3-14

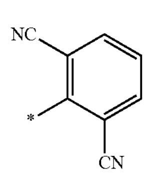

-continued
3-15
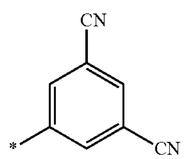
3-16
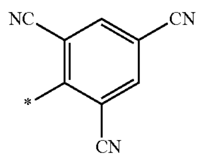
3-17
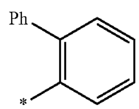
3-18
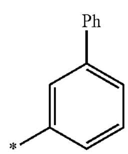
3-19
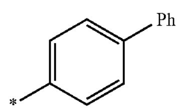
3-20
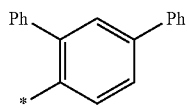
3-21
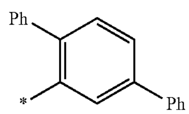
3-22
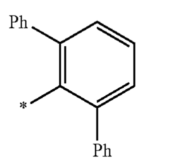
3-23
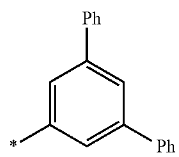
3-24
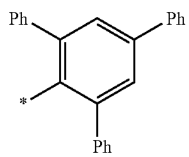
3-25
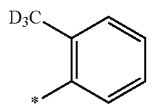
-continued
3-26
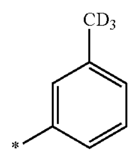
3-27
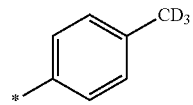
3-28
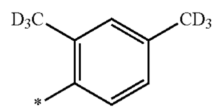
3-29
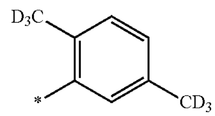
3-30
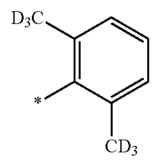
3-31
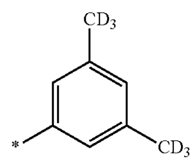
3-32
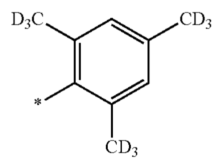
3-33
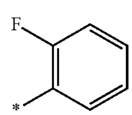
3-34
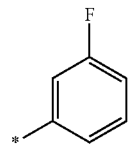
3-35
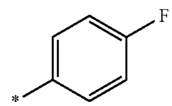
3-36
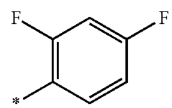

-continued
3-37
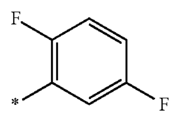
3-38
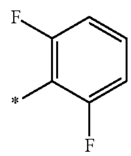
3-39
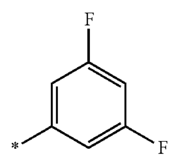
3-40
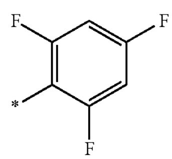
3-41
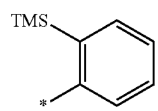
3-42
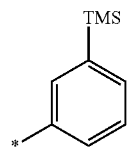
3-43
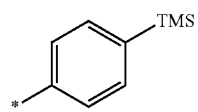
3-44
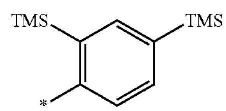
3-45
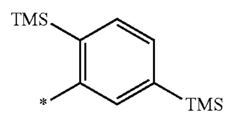
3-46
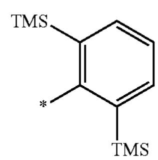
3-47
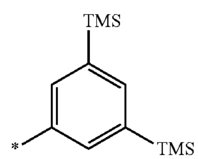
-continued
3-48
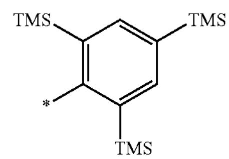
3-49
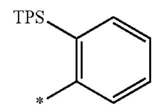
3-50
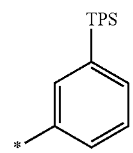
3-51
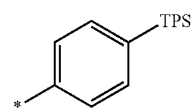
3-52
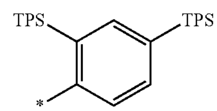
3-53
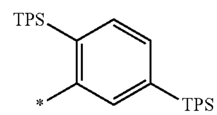
3-54
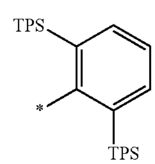
3-55
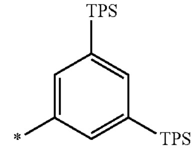
3-56
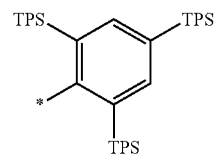
3-57
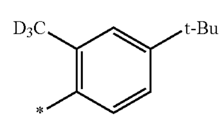
3-58
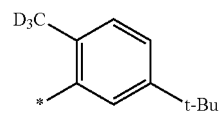

-continued
3-59
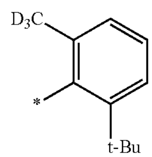
3-60
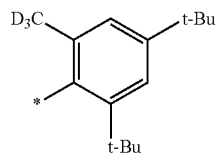
3-61
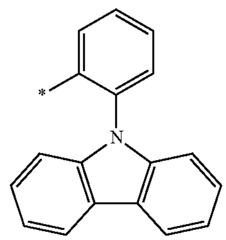
3-62
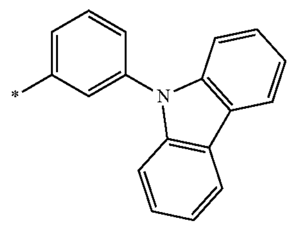
3-63
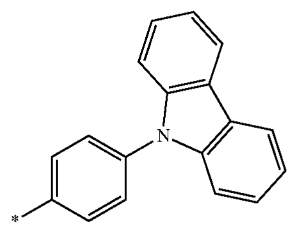
3-64
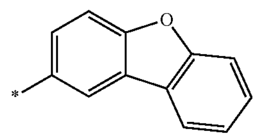
3-65
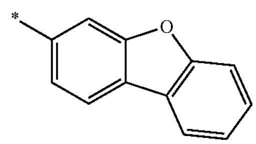
3-66
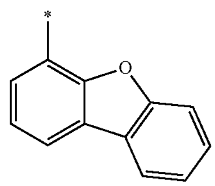
-continued
3-67
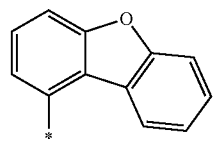
3-68
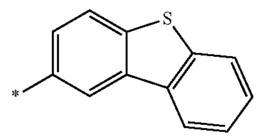
3-69
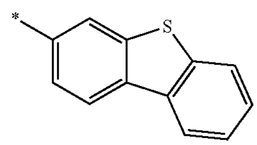
3-70
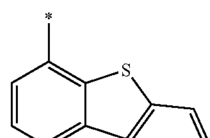
3-71
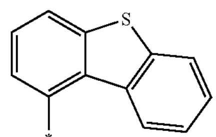
3-72
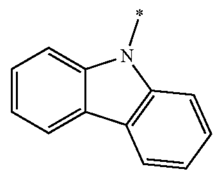
3-73
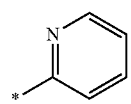
3-74
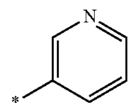
3-75
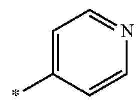
3-76
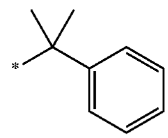
3-77
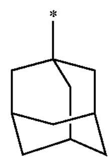

-continued 3-78

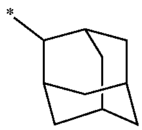

wherein, in Formulae 3-1 to 3-78,

"t-Bu" represents a tert-butyl group, "Ph" represents a phenyl group, "TMS" represents a trimethylsilyl group, and "TPS" represents a triphenylsilyl group, $Q_3$ to $Q_5$ may each independently be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof, and

* indicates a binding site to a neighboring atom.

$R_1$, $R_{10}$, $R_{20}$, $R_{30}$, and $R_{40}$ in Formula 1 may each independently be hydrogen, deuterium, —F, —Cl, —Br, —I, —$SF_5$, a hydroxyl group, a cyano group, a nitro group, an am idino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, and two or more of $R_{10}$, $R_{20}$, $R_{30}$, $R_{40}$, $R_{51}$, and $R_{52}$ may optionally be bonded together to form a substituted or unsubstituted $C_5$-$C_{30}$ carbocyclic group or a substituted or unsubstituted $C_1$-$C_{30}$ heterocyclic group.

In an embodiment, $R_1$, $R_{10}$, $R_{20}$, $R_{30}$, and $R_{40}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or —$SF_5$;

a $C_1$-$C_{20}$ alkyl group or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —$Si(Q_{33})(Q_{34})(Q_{35})$, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a benzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a purinyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a benzocarbazolyl group, an imidazopyridinyl group, an imidazopyrimidinyl group, an azacarbazolyl group, an azadibenzofuranyl group, an azadibenzothiophenyl group, —Si($Q_{33}$)($Q_{34}$)($Q_{35}$), or any combination thereof; or —Si($Q_3$)($Q_4$)($Q_5$), and $Q_3$ to $Q_5$ and $Q_{33}$ to $Q_{35}$ may each independently be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

b1 in Formula 1 indicates the number of $R_1$(s), and may be an integer from 1 to 5. When b1 is 2 or more, two or more of $R_1$(s) may be identical to or different from each other.

b10 in Formula 1 indicates the number of $R_{10}$(s), and may be an integer from 1 to 3. When b10 is 2 or more, two or more of $R_{10}$(s) may be identical to or different from each other.

b20, b30, and b40 in Formula 1 indicate the number of $R_{20}$(s), the number of $R_{30}$(s), and the number of $R_{40}$(s), respectively, and may each independently be an integer from 1 to 10. When b20 is 2 or more, two or more of $R_{20}$(s) may be identical to or different from each other, when b30 is 2 or more, two or more of $R_{30}$(s) may be identical to or different from each other, and when b40 is 2 or more, two or more of $R_{40}$(s) may be identical to or different from each other.

In an embodiment, at least one of $R_1$(s) in the number of b1 may be a substituent other than hydrogen.

For example, a group represented by

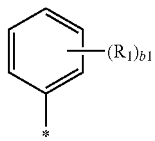

in Formula 1 may be a group represented by one of Formulae 4-1 to 4-20:

4-1

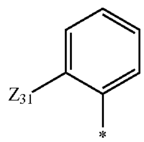

4-2

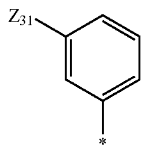

4-3

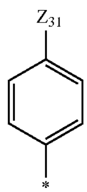

-continued 4-4

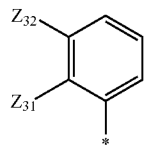

4-5

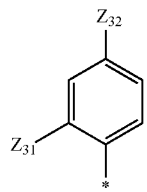

4-6

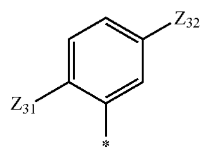

4-7

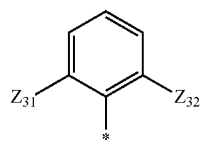

4-8

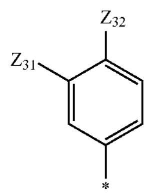

4-9

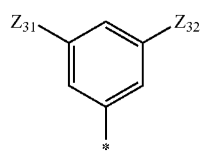

4-10

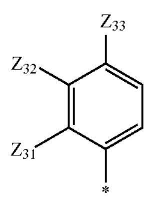

4-11

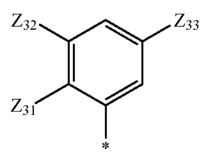

4-12

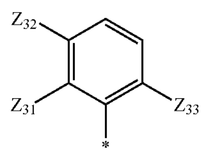

-continued 4-13

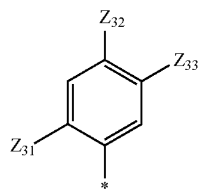

4-14

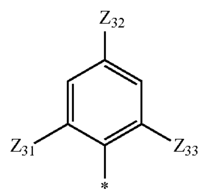

4-15

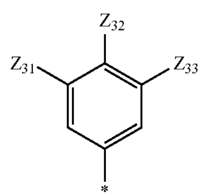

4-16

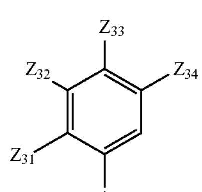

4-17

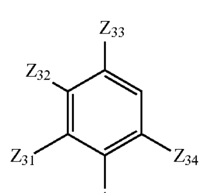

4-18

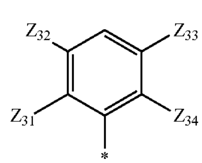

4-19

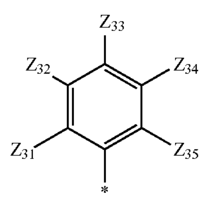

4-20

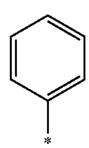

wherein, in Formulae 4-1 to 4-20, $Z_{31}$ to $Z_{35}$ are each the same as described in connection with $R_1$, $Z_{31}$ to $Z_{35}$ may each not be hydrogen, and

* indicates a binding site to a neighboring atom.

For example, $Z_{31}$ to $Z_{35}$ in Formulae 4-1 to 4-20 may each independently be:

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, or a chrysenyl group; or a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, or a chrysenyl group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or any combination thereof.

In an embodiment, a group represented by

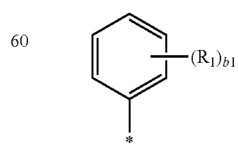

in Formula 1 may be a group represented by Formula 4-2, 4-7, 4-9, or 4-20.

In an embodiment, the organometallic compound may be represented by Formula 1A:

Formula 1A

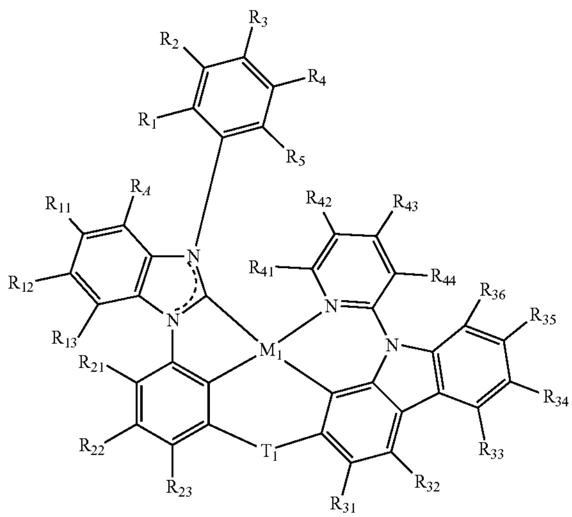

wherein, in Formula 1A, $M_1$, $T_1$, $R_A$, and $R_1$ are respectively the same as those described herein, $R_2$ to $R_5$ are each independently the same as described in connection with $R_1$, $R_{11}$ to $R_{14}$ are each independently the same as described in connection with $R_{10}$, $R_{21}$ to $R_{23}$ are each independently the same as described in connection with $R_{20}$, $R_{31}$ to $R_{36}$ are each independently the same as described in connection with $R_{30}$, and $R_{41}$ to $R_{44}$ are each independently the same as described in connection with $R_{40}$.

For example, $T_1$ in Formula 1A may be $*—N(R_{51})—*'$, $*—B(R_{51})—*'$, $*—C(R_{51})(R_{52})—*'$, $*—Si(R_{51})(R_{52})—*'$, $*—Ge(R_{51})(R_{52})—*'$, or $*—O—*'$.

For example, $R_A$ in Formula 1A may be:

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, $—Si(Q_3)(Q_4)(Q_5)$, or an adamantanyl group, each unsubstituted or substituted with at least one deuterium; or a group represented by one of Formulae 2-1 to 2-32.

at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, or any combination thereof;

$—N(Q_{31})(Q_{32})$, $—Si(Q_{33})(Q_{34})(Q_{35})$, $—B(Q_{36})(Q_{37})$, or $—P(=O)(Q_{38})(Q_{39})$; or any combination thereof, and $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

In an embodiment, the organometallic compound represented by Formula 1 may be one of Compounds 1 to 332, but embodiments of the present disclosure are not limited thereto:
1
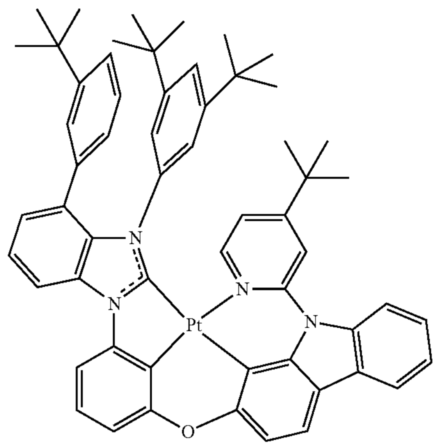
2
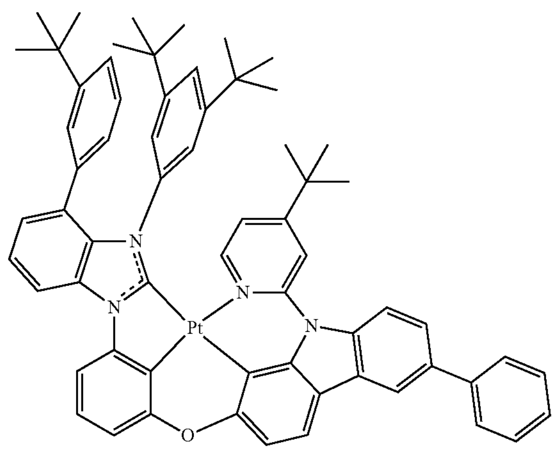
3
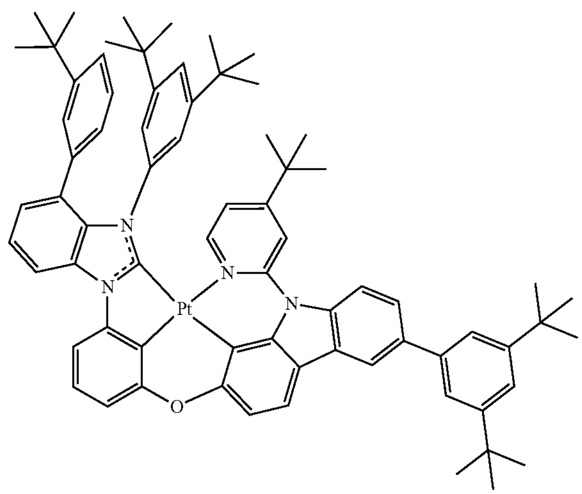
-continued
4
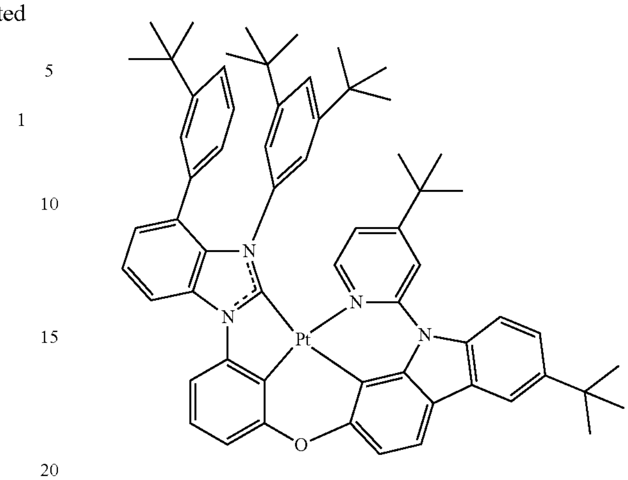
5
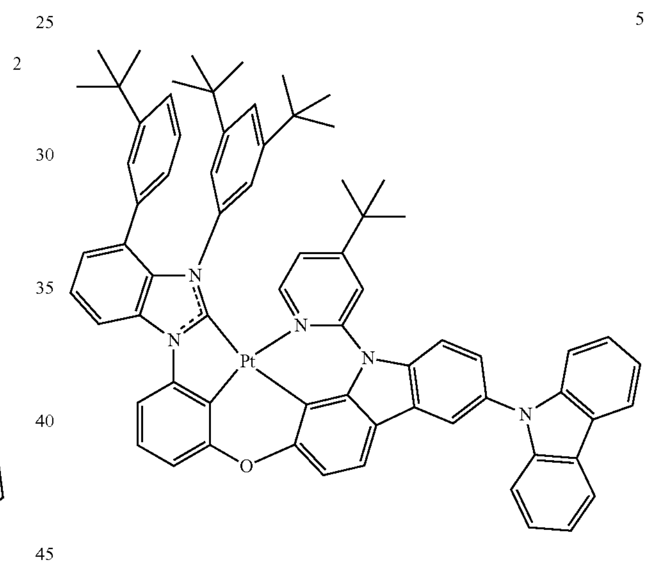
6
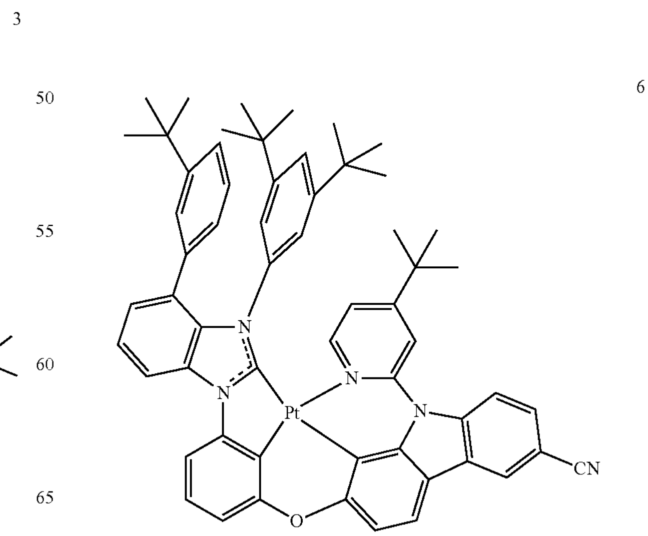

7
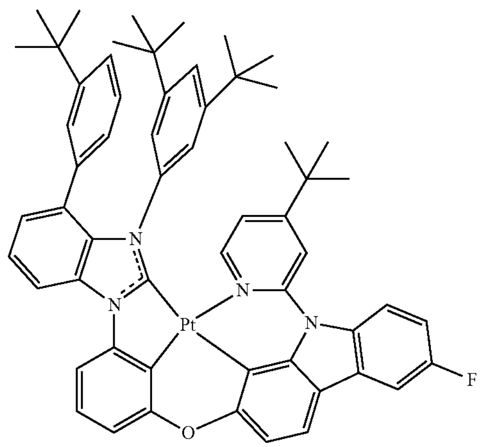
8
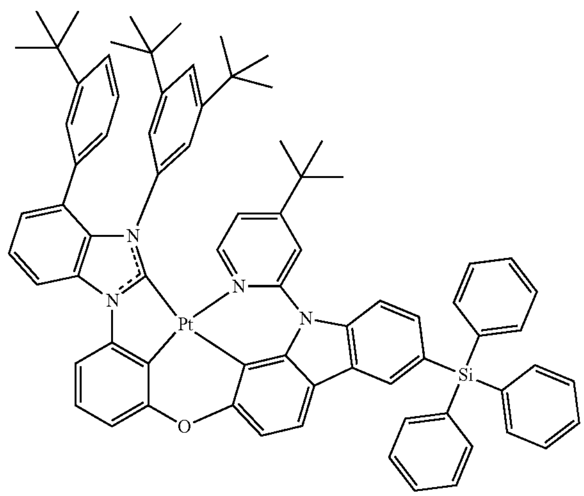
9
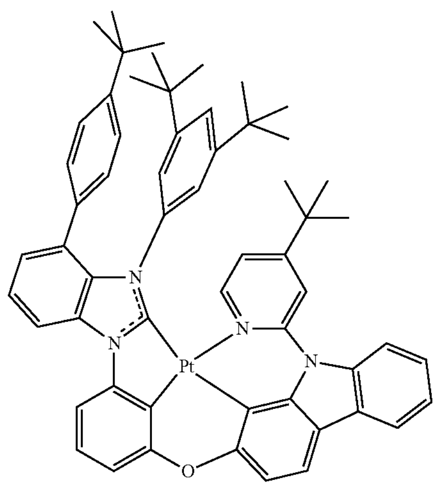
10
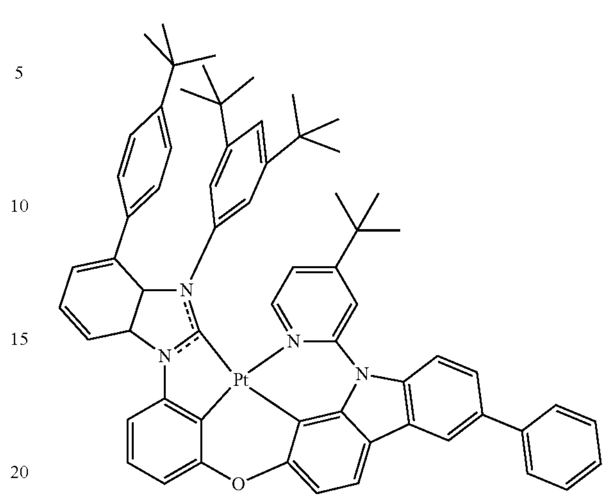
11
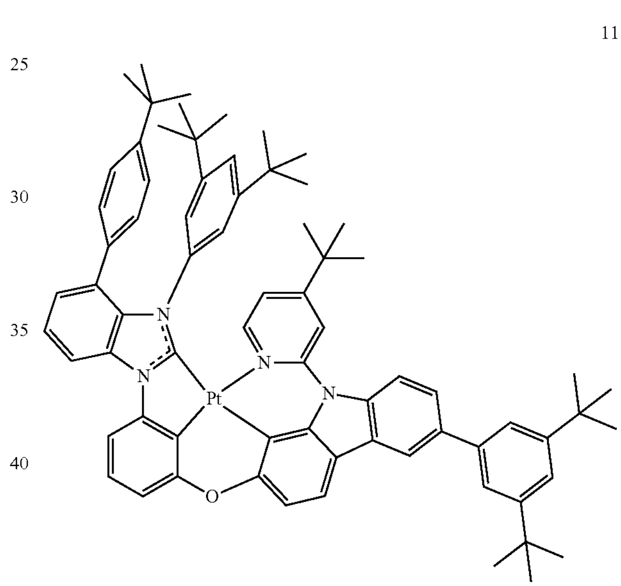
12
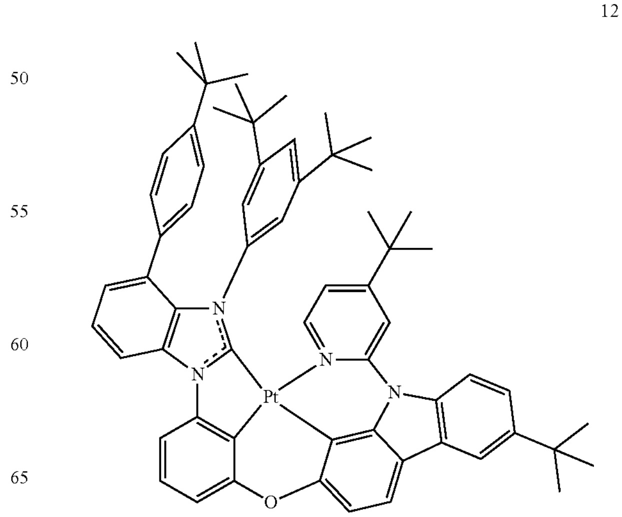

-continued
13
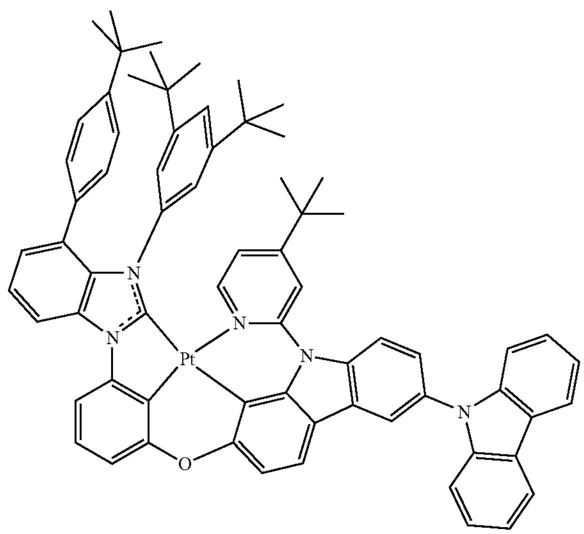
14
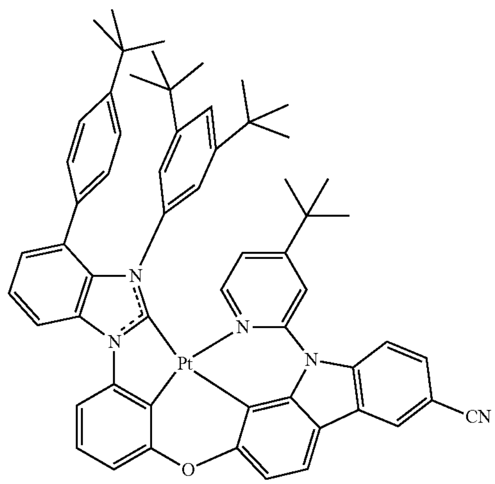
15
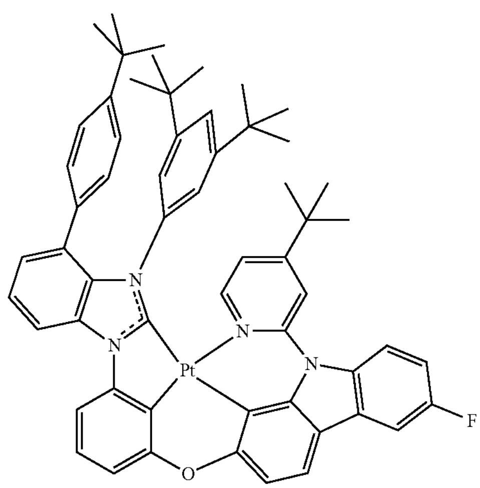
-continued
16
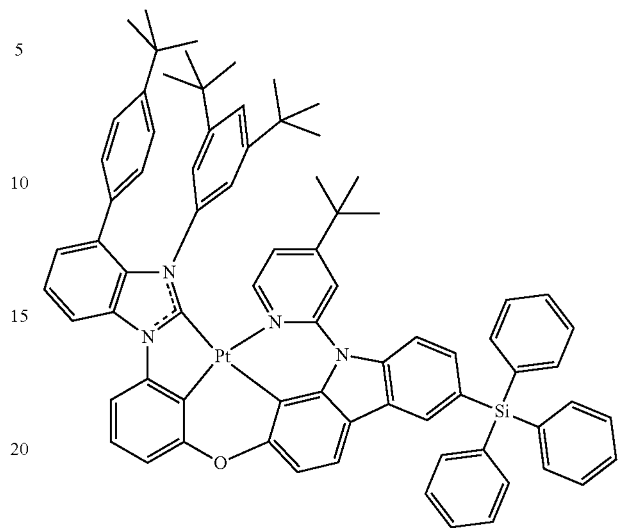
17
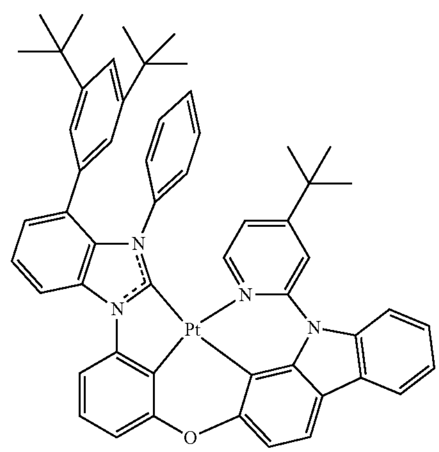
18
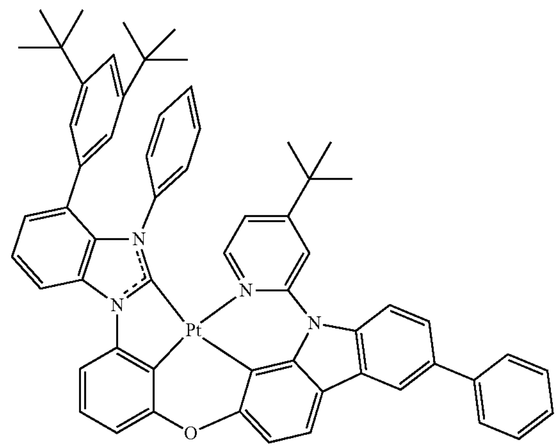

-continued
19
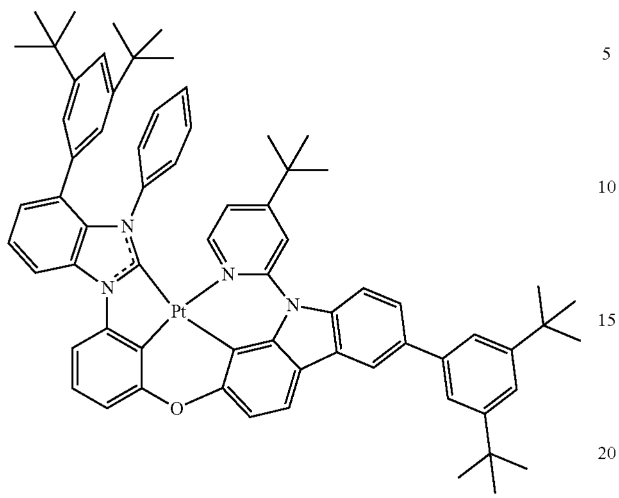
20
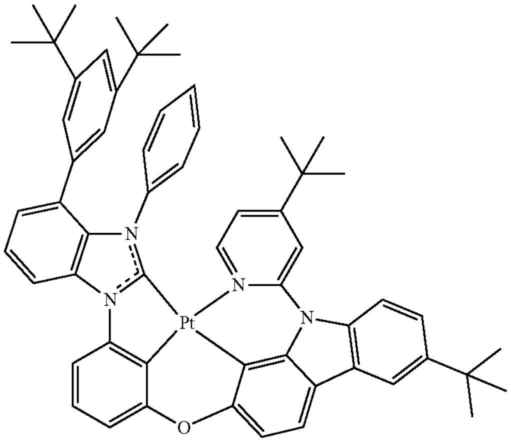
21
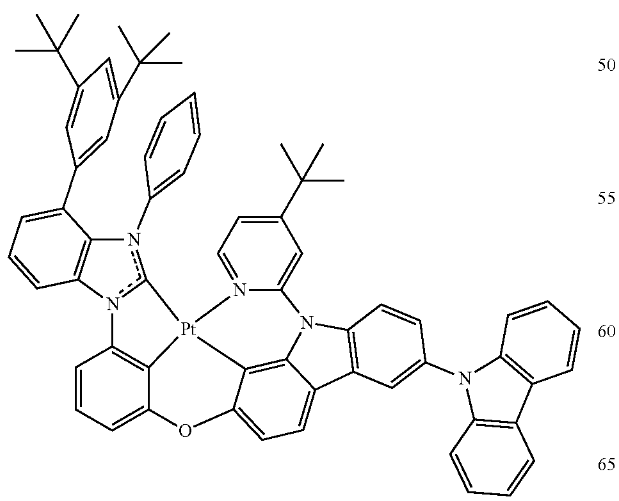
-continued
22
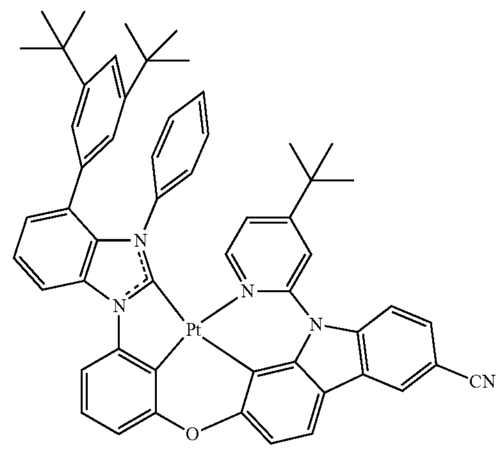
23
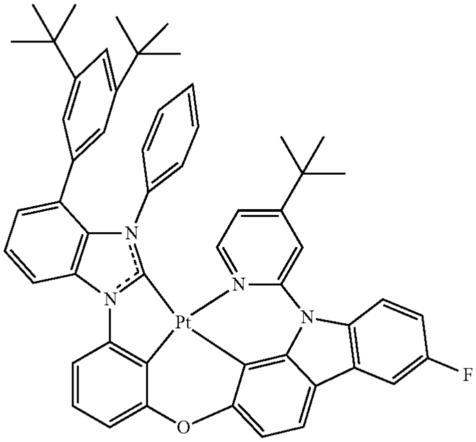
24
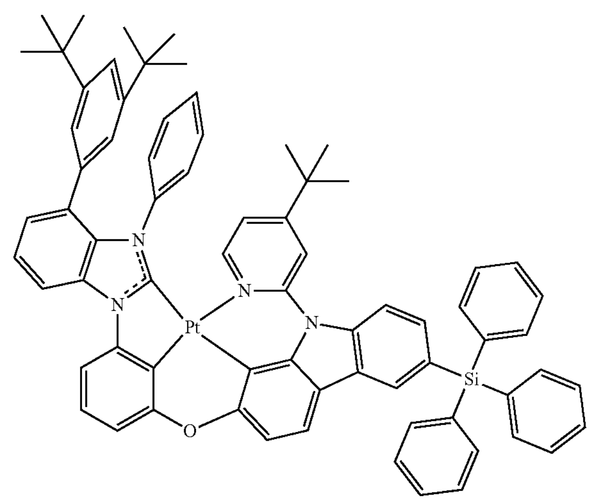

-continued
25
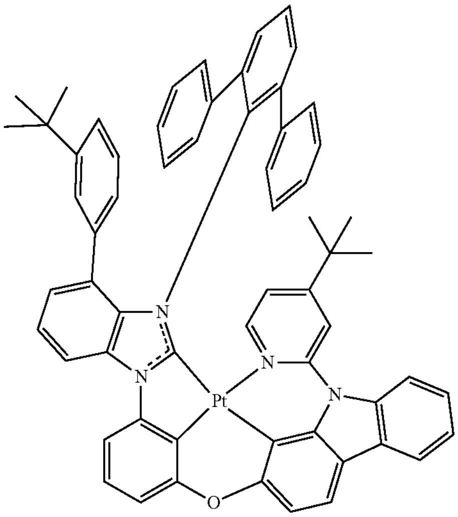
26
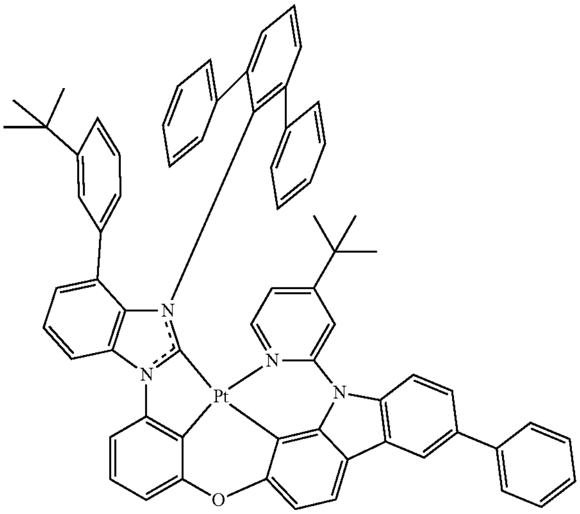
27
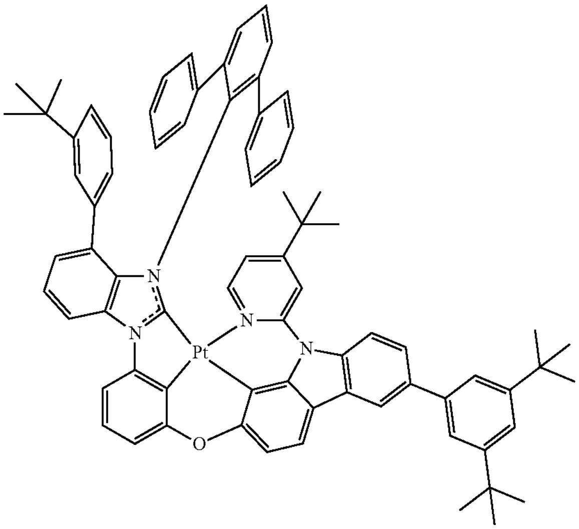
-continued
28
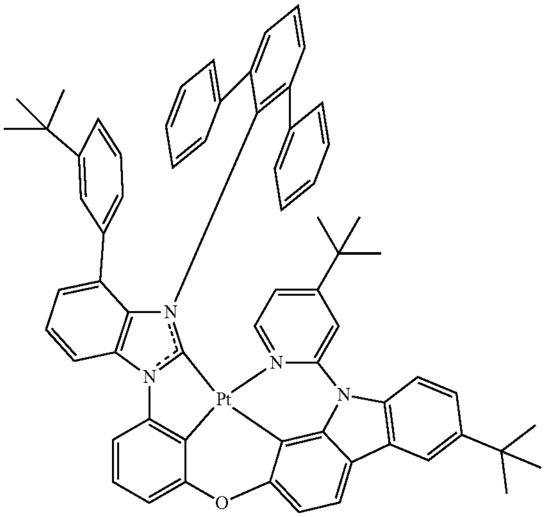
29
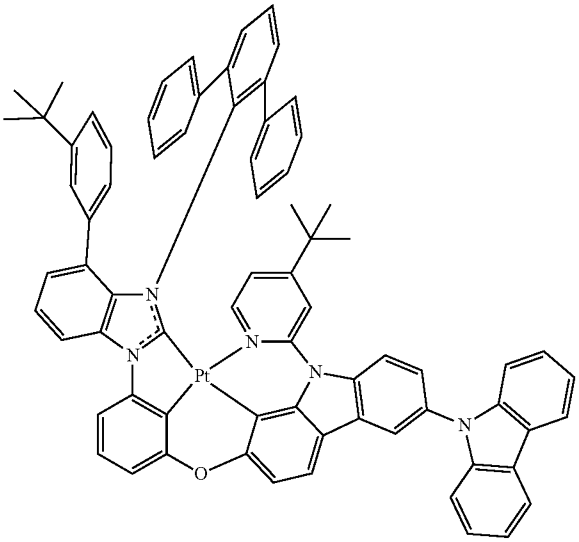
30
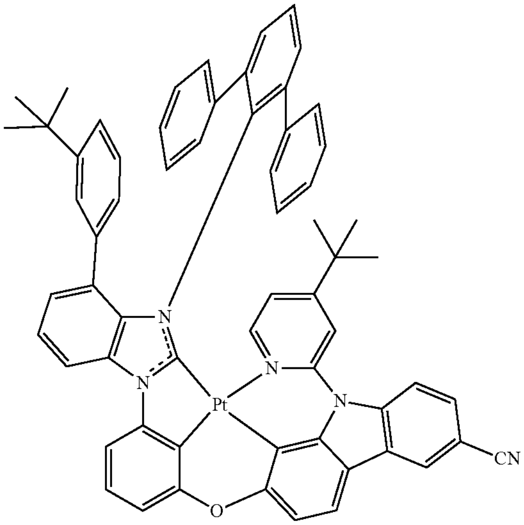

-continued
31
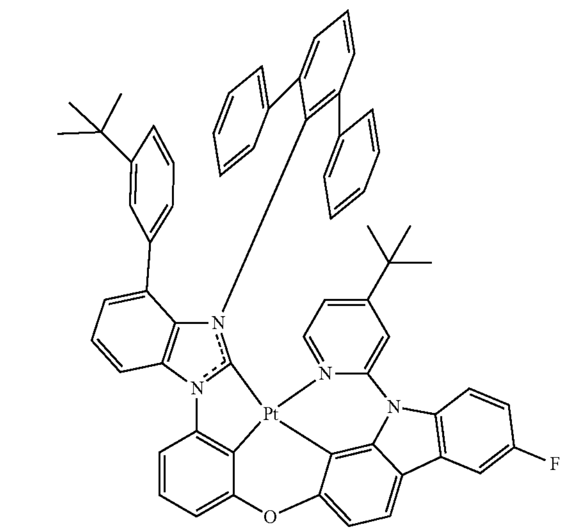
32
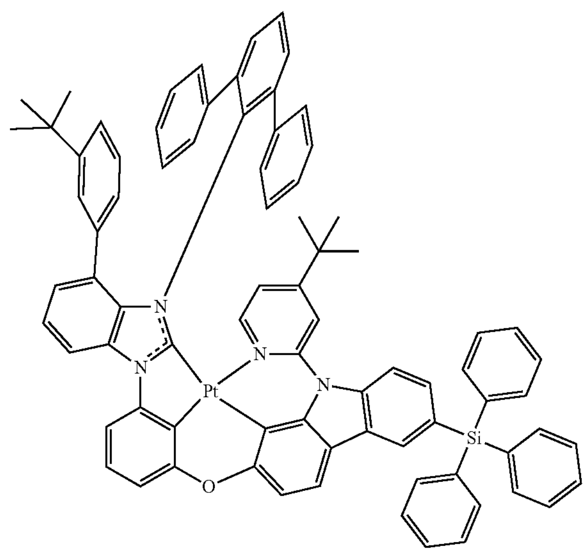
33
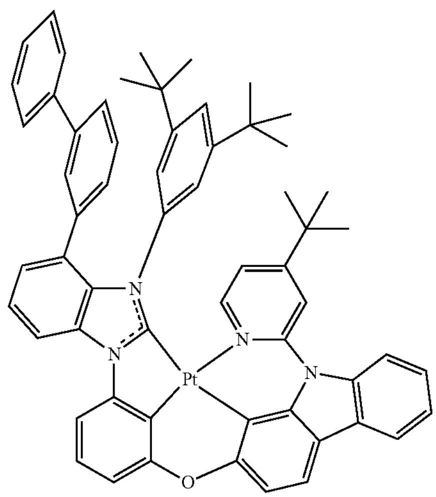
-continued
34
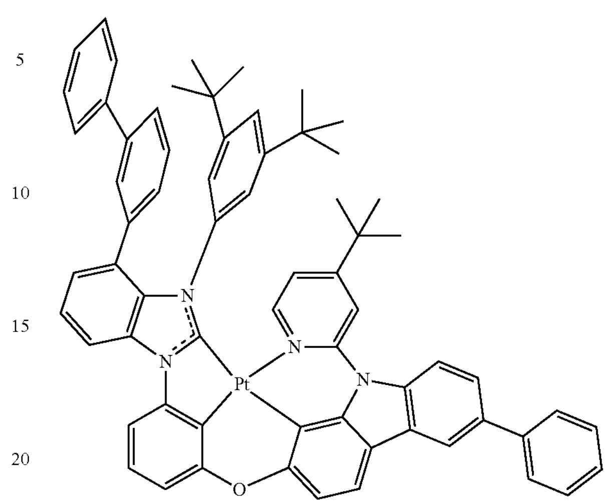
35
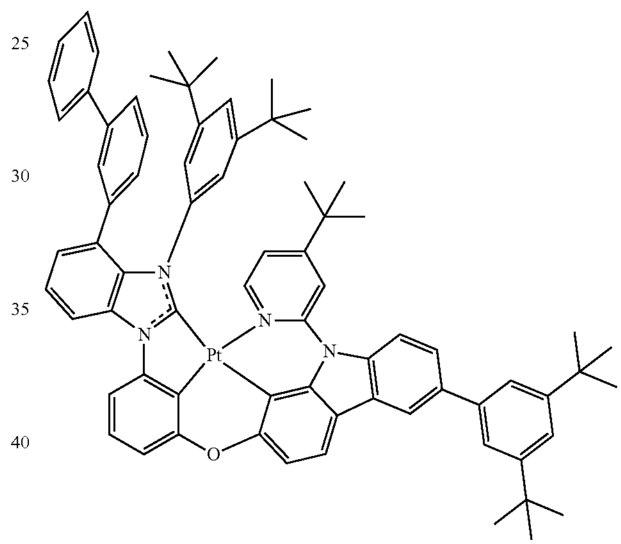
36
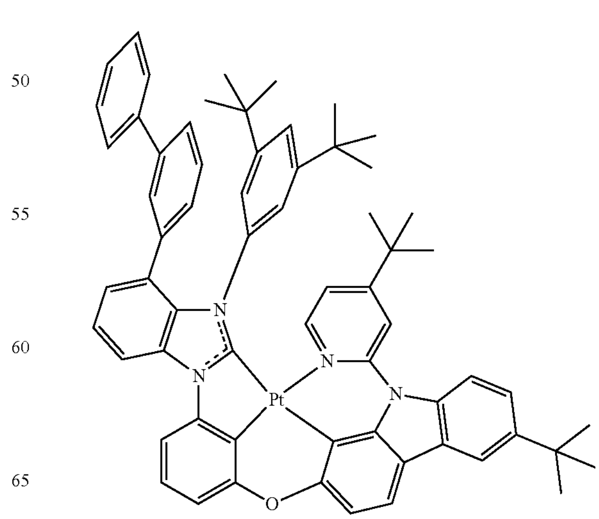

-continued
37
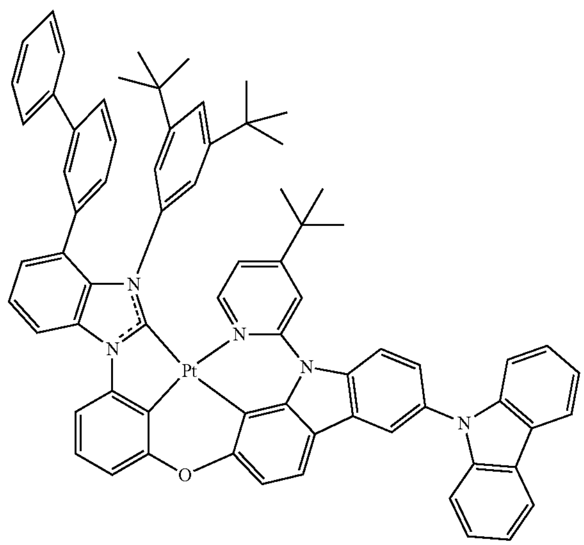
38
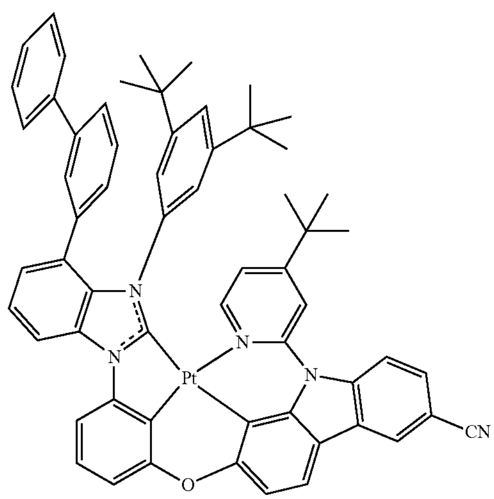
39
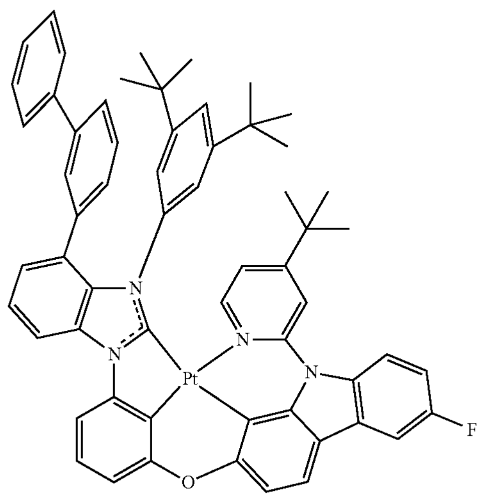
-continued
40
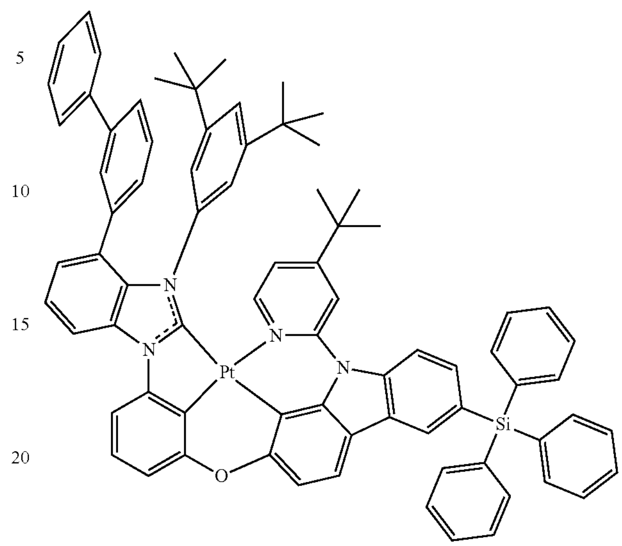
41
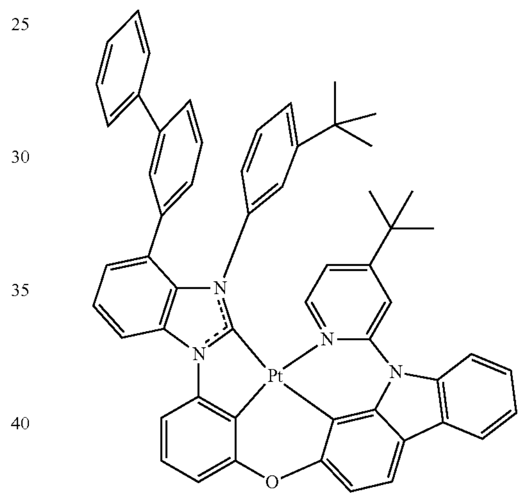
42
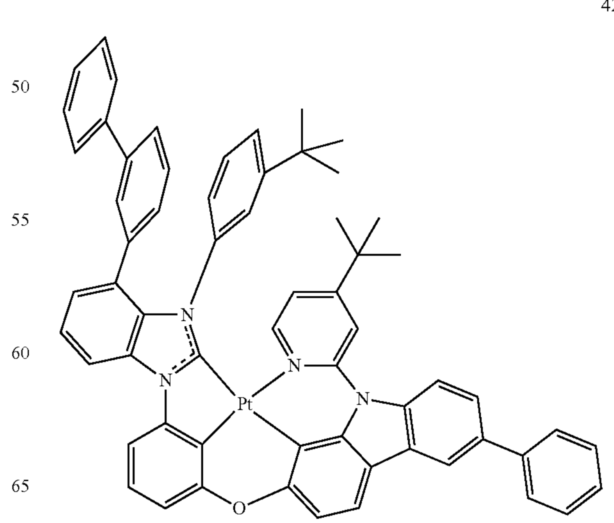

43
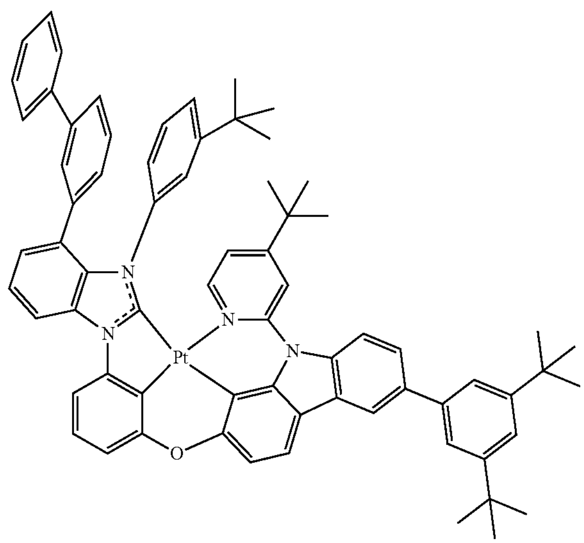
44
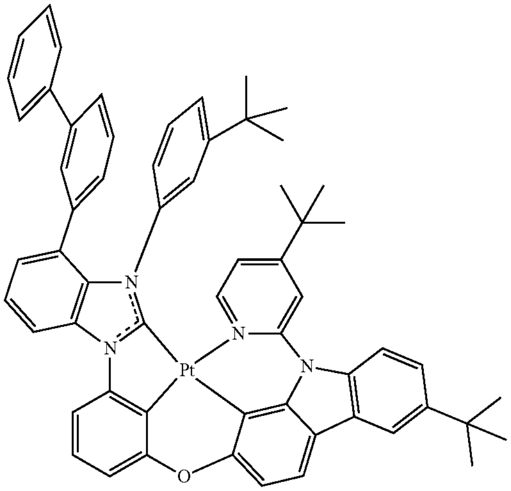
45
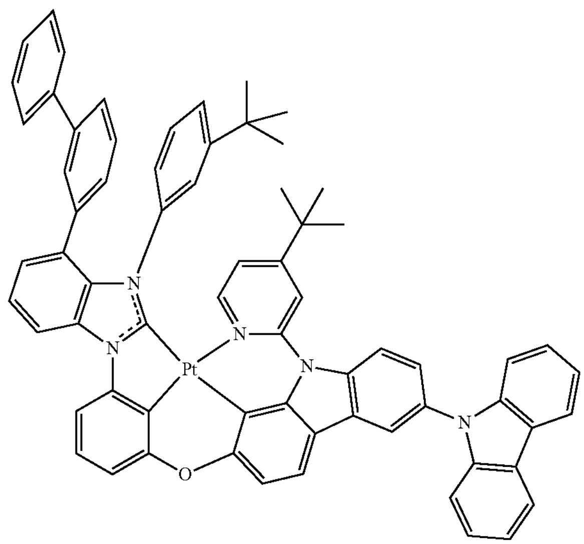
46
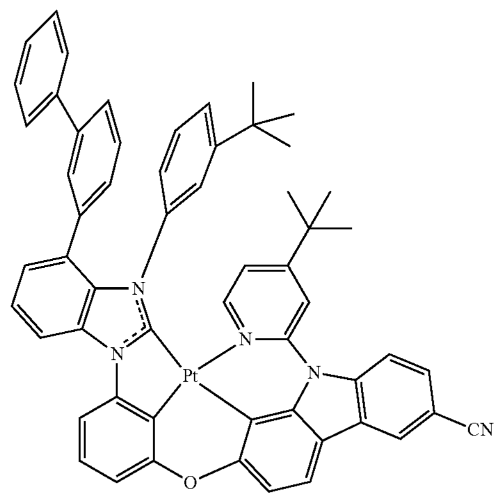
47
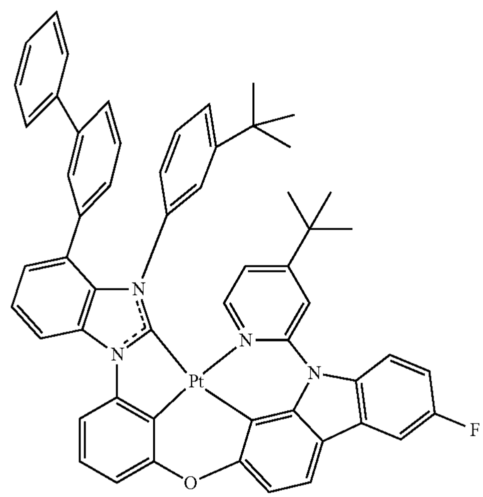
48
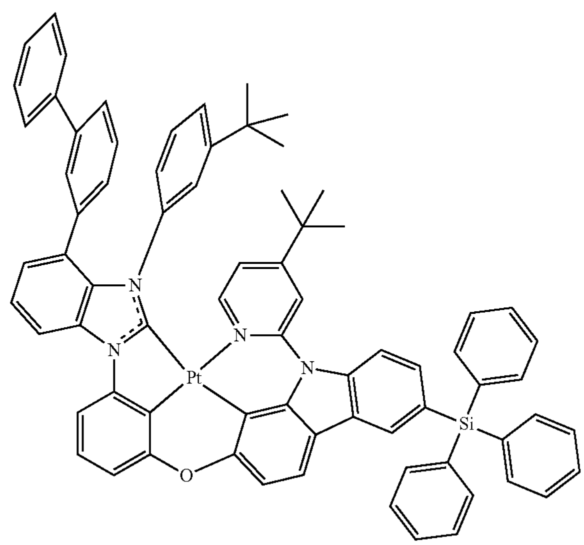

-continued
49
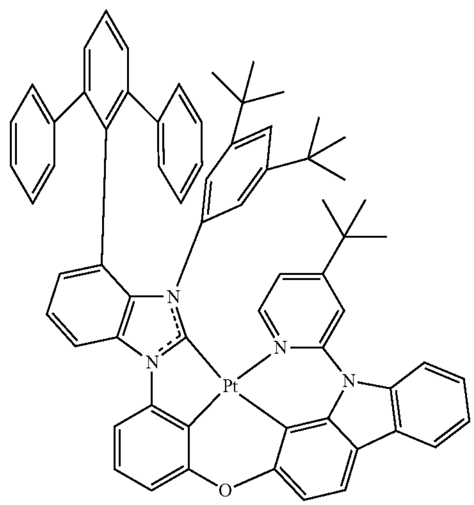
50
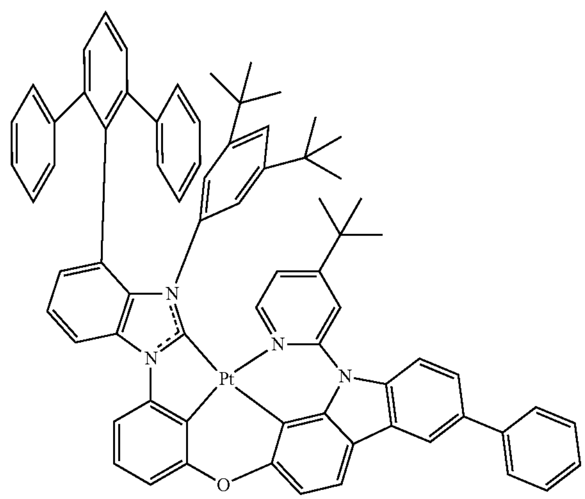
51
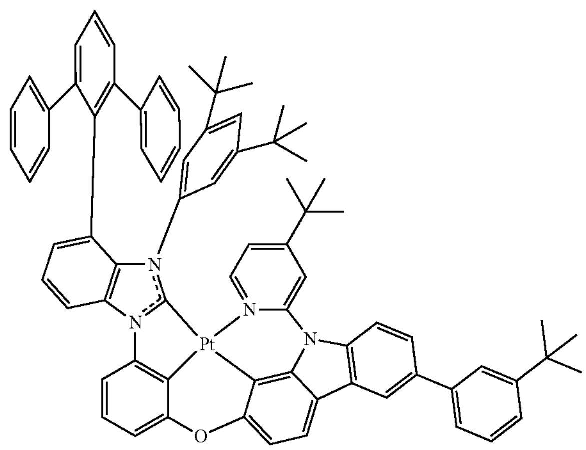
-continued
52
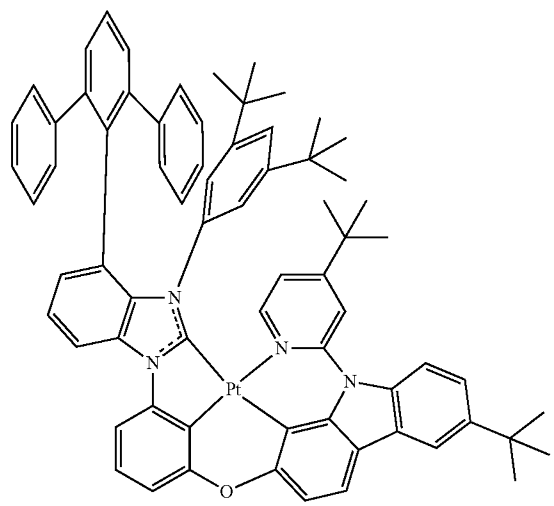
53
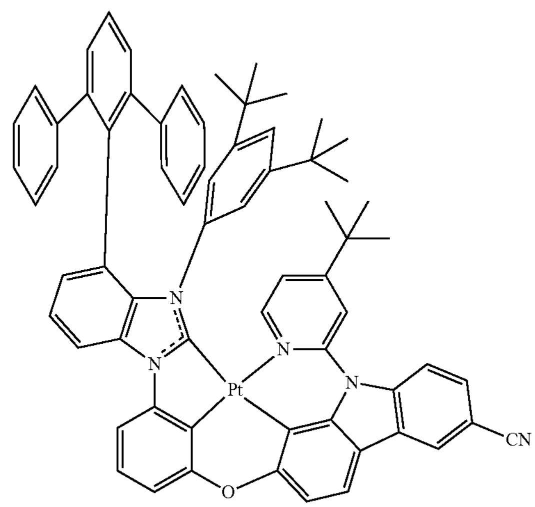
54

-continued
55
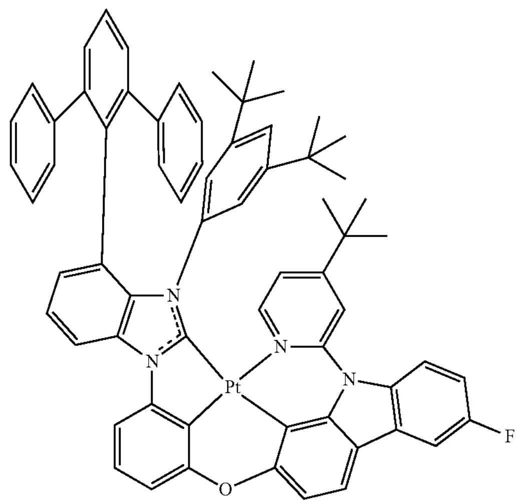
56
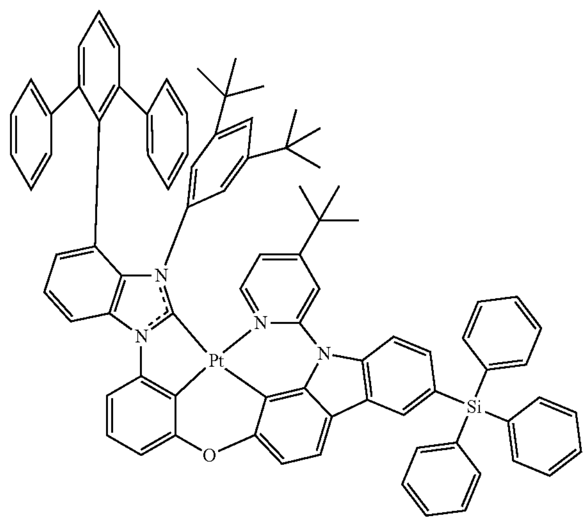
57
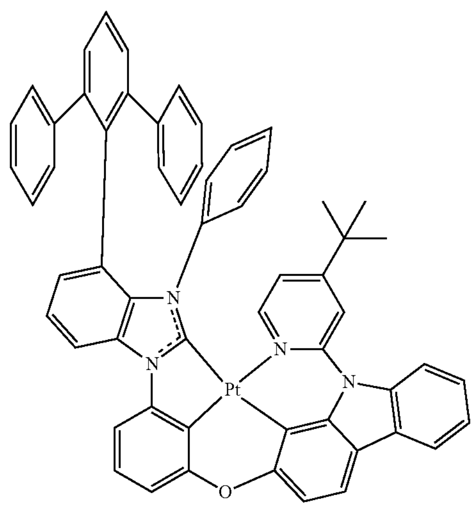
-continued
58
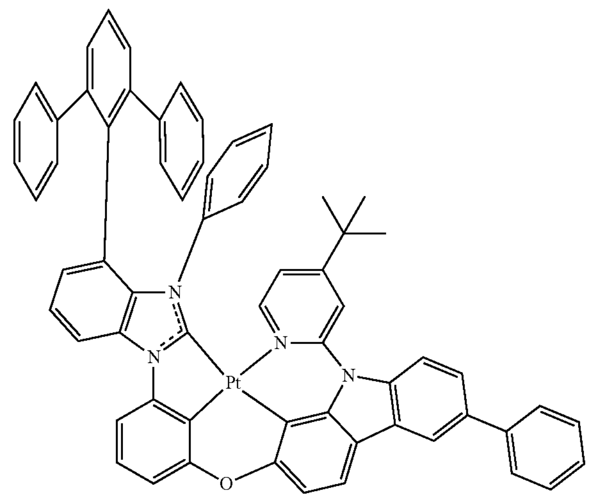
59
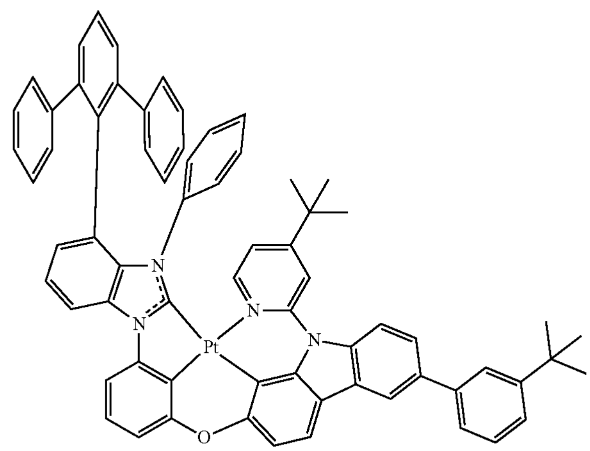
60
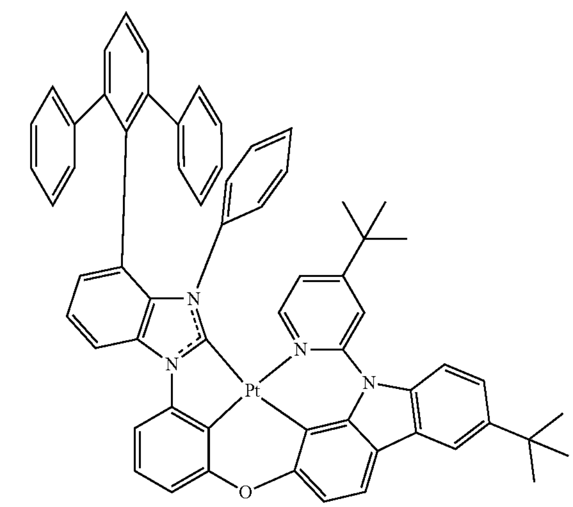

-continued
61
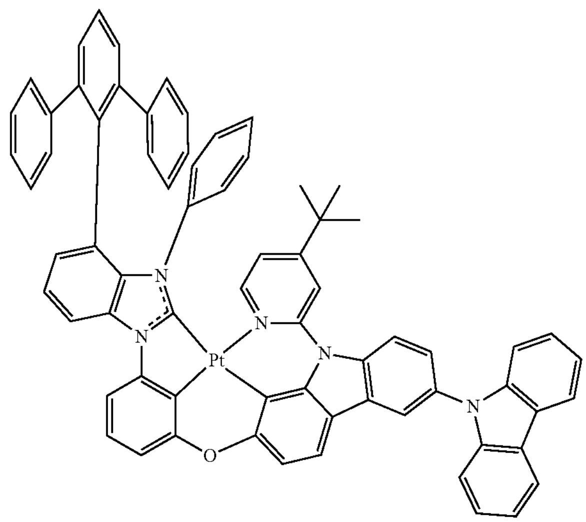
62
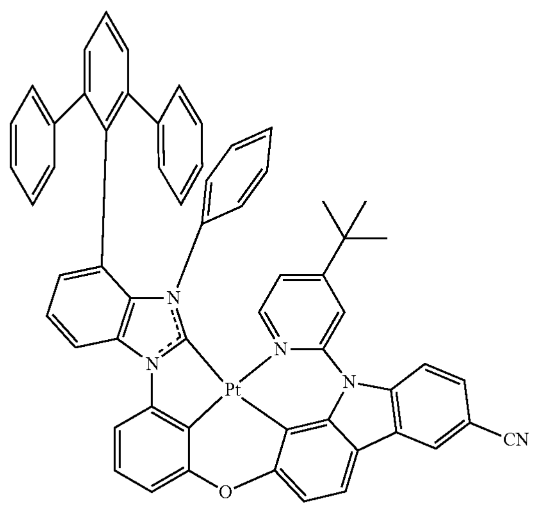
63
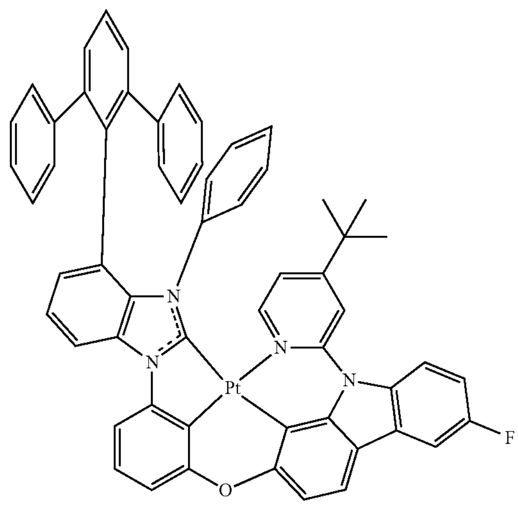
-continued
64
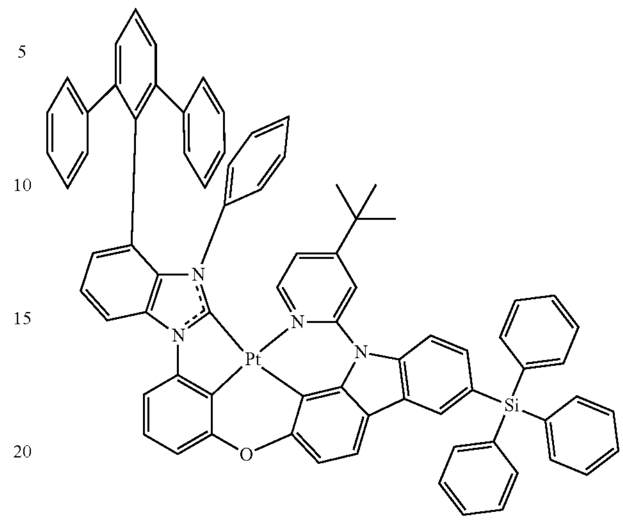
65
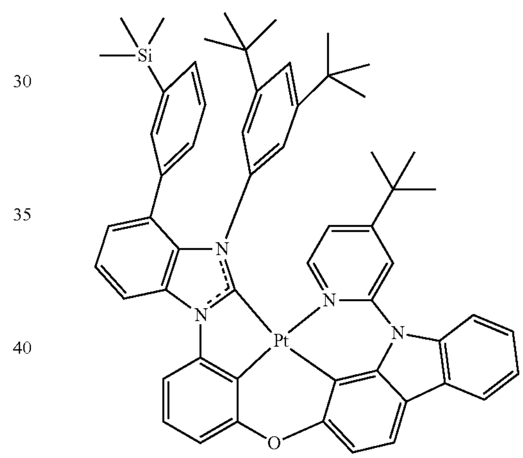
66
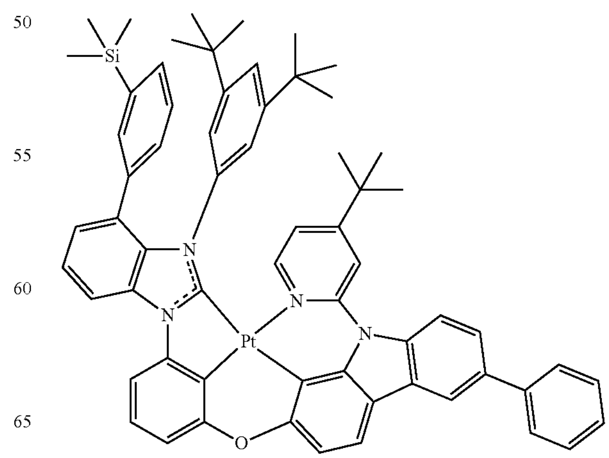

-continued
67
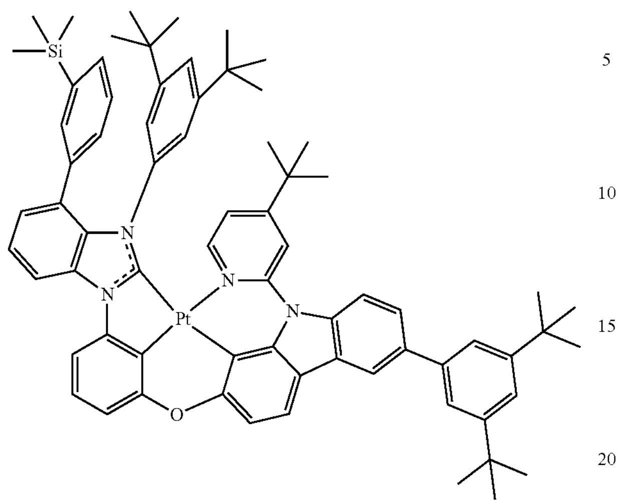
68
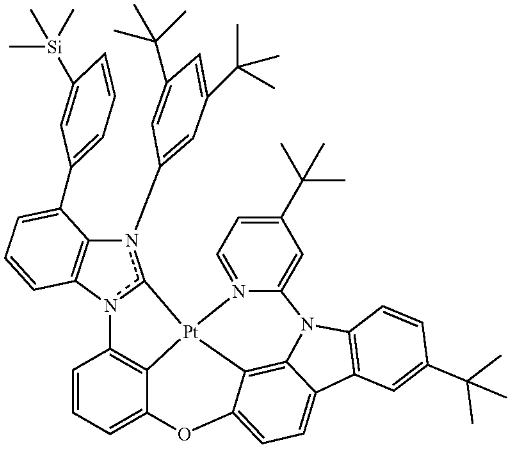
69
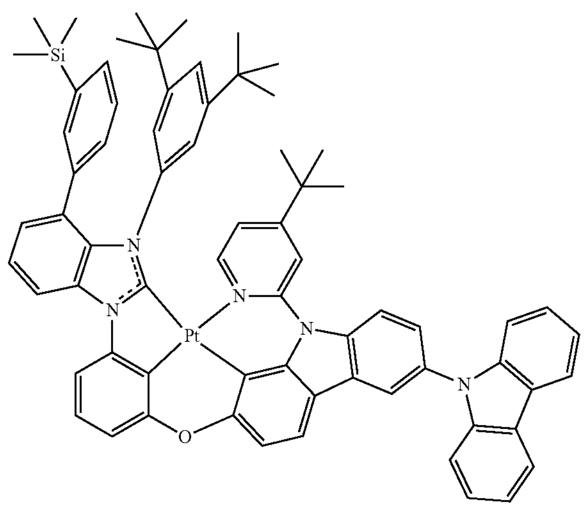
-continued
70
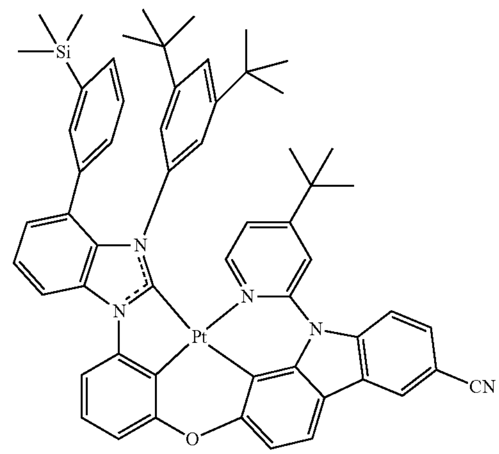
71
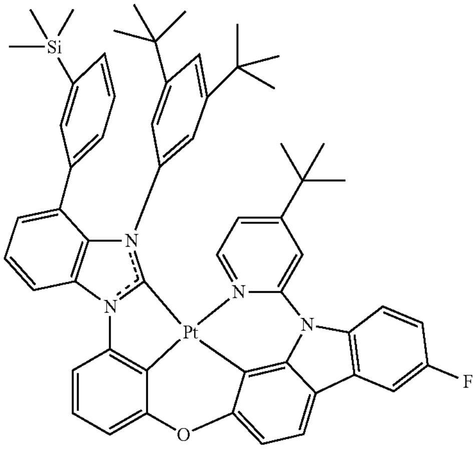
72
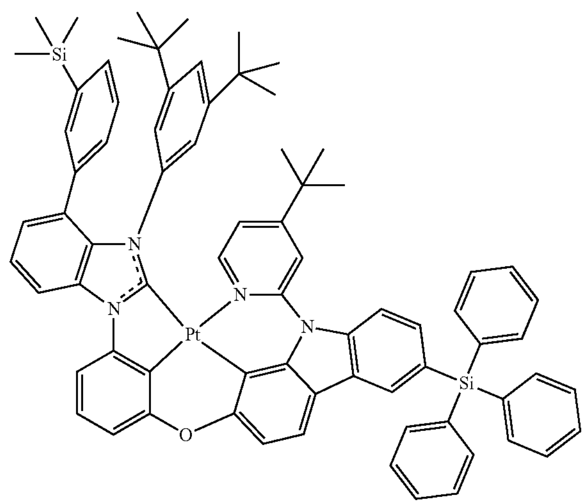

-continued
73
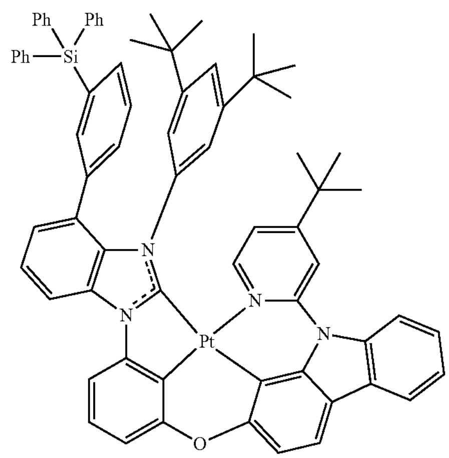
74
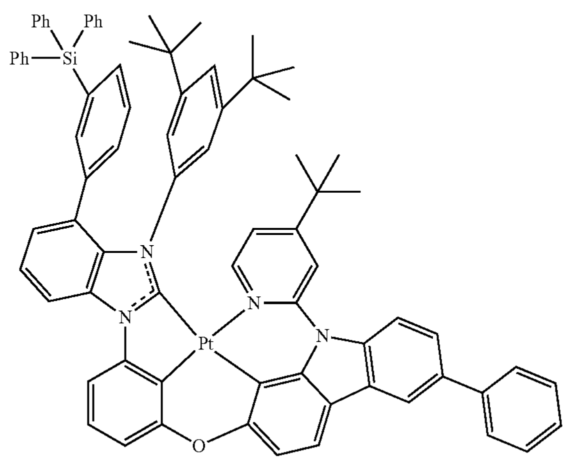
75
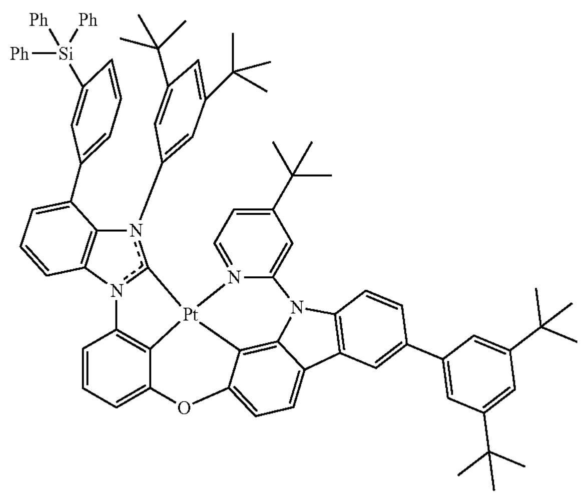
-continued
76
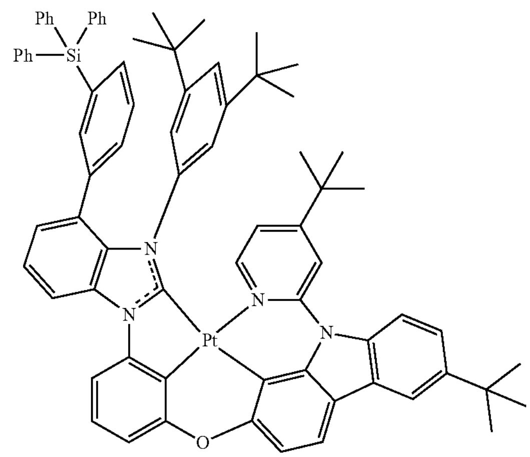
77
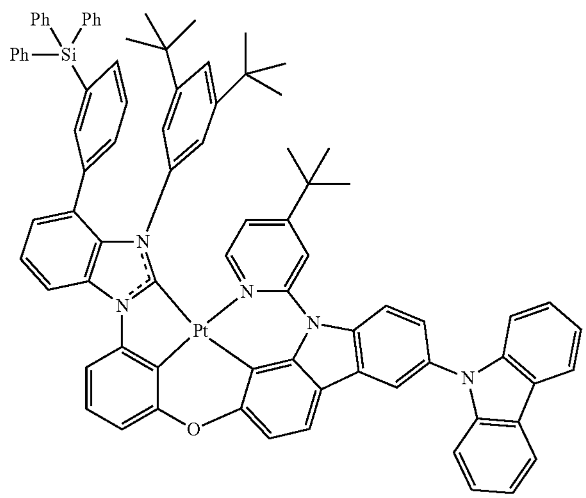
78
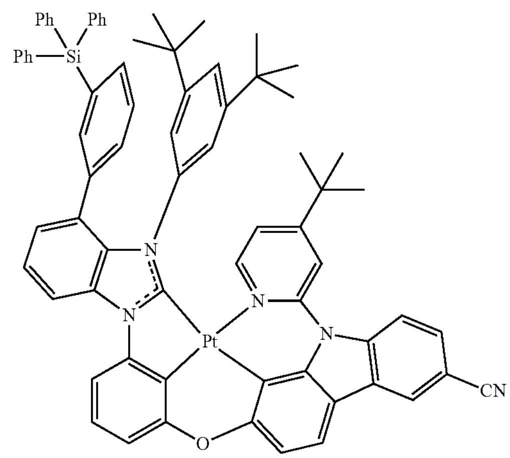

-continued
79
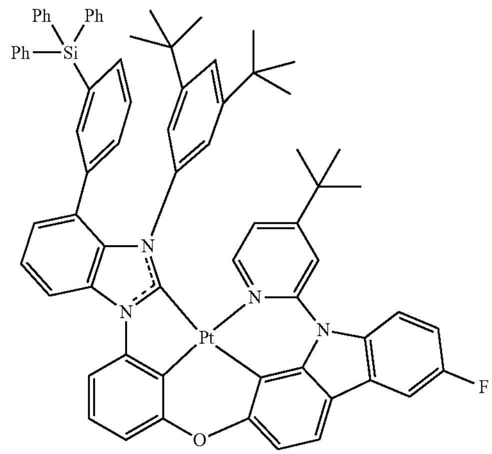
80
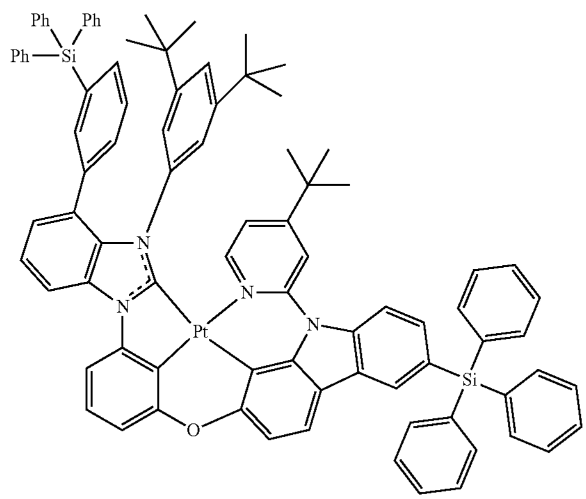
81
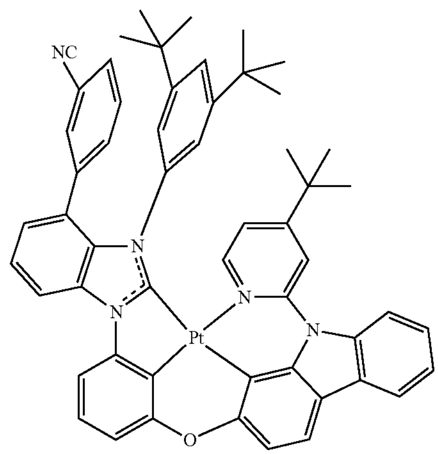
-continued
82
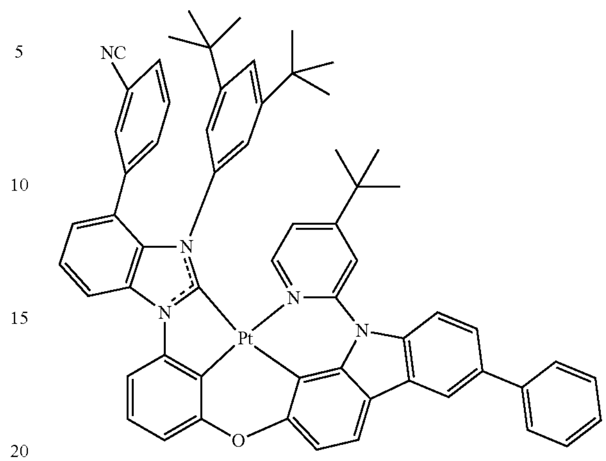
83
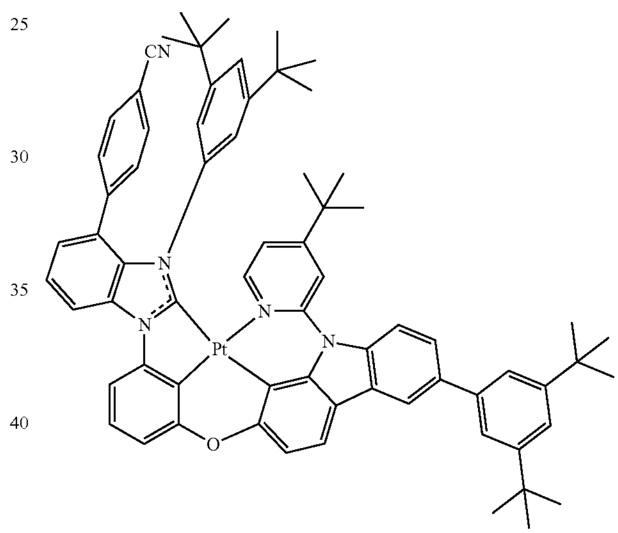
84
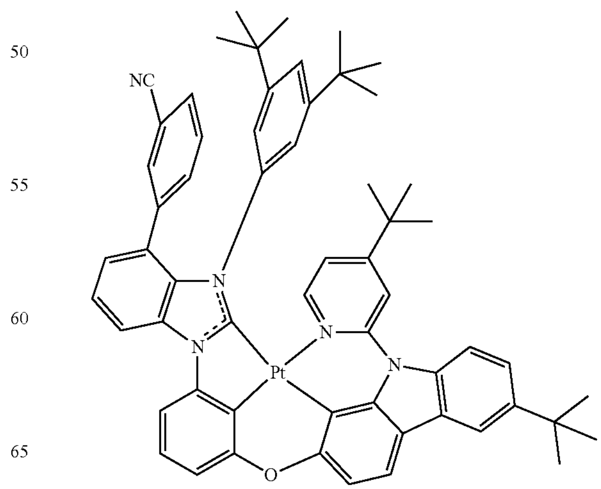

-continued
85
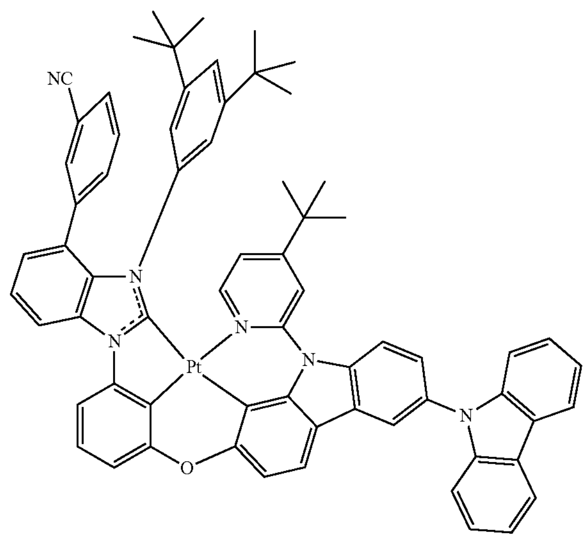
86
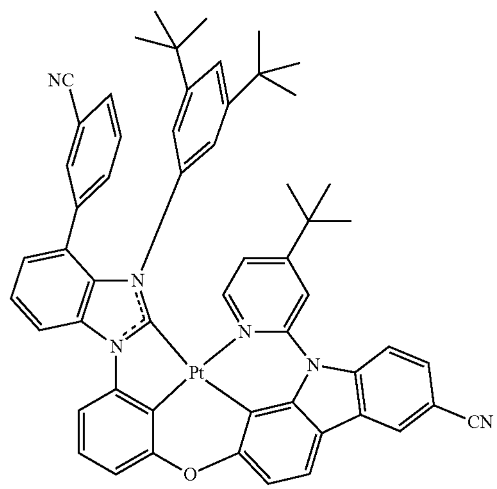
87
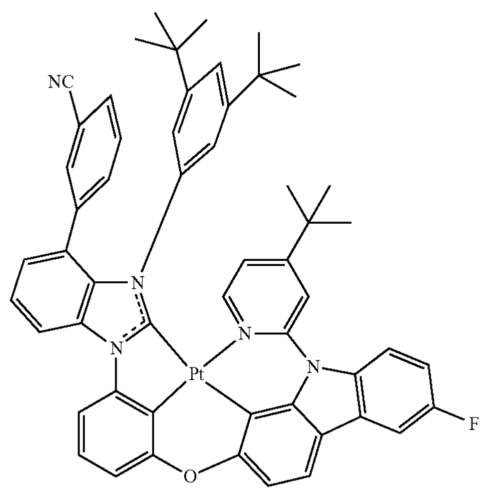
-continued
88
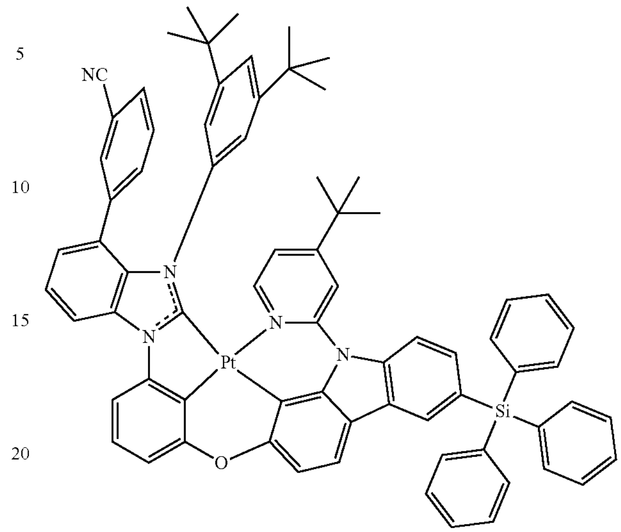
89
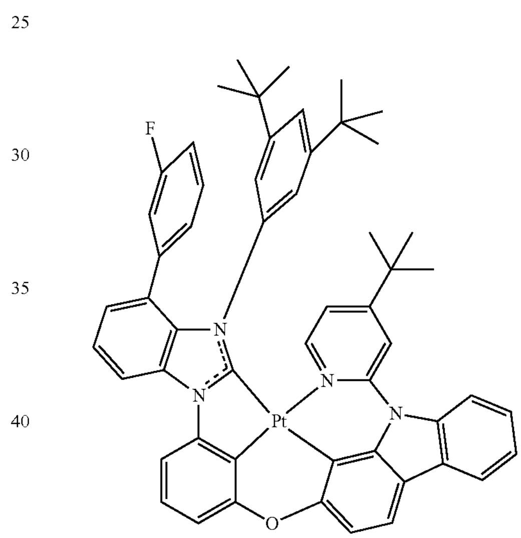
90
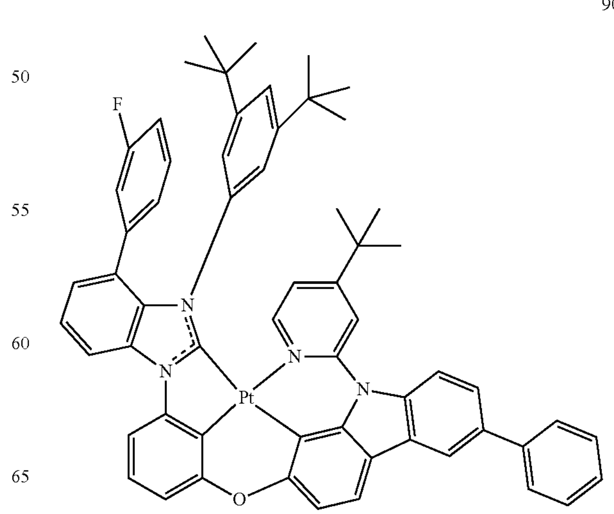

-continued
91
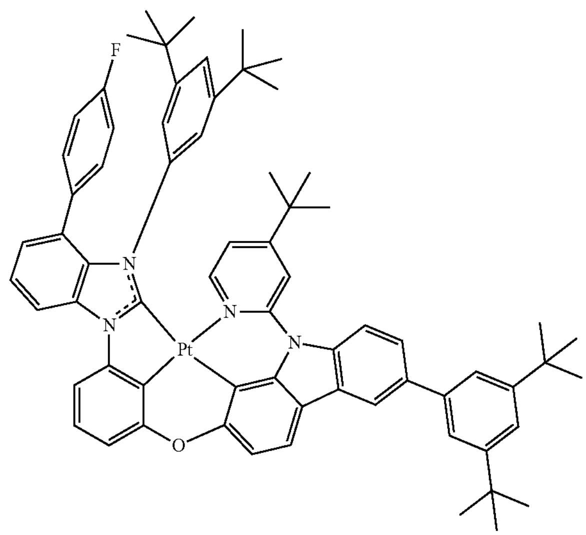
92
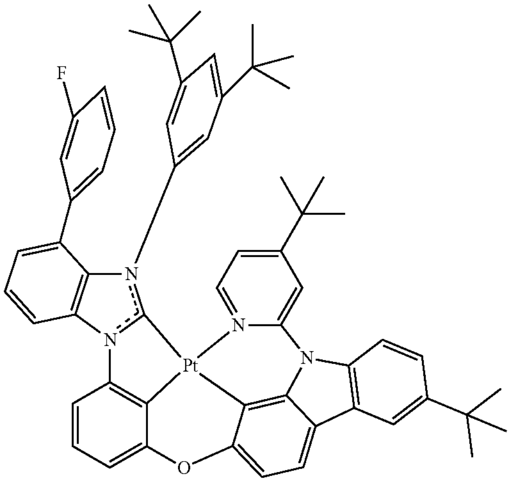
93
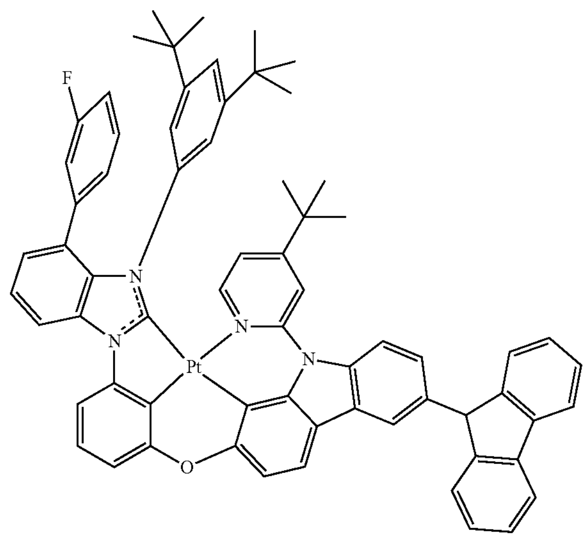
-continued
94
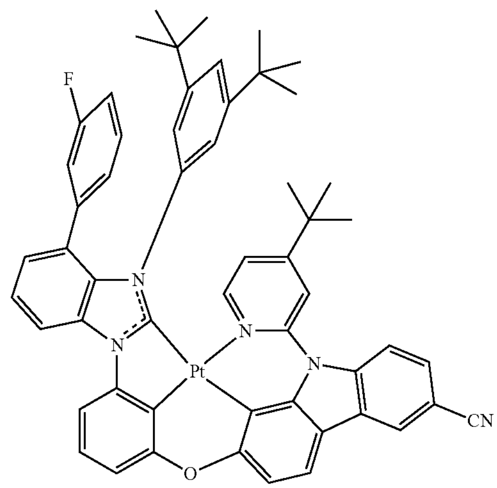
95
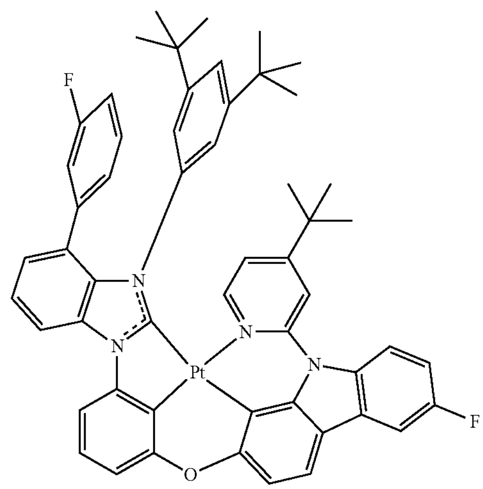
96
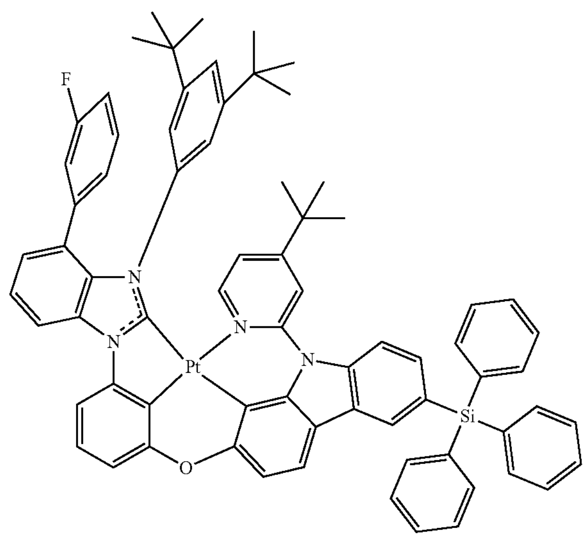

-continued
97
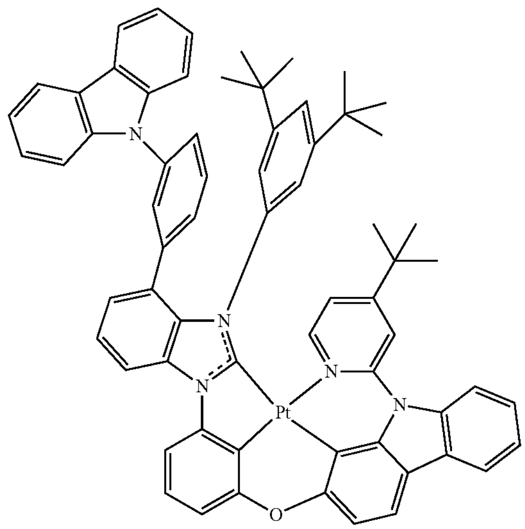
98
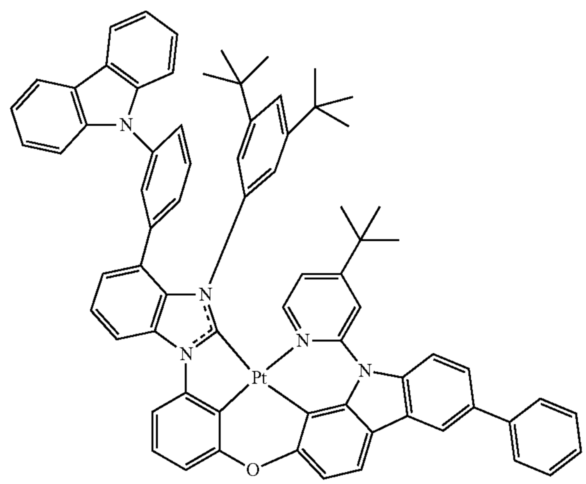
99
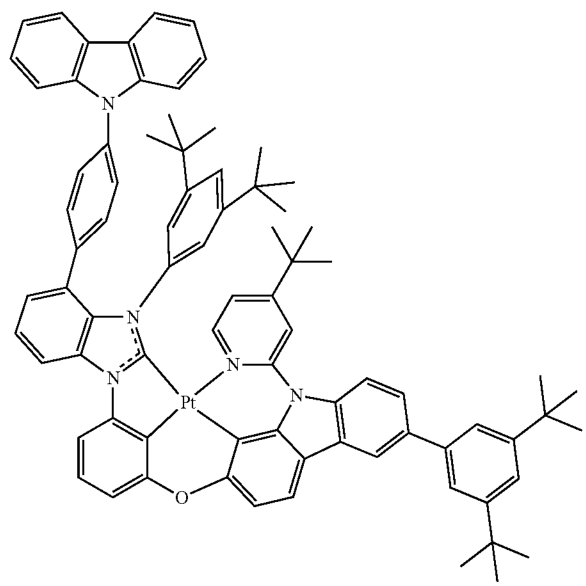
-continued
100
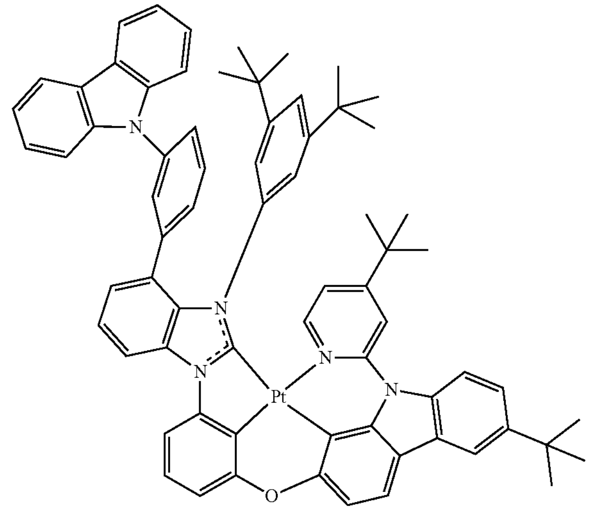
101
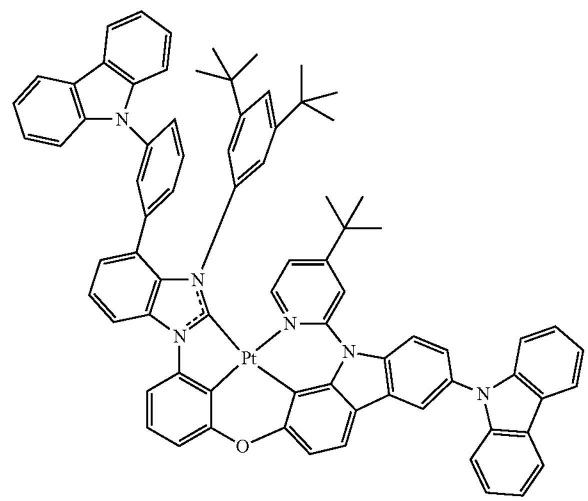
102
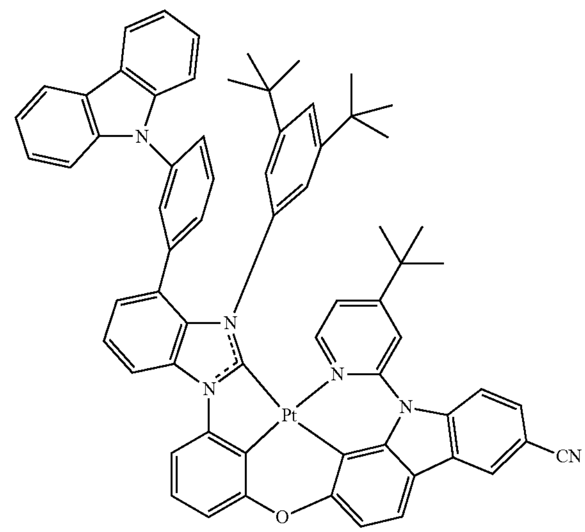

-continued
103
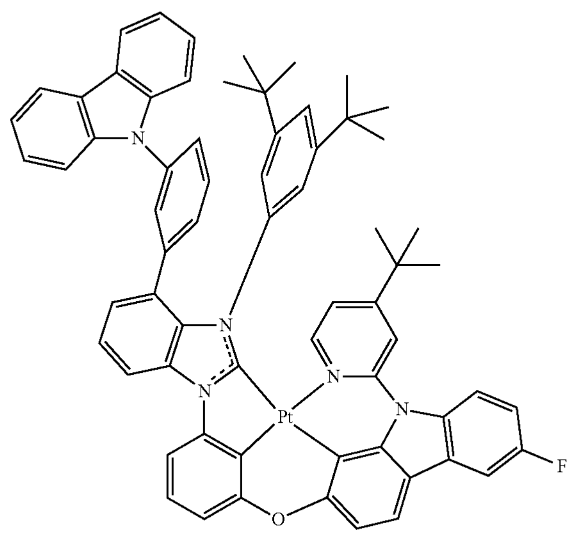
104
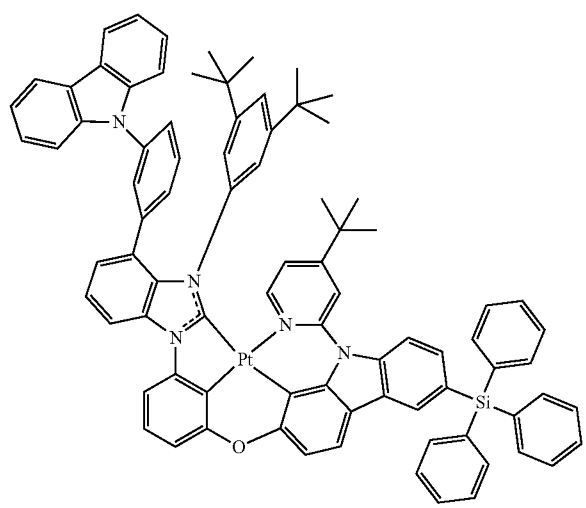
105
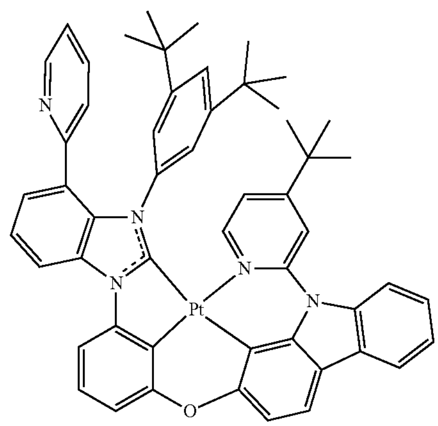
-continued
106
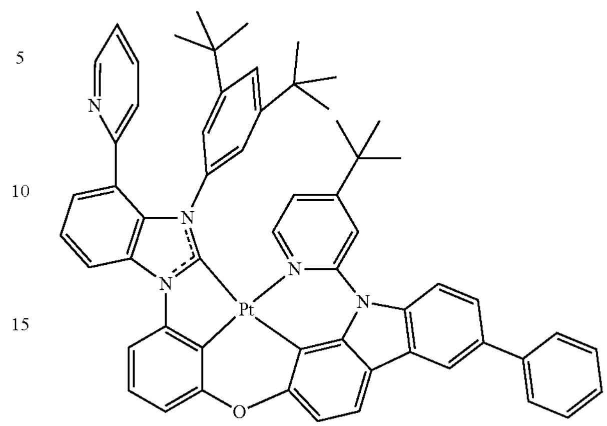
107
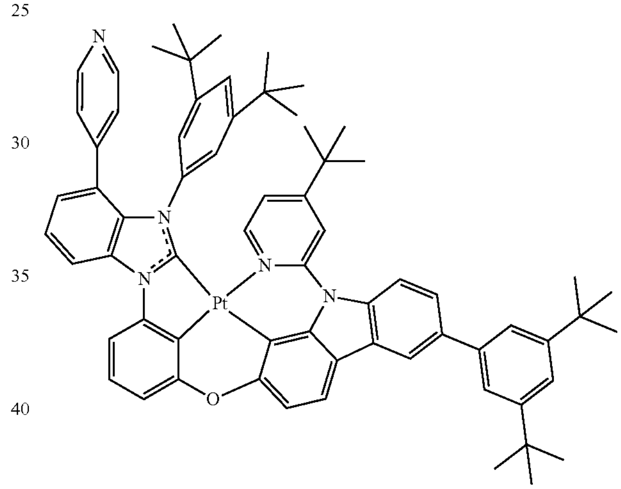
108
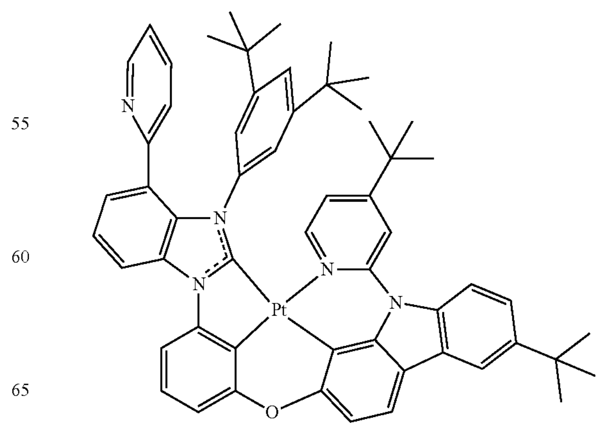

-continued
109
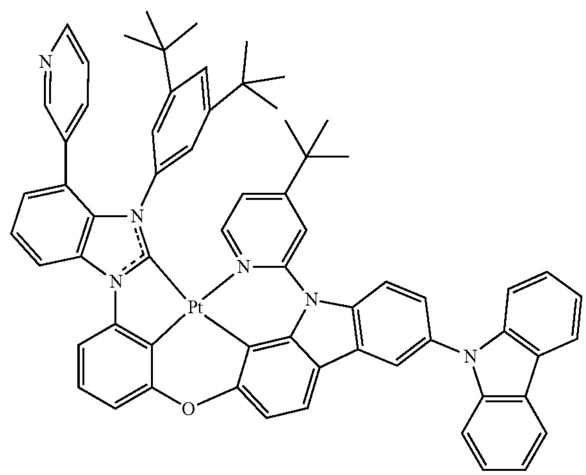
110
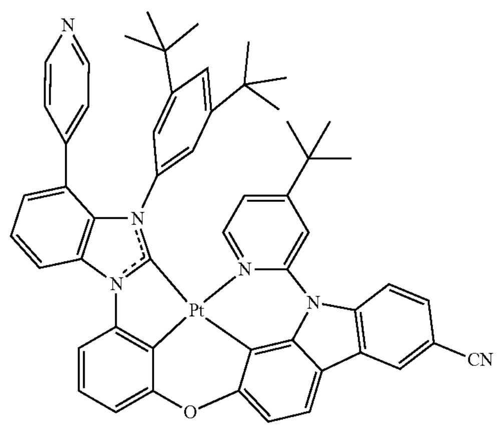
111
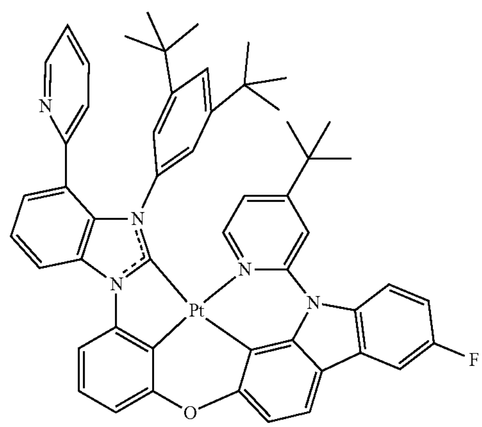
-continued
112
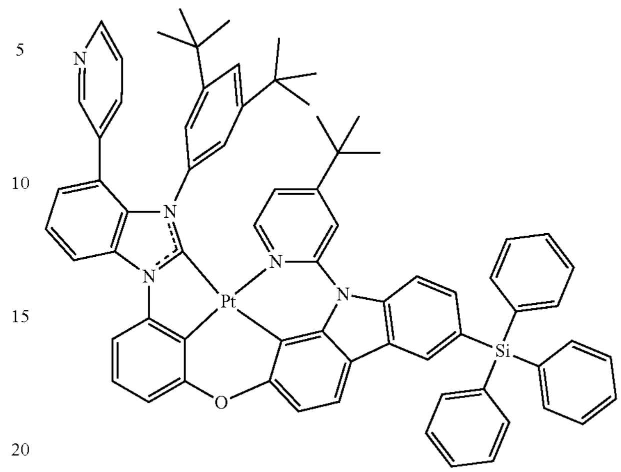
113
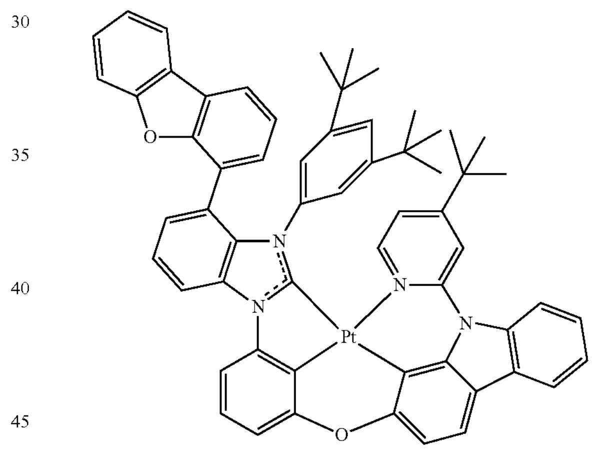
114
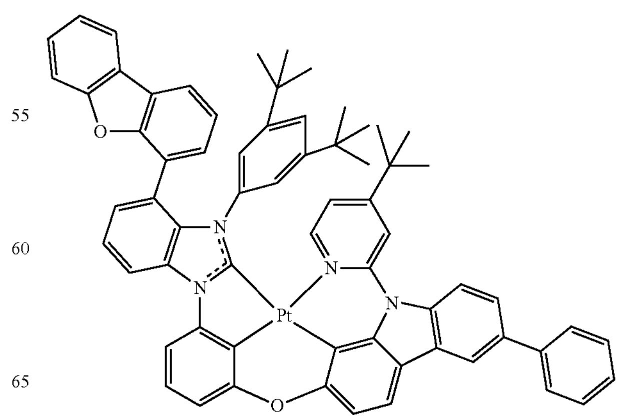

115
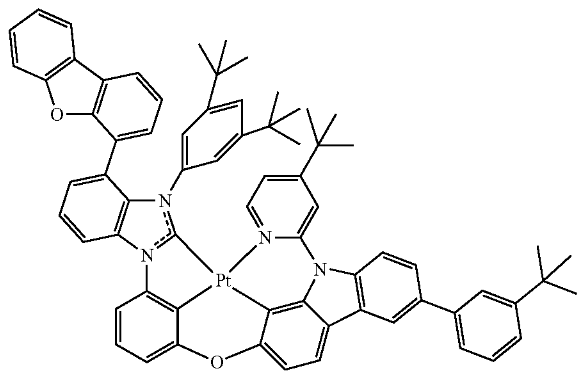
116
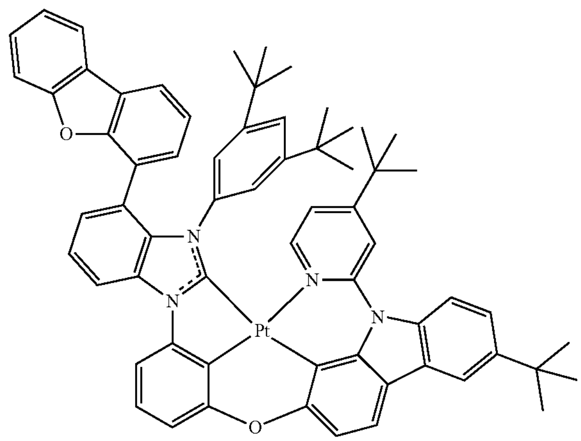
117
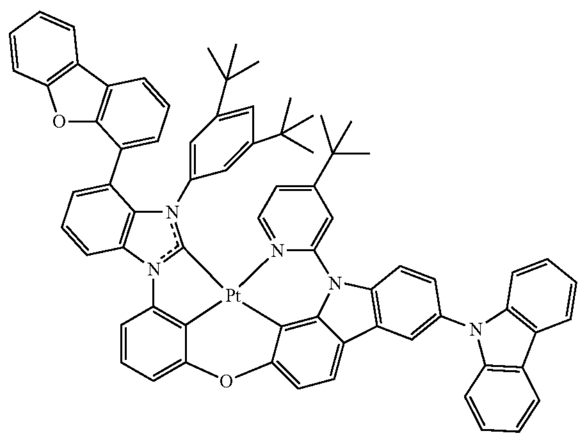
118
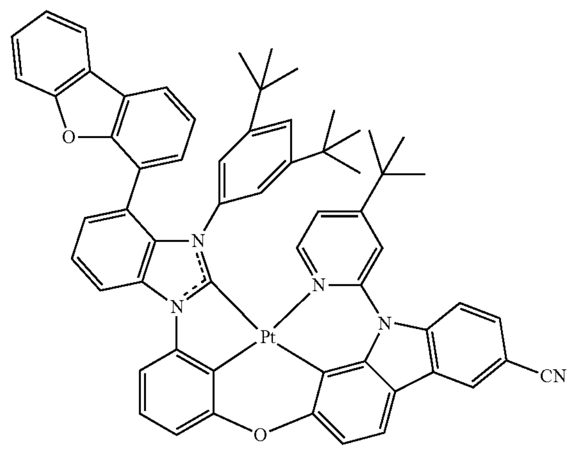
119
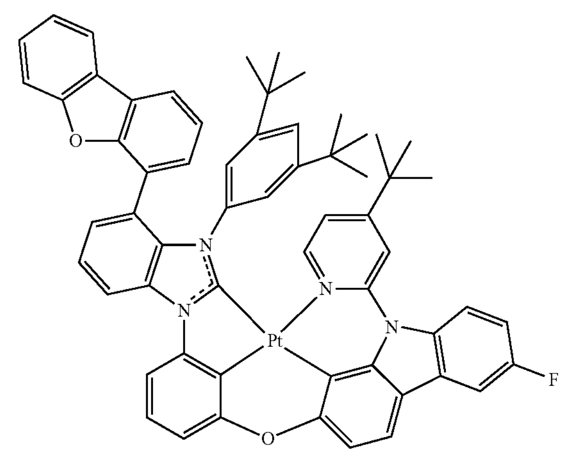
120
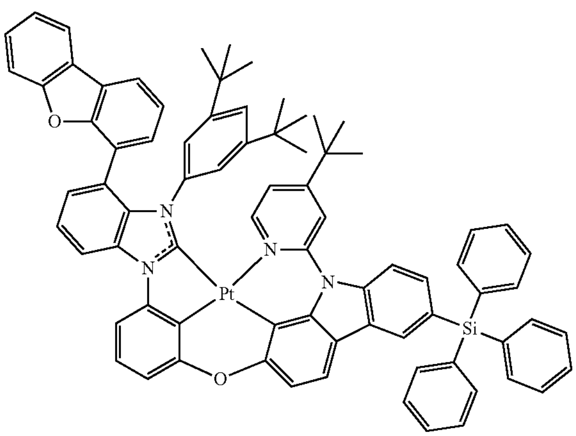

-continued
121
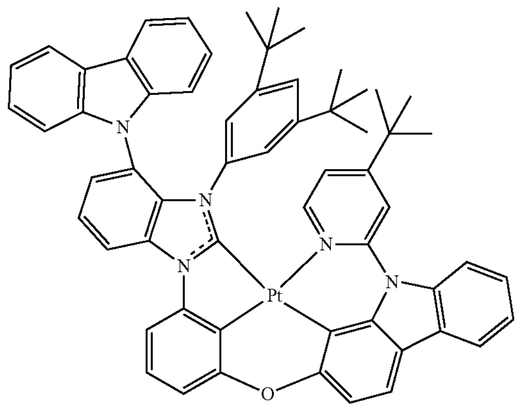
122
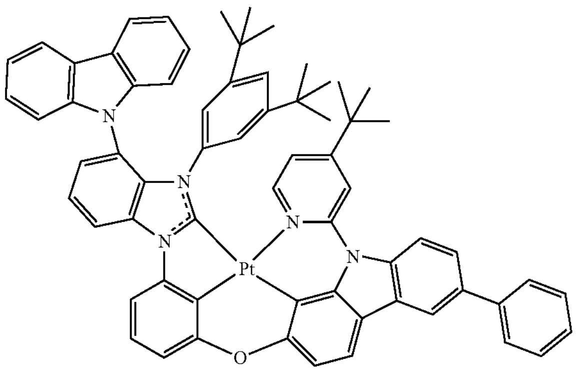
123
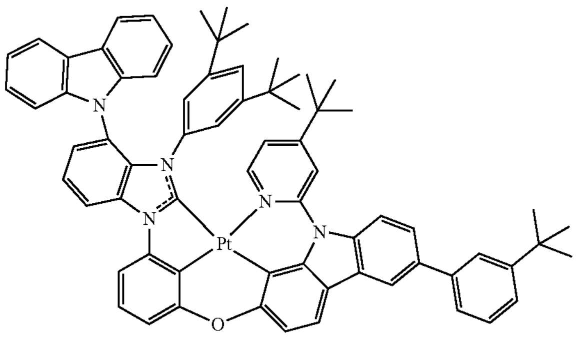
124
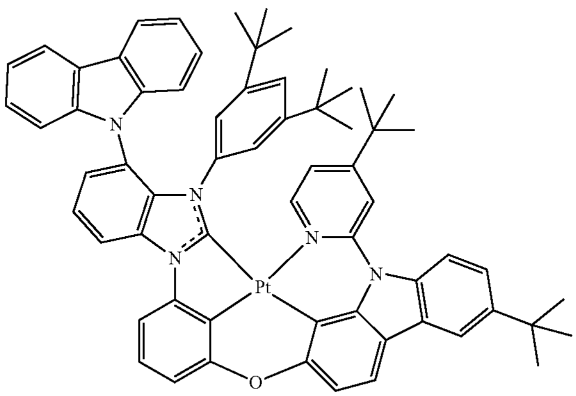
-continued
125
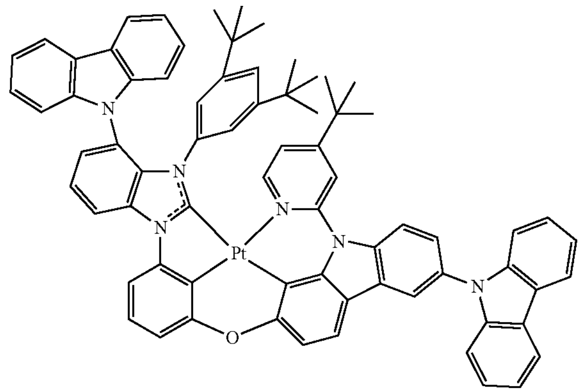
126
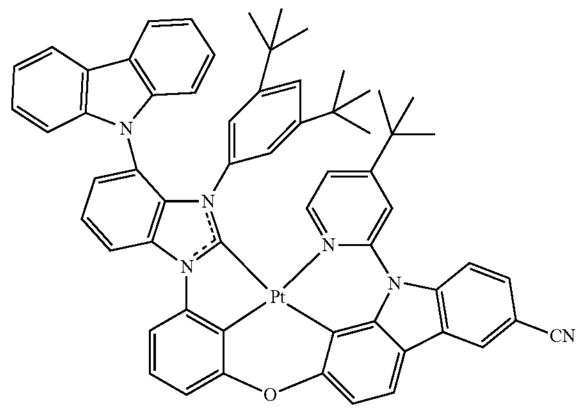
127
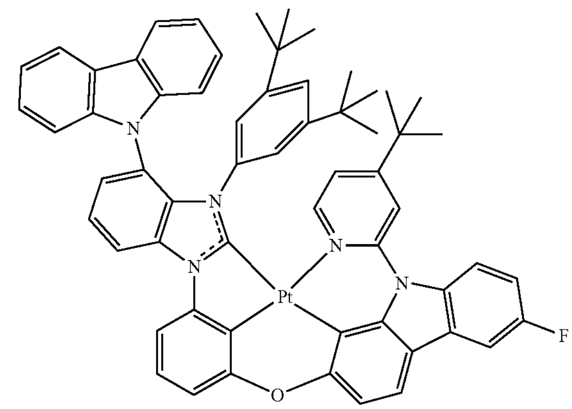

-continued
128
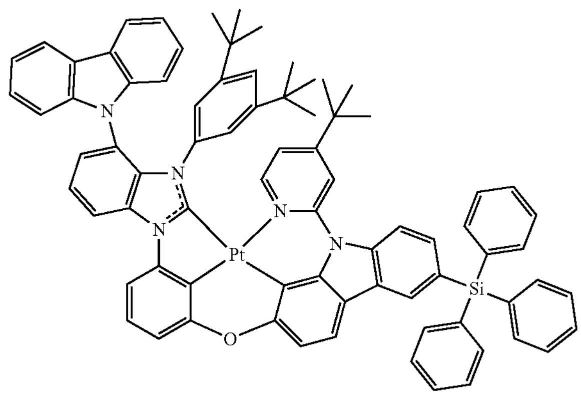
129
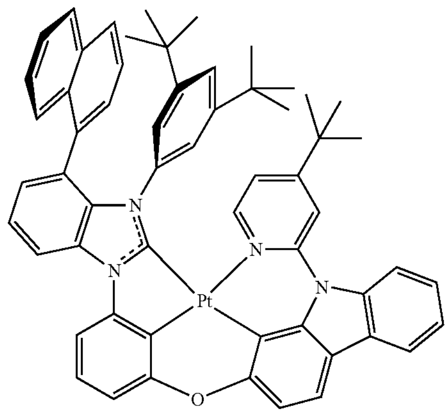
130
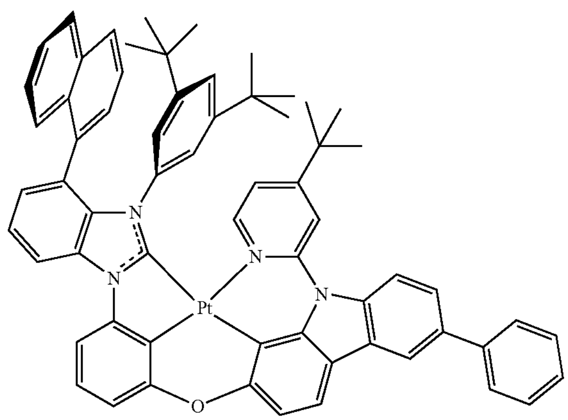
-continued
131
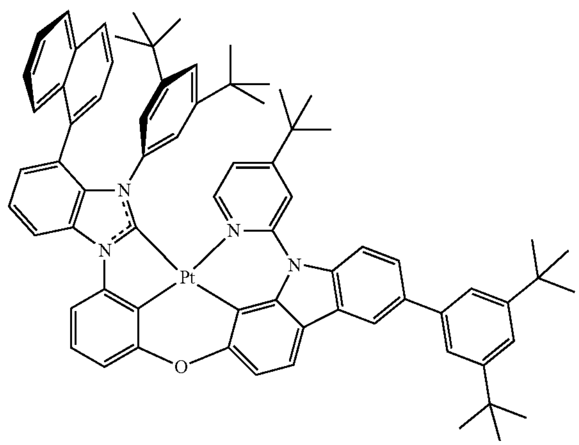
132
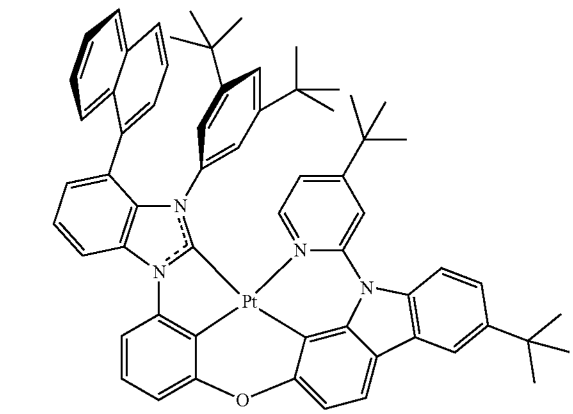
133
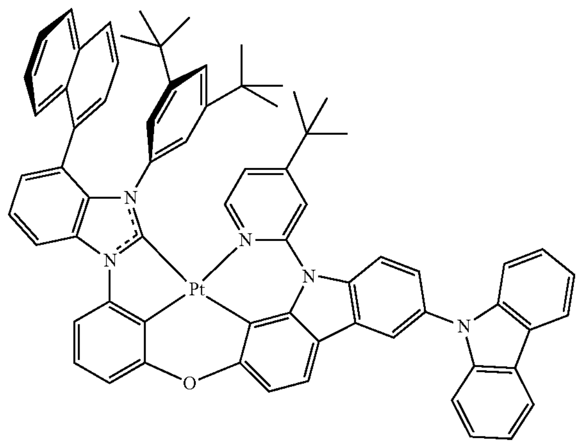

134
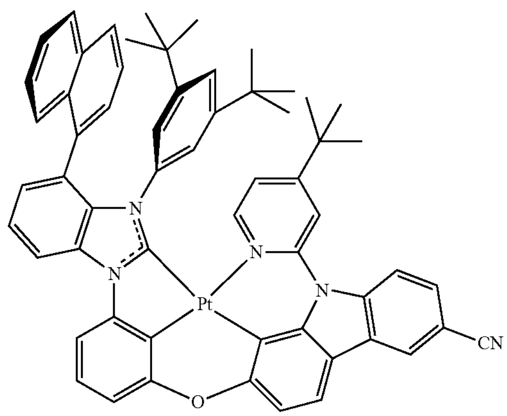
135
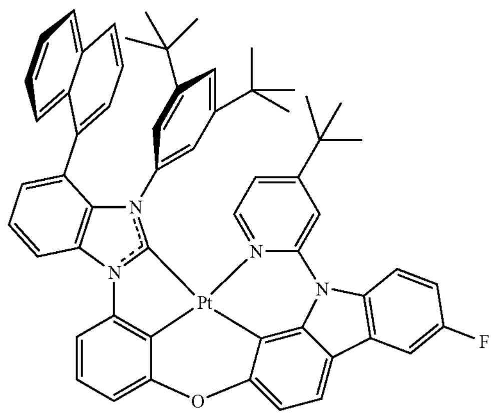
136
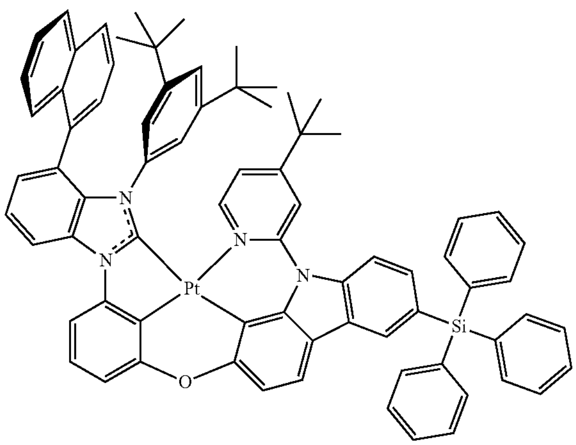
137
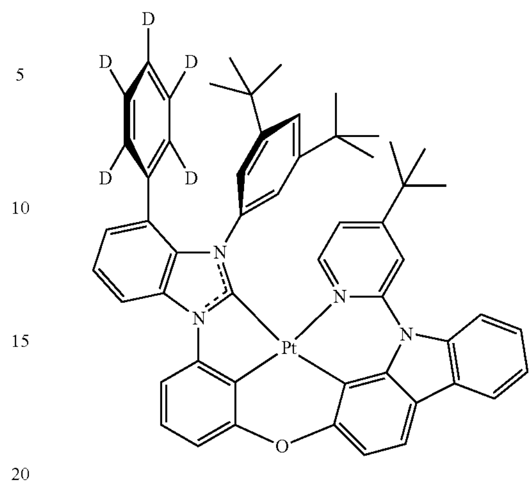
138
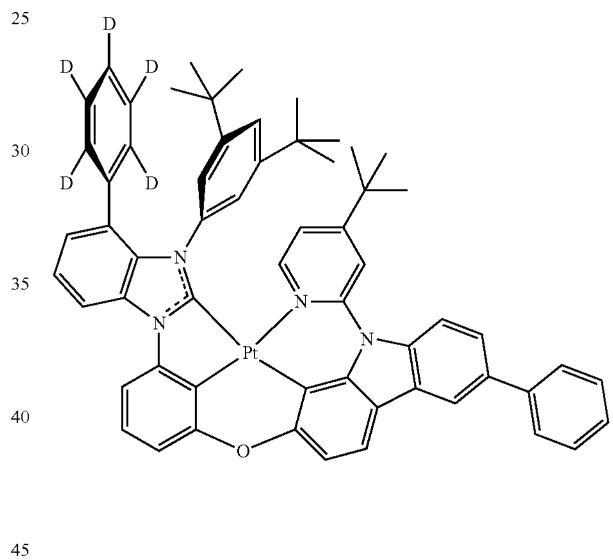
139
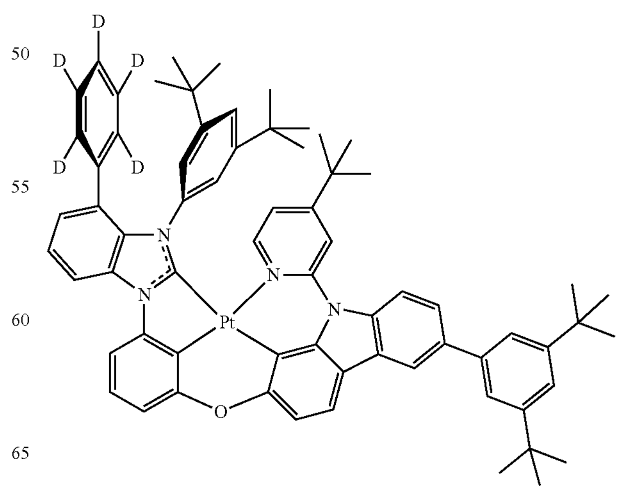

-continued
140
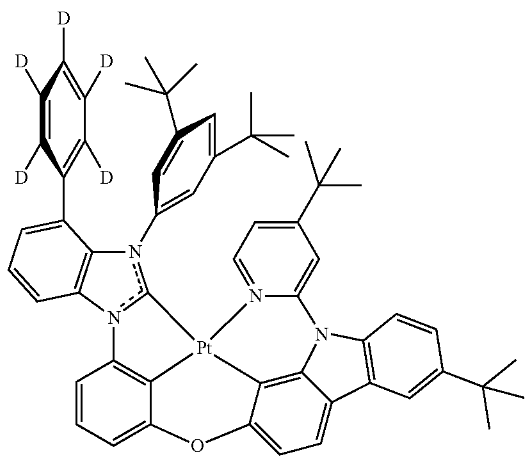
141
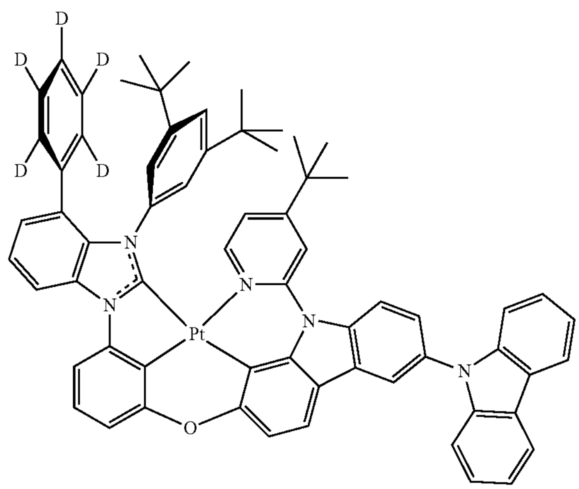
142
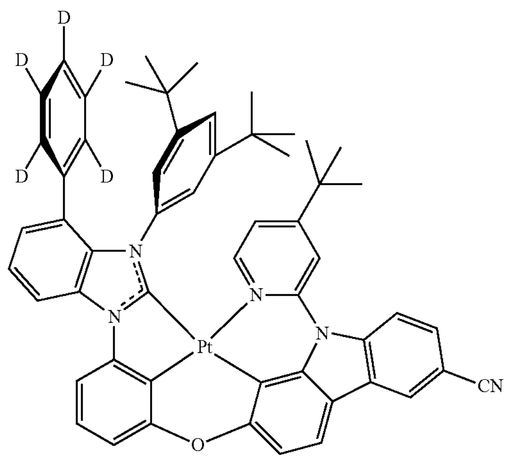
-continued
143
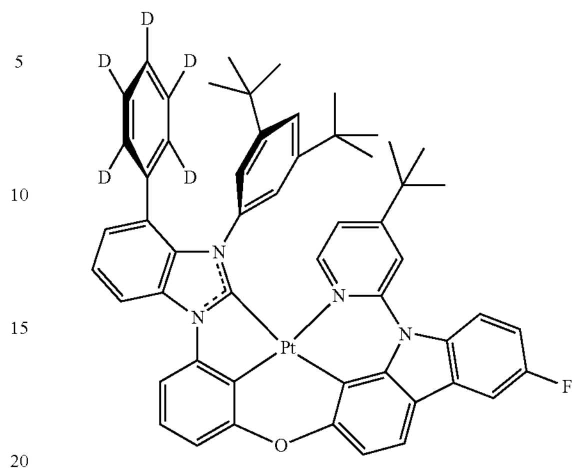
144
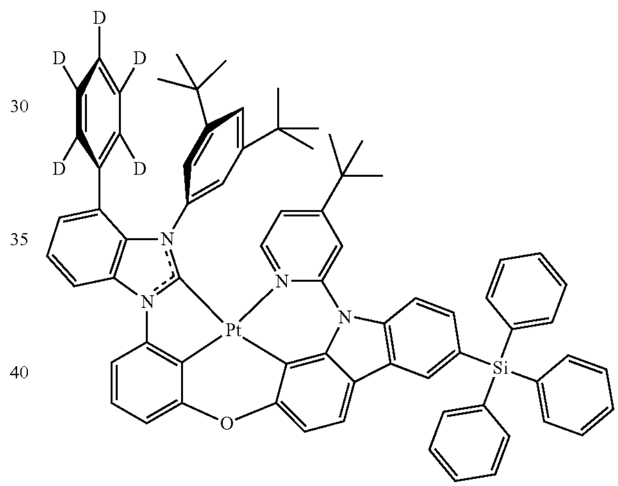
145
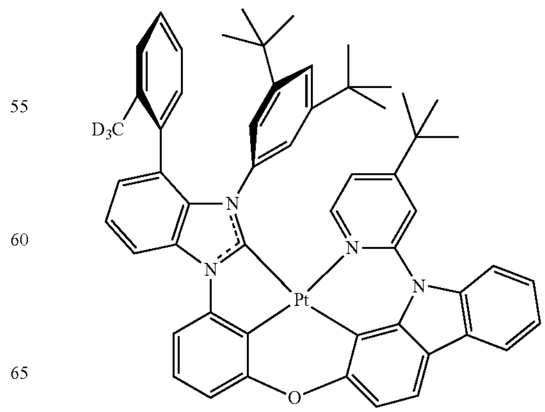

146
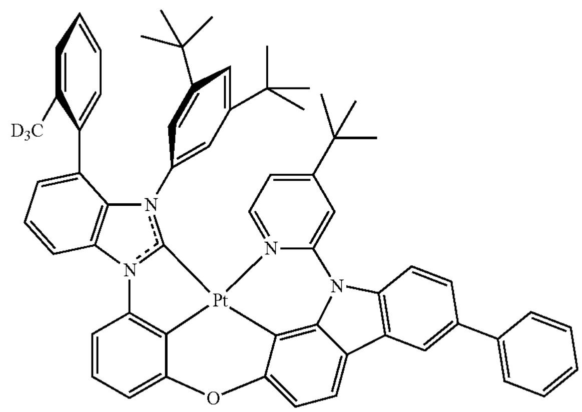
147
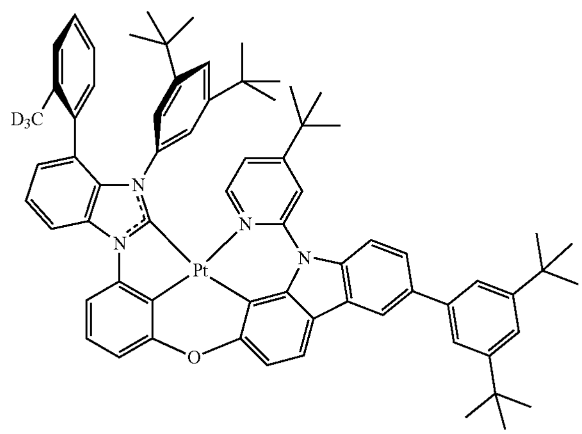
148
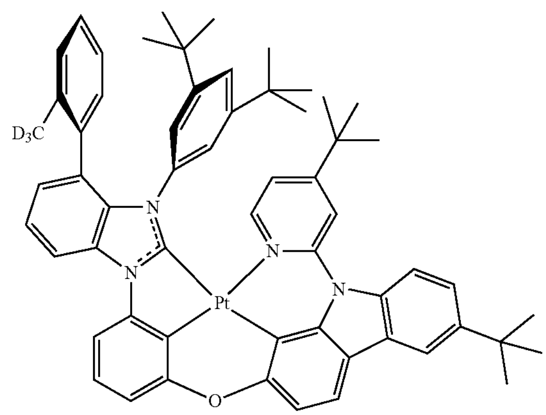
149
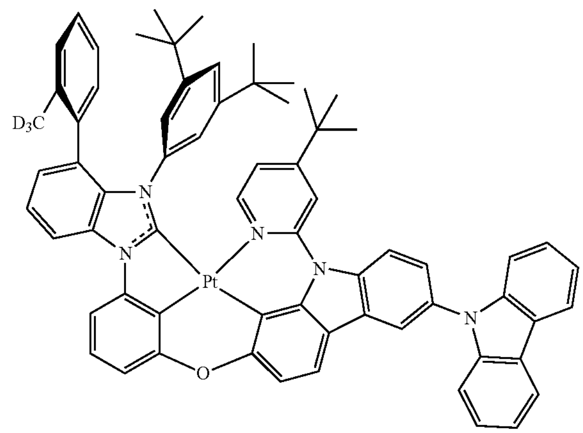
150
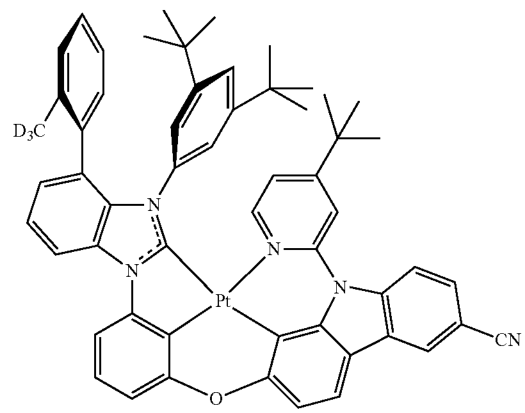
151
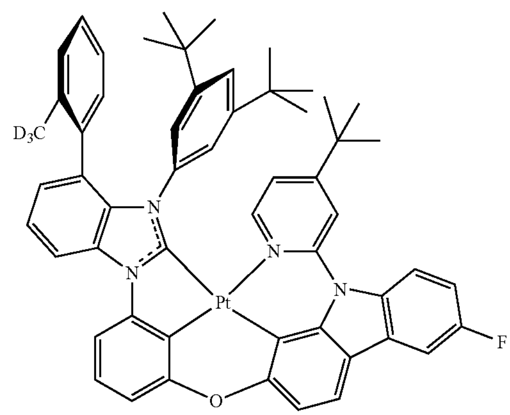

152
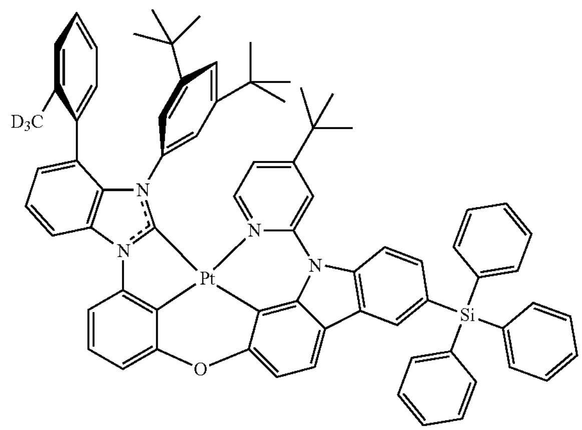
153
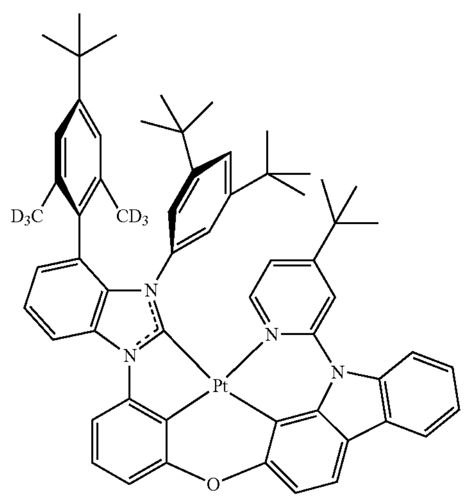
154
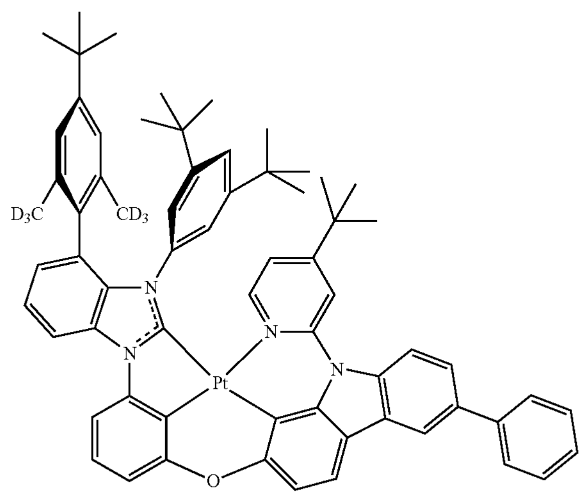
155
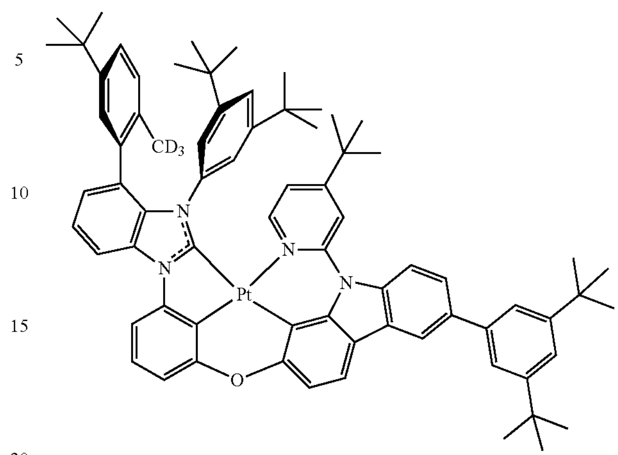
156
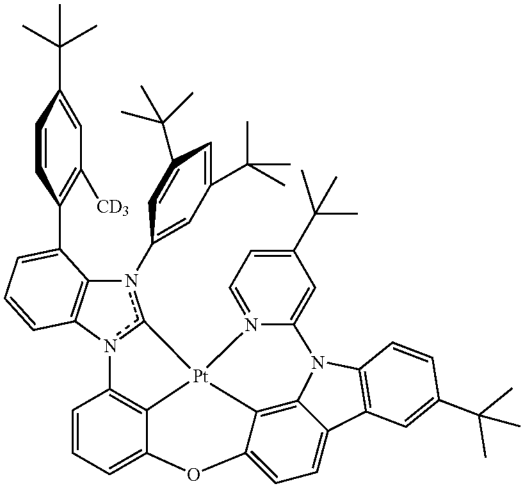
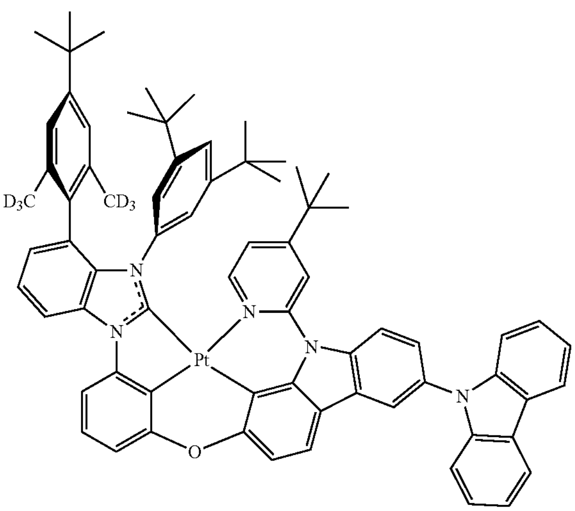
157

158
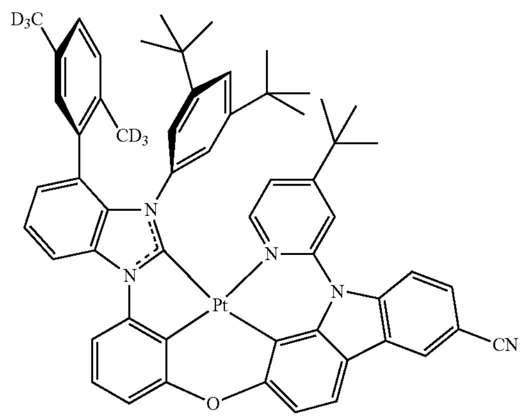
159
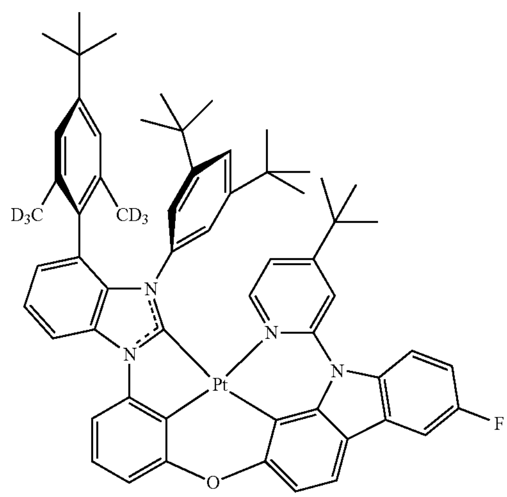
160
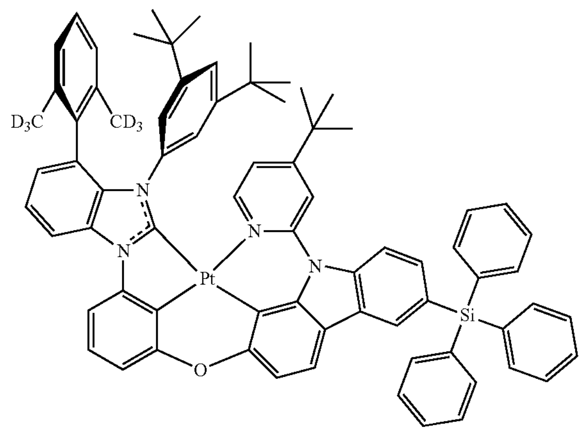
161
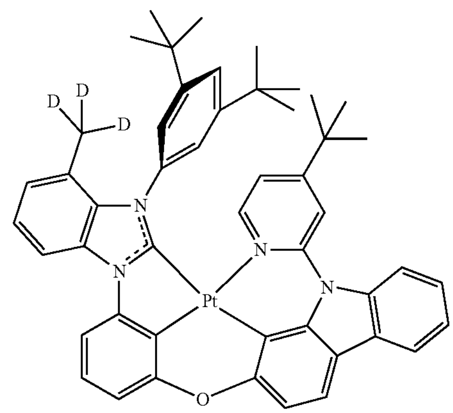
162
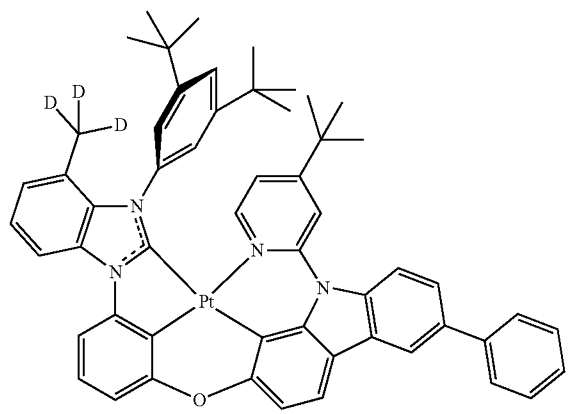
163
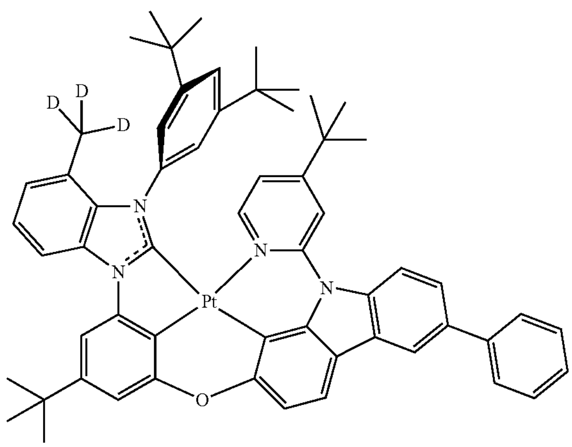

164
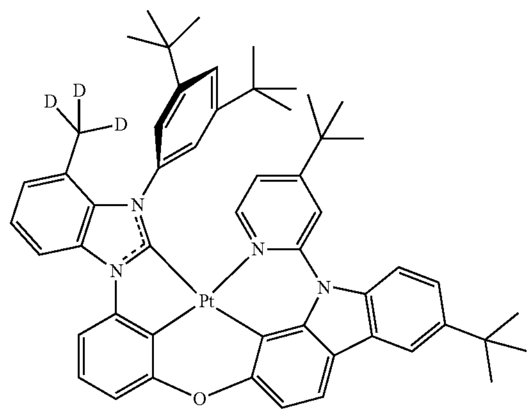
165
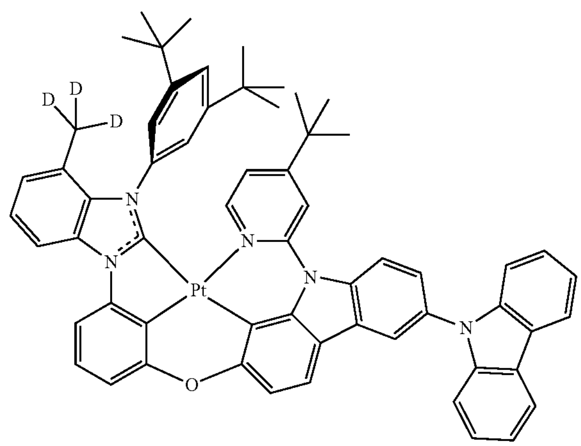
166
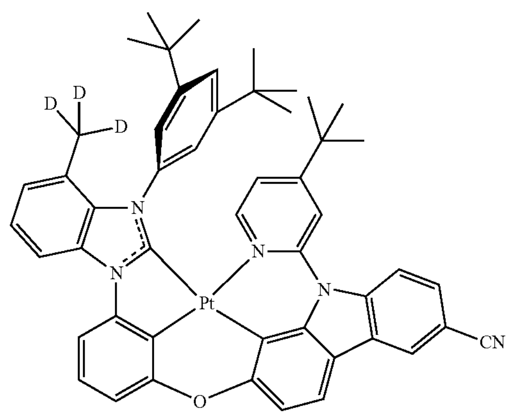
167
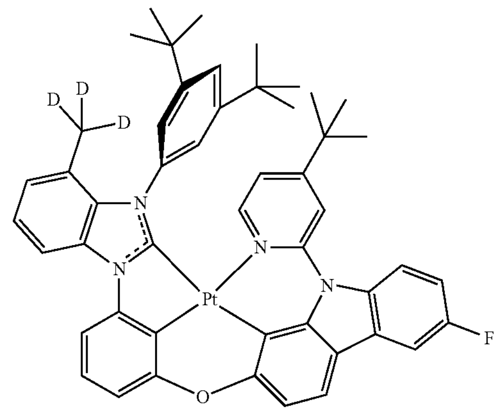
168
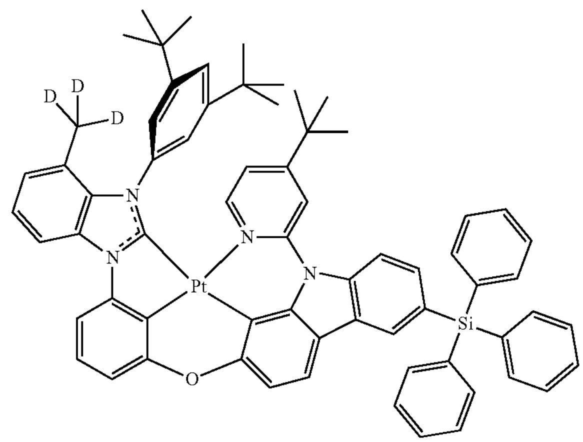
169
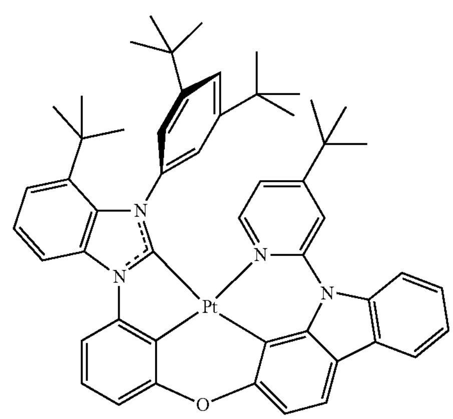

-continued
170
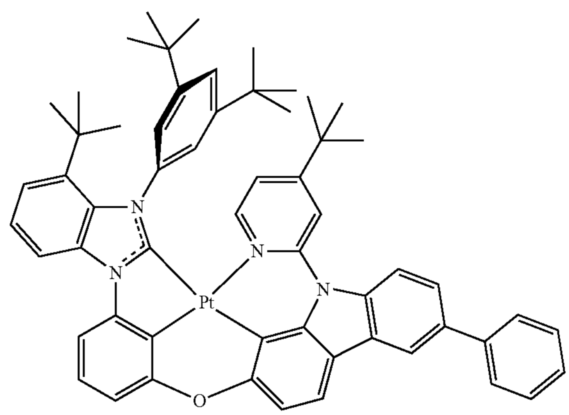
171
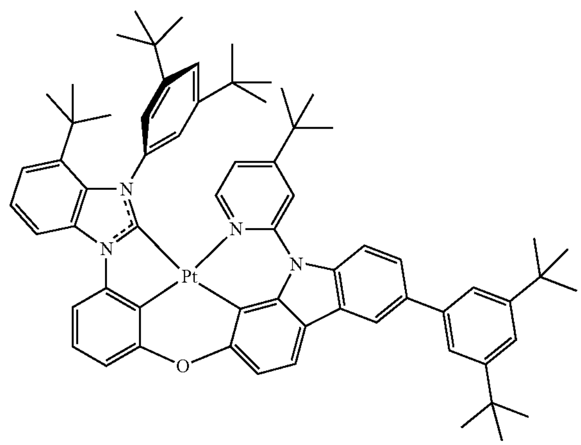
172
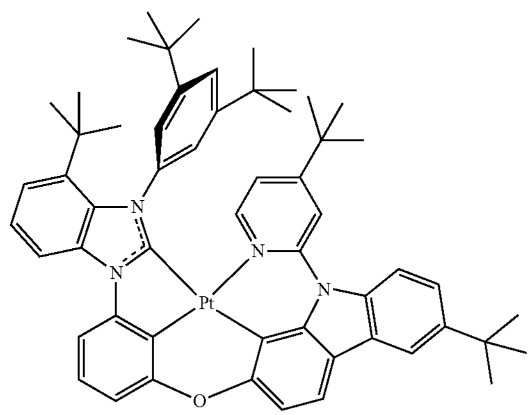
-continued
173
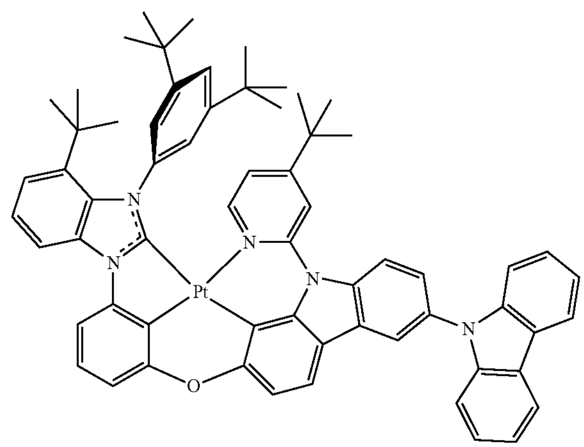
174
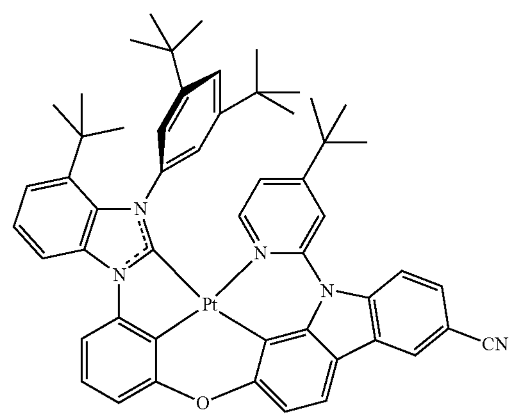
175
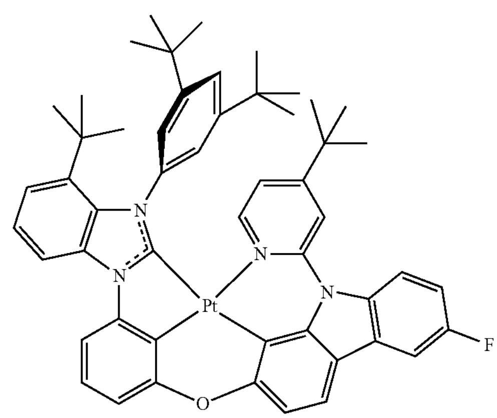

176
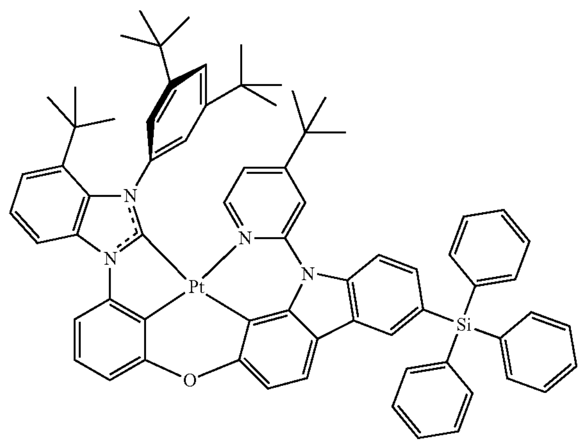
177
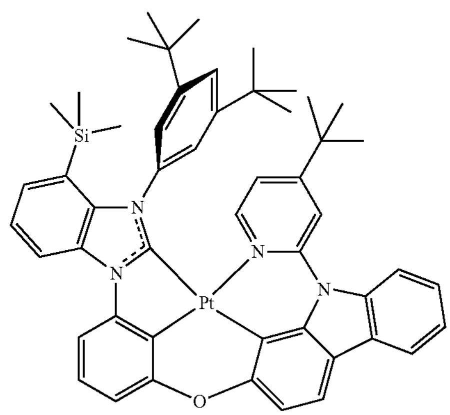
178
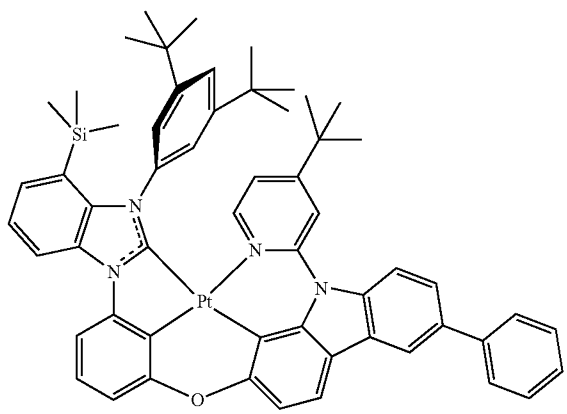
179
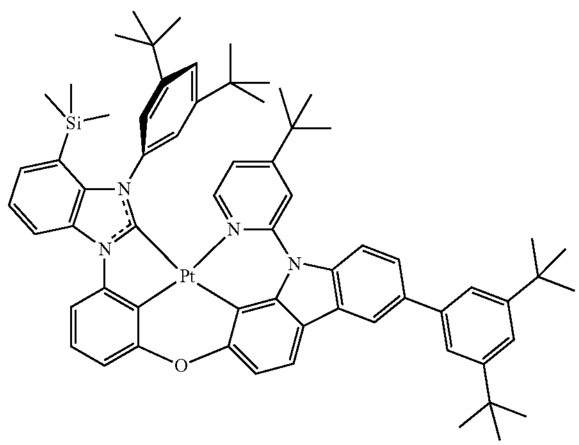
180
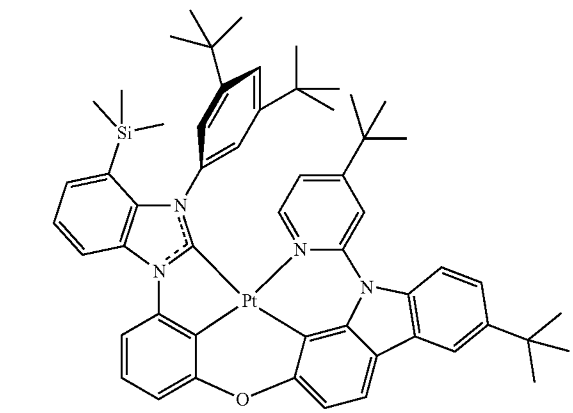
181
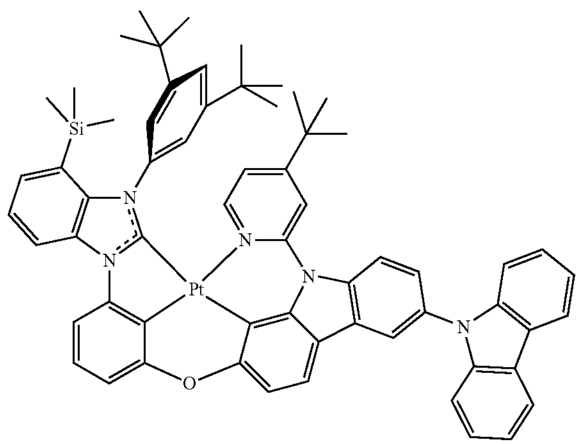

-continued
182
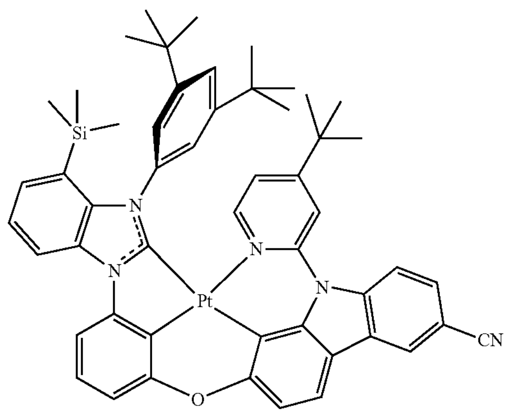
183
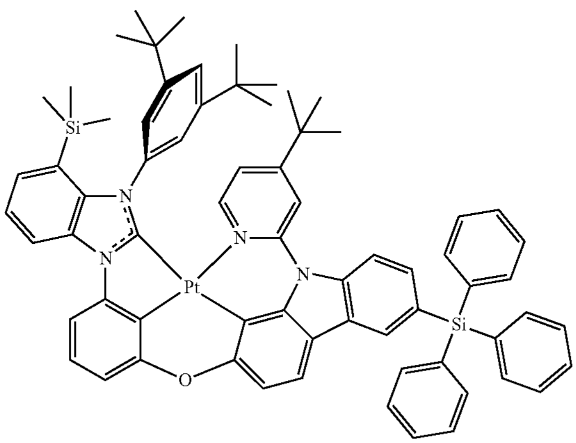
-continued
185
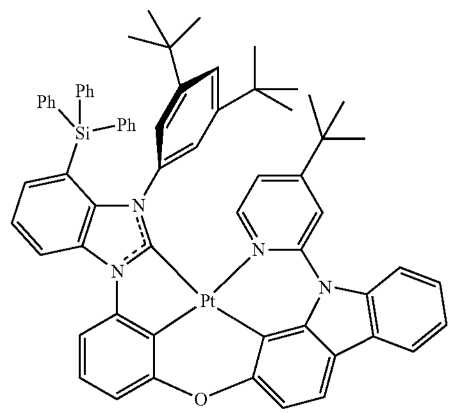
186
184
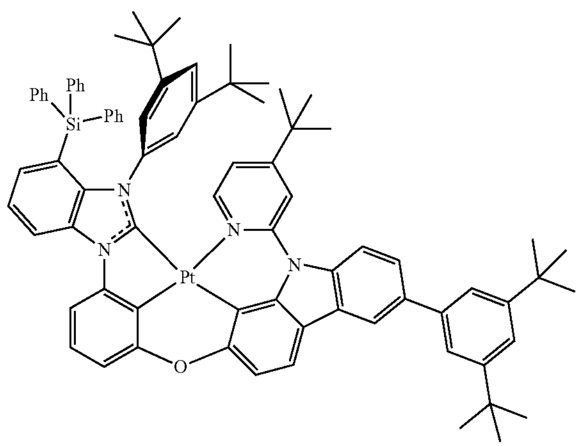
187

188
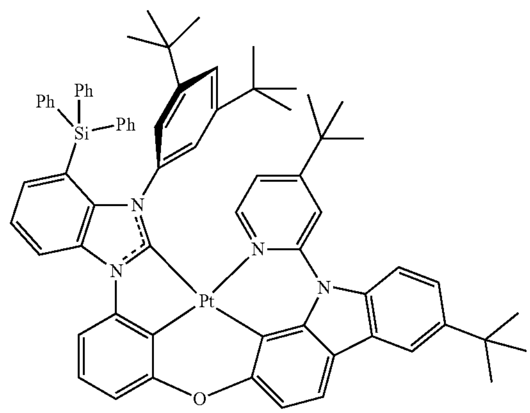
189
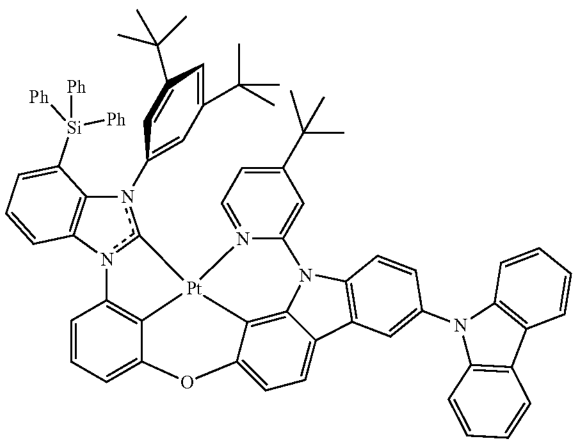
190
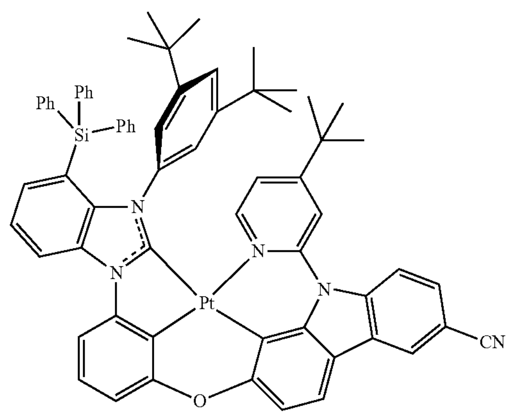
191
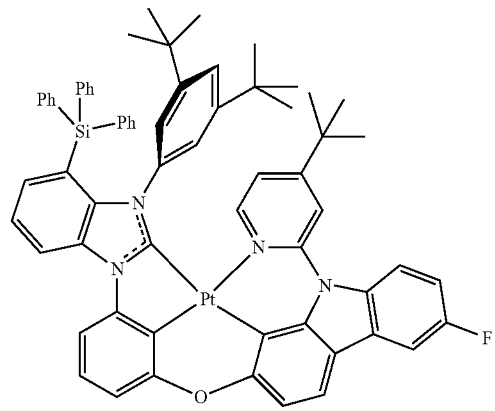
192
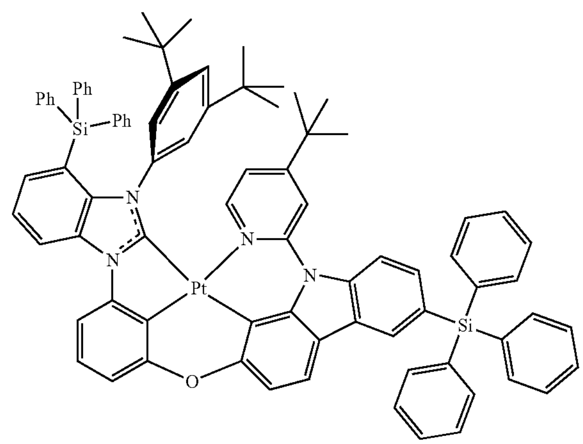
193
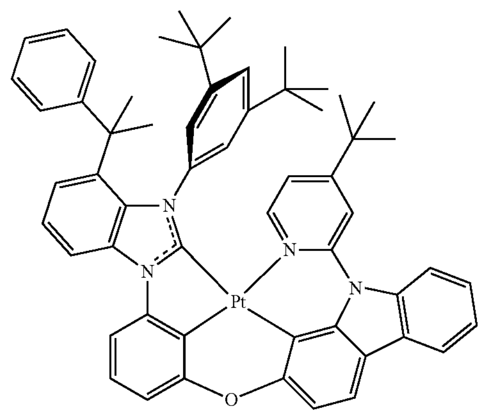

194
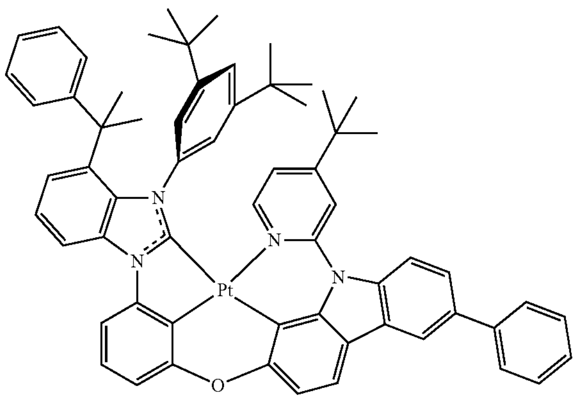
195
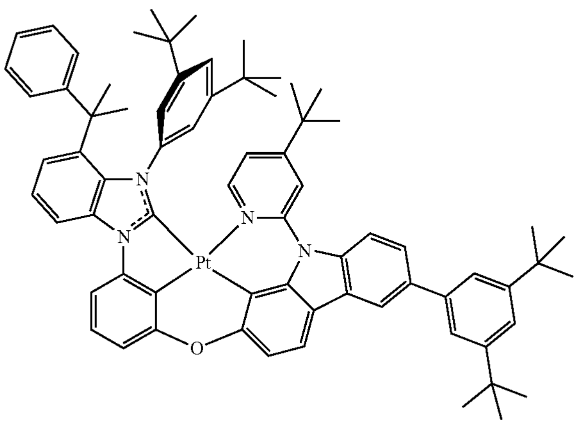
196
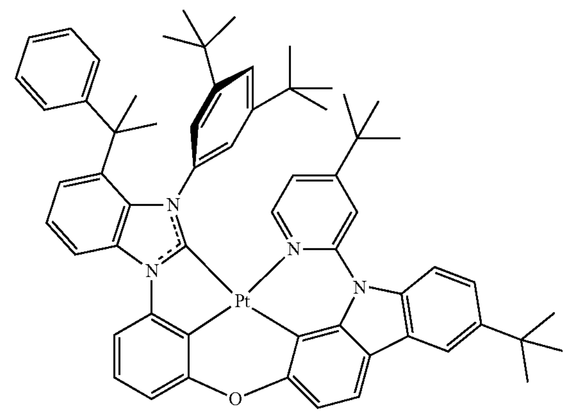
197
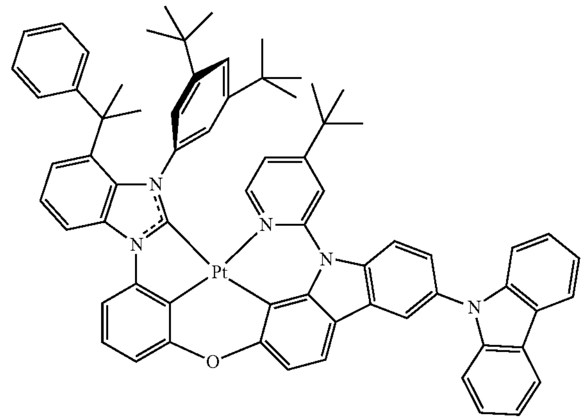
198
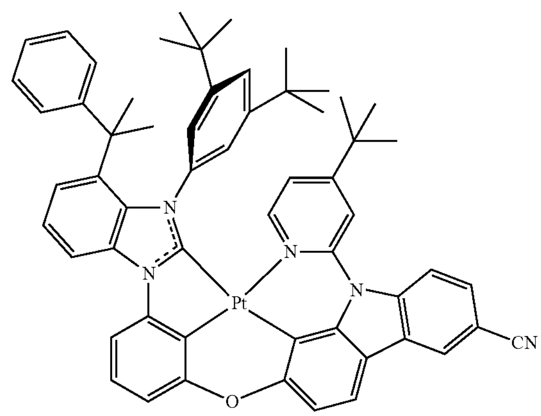
199
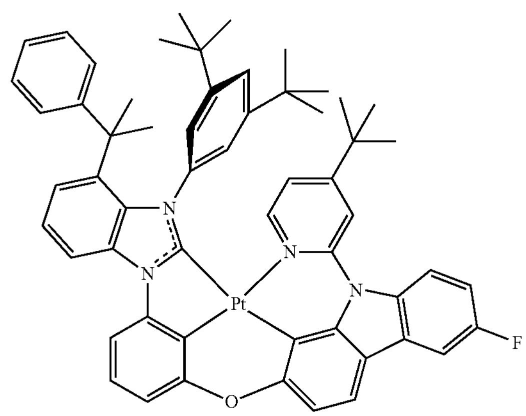

-continued
200
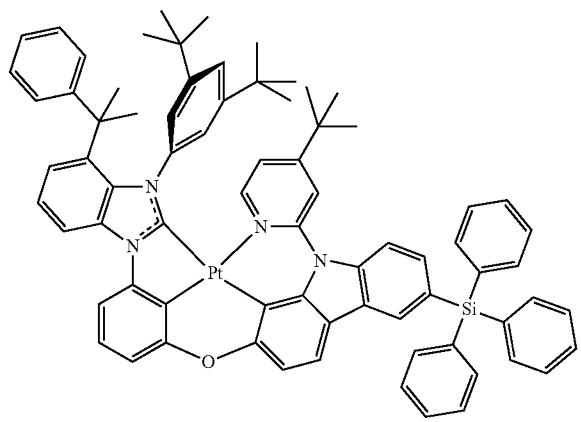
201
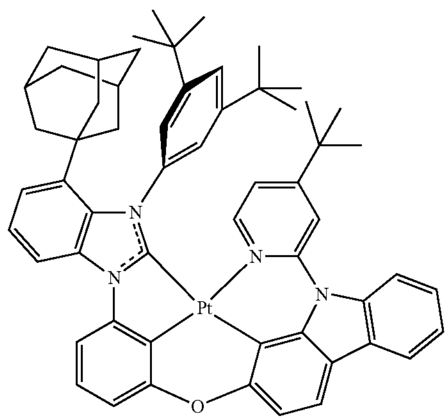
202
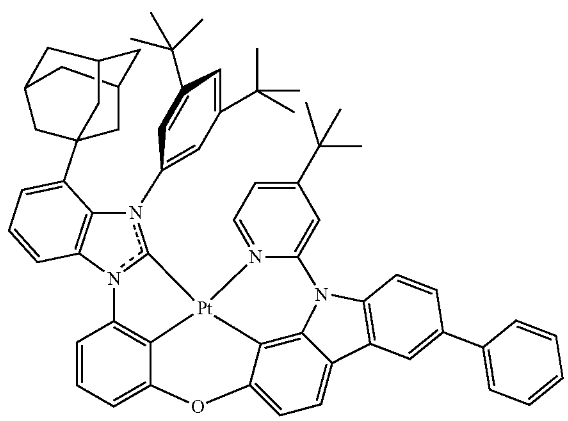
-continued
203
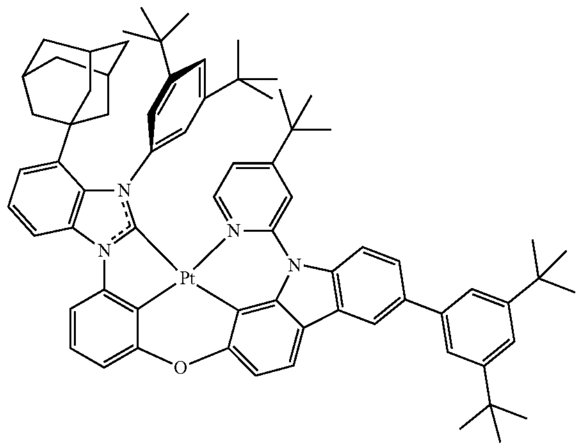
204
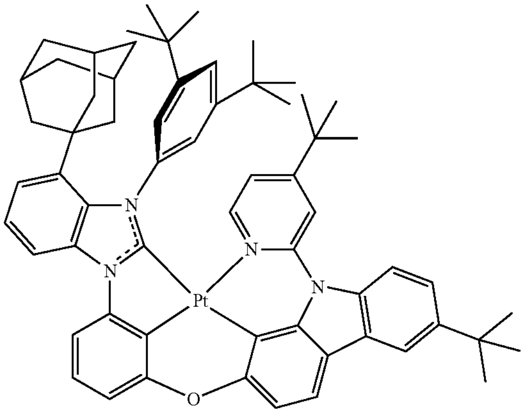
205
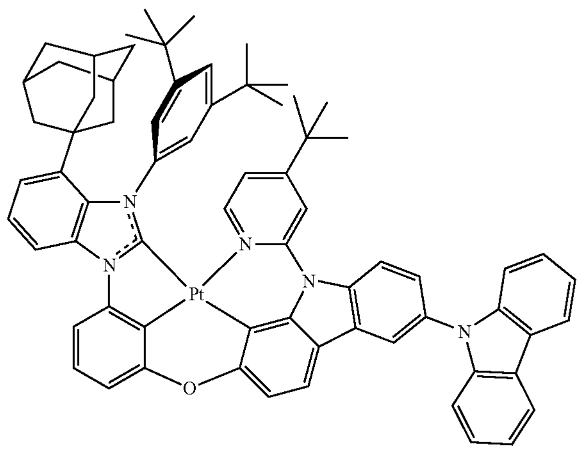

-continued
206
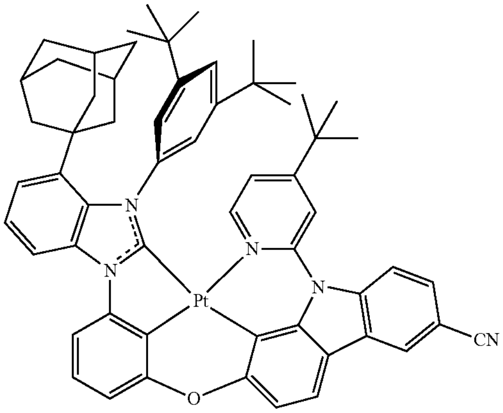
207
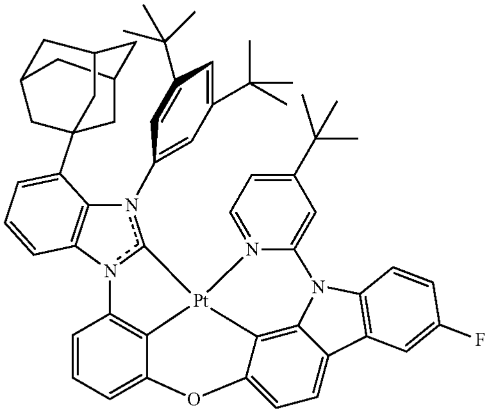
208
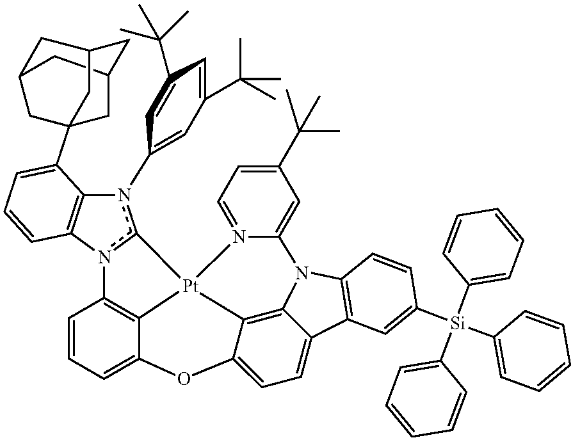
209
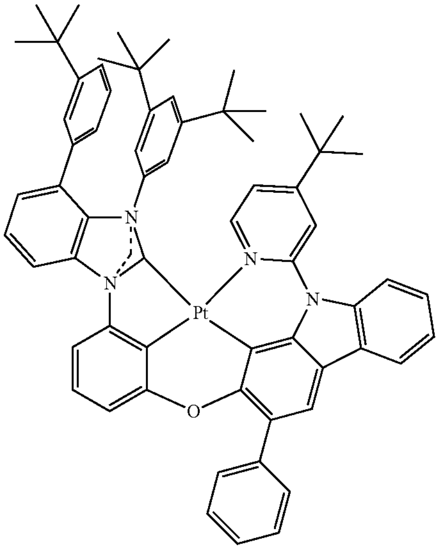
210
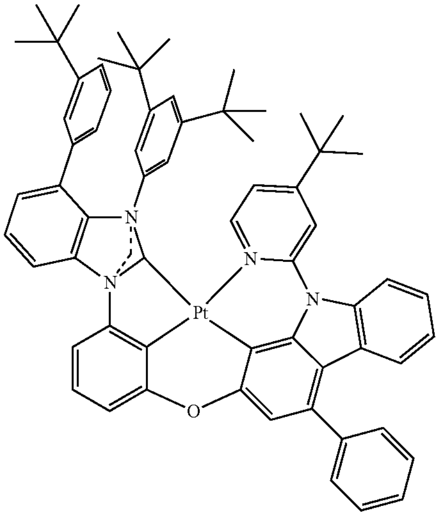
211
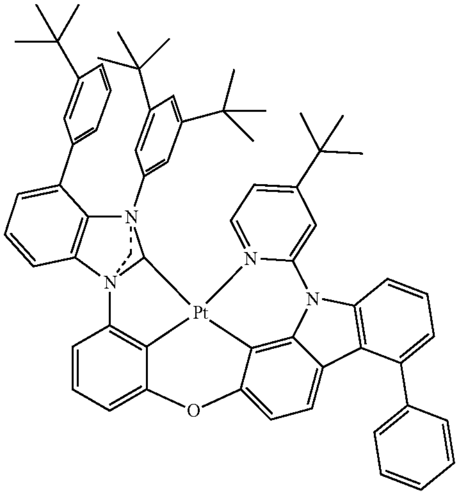

-continued
212
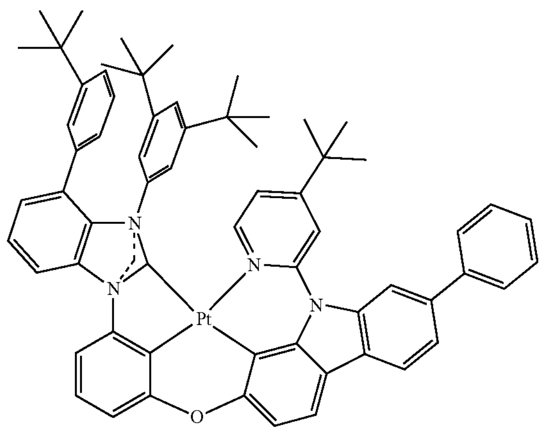
213
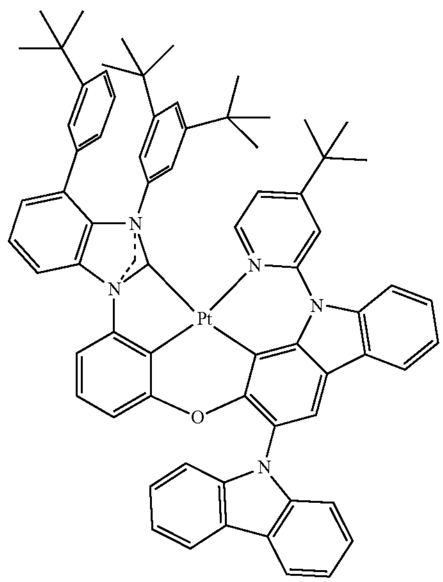
214
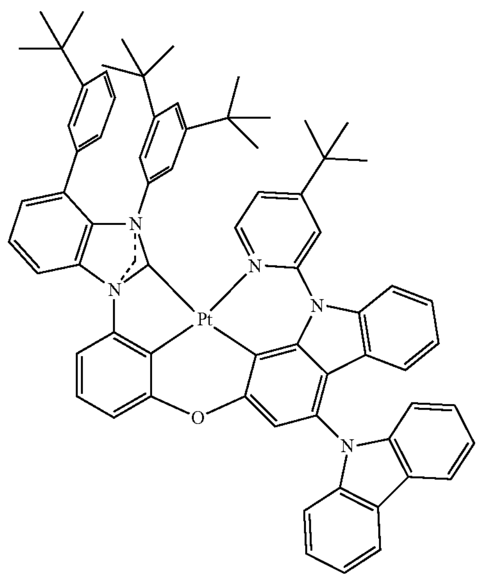
-continued
215
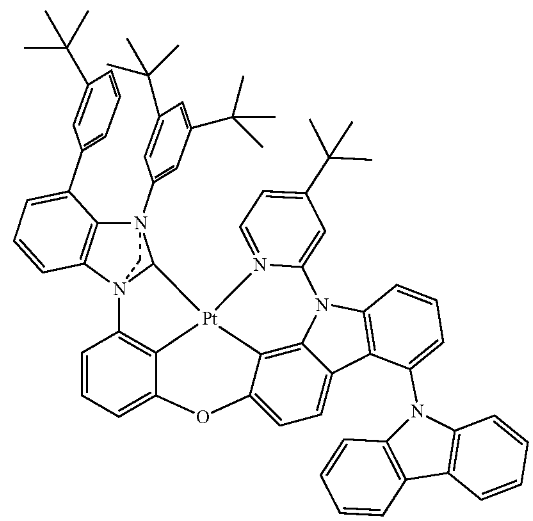
216
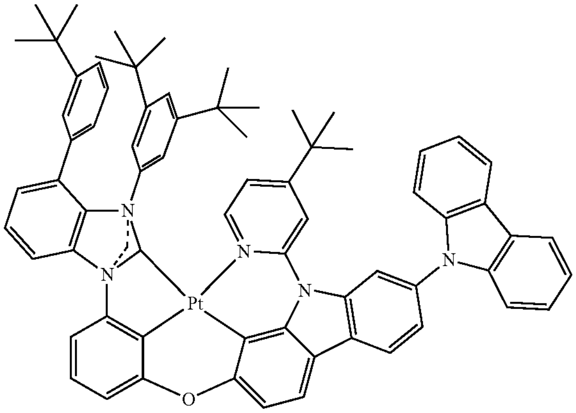
217
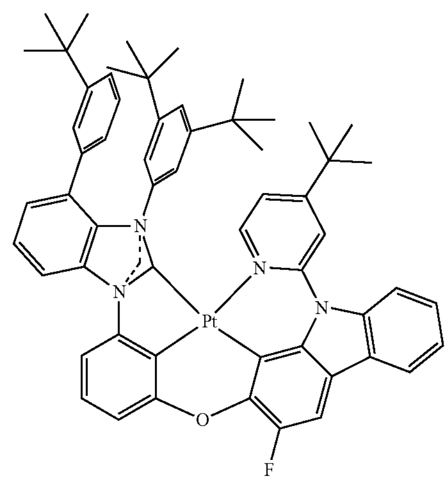

-continued
218
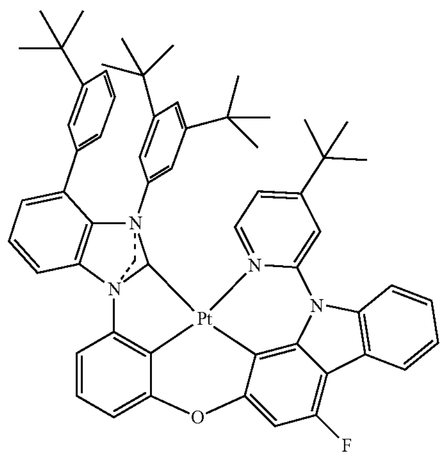
219
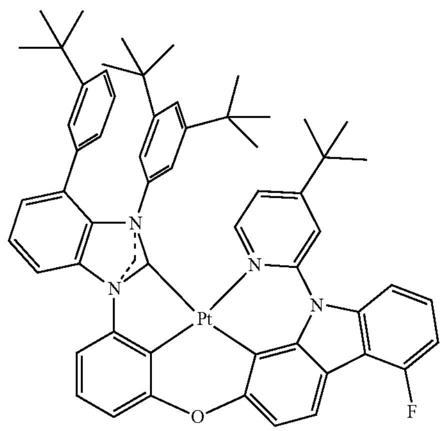
220
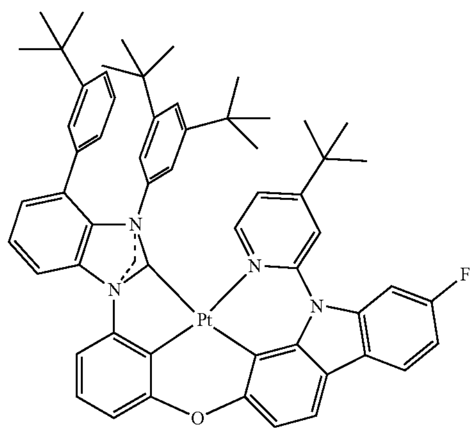
-continued
221
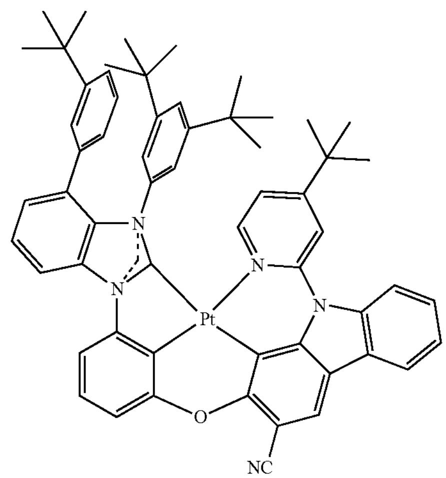
222
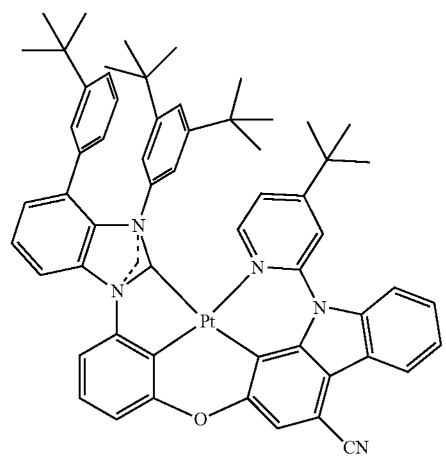
223
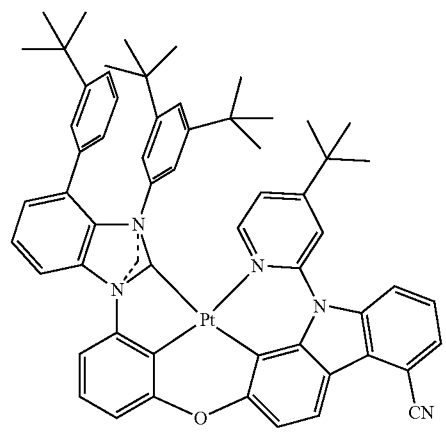

224
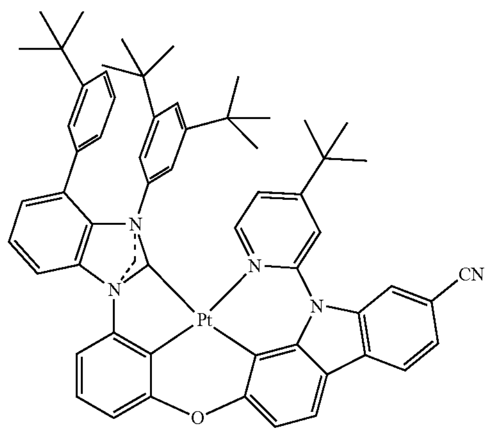
225
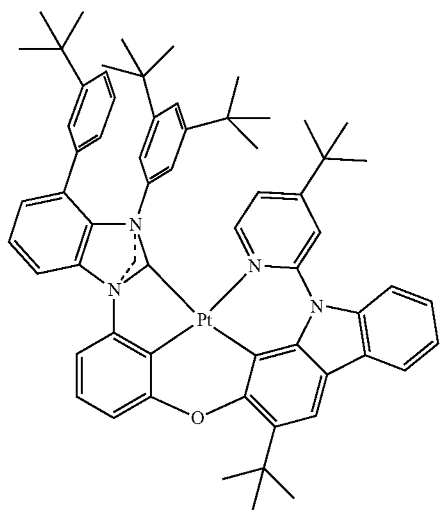
226
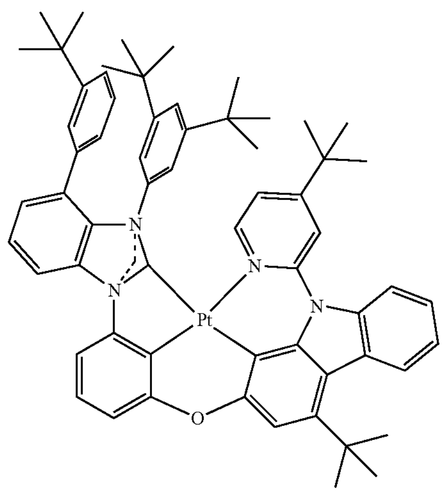
227
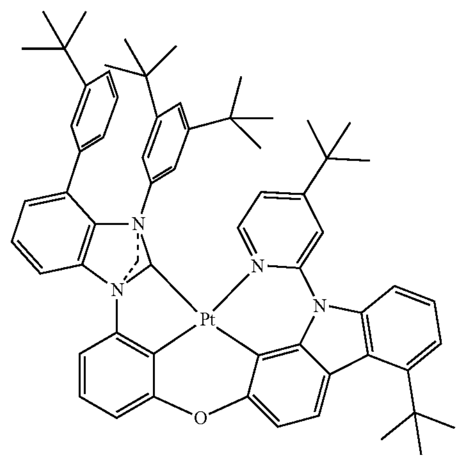
228
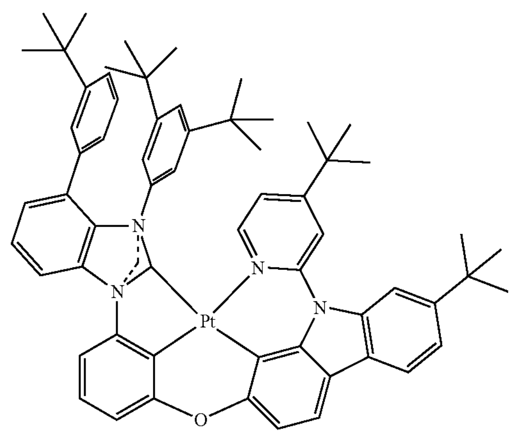
229
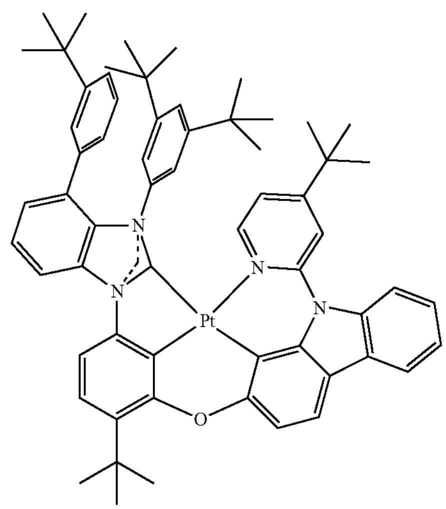

-continued
230
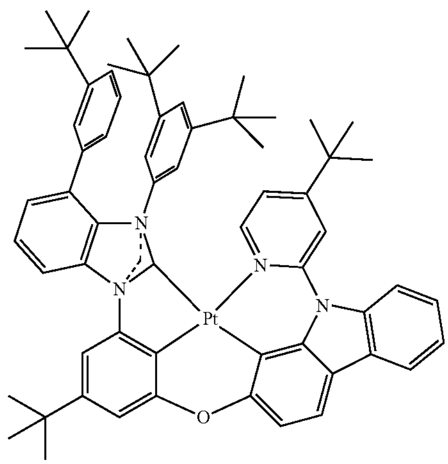
231
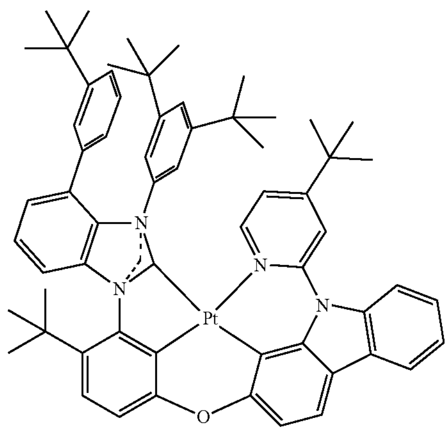
232
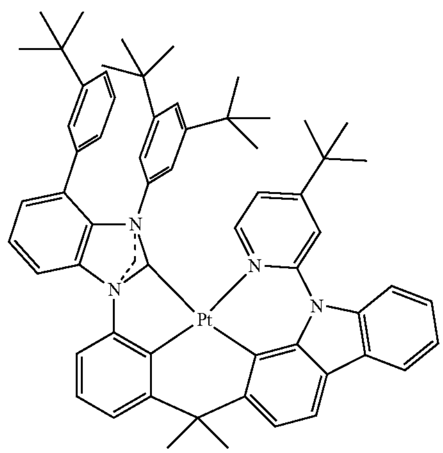
-continued
233
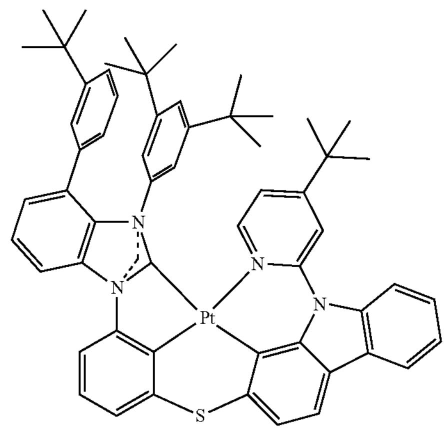
234
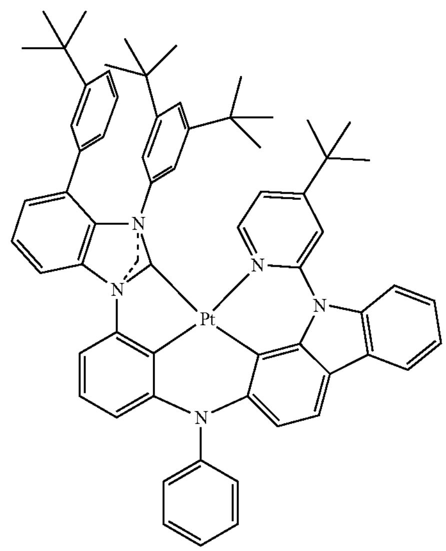
235
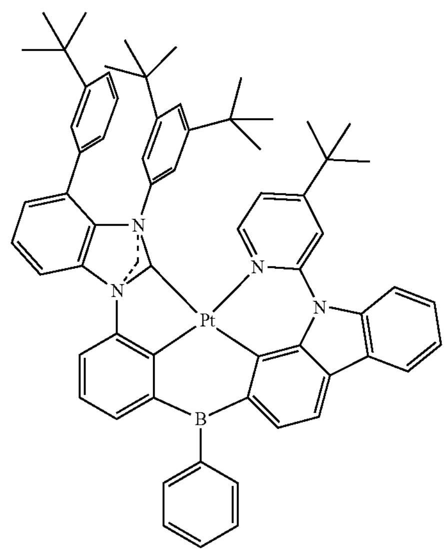

-continued
236
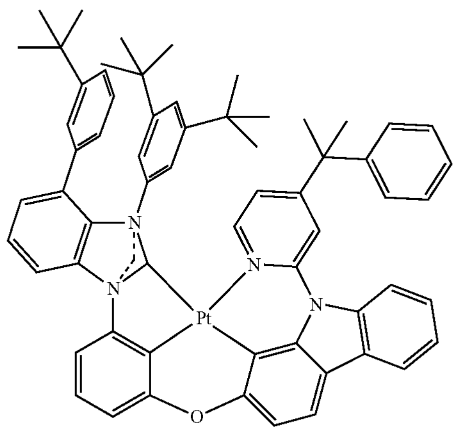
237
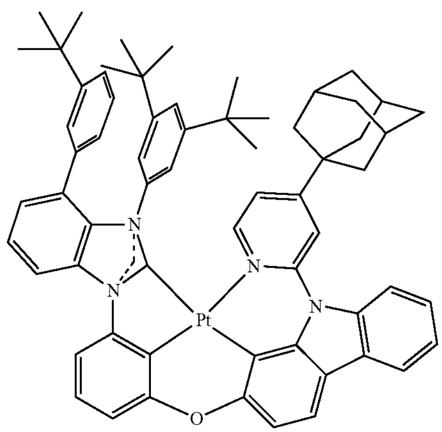
238
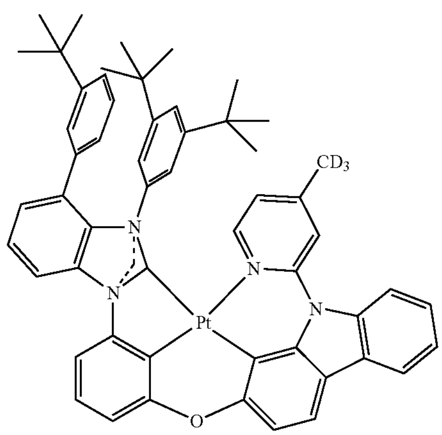
-continued
239
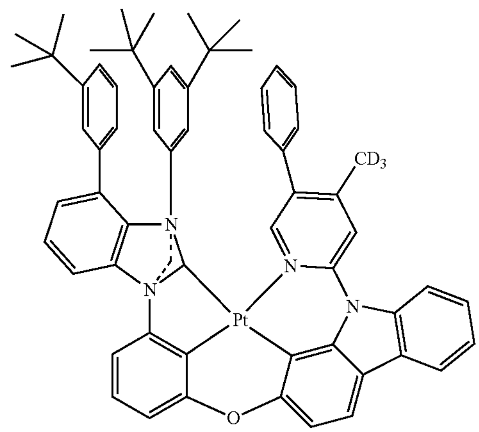
240
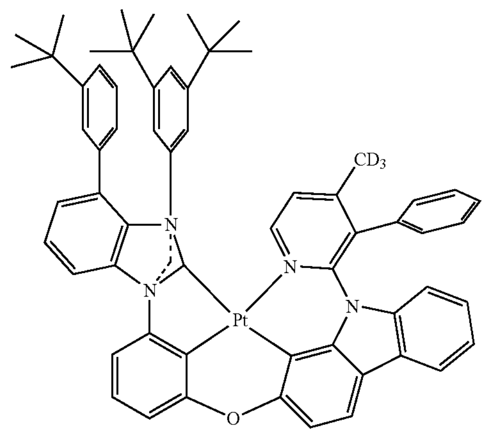
241
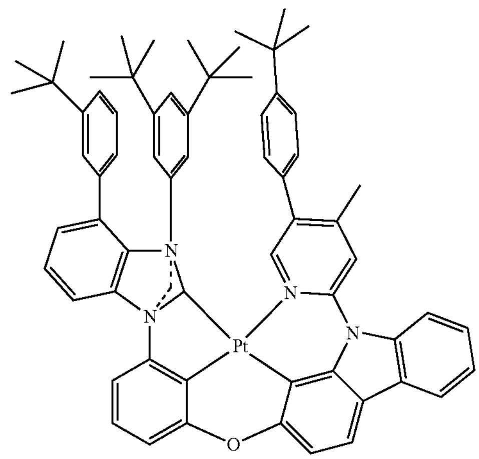

-continued
242
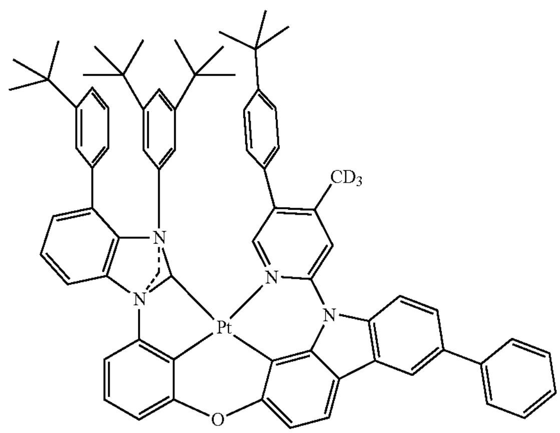
243
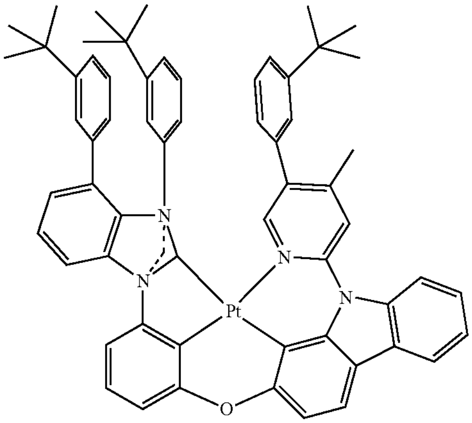
244
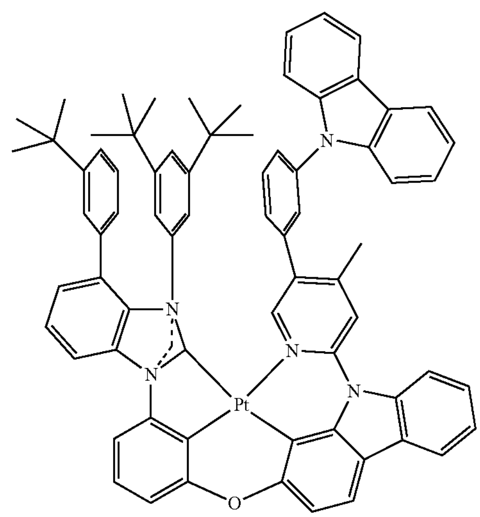
-continued
245
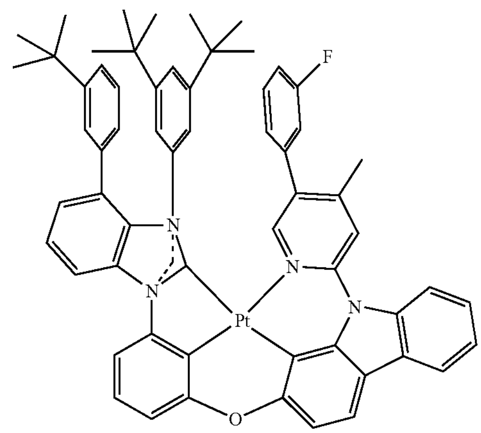
246
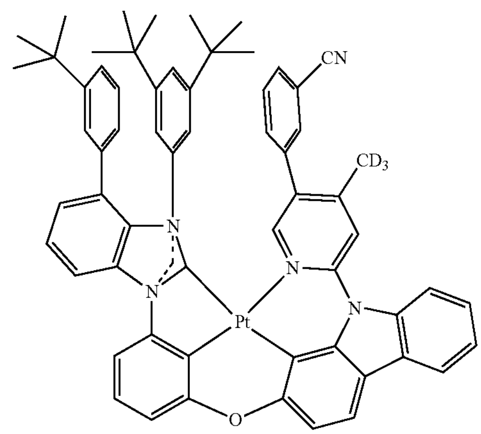
247
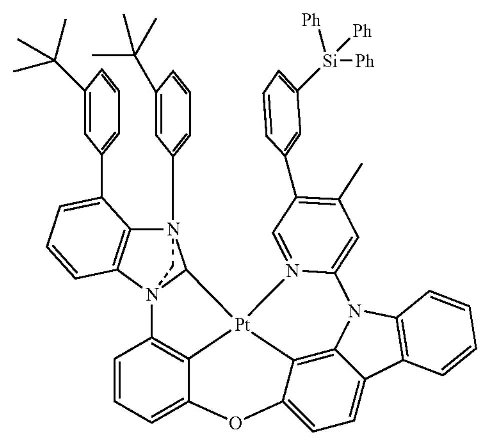

-continued
248
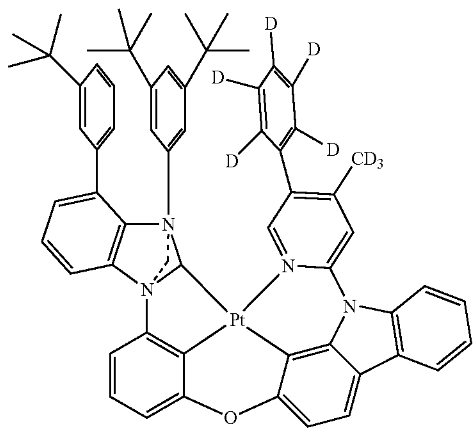
249
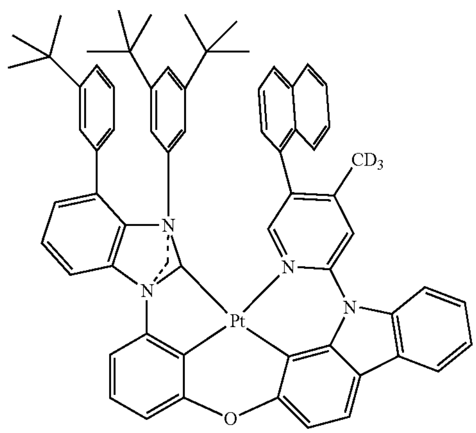
250
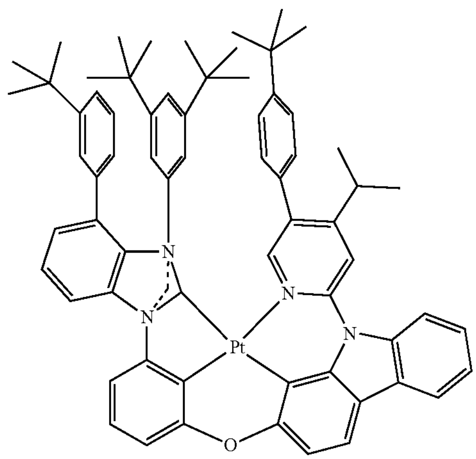
-continued
251
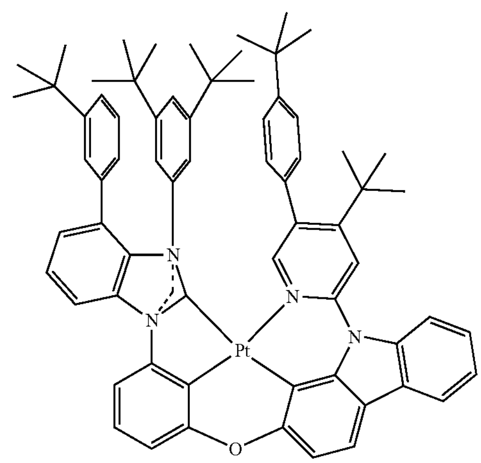
252
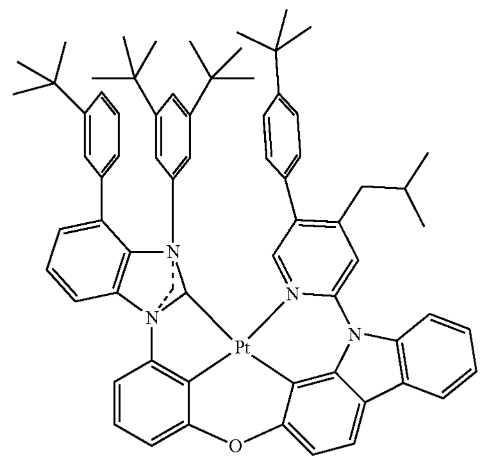
253
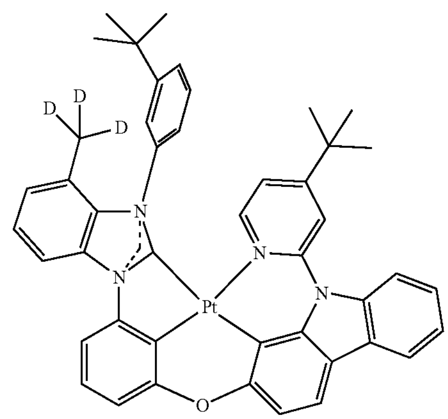

254
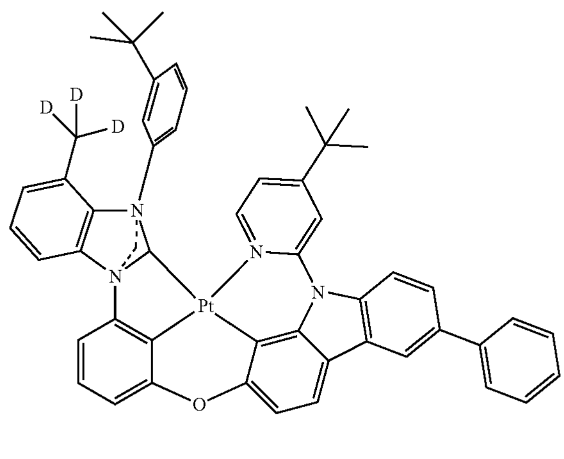
255
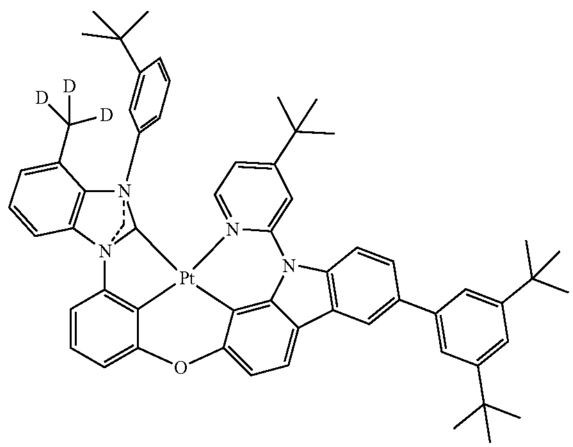
256
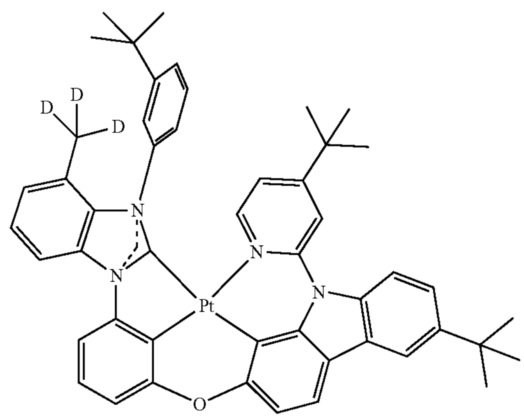
257
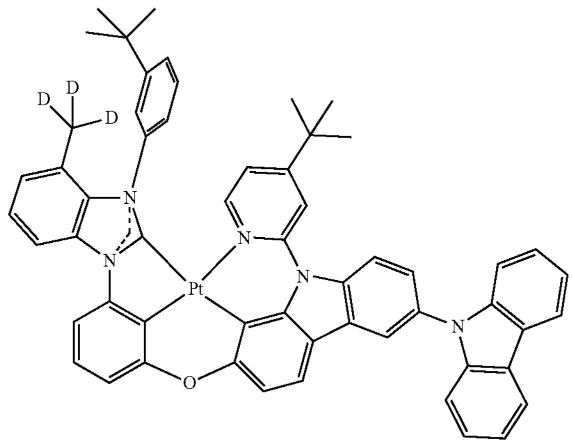
258
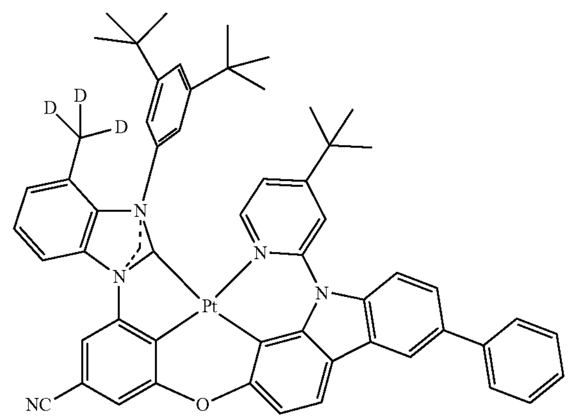
259
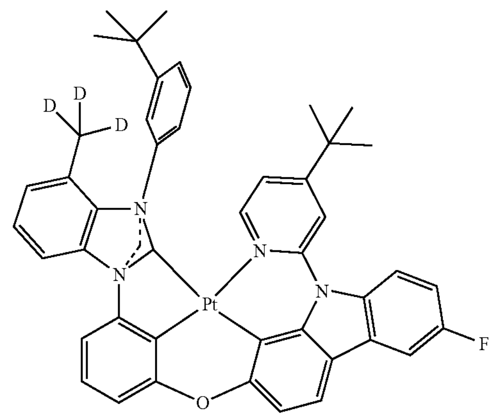

-continued
260
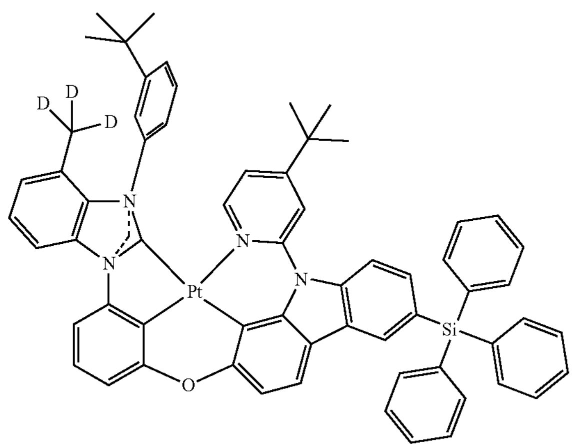
261
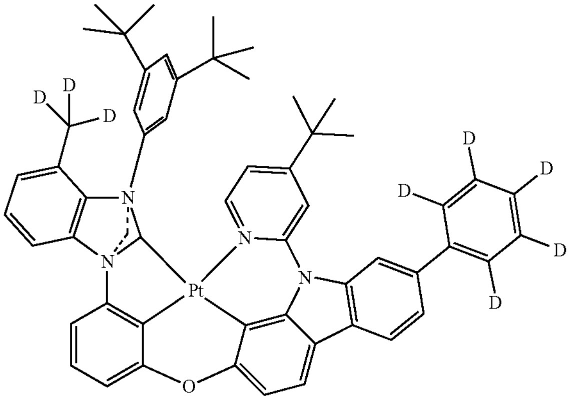
262
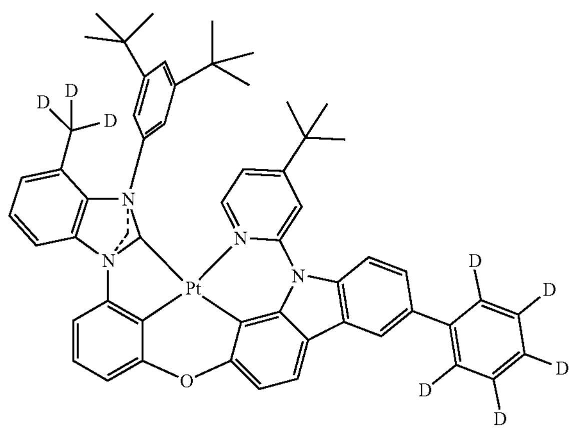
-continued
263
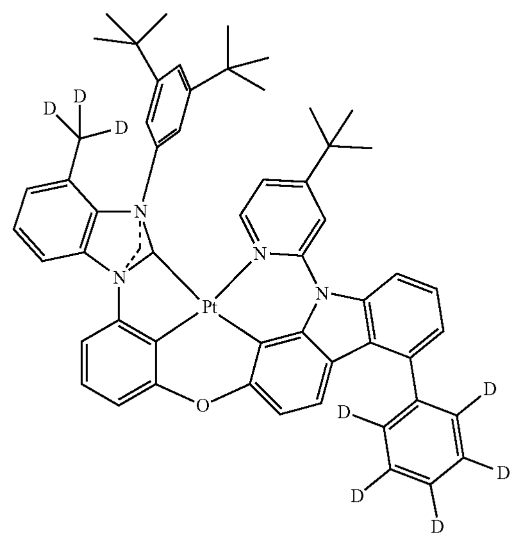
264
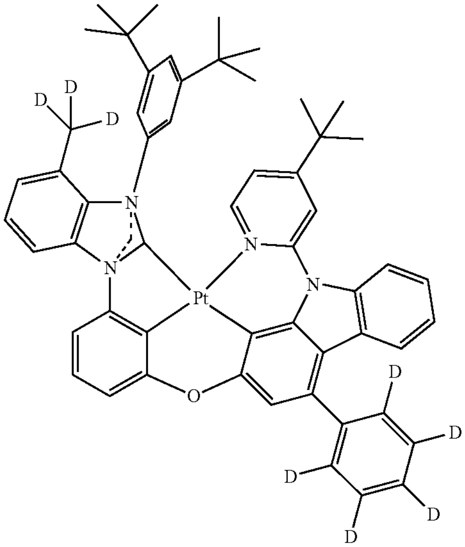
265
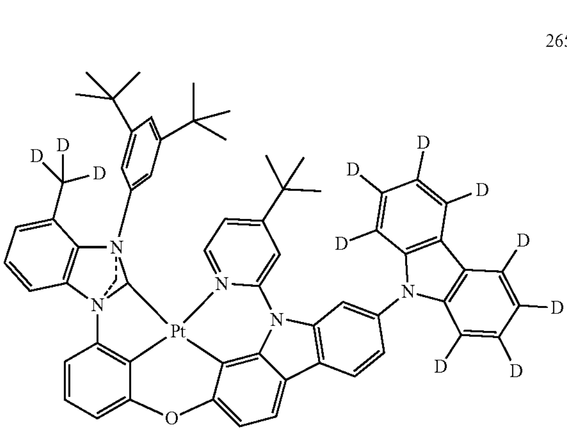

266
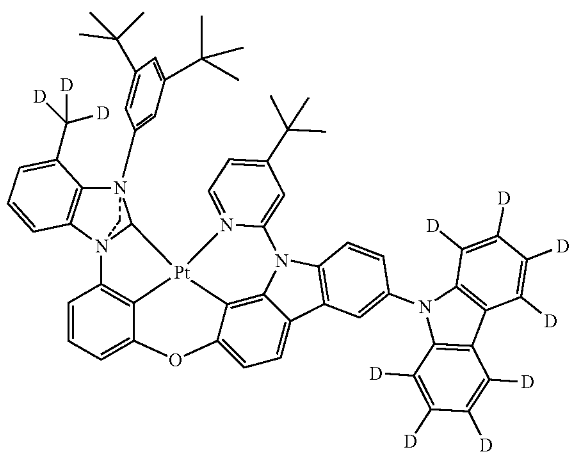
267
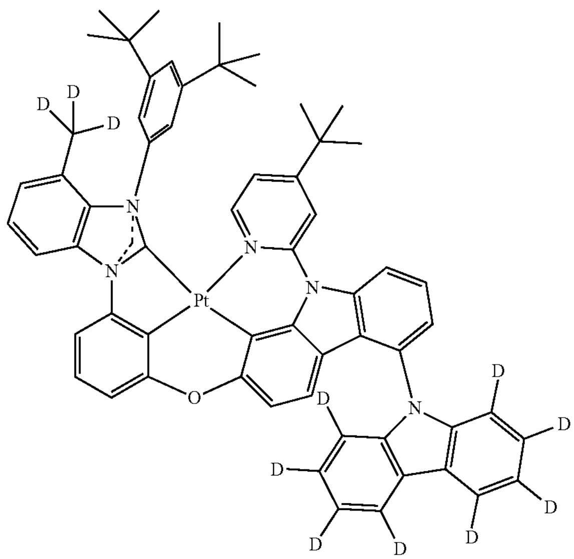
268
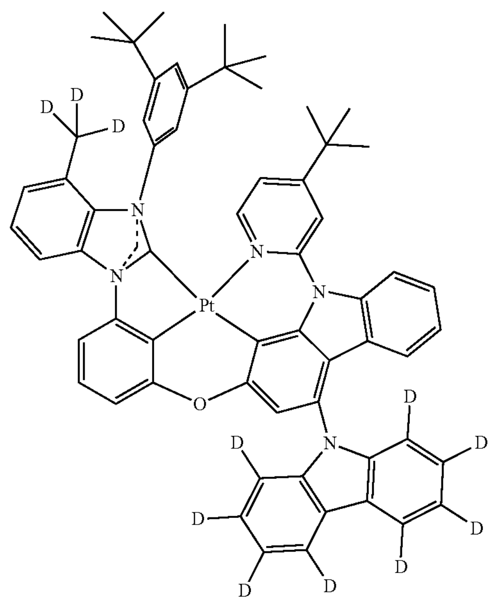
269
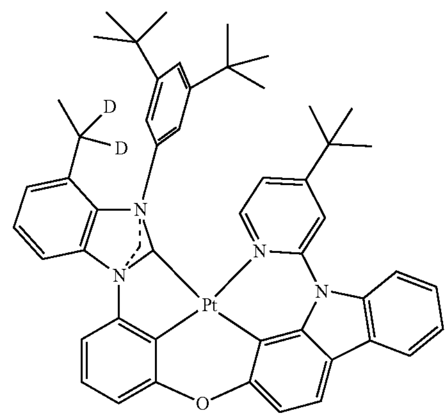
270
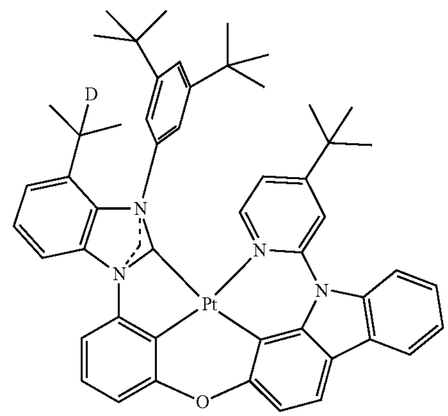
271
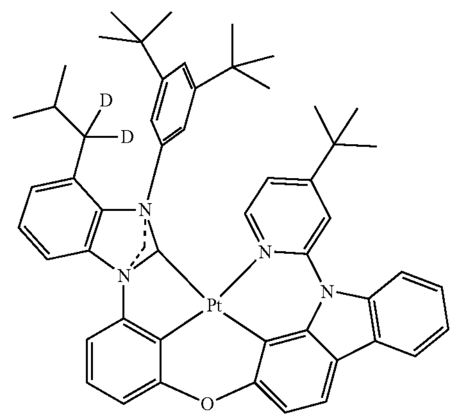
272
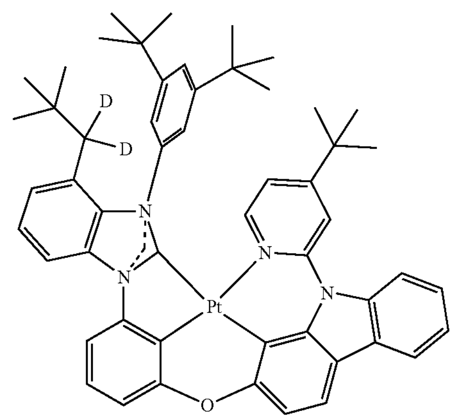

-continued
273
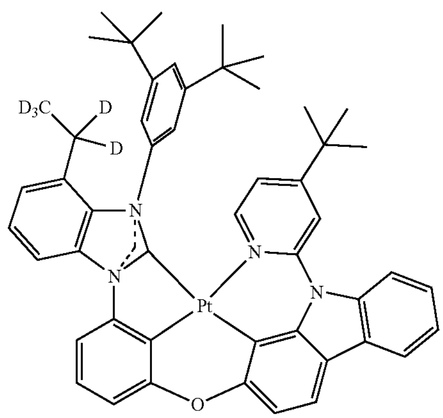
274
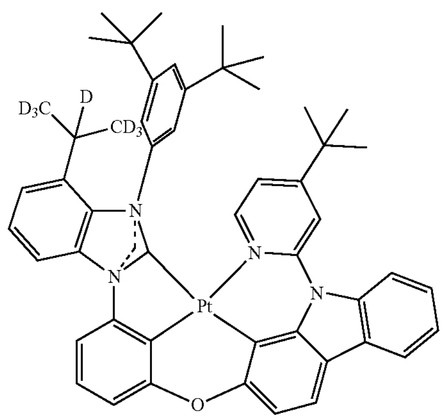
275
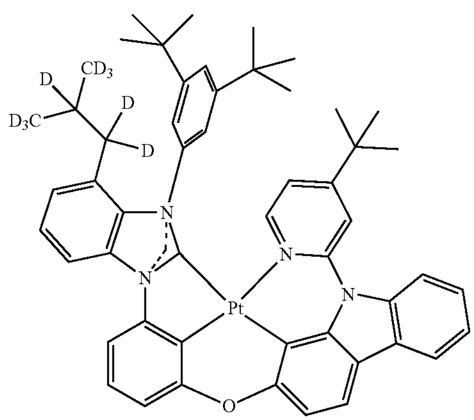
276
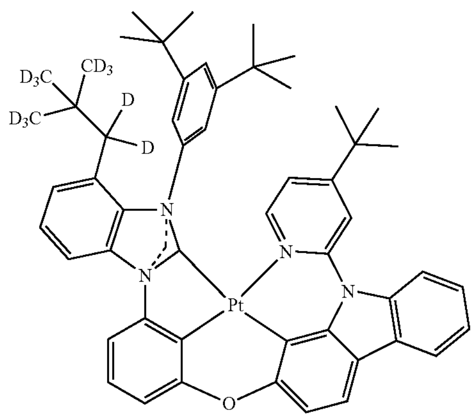
-continued
277
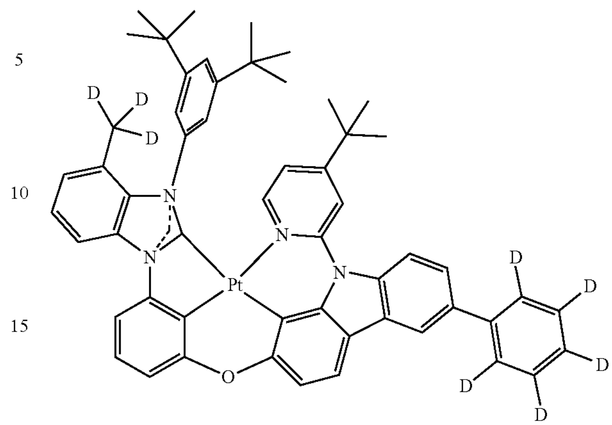
278
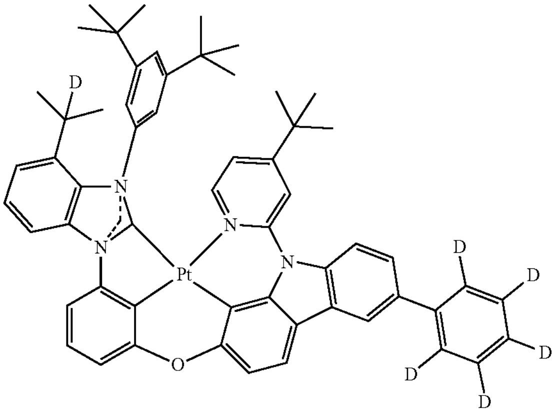
279
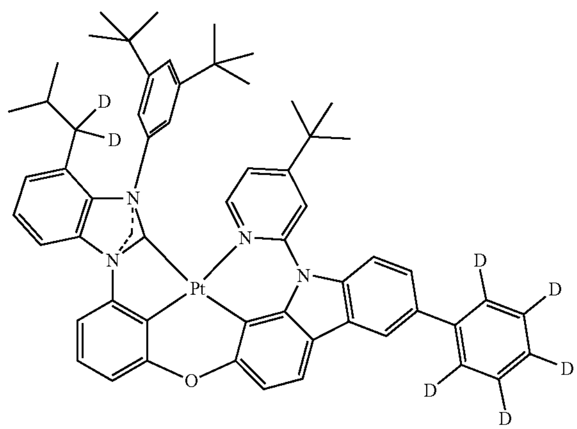

-continued
280
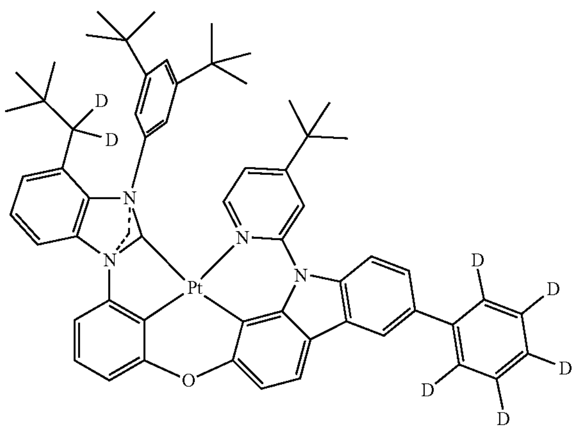
281
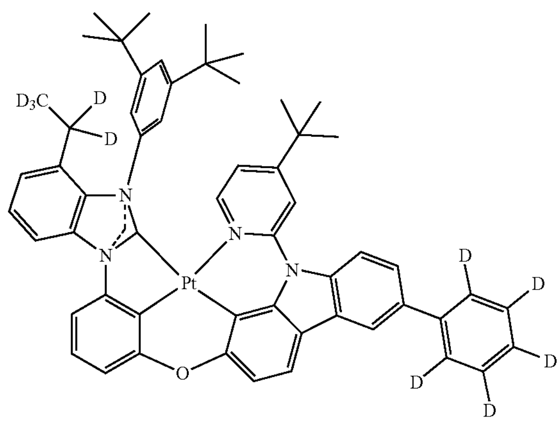
282
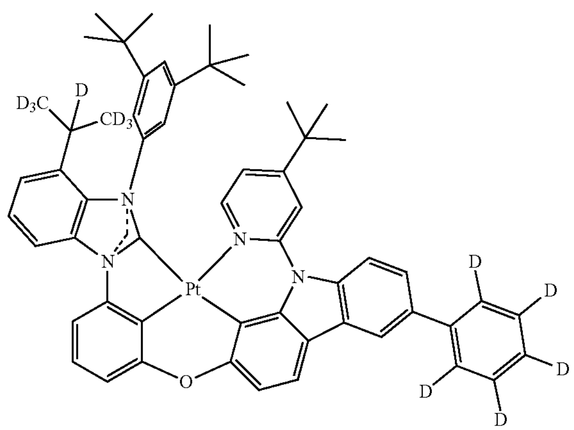
-continued
283
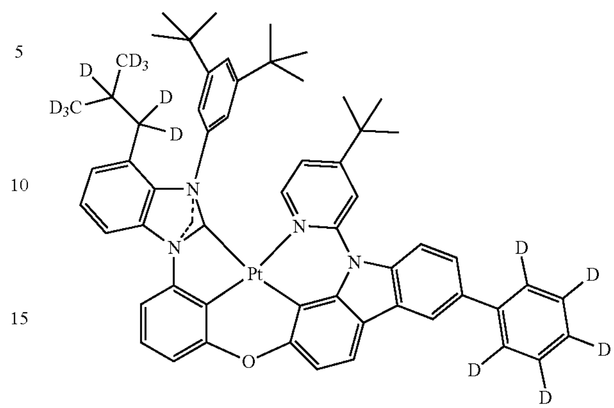
284
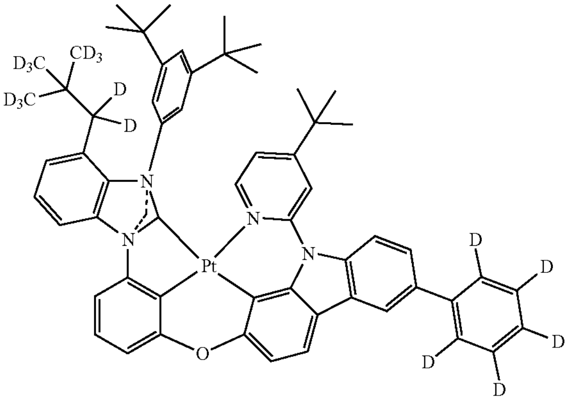
285
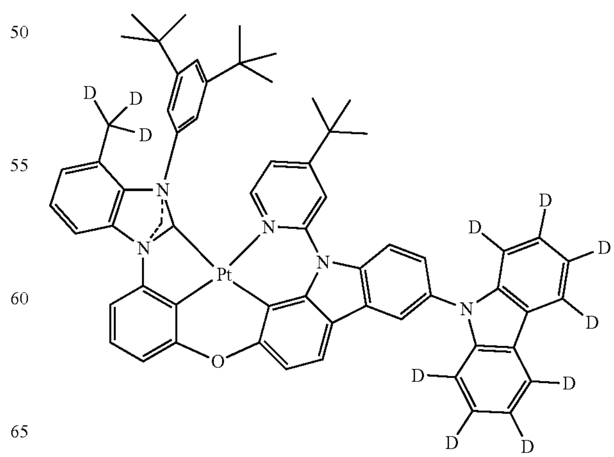

-continued
286
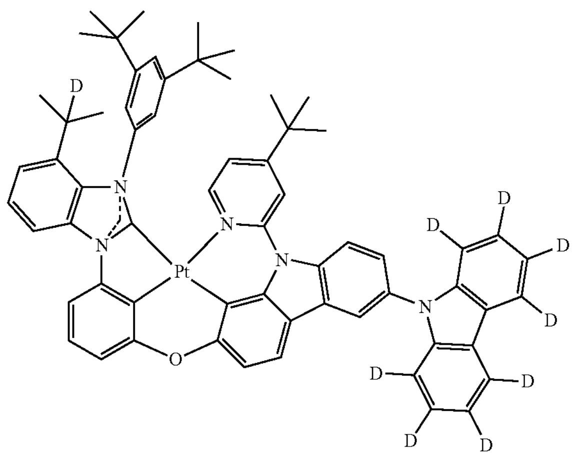
287
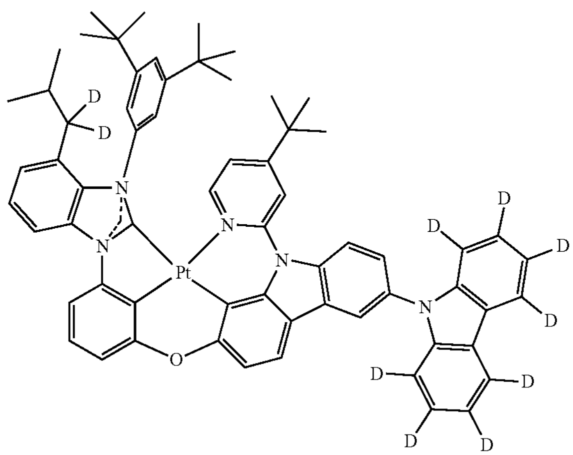
288
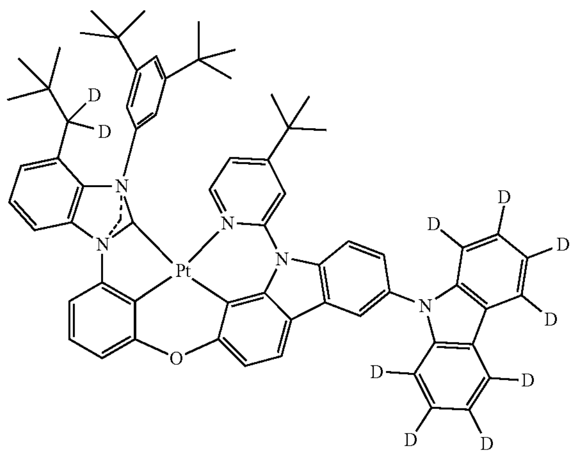
-continued
289
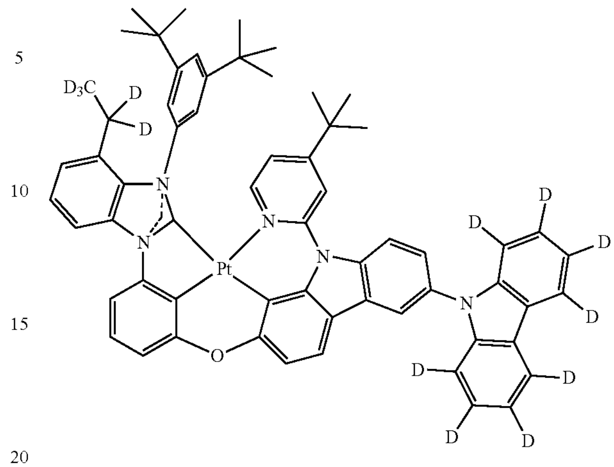
290
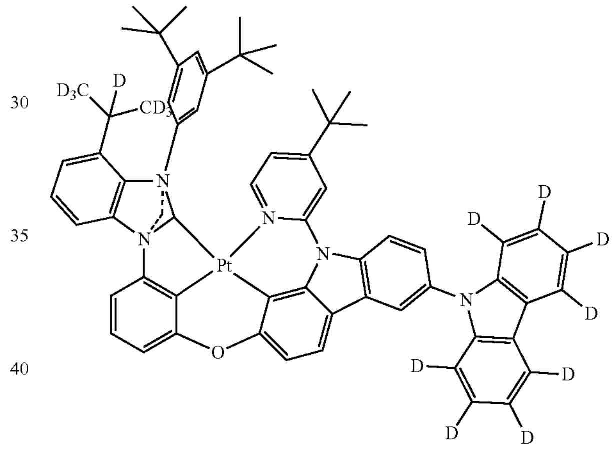
291
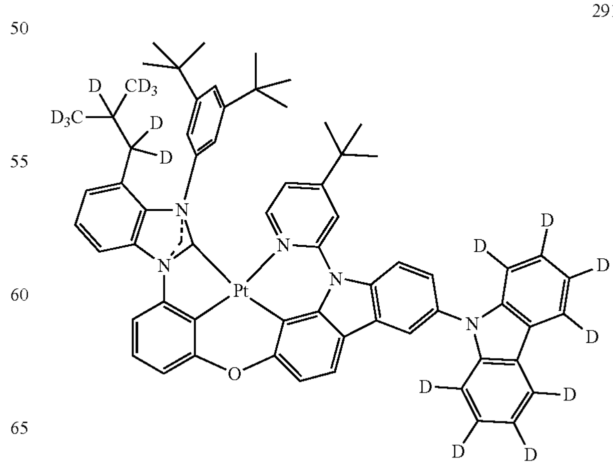

-continued
292
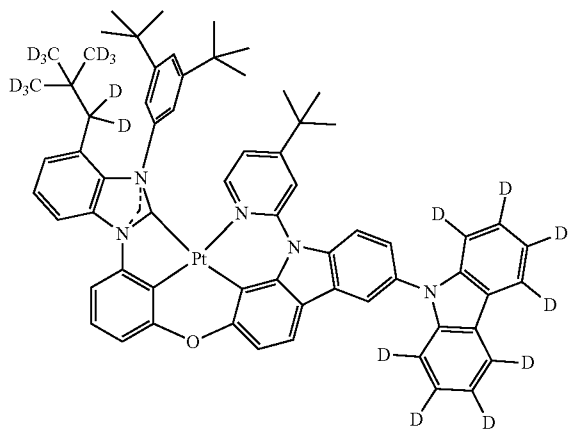
293
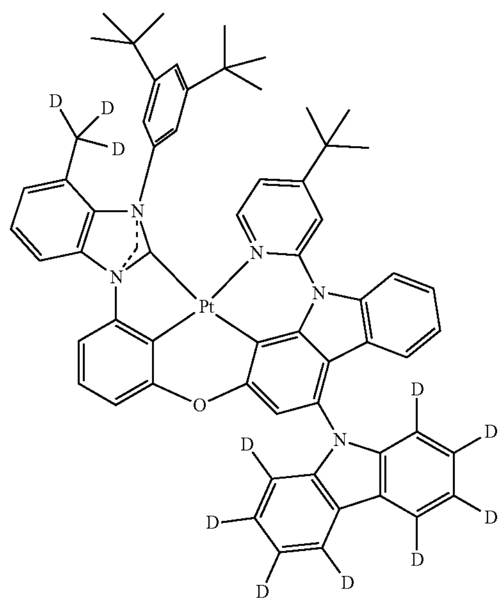
-continued
294
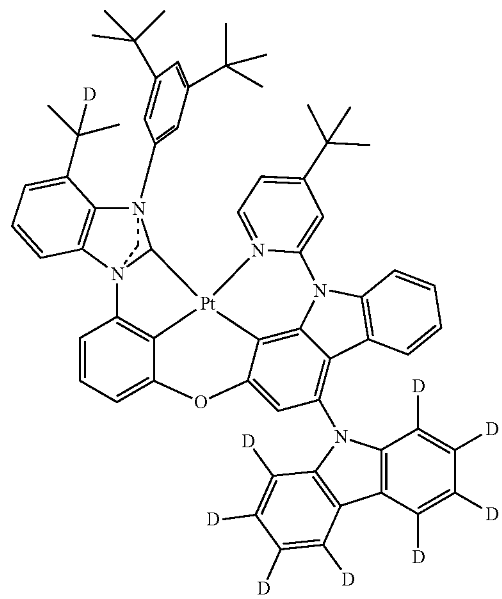
295
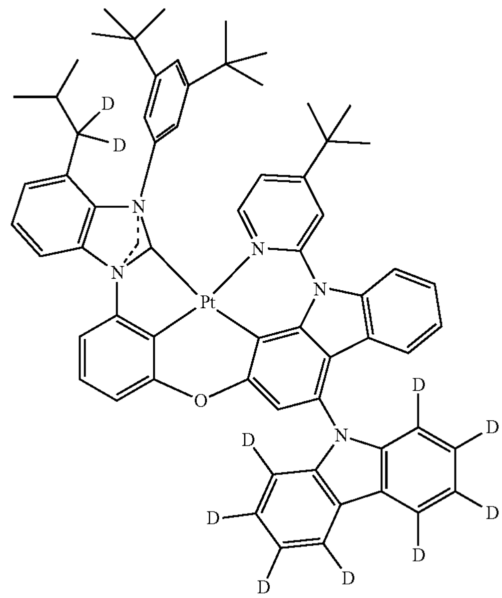

-continued
296
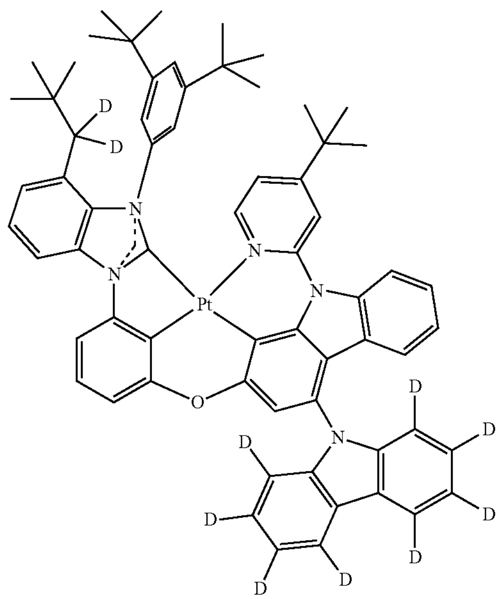
297
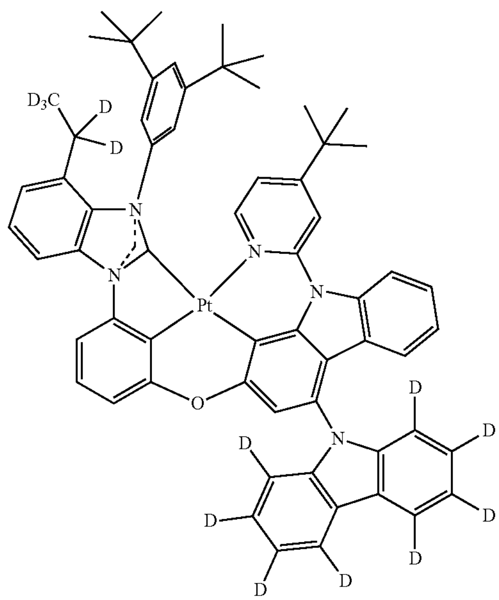
-continued
298
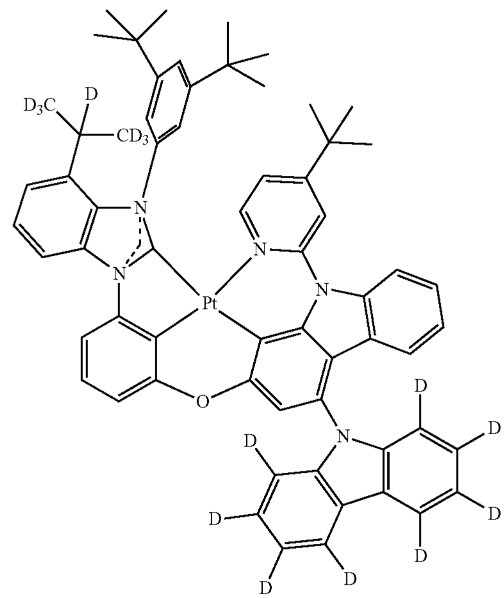
299
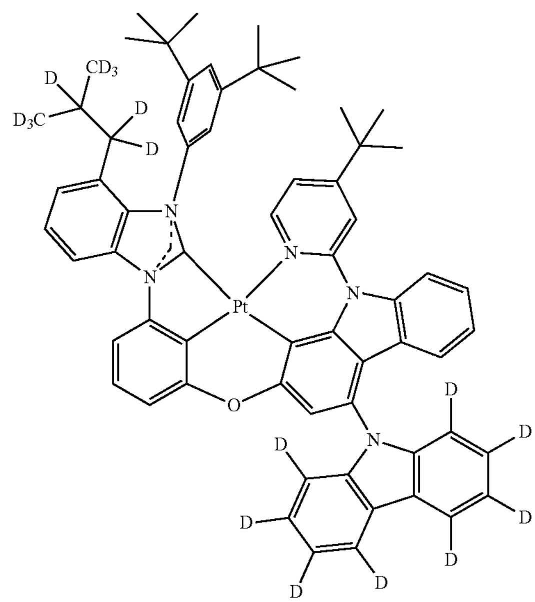

300
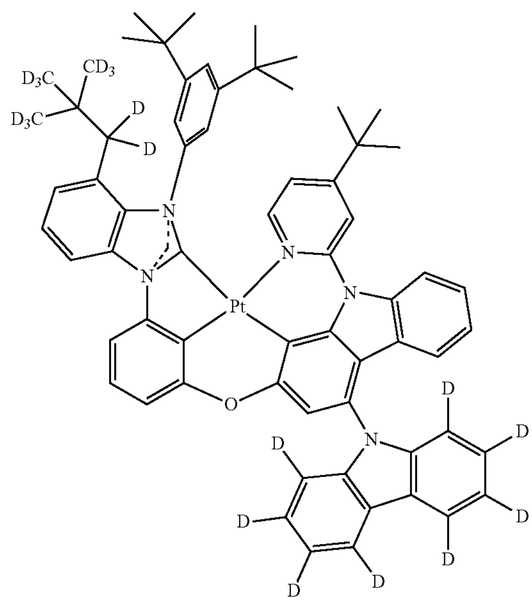
301
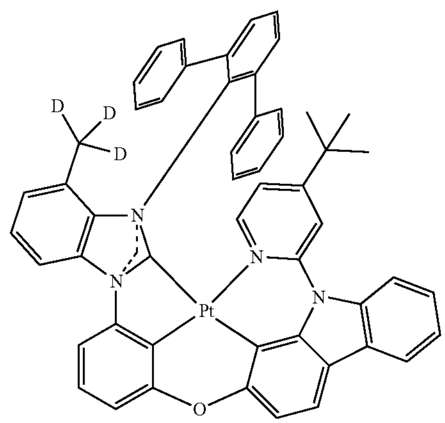
302
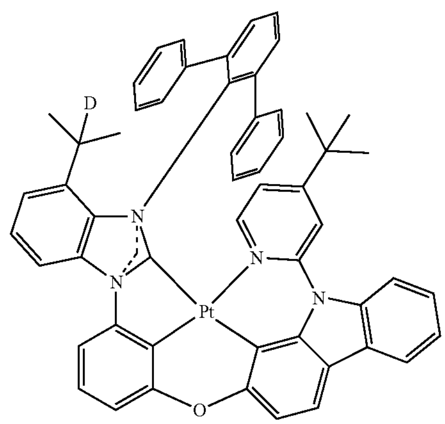
303
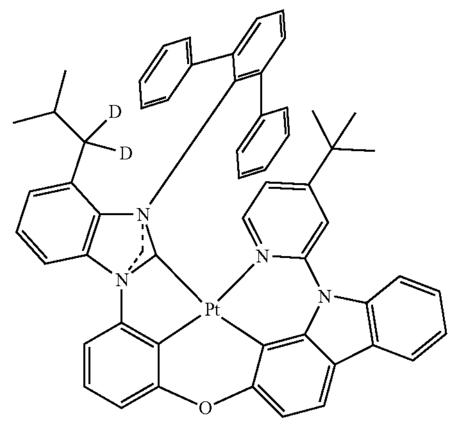
304
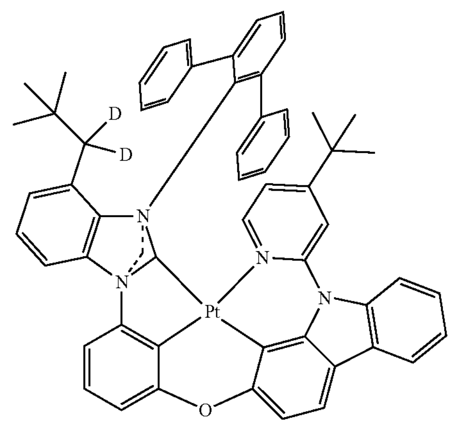
305
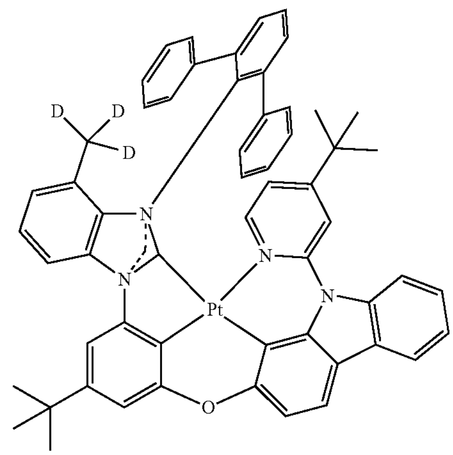

-continued
306
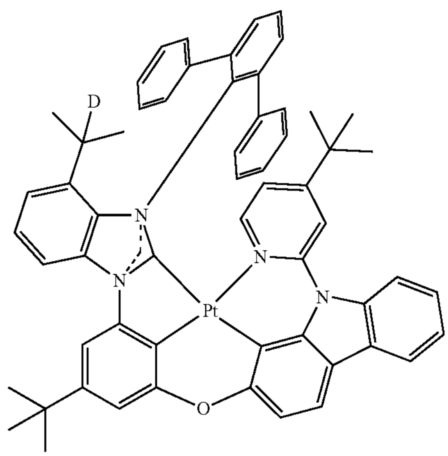
307
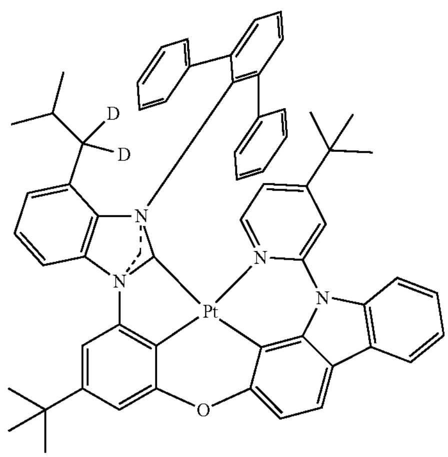
308
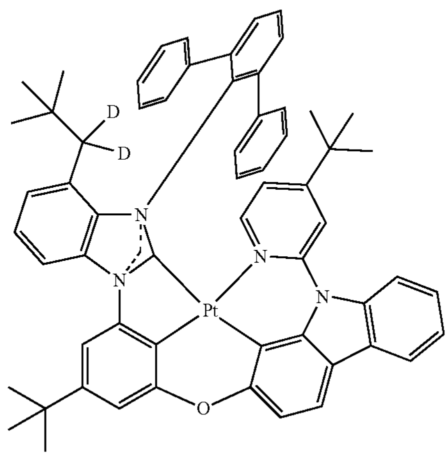
-continued
309
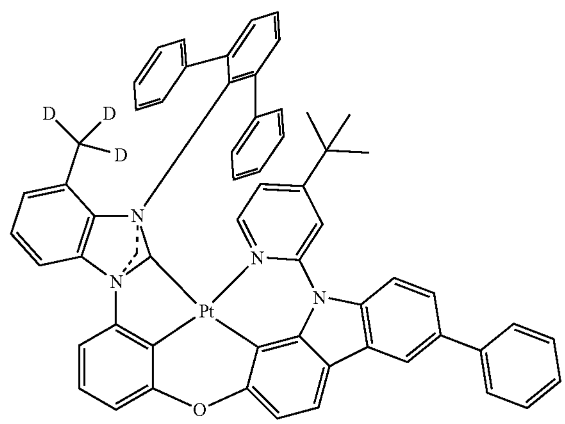
310
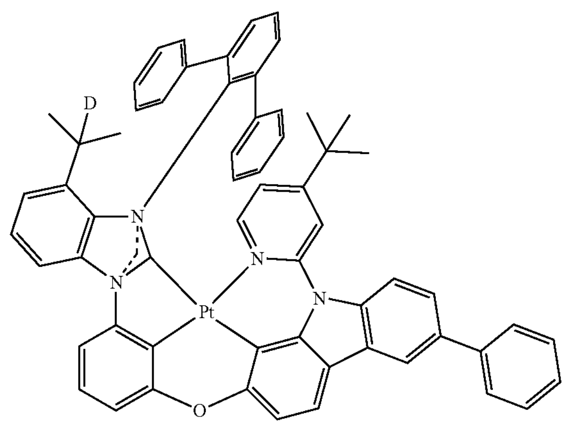
311
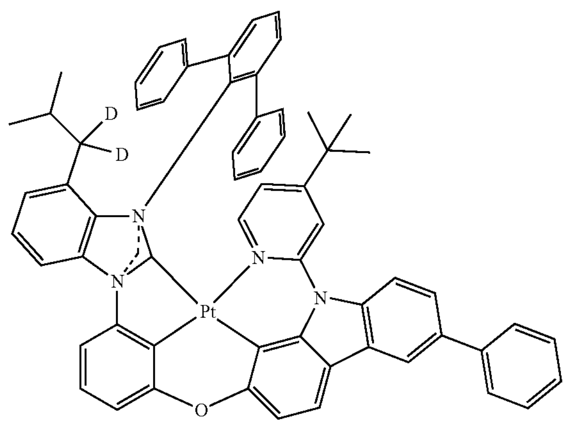

312
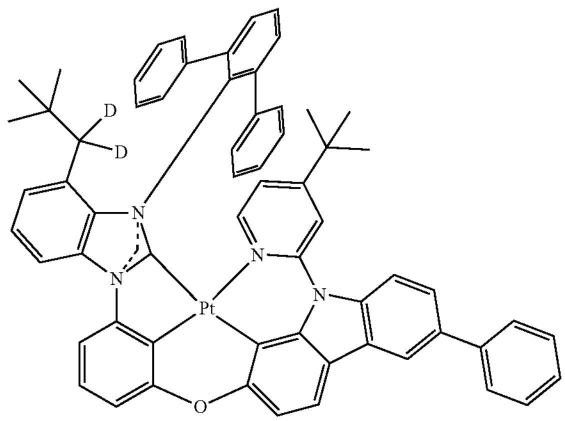
313
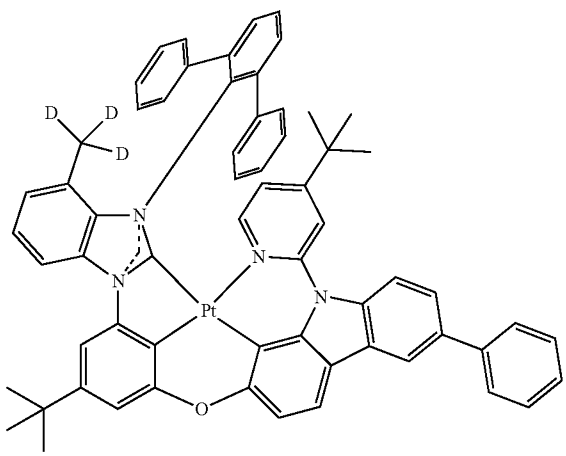
314
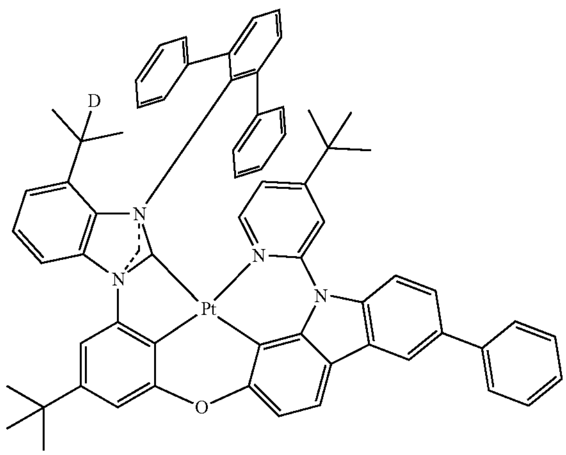
315
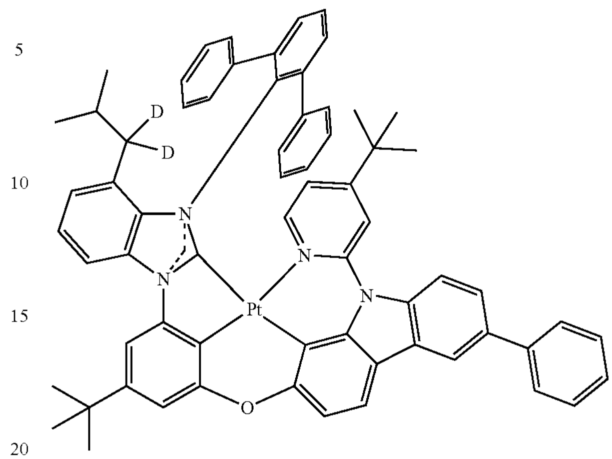
316
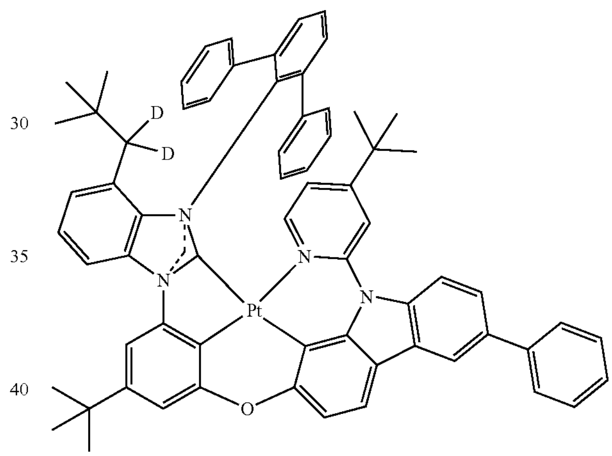
317
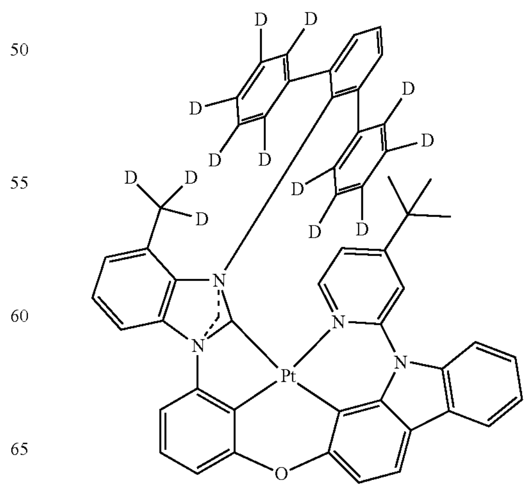

318
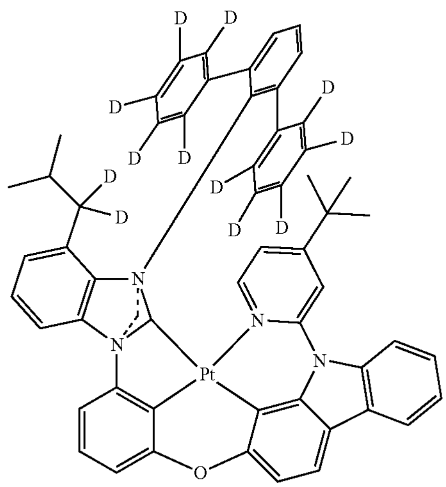
319
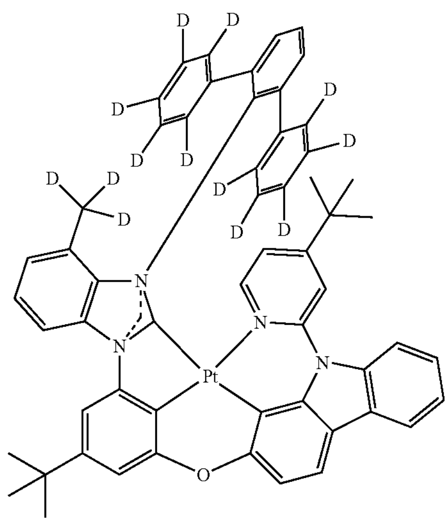
320
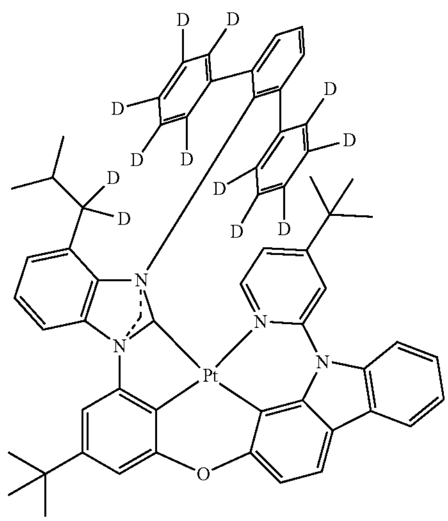
321
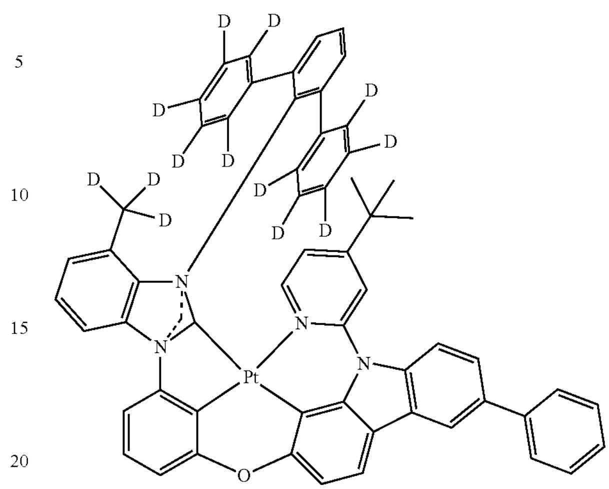
322
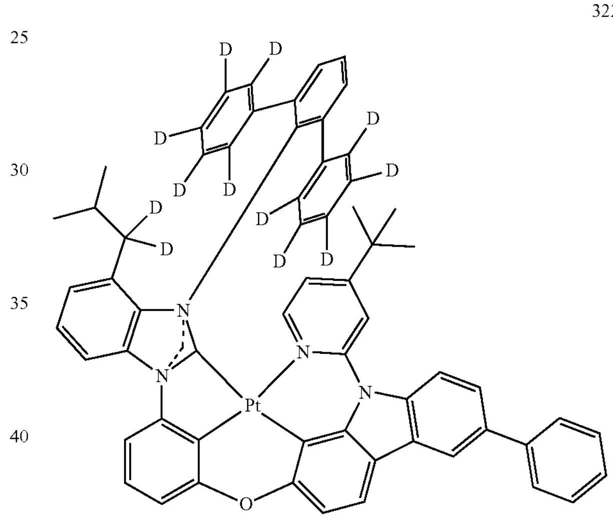
323
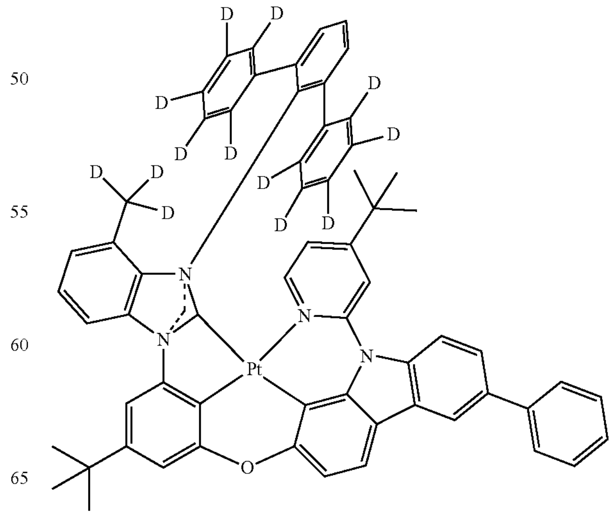

-continued
324
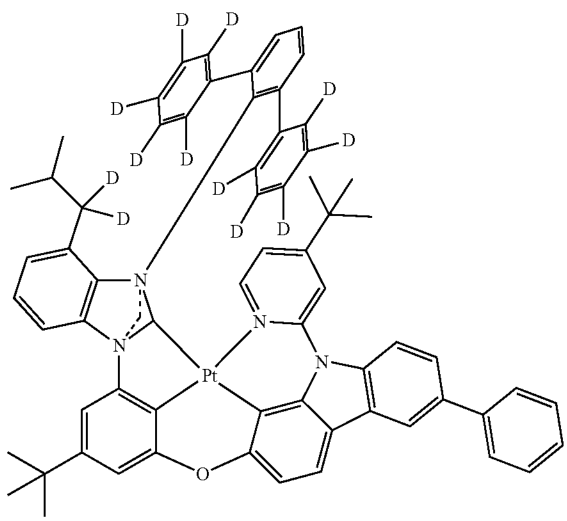
325
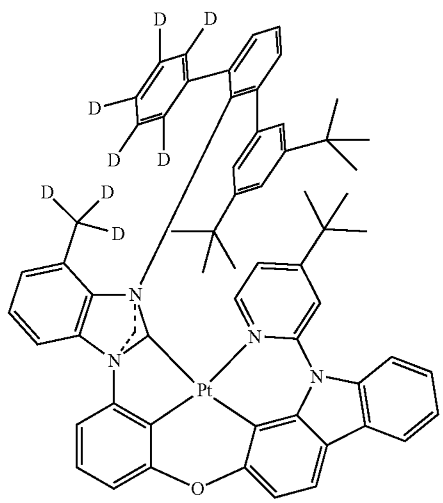
326
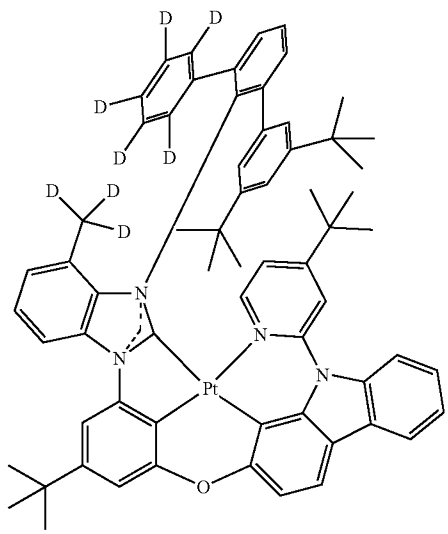
-continued
327
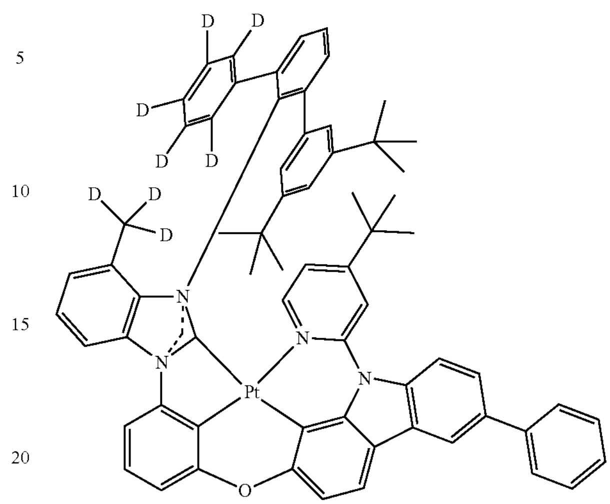
328
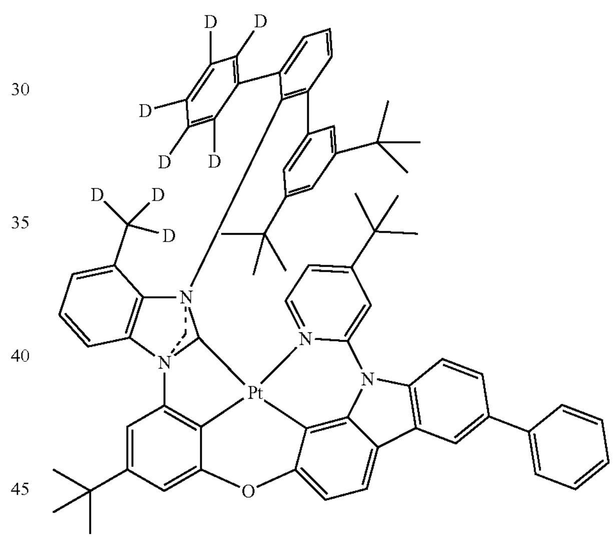
329
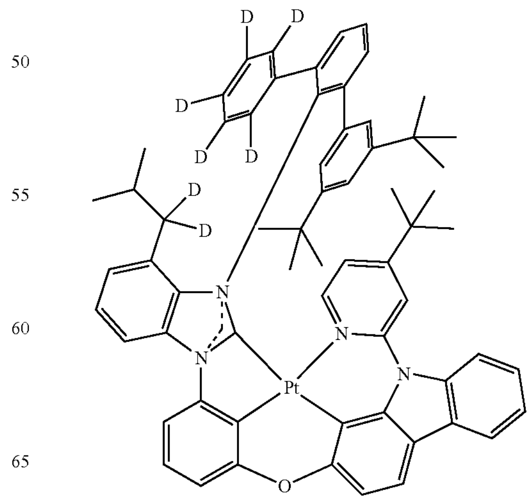

-continued

330

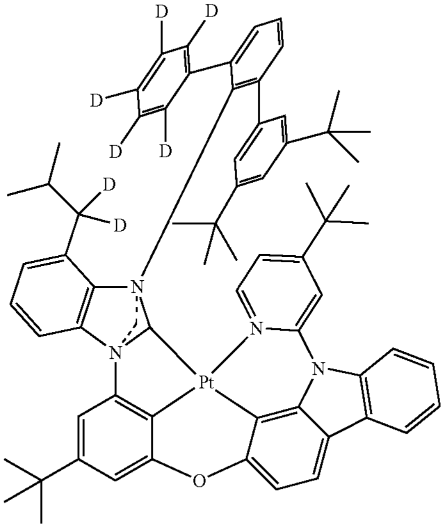

331

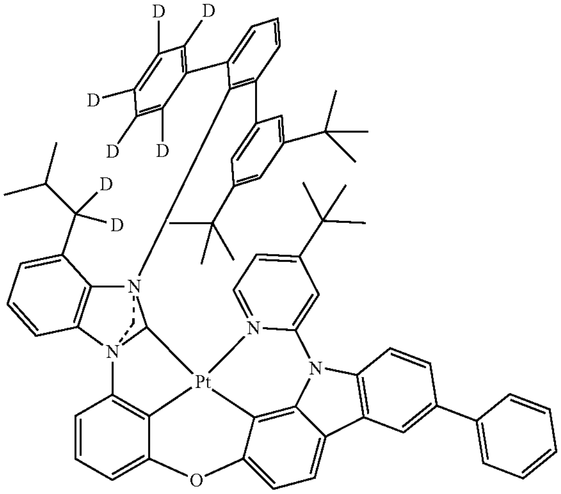

332

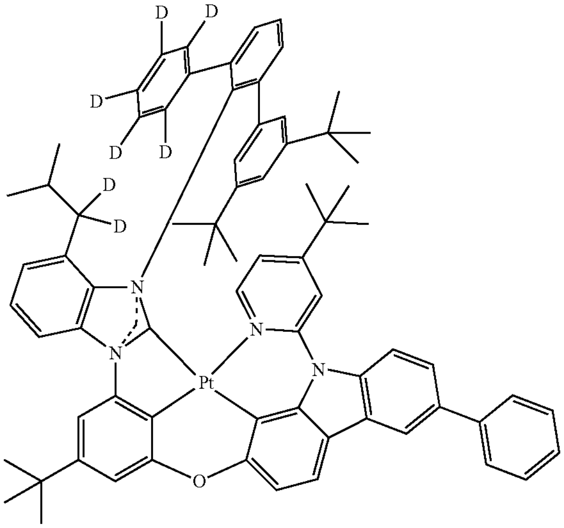

In the organometallic compound represented by Formula 1, due to steric repulsion of a phenyl group bonded to N of a benzimidazole-based moiety of a ligand and a substituent $R_A$ bonded to the benzimidazole-based moiety, rotation of the phenyl group and the $R_A$ substituent may be suppressed. Accordingly, a degree of freedom of rotation of the organometallic compound molecule may be reduced, and thus, the organometallic compound may exhibit an emission spectrum having a narrow full width at half maximum (FWHM) and reduced second peak intensity. Accordingly, an organic light-emitting device including the organometallic compound may have improved color purity.

In addition, due to the steric repulsion of the substituents, a dihedral angle between a plane including benzimidazole among ligands of the organometallic compound and a plane including a phenyl group may increase. Accordingly, a conjugation length of the organometallic compound may be reduced, and thus, an emission wavelength of the organometallic compound may be blue-shifted. Accordingly, the organometallic compound including the $R_A$ group may emit deep blue light.

The highest occupied molecular orbital (HOMO) energy level, lowest unoccupied molecular orbital (LUMO) energy level, $T_1$ energy level, and FWHM of some compounds of the organometallic compound represented by Formula 1 and Comparative Compounds C1 and C2 were evaluated using the Gaussian 09 program with the molecular structure optimization obtained by B3LYP-based density functional theory (DFT), and results thereof are shown in Table 1.

TABLE 1

| Compound No. | HOMO (eV) | LUMO (eV) | $T_1$ (eV) | FWHM (nm) |
|---|---|---|---|---|
| 2 | −4.64 | −1.23 | 2.66 | 21 |
| 50 | −4.63 | −1.22 | 2.64 | 21 |
| 65 | −4.63 | −1.18 | 2.69 | 29 |
| 69 | −4.77 | −1.32 | 2.69 | 17 |
| 85 | −4.74 | −1.31 | 2.65 | 21 |
| 121 | −4.70 | −1.31 | 2.60 | 17 |
| 154 | −4.66 | −1.23 | 2.65 | 17 |
| 162 | −4.66 | −1.22 | 2.69 | 29 |
| 166 | −4.89 | −1.49 | 2.69 | 18 |
| 177 | −4.63 | −1.24 | 2.66 | 19 |
| 242 | −4.65 | −1.23 | 2.65 | 19 |
| 258 | −4.98 | −1.48 | 2.67 | 16 |
| 319 | −4.58 | −1.22 | 2.63 | 24 |
| C1 | −4.65 | −1.22 | 2.65 | 32 |
| C2 | −4.65 | −1.24 | 2.64 | 33 |

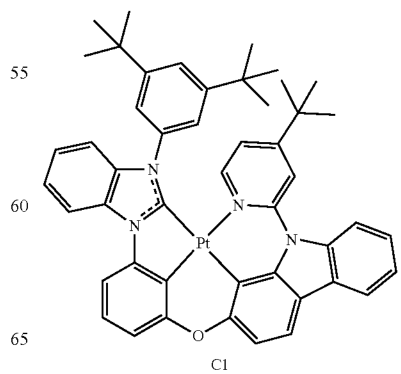

C1

TABLE 1-continued

| Compound No. | HOMO (eV) | LUMO (eV) | $T_1$ (eV) | FWHM (nm) |
|---|---|---|---|---|
| 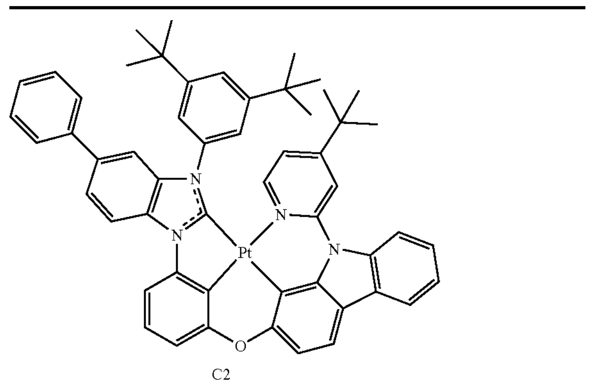 C2 | | | | |

From Table 1, it may be confirmed that the organometallic compound according to an embodiment has a higher $T_1$ energy level than those of Compounds C1 and C2 and emits light having a relatively narrow FWHM.

Synthesis methods of the organometallic compound represented by Formula 1 may be understood by one of ordinary skill in the art by referring to Synthesis Examples provided below.

Accordingly, the organometallic compound represented by Formula 1 may be suitable for use as a material for an organic layer of an organic light-emitting device, for example, a material for an emission layer of the organic layer. Thus, another aspect of the present disclosure provides an organic light-emitting device including: a first electrode; a second electrode; and an organic layer arranged between the first electrode and the second electrode and including an emission layer, wherein the organic layer includes at least one organometallic compound as described above.

The organic light-emitting device may include an organic layer including the organometallic compound represented by Formula 1. Thus, the organic light-emitting device may have an excellent driving voltage, excellent external quantum efficiency, an emission spectrum with reduced second peak intensity, and excellent color purity.

As used herein, the expression the "(organic layer) includes at least one organometallic compound" may be construed as meaning the "(organic layer) may include one organometallic compound of Formula 1 or two different organometallic compounds of Formula 1".

For example, the organic layer may include, as the organometallic compound, only Compound 1. In this regard, Compound 1 may be included in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

In an embodiment, the at least one organometallic compound may be included in the emission layer of the organic light-emitting device.

For example, the emission layer may further include a host, and an amount of the host in the emission layer may be greater than that of the at least one organometallic compound in the emission layer.

The emission layer may emit red light, green light, or blue light. For example, the emission layer may emit blue light having a maximum emission wavelength in a range of about 430 nm to about 470 nm.

For example, the emission layer may have a configuration as described in First embodiment or Second embodiment:

First Embodiment

The emission layer may include the organometallic compound represented by Formula 1, and the organometallic compound may serve as a phosphorescent emitter. For example, a ratio of a luminescent component emitted from the organometallic compound with respect to all luminescent components of the emission layer may be 80% or more, 85% or more, 90% or more, or 95% or more. Light emitted from the organometallic compound may be blue light.

Second Embodiment

The emission layer may further include, in addition to the organometallic compound represented by Formula 1, a phosphorescent dopant, a fluorescent dopant, or any combination thereof, which is different from the organometallic compound. In this regard, the organometallic compound may serve not as a phosphorescent emitter, but as a sensitizer or an auxiliary dopant. For example, the emission layer may further include a fluorescent dopant, the fluorescent dopant may be different from the organometallic compound, and a ratio of a luminescent component emitted from the fluorescent dopant with respect to all luminescent components of the emission layer may be 80% or more, 85% or more, 90% or more, or 95% or more.

In the second embodiment, an amount of the fluorescent dopant may be, based on 100 parts by weight of the organometallic compound represented by Formula 1, in a range of about 1 part by weight to about 100 parts by weight, about 5 parts by weight to about 50 parts by weight, or about 10 parts by weight to about 20 parts by weight.

In the second embodiment, a total amount of the organometallic compound represented by Formula 1 and the fluorescent dopant may be, based on 100 parts by weight of the emission layer, in a range of about 1 part by weight to about 30 parts by weight, about 3 parts by weight to about 20 parts by weight, or about 5 parts by weight to about 15 parts by weight.

The fluorescent dopant that may be used in the second embodiment may not include a transition metal.

In the second embodiment, the emission layer may emit fluorescence generated while triplet excitons of the organometallic compound represented by Formula 1 are delivered to the fluorescent dopant and then transferred.

In an embodiment, the first electrode may be an anode, which is a hole injection electrode, and the second electrode may be a cathode, which is an electron injection electrode. In one or more embodiments, the first electrode may be a cathode, which is an electron injection electrode, and the second electrode may be an anode, which is a hole injection electrode.

In an embodiment, the first electrode may be an anode, the second electrode may be a cathode, and the organic layer may include a hole transport region arranged between the first electrode and the emission layer and an electron transport region arranged between the emission layer and the second electrode, wherein the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

For example, the organometallic compound may be included in at least one of the hole transport region and the electron transport region.

The term "organic layer" as used herein refers to a single layer and/or a plurality of layers between the first electrode and the second electrode of the organic light-emitting device. The "organic layer" may include, in addition to an organic compound, an organometallic complex including metal.

Description of FIG. 1

FIG. 1 is a schematic cross-sectional view of an organic light-emitting device 10 according to an exemplary embodiment. Hereinafter, the structure and manufacturing method of the organic light-emitting device 10 according to an embodiment of the present disclosure will be described in connection with FIG. 1.

The organic light-emitting device 10 of FIG. 1 includes a first electrode 11, an organic layer 15, and a second electrode 19, which are sequentially stacked.

A substrate may be additionally arranged under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

The first electrode 11 may be, for example, formed by depositing or sputtering a material for forming the first electrode 11 on the substrate. The first electrode 11 may be an anode. The material for forming the first electrode 11 may be selected from materials with a high work function to facilitate hole injection.

The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. For example, the first electrode 11 may have a three-layered structure of ITO/Ag/ITO, but the structure of the first electrode 11 is not limited thereto.

The organic layer 15 is arranged on the first electrode 11.

The organic layer 15 may include a hole transport region, an emission layer, and an electron transport region.

The hole transport region may be arranged between the first electrode 11 and the emission layer.

The hole transport region may include at least one of a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, respective layers are sequentially stacked in this stated order from the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When the hole injection layer is formed by vacuum deposition, the deposition conditions may vary according to a material that is used to form the hole injection layer, and the structure and thermal characteristics of the hole injection layer. For example, the deposition conditions may include a deposition temperature in a range of about 100° C. to about 500° C., a vacuum pressure in a range of about $10^{-8}$ torr to about $10^{-3}$ torr, and a deposition rate in a range of about 0.01 Å/sec to about 100 Å/sec. However, the deposition conditions are not limited thereto.

When the hole injection layer is formed by spin coating, the coating conditions may vary according to a material that is used to form the hole injection layer, and the structure and thermal characteristics of the hole injection layer. For example, the coating conditions may include a coating speed in a range of about 2,000 rpm to about 5,000 rpm and a heat treatment temperature for removing a solvent after coating in a range of about 80° C. to about 200° C. However, the coating conditions are not limited thereto.

Conditions for forming the hole transport layer and the electron blocking layer may be the same as the conditions for forming the hole injection layer.

The hole transport region may include, for example, at least one of m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylam ine (TCTA), polyaniline/dodecylbenzenesulfonic acid (PAN I/D BSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or any combination thereof:

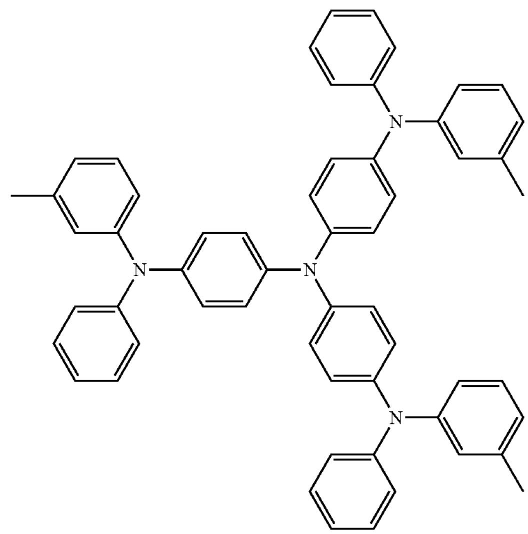

m-MTDATA

-continued
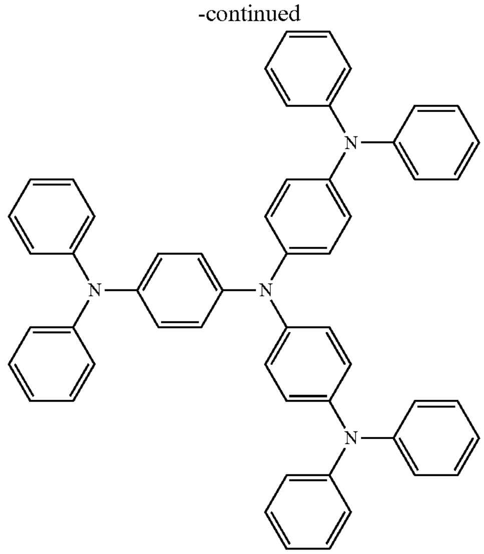
TDATA
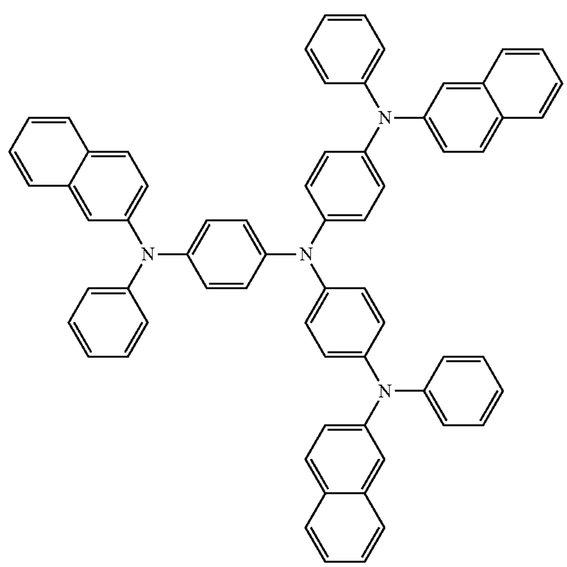
2-TNATA
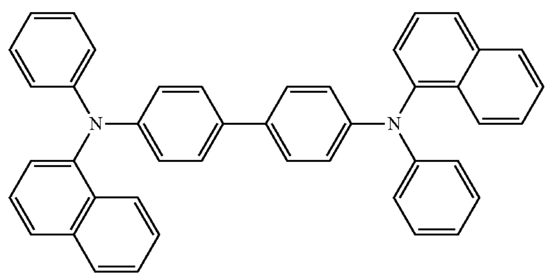
NPB
-continued
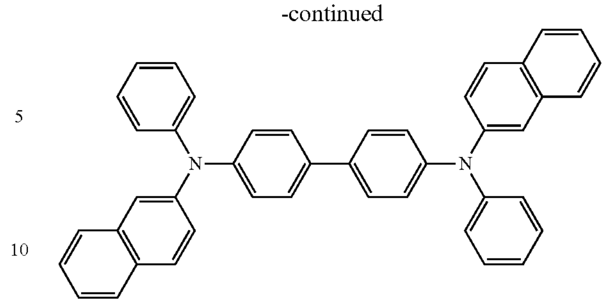
β-NPB
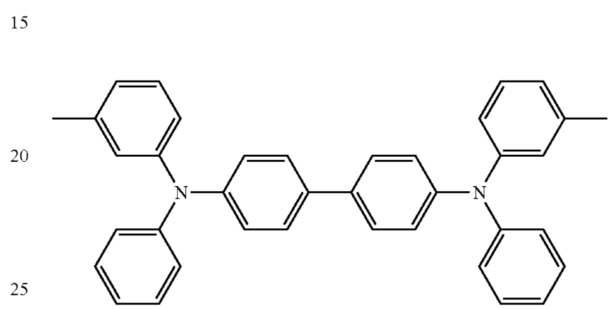
TPD
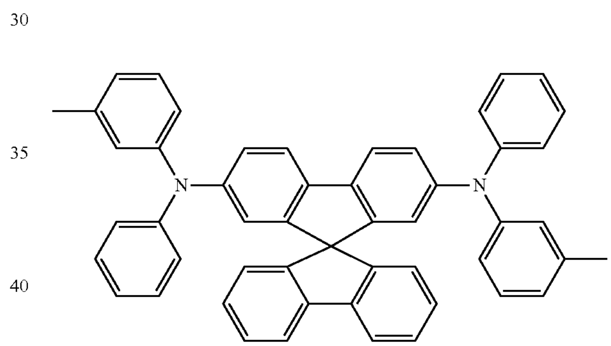
Spiro-TPD
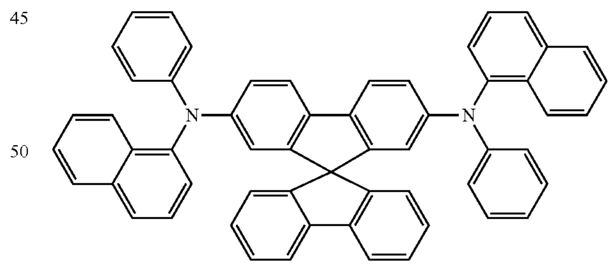
Spiro-NPB
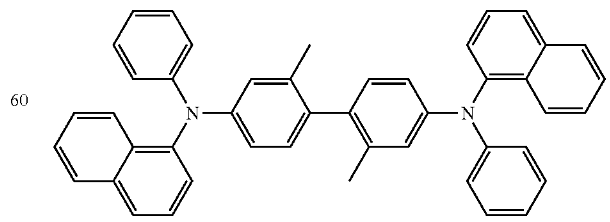
methylated NPB -continued

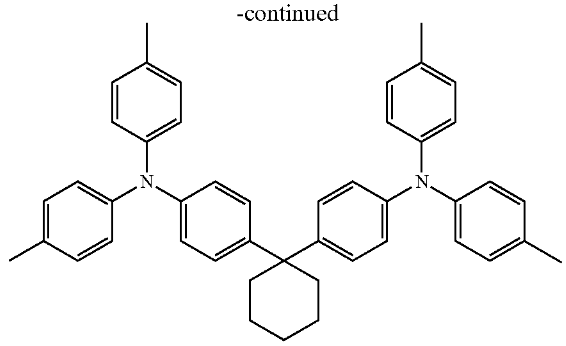

TAPC

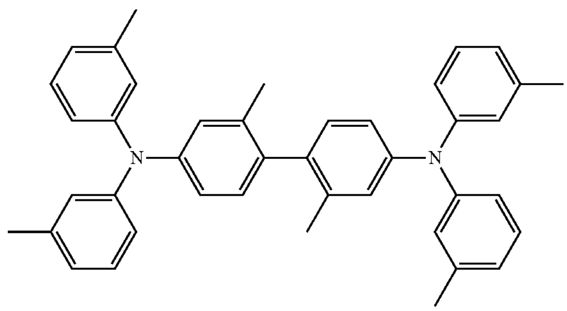

HMTPD

Formula 201

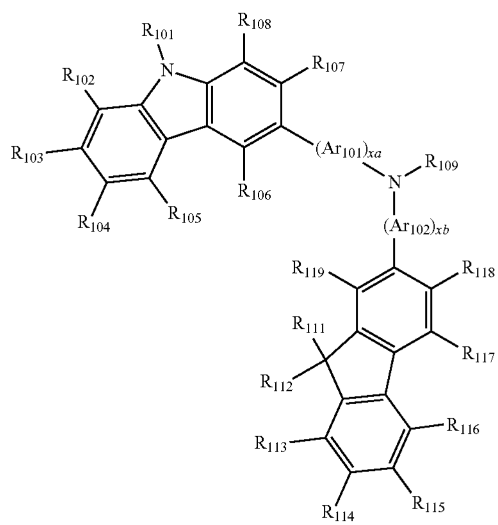

Formula 202

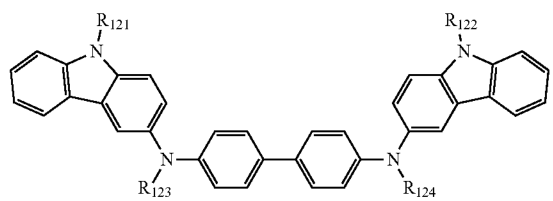

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an am idino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, pentyl group, a hexyl group, etc.), or a $C_1$-$C_{10}$ alkoxy group (for example, a methoxy group, an ethoxy group, a propoxy group, a butoxy group, a pentoxy group, etc.);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, or any combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In an embodiment, the compound represented by Formula 201 may be represented by Formula 201A:

Formula 201A
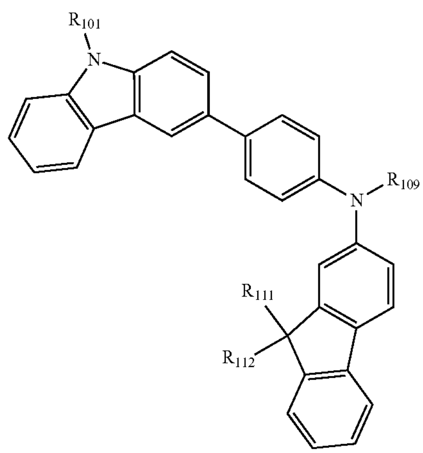
wherein, in Formula 201A, $R_{101}$, $R_{111}$, $R_{112}$, and $R_{109}$ are respectively the same as those described herein.
For example, the hole transport region may include one of Compounds HT1 to HT20 or any combination thereof:
HT1
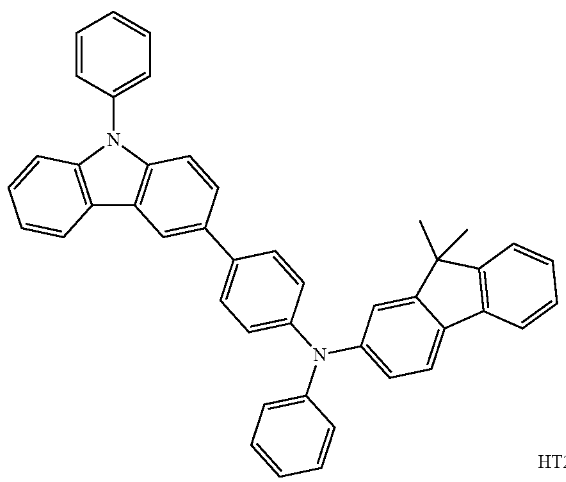
HT2
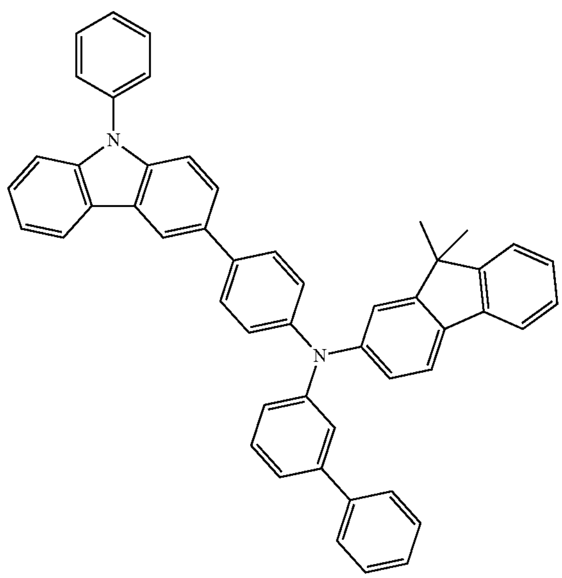
-continued
HT3
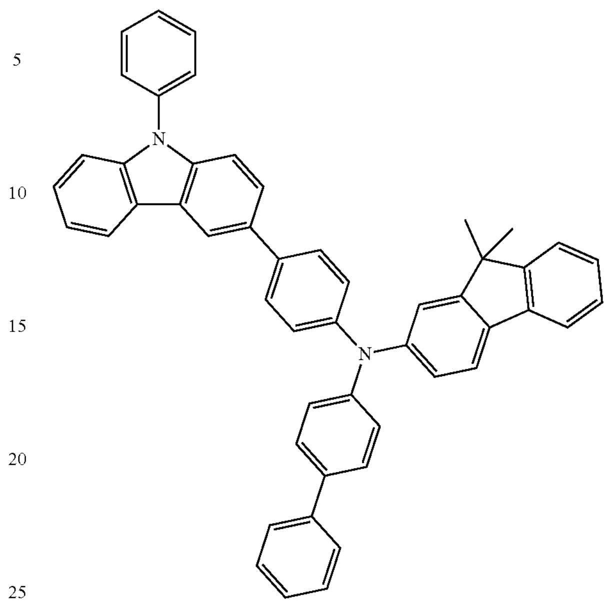
HT4
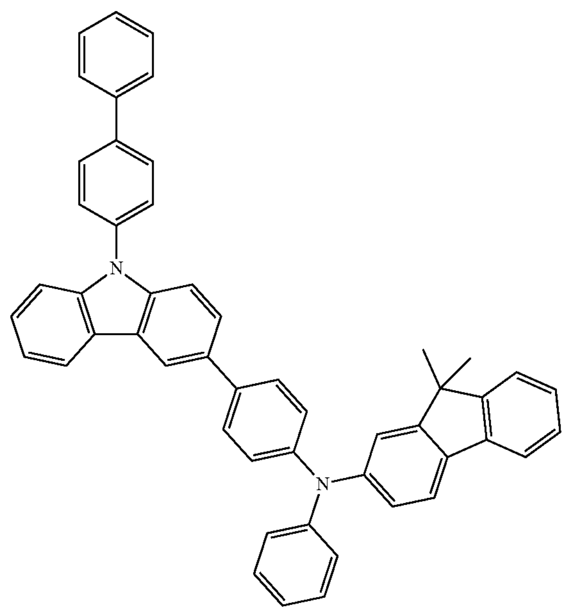

-continued
HT5
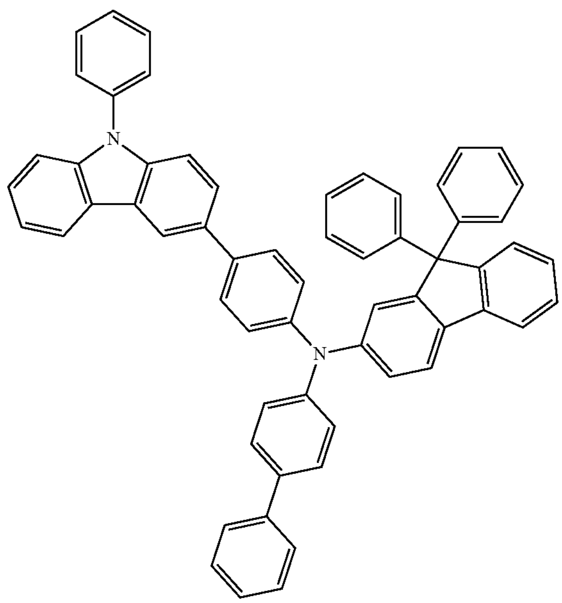
HT6
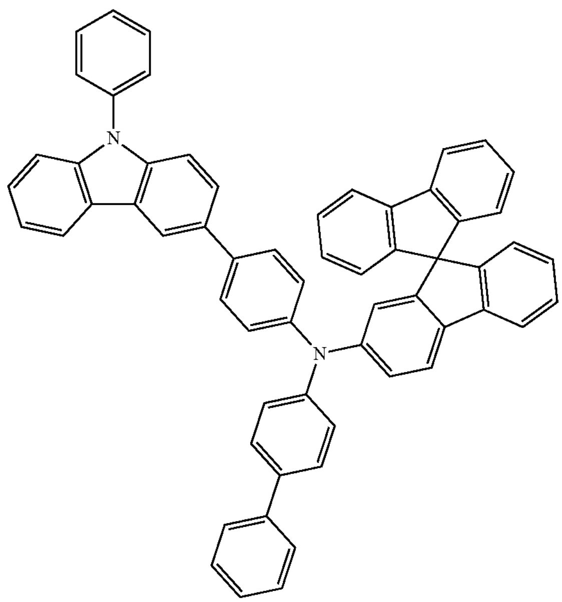
-continued
HT7
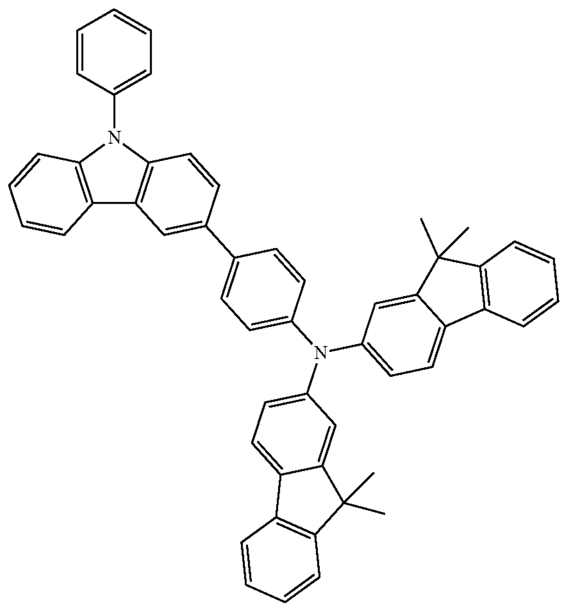
HT8
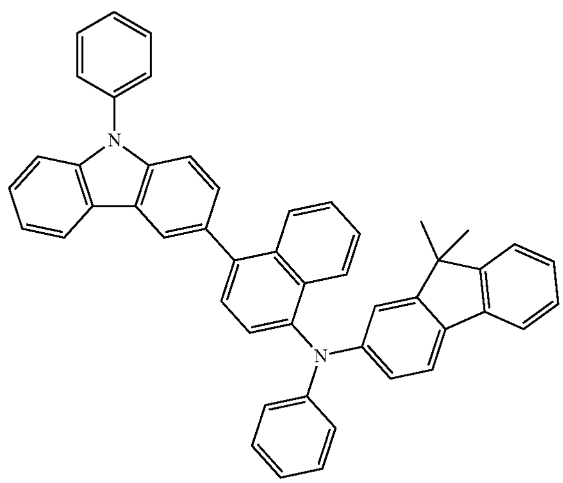
HT9
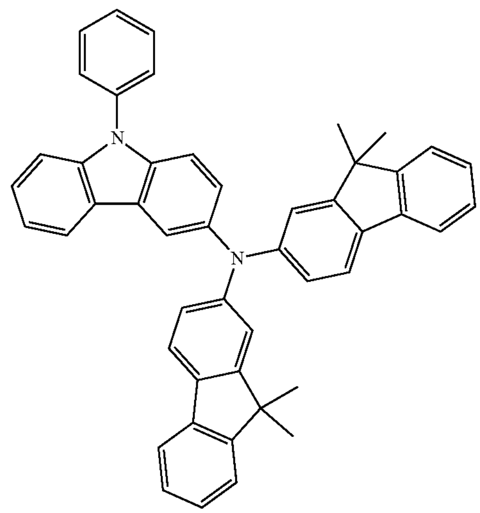

-continued
HT10
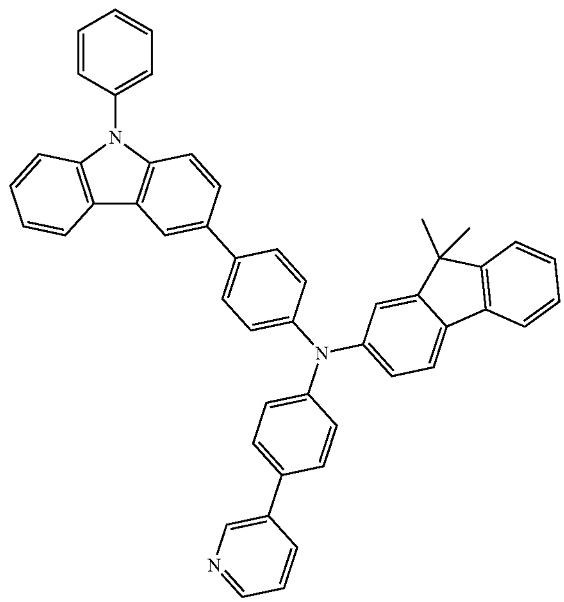
HT11
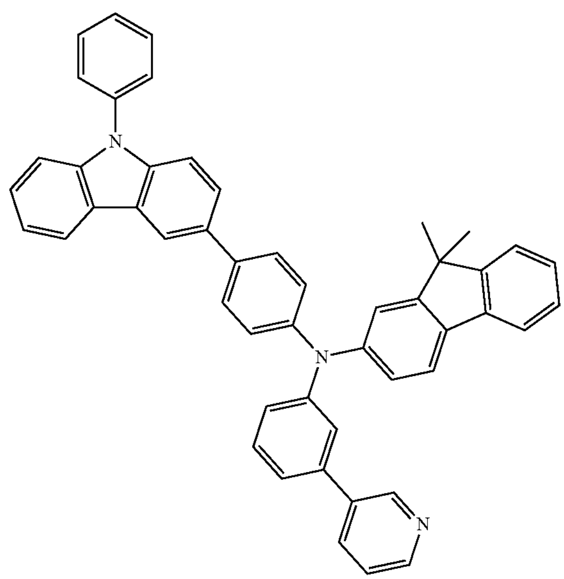
-continued
HT12
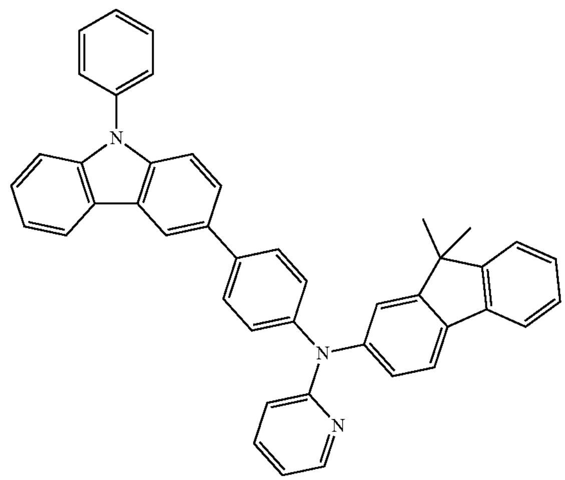
HT13
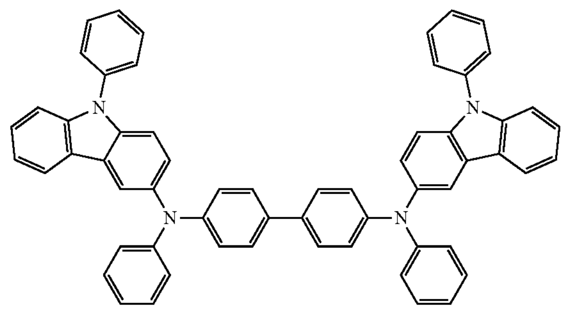
HT14
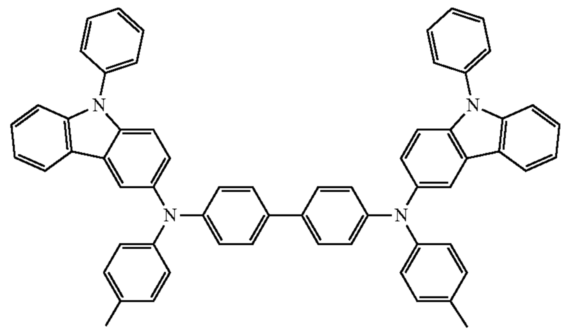
HT15
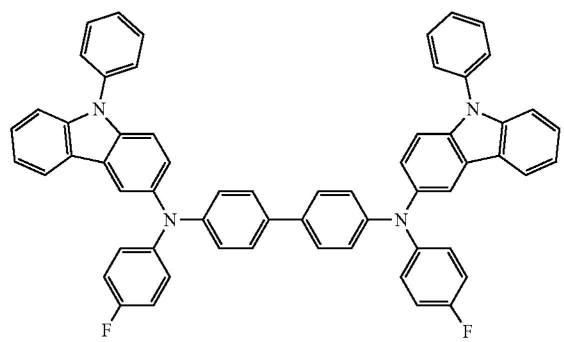

-continued

HT16

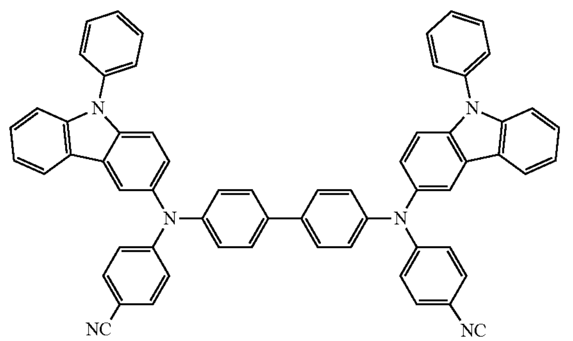

HT17

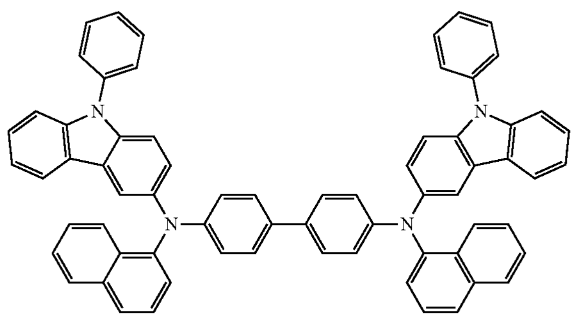

HT18

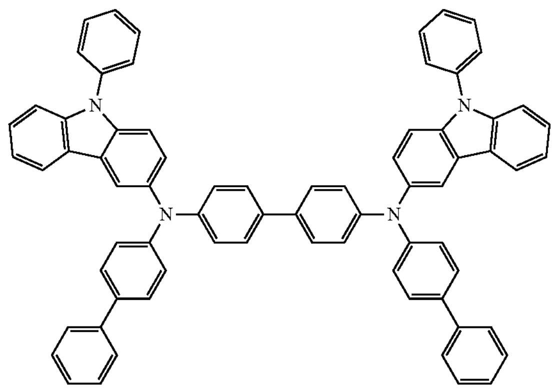

HT19

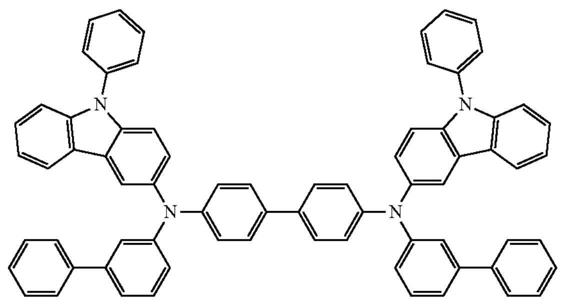

-continued

HT20

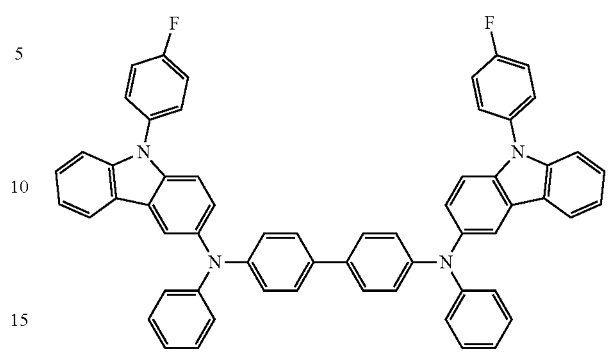

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within the ranges described above, satisfactory hole transporting characteristics may be obtained without a substantial increase in driving voltage.

The hole transport region may further include, in addition to the materials as described above, a charge-generation material for improving conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or any combination thereof, but embodiments of the present disclosure are not limited thereto. For example, non-limiting examples of the p-dopant are: a quinone derivative, such as tetracyanoquinonedimethane (TCNQ), 2,3,5,6-tetrafluoro-tetracyano-1,4-benzoquinonedimethane (F4-TCNQ), and F6-TCNQ; a metal oxide, such as a tungsten oxide and a molybdenum oxide; and a cyano group-containing compound, such as Compounds HT-D1 and F12, but embodiments of the present disclosure are not limited thereto:

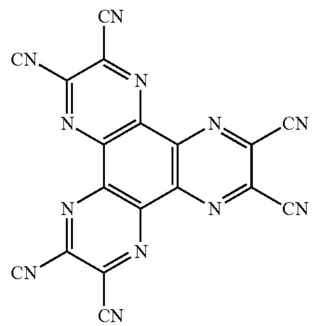

HT-D1

-continued

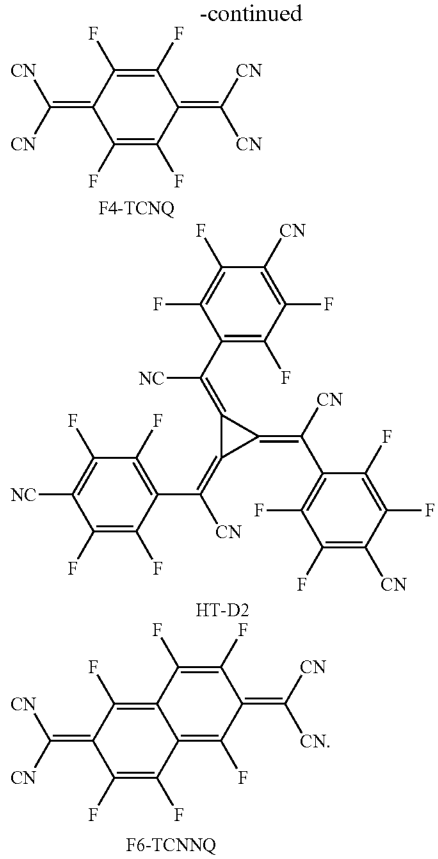

F4-TCNQ

HT-D2

F6-TCNNQ

The hole transport region may further include a buffer layer.

The buffer layer may compensate for an optical resonance distance according to a wavelength of light emitted from the emission layer to increase efficiency.

The emission layer may be formed on the hole transport region by using one or more suitable methods, such as vacuum deposition, spin coating, casting, and LB deposition. When the emission layer is formed by vacuum deposition or spin coating, the deposition or coating conditions may be similar to those applied in forming the hole injection layer although the deposition or coating conditions may vary according to a material that is used to form the hole transport layer.

The hole transport region may further include an electron blocking layer. The electron blocking layer may include a material available in the art, for example, mCP, but embodiments of the present disclosure are not limited thereto:

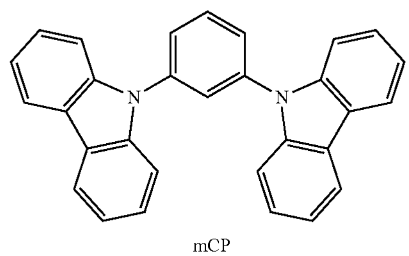

mCP

A thickness of the electron blocking layer may be in a range of about 50 Å to about 1,000 Å, for example, about 70 Å to about 500 Å. When the thickness of the electron blocking layer is within the range described above, satisfactory electron blocking characteristics may be obtained without a substantial increase in driving voltage.

When the organic light-emitting device 10 is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

The emission layer may include the organometallic compound represented by Formula 1.

The emission layer may include a host and a dopant, and the dopant may include the organometallic compound represented by Formula 1.

The host may include TPBi, TBADN, ADN (also referred to as "DNA"), CBP, CDBP, TCP, mCP, Compound H50, Compound H51, Compound H52, or any combination thereof:

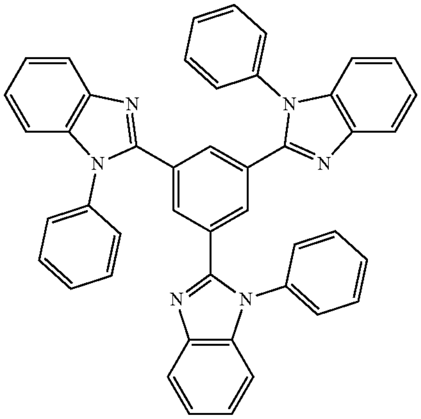

TPBi

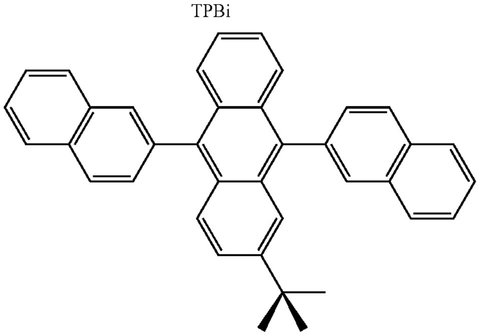

TBADN

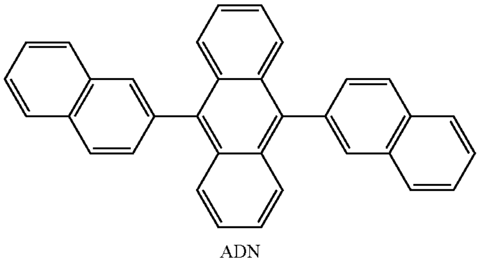

ADN

-continued

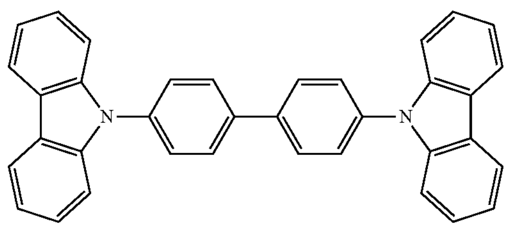

CBP

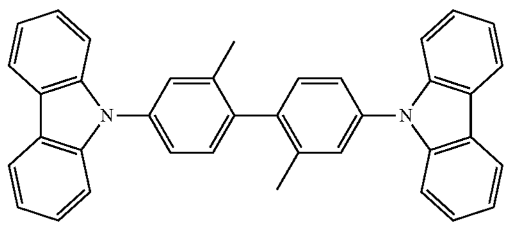

CDBP

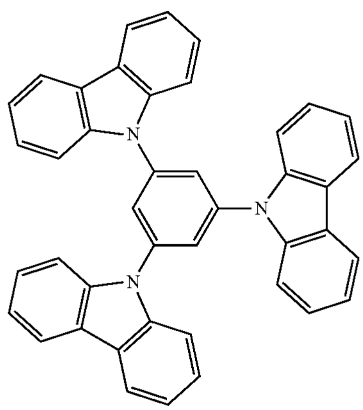

TCP

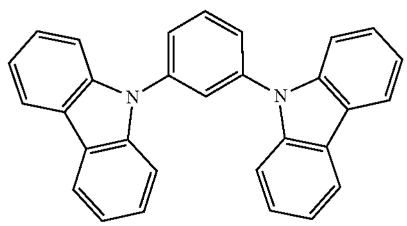

mCP

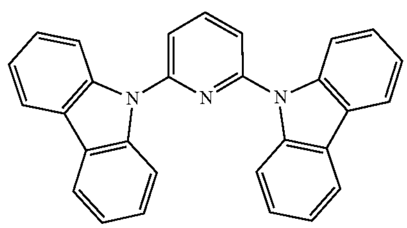

H50

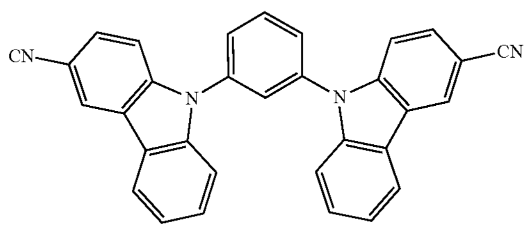

H51

-continued

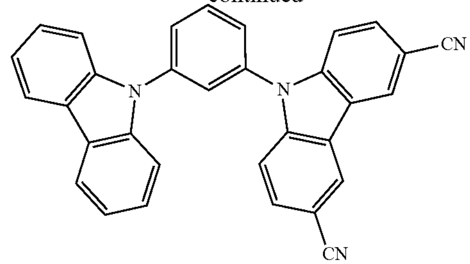

H52

In one or more embodiments, the host may further include a compound represented by Formula 301:

Formula 301

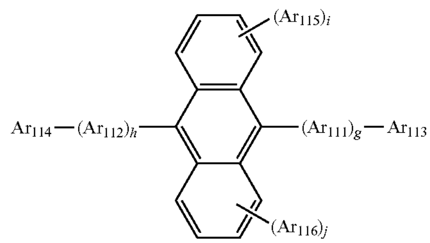

wherein, in Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, or a pyrenylene group, each substituted with a phenyl group, a naphthyl group, an anthracenyl group, or any combination thereof.

$Ar_{113}$ to $Ar_{116}$ in Formula 301 may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each substituted with a phenyl group, a naphthyl group, an anthracenyl group, or any combination thereof.

g, h, i, and j in Formula 301 may each independently be 0, 1, 2, 3, or 4, for example, 0, 1, or 2.

$Ar_{113}$ to $Ar_{116}$ in Formula 301 may each independently be:

a $C_1$-$C_{10}$ alkyl group substituted with a phenyl group, a naphthyl group, an anthracenyl group, or any combination thereof;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, or a fluorenyl group, each substituted with deuterium, —F, —Br, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, or any combination thereof; or

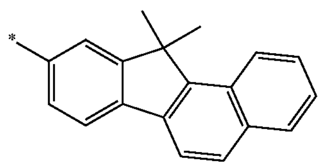

but embodiments of the present disclosure are not limited thereto.

In one or more embodiments, the host may include a compound represented by Formula 302:

Formula 302

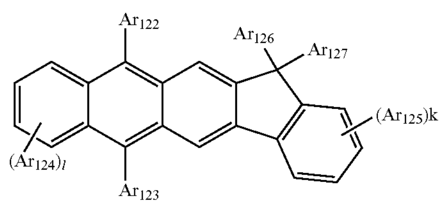

wherein, in Formula 302, $Ar_{122}$ to $Ar_{125}$ are each the same as described in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer of 0, 1, 2, 3, or 4. For example, k and l may each be 0, 1, or 2.

When the organic light-emitting device 10 is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 part by weight to about 20 parts by weight based on 100 parts by weight of the emission layer, but embodiments of the present disclosure are not limited thereto. When the amount of the dopant satisfies the above range, it may be possible to realize emission without extinction phenomenon.

In an embodiment, the organic layer of the organic light-emitting device 10 may further include, in addition to the organometallic compound represented by Formula 1, a fluorescent dopant.

For example, the fluorescent dopant may be a condensed polycyclic compound, a styryl-based compound, or any combination thereof.

In an embodiment, the fluorescent dopant may include a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a group represented by one of Formulae 501-1 to 501-21, or any combination thereof:

501-1

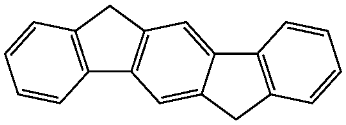

501-2

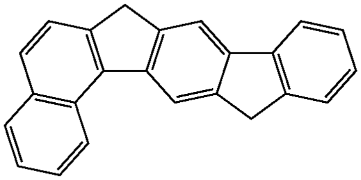

501-3

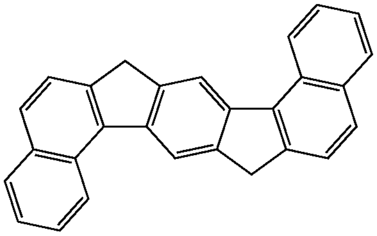

501-4

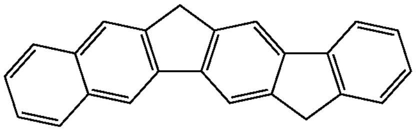

501-5

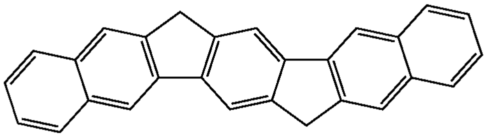

501-6

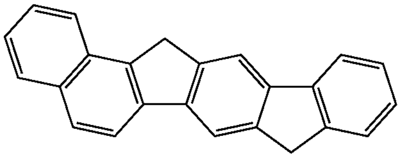

501-7

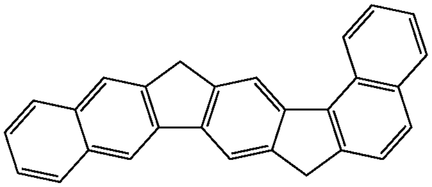

501-8

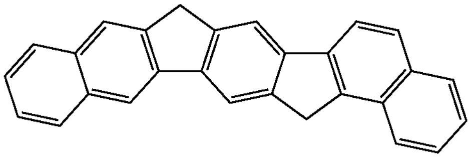

501-9

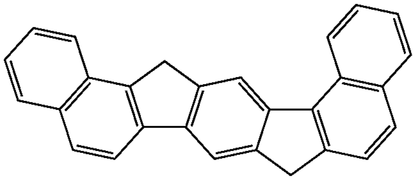

-continued 501-10

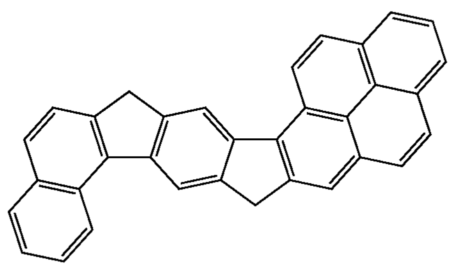

501-11

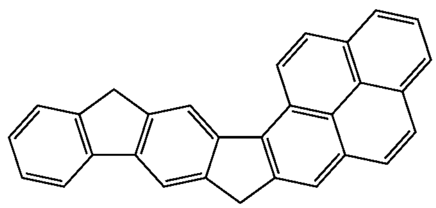

501-12

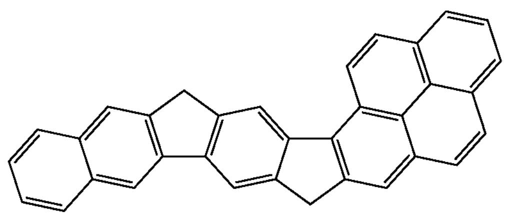

501-13

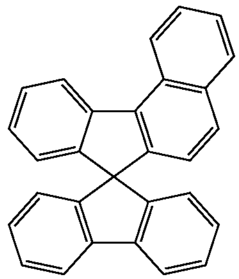

501-14

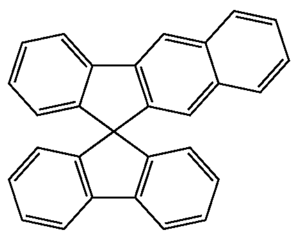

501-15

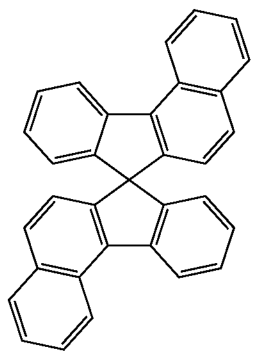

-continued 501-16

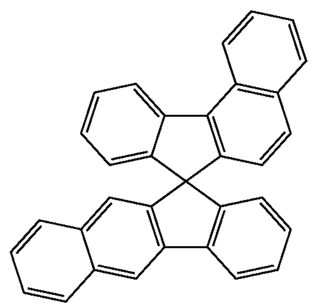

501-17

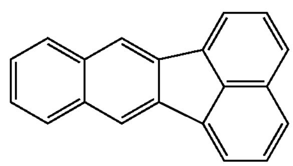

501-18

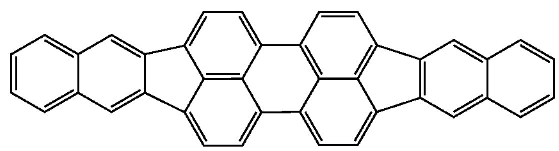

501-19

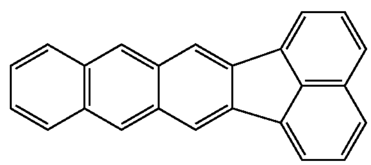

501-20

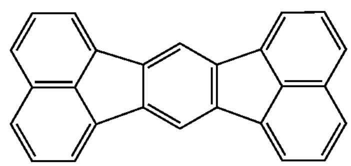

501-21

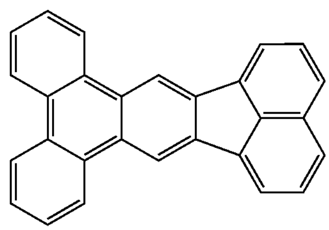

.

In an embodiment, the fluorescent dopant may be a compound represented by Formula 501:

Formula 501

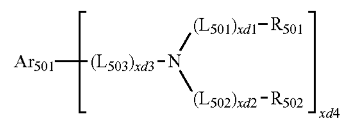

wherein, in Formula 501, $Ar_{501}$ may be: a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-21; or a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene indenoanthracene group, a tetracene group, a bisanthracene group, or a group represented by one of Formulae 501-1 to 501-21, each substituted with deuterium, —F, —Cl, —Br, —I, a hydroxyl group, a cyano group, a nitro group, an amino group, an am idino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si$(Q_{501})(Q_{502})(Q_{503})$ (wherein $Q_{501}$ to $Q_{503}$ may each independently be hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group), or any combination thereof, $L_{501}$ to $L_{503}$ may each independently be a substituted or unsubstituted cycloalkylene group, a substituted or unsubstituted heterocycloalkylene group, a substituted or unsubstituted $C_3$-$C_{10}$ cycloalkenylene group, a substituted or unsubstituted heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $R_{501}$ and $R_{502}$ may each independently be:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or any combination thereof, xd1 to xd3 may each independently be 0, 1, 2, or 3, and xd4 may be 0, 1, 2, 3, 4, 5, or 6.

For example, $Ar_{501}$ in Formula 501 may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-21; or a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-21, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a dibenzofuranyl group, a dibenzothiophenyl group, a carbazolyl group, a pyridinyl group, a pyrimidinyl group, a triazinyl group, a quinolinyl group, an isoquinolinyl group, —Si$(Q_{501})(Q_{502})(Q_{503})$ (wherein $Q_{501}$ to $Q_{503}$ may each independently be hydrogen, a $C_1$-$C_{20}$ alkyl group, a $C_1$-$C_{20}$ alkoxy group, a phenyl group, a biphenyl group, a terphenyl group, or a naphthyl group), or any combination thereof, $L_{501}$ to $L_{503}$ are each the same as described in connection with $L_{21}$, xd1 to xd3 may each independently be 0, 1, or 2, and xd4 may be 0, 1, 2, or 3, but embodiments of the present disclosure are not limited thereto.

The fluorescent dopant may include, for example, one of Compounds FD(1) to FD(16), Compounds FD1 to FD16, or any combination thereof:

FD(1)
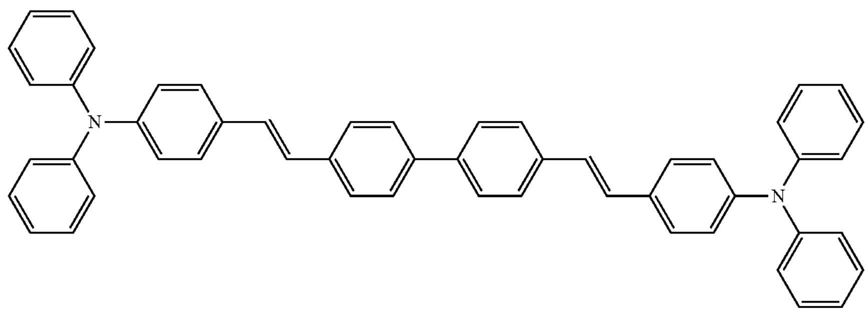
FD(2)
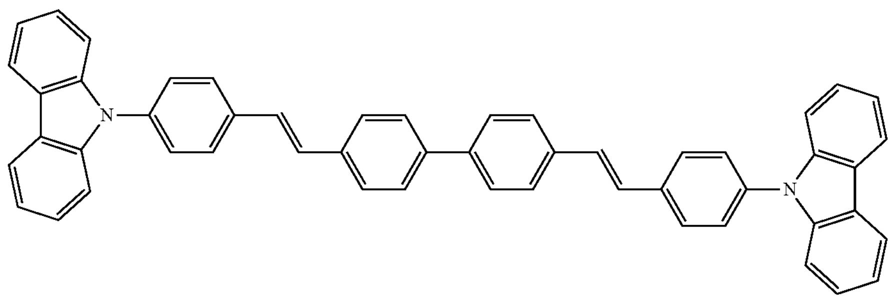
FD(3)
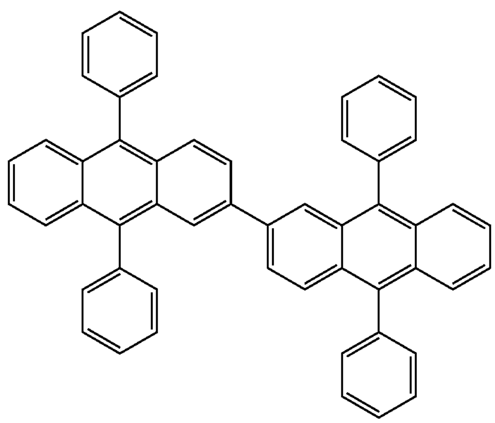
FD(4)
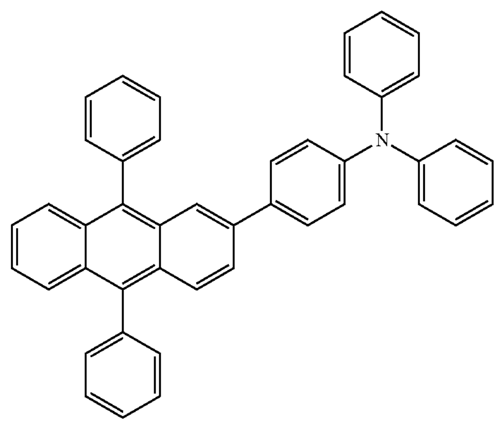
FD(5)
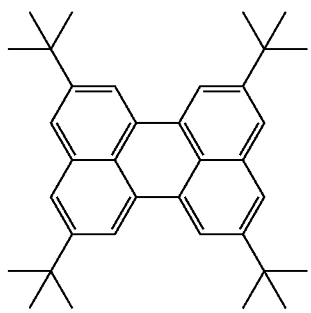
FD(6)
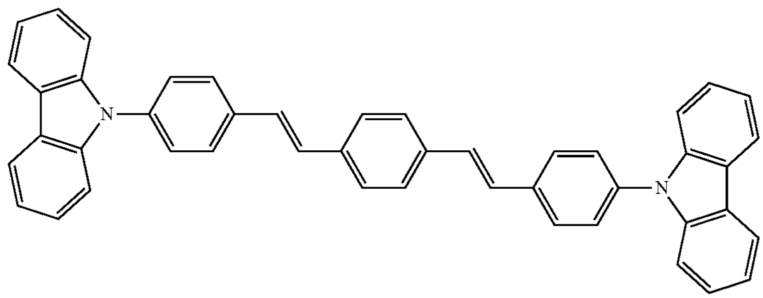

-continued
FD(7)
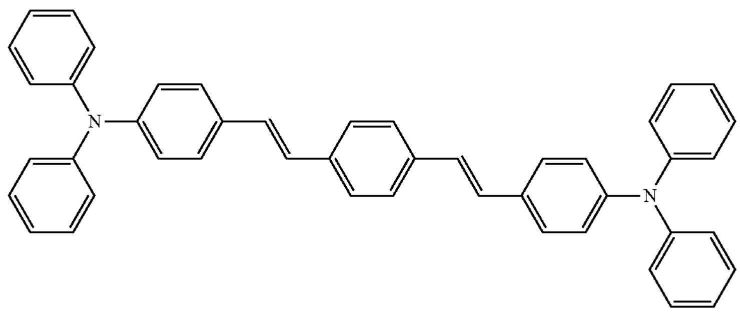
FD(8)
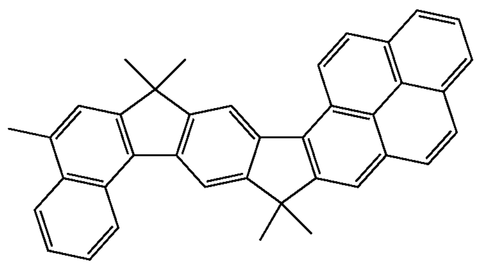
FD(9)
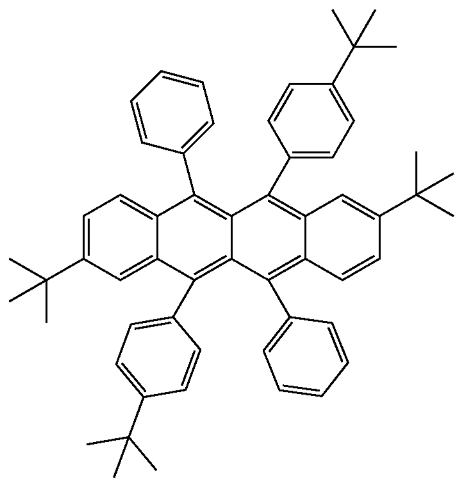
FD(10)
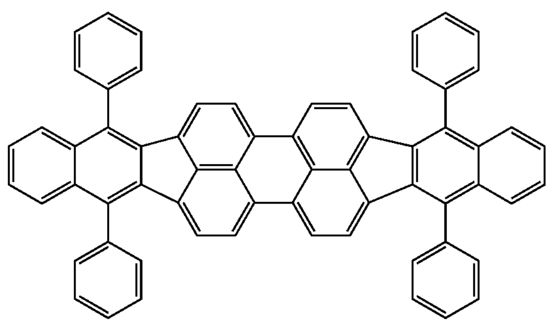
FD(11)
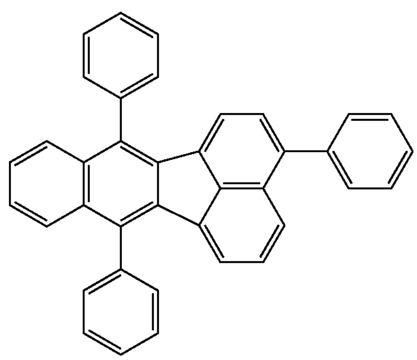
FD(12)
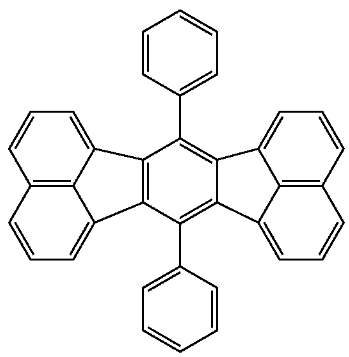
FD(13)
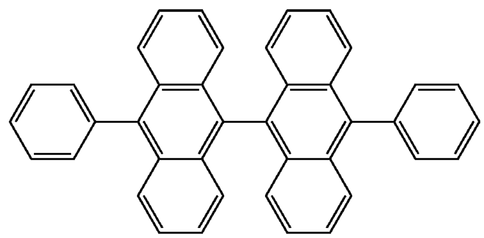

-continued
FD(14)
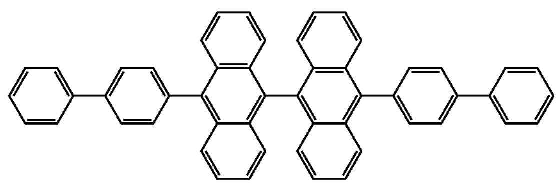
FD(15)
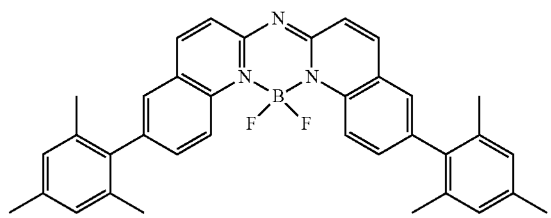
FD(16)
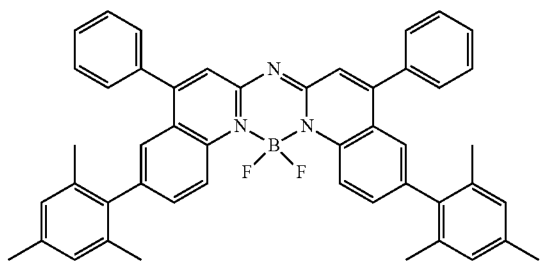
FD1
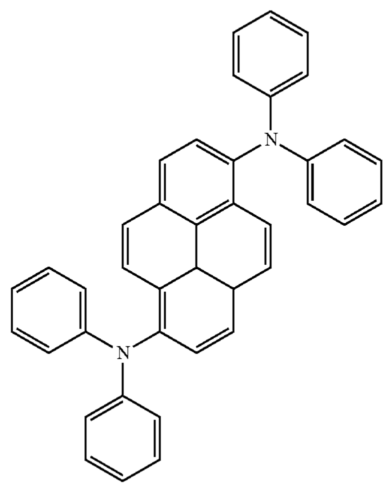
FD2
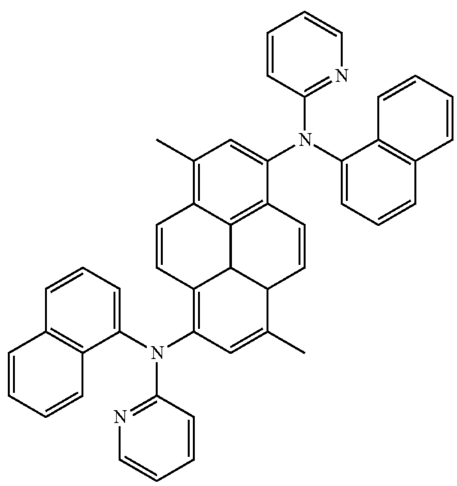
FD3
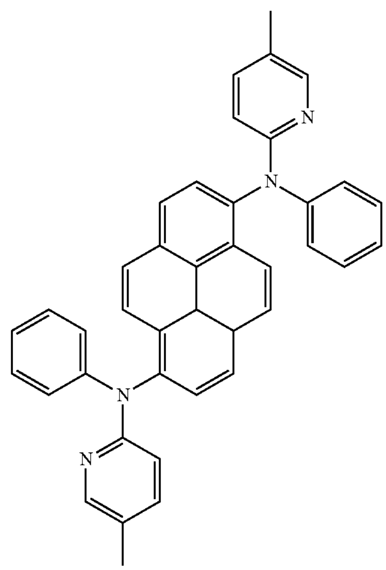

-continued
FD4
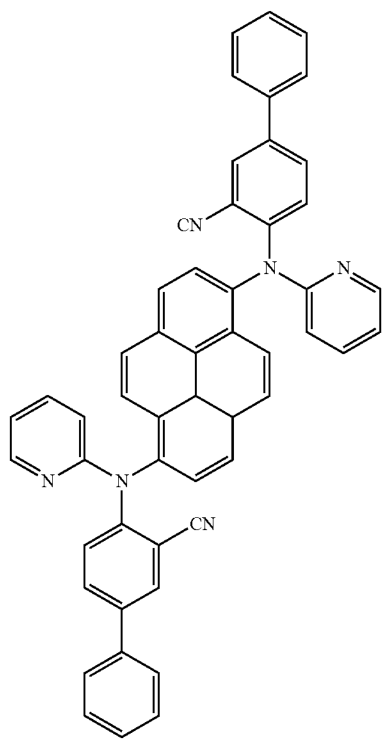
FD5
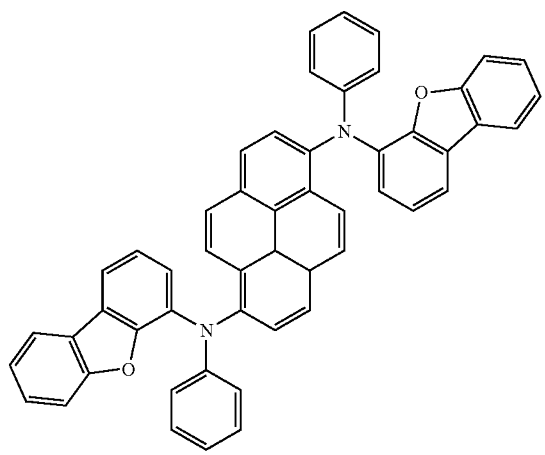
FD6
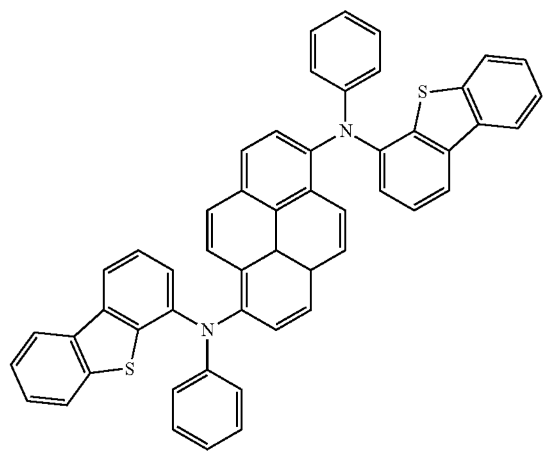
FD7
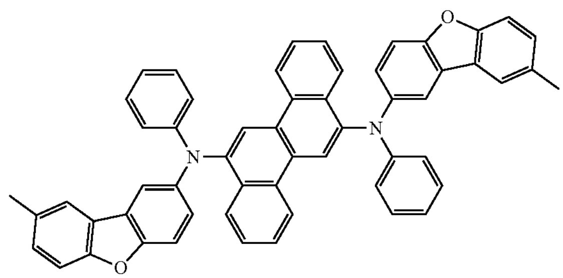
FD8
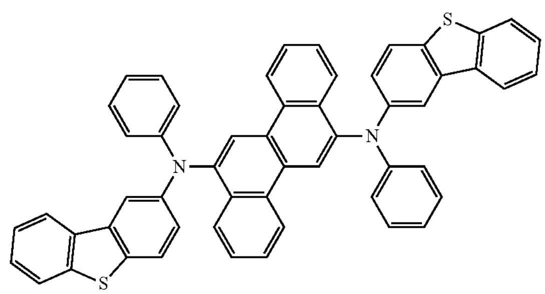
FD9
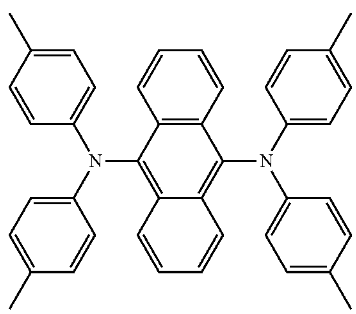

-continued
FD10
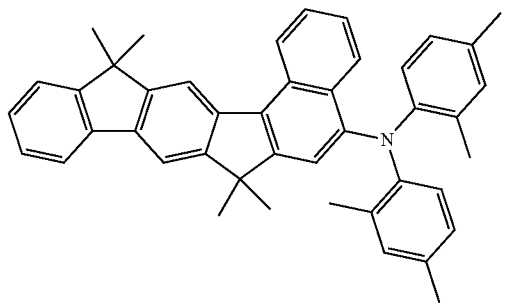
FD11
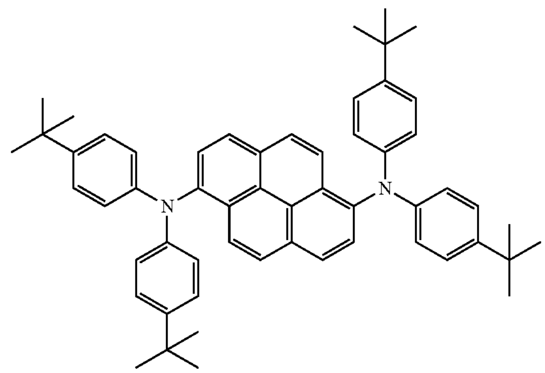
FD12
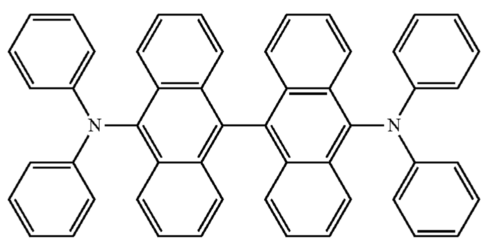
FD13
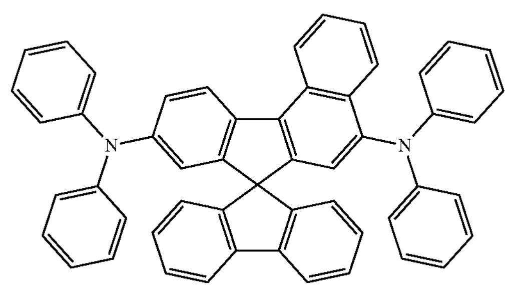
FD14
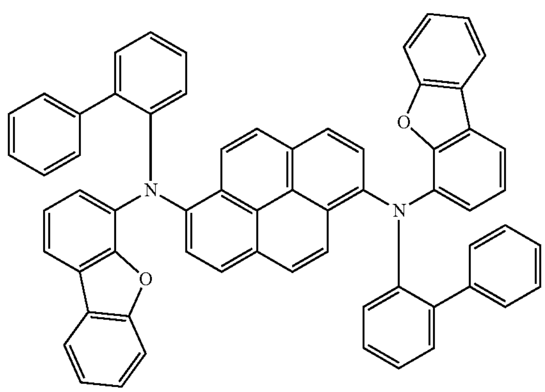
FD15
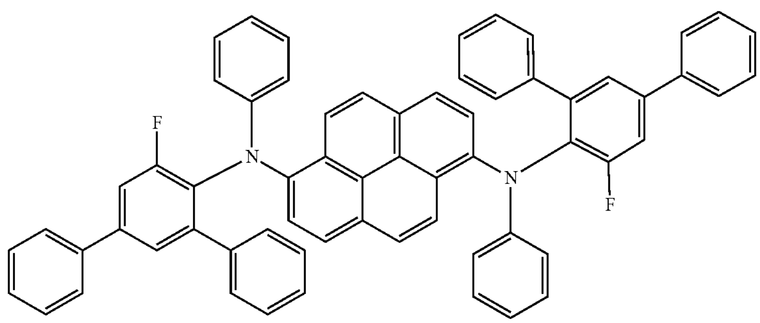

-continued

FD16

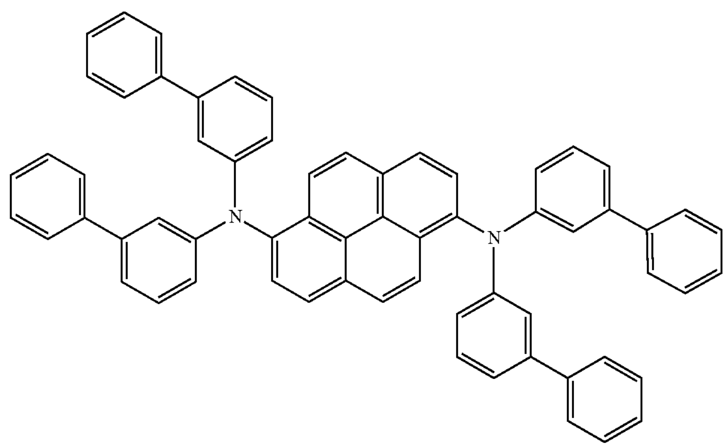

A thickness of the emission layer may be in a range of about 100 Å to about 1,000 Å, for example, about 200 Å to about 600 Å. When the thickness of the emission layer is within the range described above, excellent light-emission characteristics may be obtained without a substantial increase in driving voltage.

Next, the electron transport region is arranged on the emission layer.

The electron transport region may include at least one of a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be the same as the conditions for forming the hole injection layer.

When the electron transport region includes a hole blocking layer, the hole blocking layer may include, for example, at least one of BCP and Bphen, but embodiments of the present disclosure are not limited thereto:

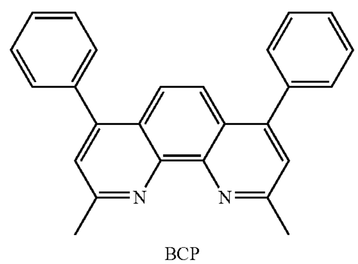

BCP

-continued

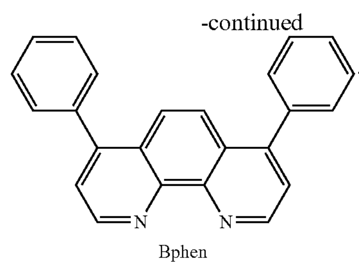

Bphen

A thickness of the hole blocking layer may be in a range of about 20 Å to about 1,000 Å, for example, about 30 Å to about 300 Å. When the thickness of the hole blocking layer is within the range described above, excellent hole blocking characteristics may be obtained without a substantial increase in driving voltage.

The electron transport layer may include BCP, Bphen, TPBi, $Alq_3$, BAlq, TAZ, NTAZ, or any combination thereof:

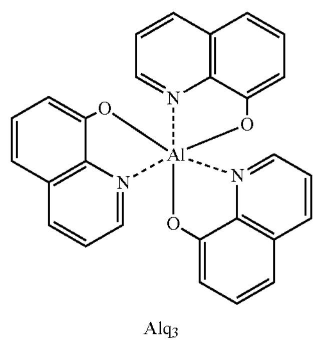

$Alq_3$

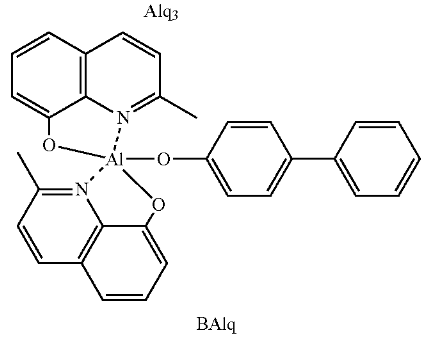

BAlq

-continued
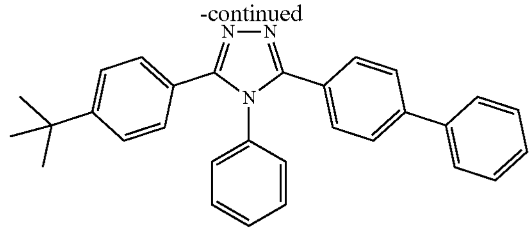
TAZ
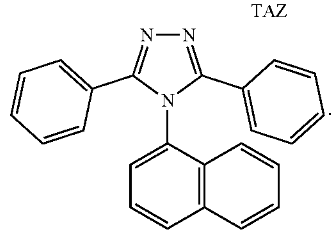
NTAZ
In one or more embodiments, the electron transport layer may include at least one of Compounds ET1 to ET25, but embodiments of the present disclosure are not limited thereto:
ET1
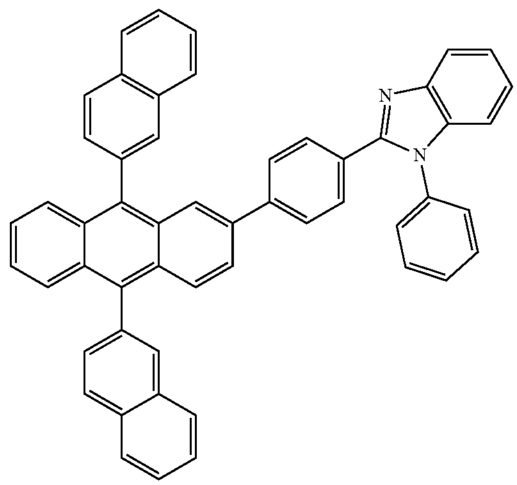
ET2
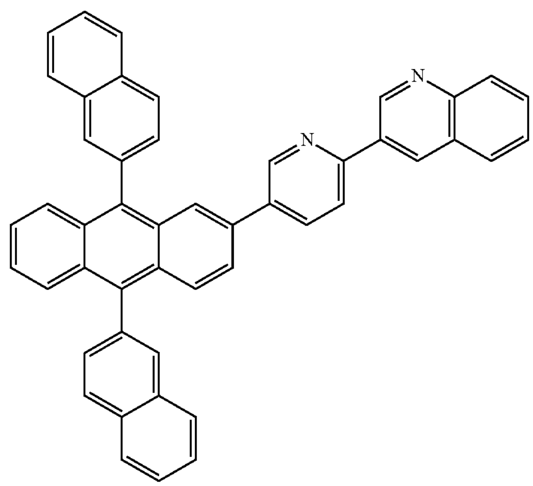
-continued
ET3
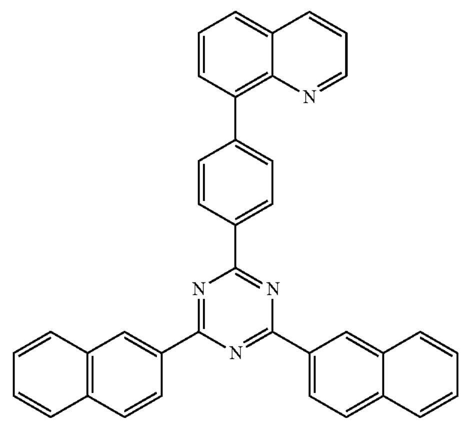
ET4
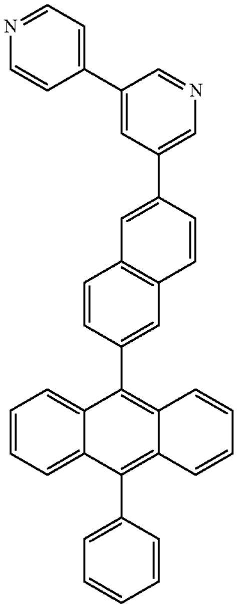
ET5
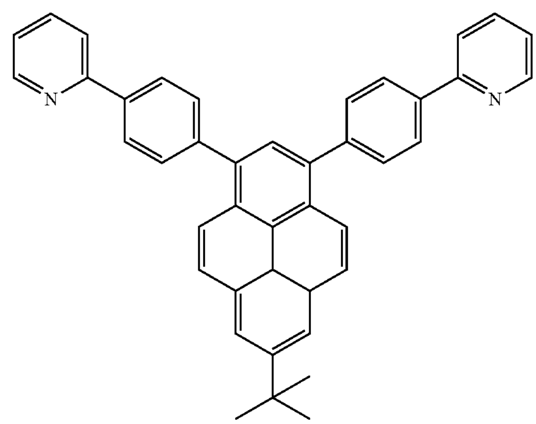

-continued
ET6
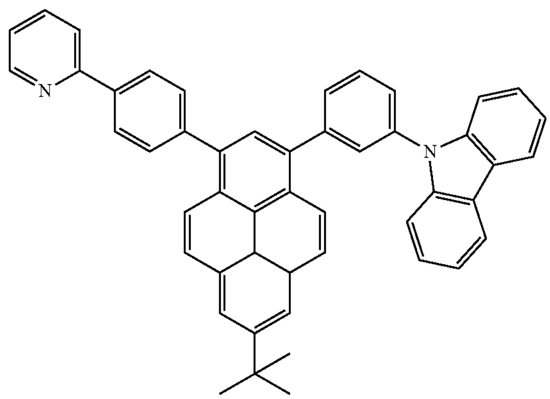
ET7
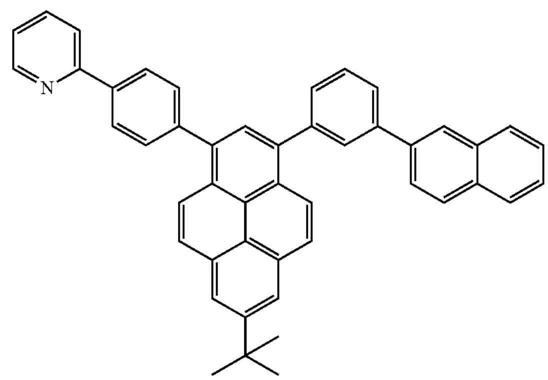
ET8
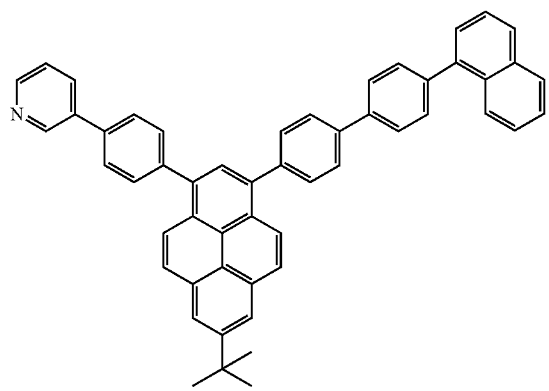
-continued
ET9
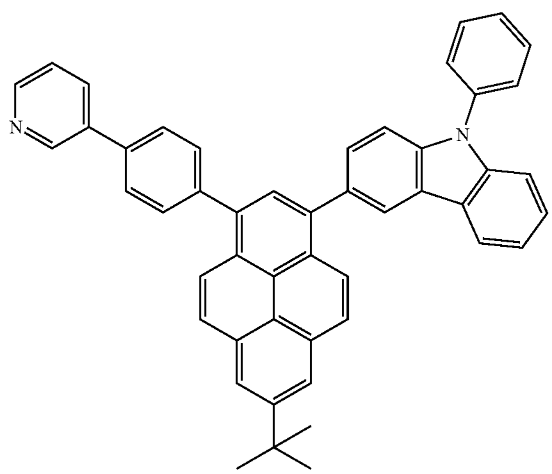
ET10
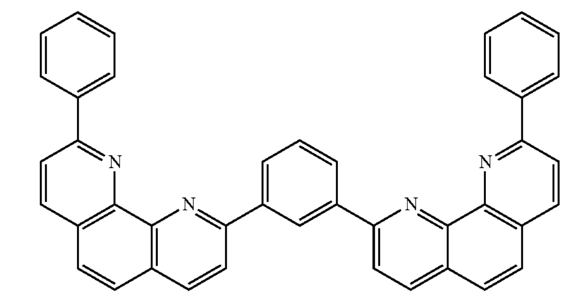
ET11
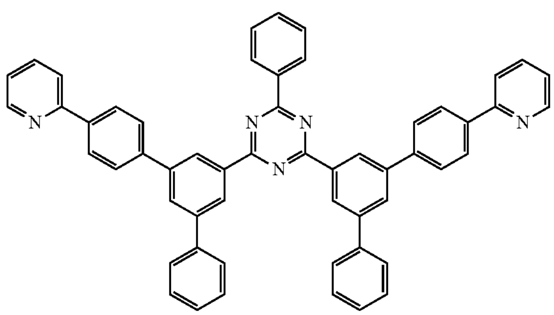
ET12

-continued
ET13
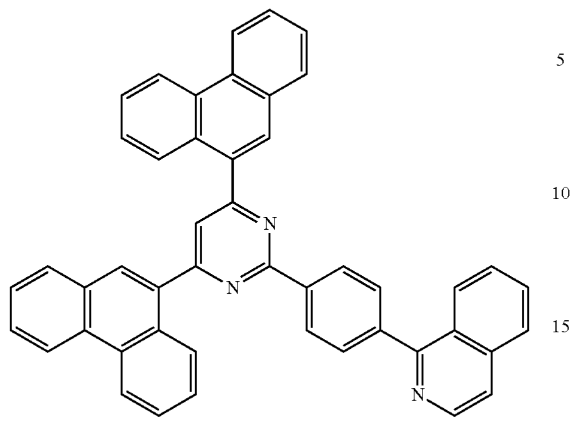
ET14
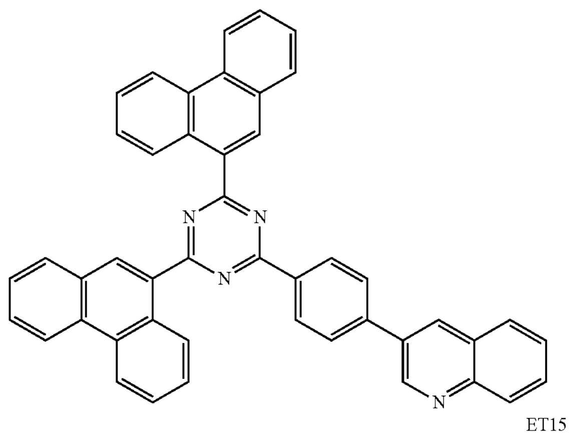
ET15
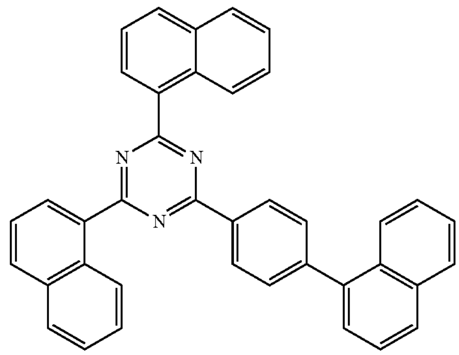
ET16
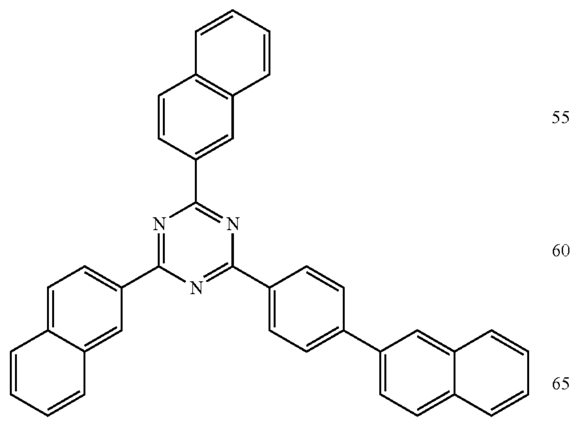
-continued
ET17
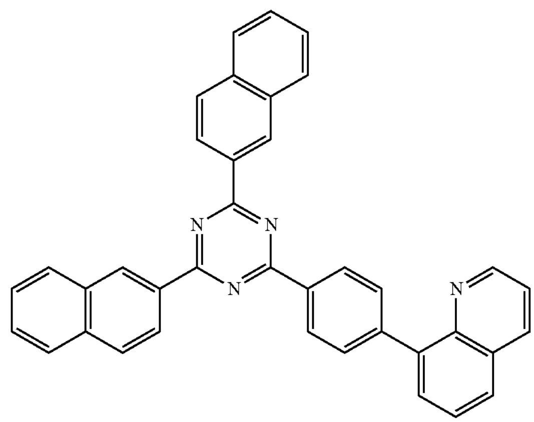
ET18
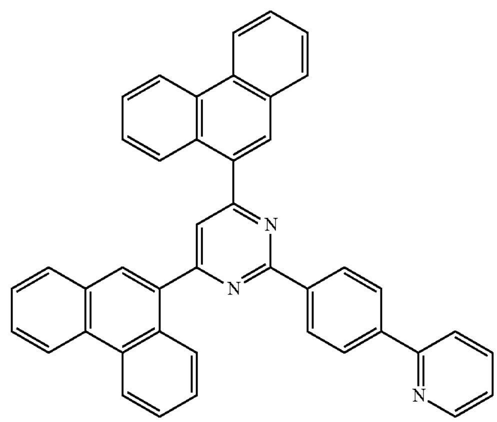
ET19
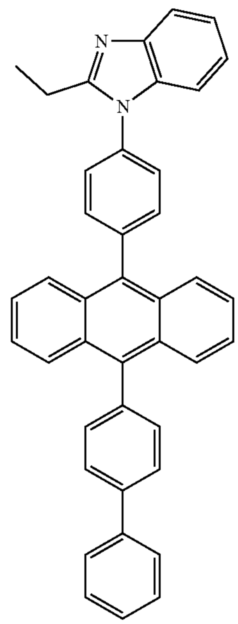

-continued
ET20
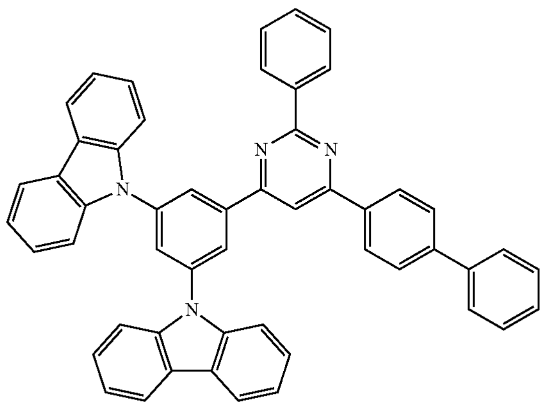
ET21
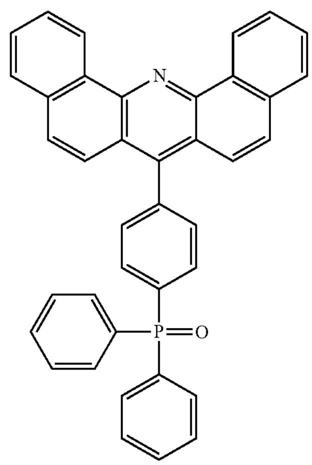
ET22
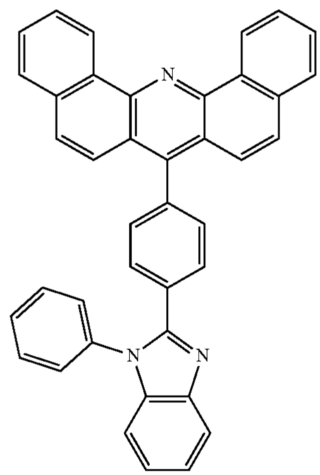
-continued
ET23
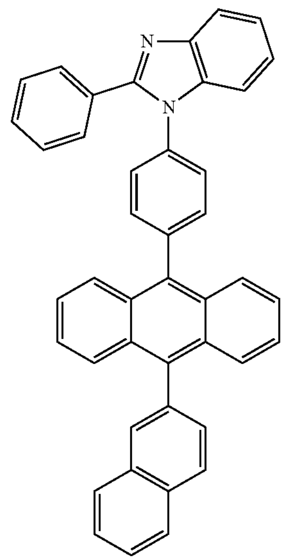
ET24
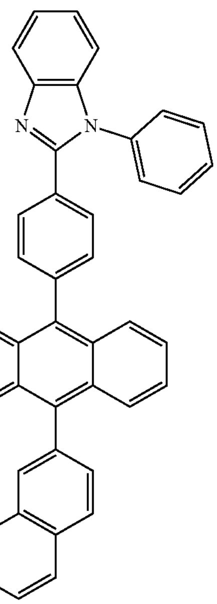
ET25
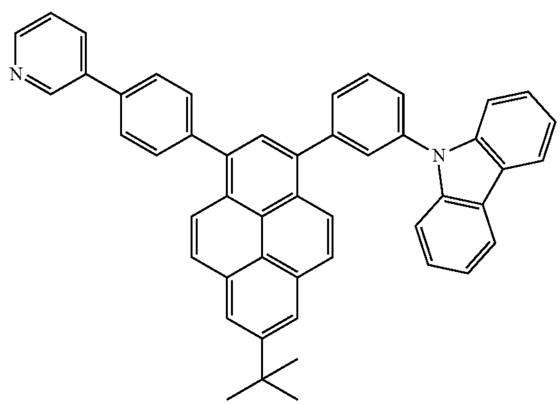
A thickness of the electron transport layer may be in a range of about 100 Å to about 1,000 Å, for example, about 150 Å to about 500 Å. When the thickness of the electron transport layer is within the range described above, satisfactory electron transporting characteristics may be obtained without a substantial increase in driving voltage.

The electron transport layer may further include, in addition to the materials described above, a metal-containing material.

The metal-containing material may include a Li complex. The Li complex may include, for example, Compound ET-D1 (lithium quinolate, LiQ) or ET-D2:

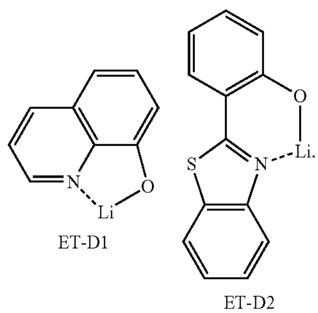

ET-D1 ET-D2

The electron transport region may include an electron injection layer that facilitates injection of electrons from the second electrode 19.

The electron injection layer may include at least one selected from LiQ, LiF, NaCl, CsF, $Li_2O$, BaO, or any combination thereof.

A thickness of the electron injection layer may be in a range of about 1 Å to about 100 Å, for example, about 3 Å to about 90 Å. When the thickness of the electron injection layer is within the range described above, satisfactory electron injection characteristics may be obtained without a substantial increase in driving voltage.

The second electrode 19 is arranged on the organic layer 15. The second electrode 19 may be a cathode. A material for forming the second electrode 19 may be a metal, an alloy, an electrically conductive compound, or a combination thereof, which has a relatively low work function. For example, the material for forming the second electrode 19 may be lithium (Li), magnesium (Mg), aluminum (Al), aluminum-lithium (Al—Li), calcium (Ca), magnesium-indium (Mg—In), or magnesium-silver (Mg—Ag). In one or more embodiments, to manufacture a top-emission type light-emitting device, a transmissive electrode formed using ITO or IZO may be used as the second electrode 19.

Hereinbefore, the organic light-emitting device 10 has been described with reference to FIG. 1, but embodiments of the present disclosure are not limited thereto.

Another aspect of the present disclosure provides a diagnostic composition including at least one organometallic compound represented by Formula 1.

Since the organometallic compound represented by Formula 1 provides high luminescence efficiency, the diagnostic composition including the organometallic compound represented by Formula 1 may have high diagnostic efficiency.

The diagnostic composition may be used in various applications, such as a diagnosis kit, a diagnosis reagent, a biosensor, and a biomarker.

Explanation of Terms

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, P, Si, B, Te, Se, Ge, S, or any combination thereof as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that includes 3 to 10 carbon atoms and at least one carbon-carbon double bond in the ring thereof and has no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, B, Te, Se, Ge, S, or any combination thereof as a ring-forming atom, 1 to 10 carbon atoms, and at least one carbon-carbon double bond in the ring thereof. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group that includes a carbocyclic aromatic system having 6 to 60 carbon atoms, and the term "$C_6$-$C_{60}$ arylene group" as used herein refers to a divalent group that includes a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, Si, B, Te, Se, Ge, S, or any combination thereof as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, and S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_6$-$C_{60}$ aryloxy group" as used herein refers to $—OA_{102}$ (wherein $A_{102}$ is the $C_6$-$C_{60}$ aryl group), and the term "$C_6$-$C_{60}$ arylthio group" as used herein refers to $—SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed with each other, a heteroatom selected from N, O, P, Si, B, Te, Se, Ge, S, or any combination thereof, other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group.

The term "$C_1$-$C_{30}$ heterocyclic group" as used herein refers to a saturated or unsaturated cyclic group including 1 to 30 carbon atoms and at least one heteroatom selected from N, O, P, Si, B, Te, Se, Ge, S, or any combination thereof as ring-forming atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, and $—P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, or any combination thereof; or —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), or —P(═O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ described herein may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

As used herein, the number of carbons in each group that is substituted (e.g., $C_1$-$C_{60}$) excludes the number of carbons in the substituent. For example, a $C_1$-$C_{60}$ alkyl group can be substituted with a $C_1$-$C_{60}$ alkyl group. The total number of carbons included in the $C_1$-$C_{60}$ alkyl group substituted with the $C_1$-$C_{60}$ alkyl group is not limited to 60 carbons. In addition, more than one $C_1$-$C_{60}$ alkyl substituent may be present on the $C_1$-$C_{60}$ alkyl group. This definition is not limited to the $C_1$-$C_{60}$ alkyl group and applies to all substituted groups that recite a carbon range.

The term "room temperature" as used herein refers to a temperature of about 25° C.

The terms "a biphenyl group, a terphenyl group, and a tetraphenyl group" as used herein respectively refer to monovalent groups in which two, three, or four phenyl groups are linked together via a single bond.

Hereinafter, a compound and an organic light-emitting device according to an embodiment will be described in detail with reference to Synthesis Examples and Examples. However, the present disclosure is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 2

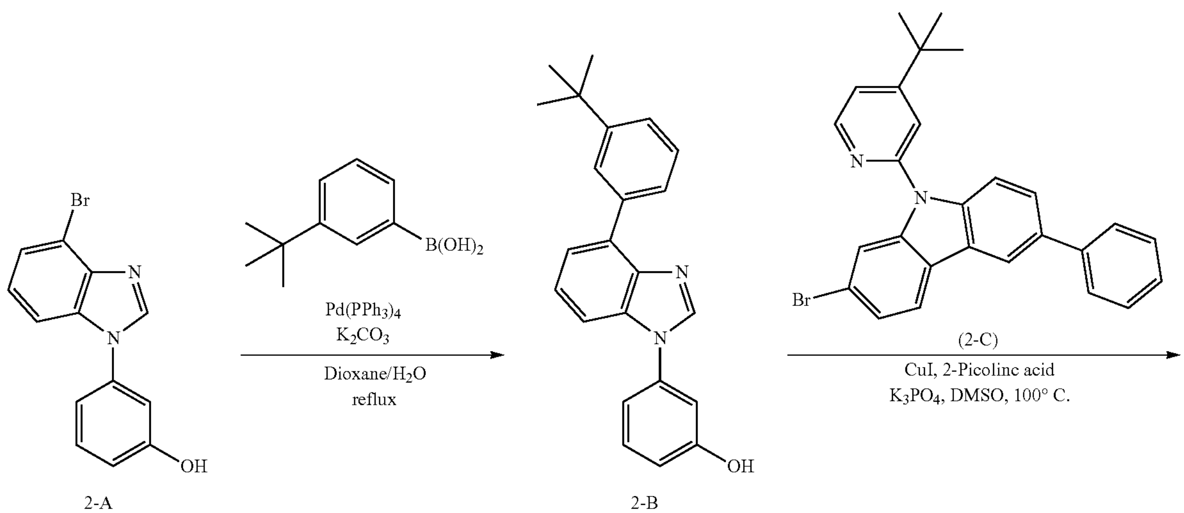

2-A

2-B

-continued

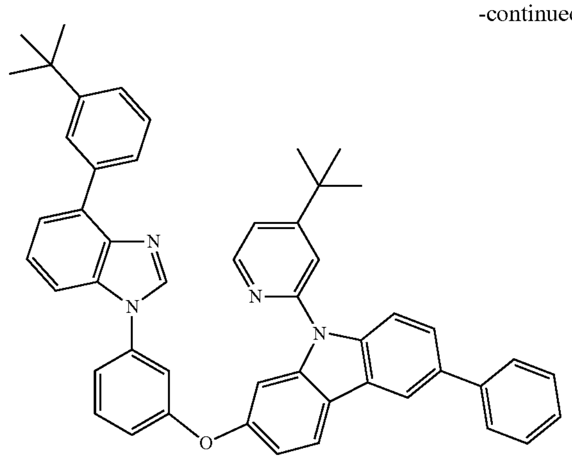

2-D

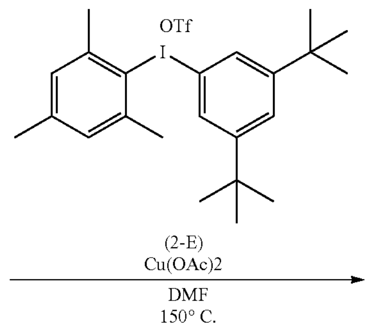

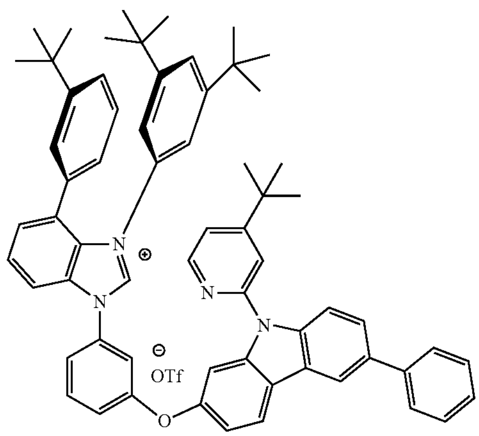

2-F

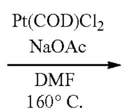

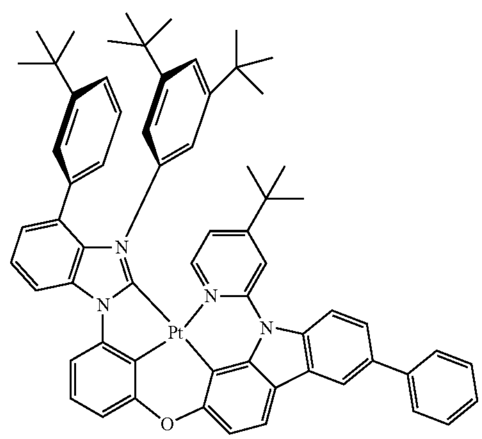

2

Synthesis of [Compound 2-B]

Compound 2-A (10.0 g, 34.6 mmol), 3-tert-butylphenyl boronic acid (8.00 g, 45.0 mmol), $Pd(PPh_3)_4$ (4.00 g, 3.46 mmol), and $K_2CO_3$ (14.3 g, 104 mmol) were placed in a round-bottom flask and then mixed with 1,4-dioxane/$H_2O$ (90 mL/30 mL). The resultant reaction solution was stirred under reflux at 110° C. for 12 hours. After completion of the reaction, the temperature was lowered to room temperature, and then, ethyl acetate and a saturated aqueous ammonium chloride solution were added to the reaction solution. An organic solution layer was extracted therefrom using ethyl acetate, dried using anhydrous $MgSO_4$, and then filtered. The filtrate was concentrated and purified through silica gel column chromatography to obtain 5.0 g (yield of 42%) of Compound 2-B.

HPLC-MS: 343.17 $[M+H]^+$

Synthesis of [Compound 2-D]

Compound 2-B (5.00 g, 14.6 mmol), Compound 2-C (7.31 g, 16.1 mmol), CuI (0.83 g, 4.38 mmol), 2-picolinic acid (2.70 g, 21.9 mmol), and $K_3PO_4$ (12.4 g, 58.4 mmol) were placed in a round-bottom flask and then mixed with dimethyl sulfoxide (DMSO) (150 mL). The resultant reaction solution was stirred under reflux at 100° C. for 12 hours. After completion of the reaction, the temperature was lowered to room temperature, and then, ethyl acetate and a saturated aqueous ammonium chloride solution were added to the reaction solution. An organic solution layer was extracted therefrom using ethyl acetate, dried using anhydrous $MgSO_4$, and then filtered. The filtrate was concentrated and purified through silica gel column chromatography to obtain 6.8 g (yield of 65%) of Compound 2-D.

HPLC-MS: 717.36 $[M+H]^+$

Synthesis of [Compound 2-F]

Compound 2-D (6.80 g, 9.48 mmol), Compound 2-E (8.32 g, 14.2 mmol), and $Cu(OAc)_2$ (0.34 g, 1.90 mmol) were placed in a round-bottom flask and then mixed with dimethylformamide (DMF) (50 mL). The resultant reaction solution was stirred under reflux at 150° C. for 12 hours. After completion of the reaction, the temperature was lowered to room temperature, and then, ethyl acetate and a saturated aqueous ammonium chloride solution were added to the reaction solution. An organic solution layer was extracted therefrom using ethyl acetate, dried using anhydrous $MgSO_4$, and then filtered. The filtrate was concentrated and purified through silica gel column chromatography to obtain 5.6 g (yield of 56%) of Compound 2-F.

HPLC-MS: 905.51 $[M-OTf]^+$

Synthesis of [Compound 2]

Compound 2-F (5.60 g, 5.31 mmol), $Pt(COD)Cl_2$ (1.99 g, 5.31 mmol), and NaOAc (1.31 g, 15.9 mmol) were placed in a round-bottom flask and then mixed with DMF (90 mL). The resultant reaction solution was stirred under reflux at 160° C. for 12 hours. After completion of the reaction, the temperature was lowered to room temperature, and then, the reaction solution was diluted with dichloromethane. The precipitate was filtered using celite/silica, and then, distilled water was added to the filtrate. An organic solution layer was extracted therefrom using dichloromethane, dried using anhydrous $MgSO_4$, and then filtered. The filtrate was concentrated and purified through silica gel column chromatography to obtain 1.65 g (yield of 28%) of [Compound 2].

HPLC-MS: 1098.46 $[M+H]^+$

Synthesis Example 2: Synthesis of Compound 10

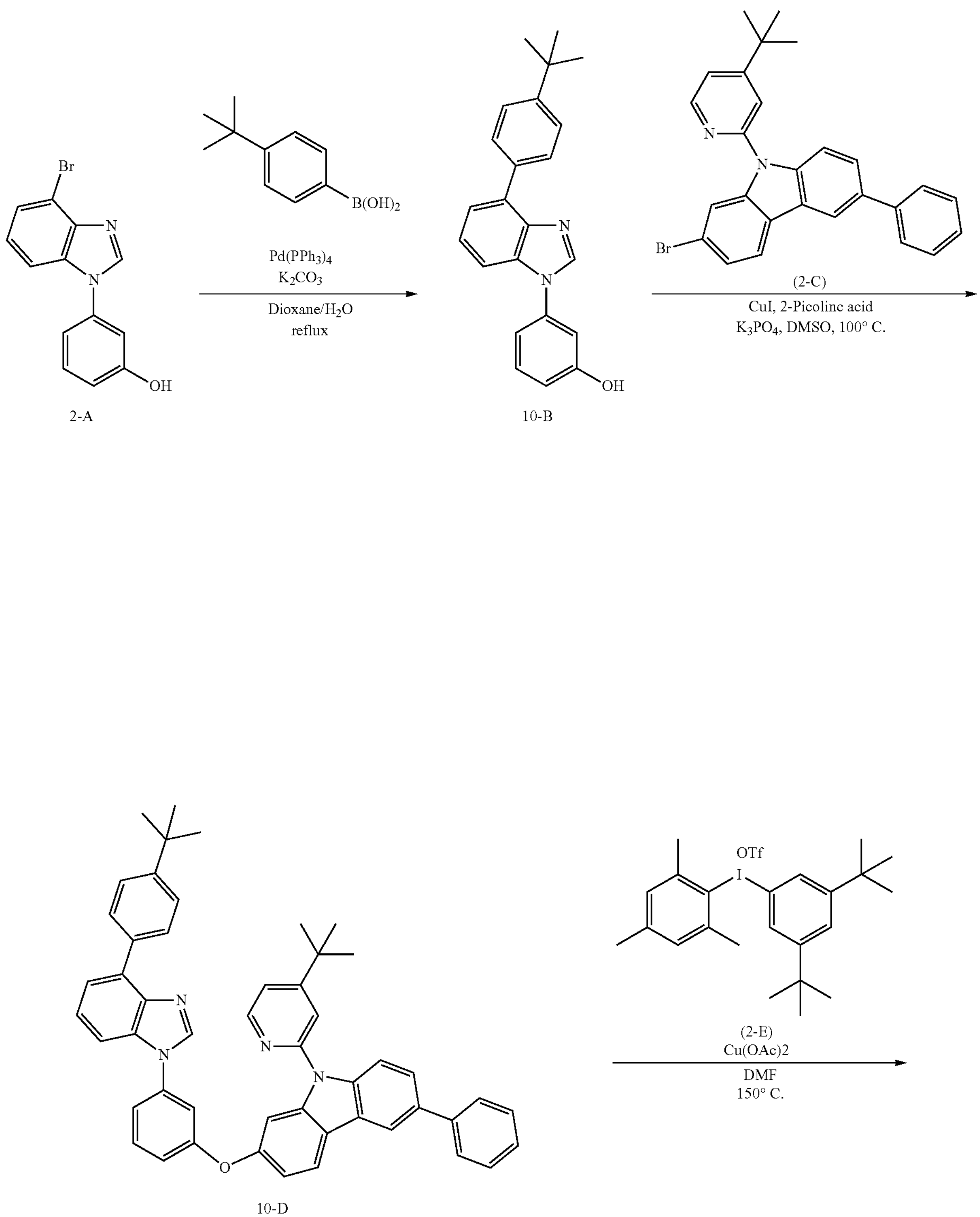

2-A

10-B

10-D

-continued

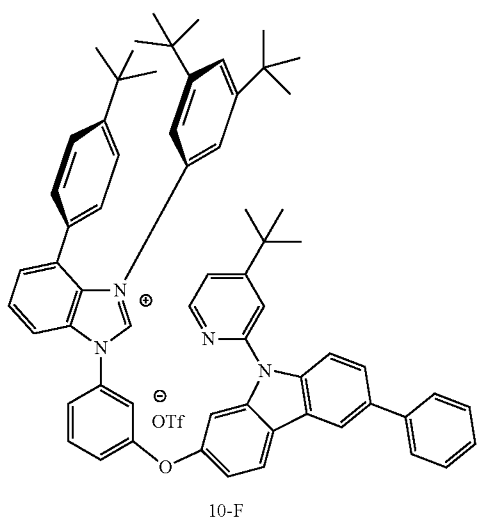

10-F

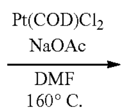

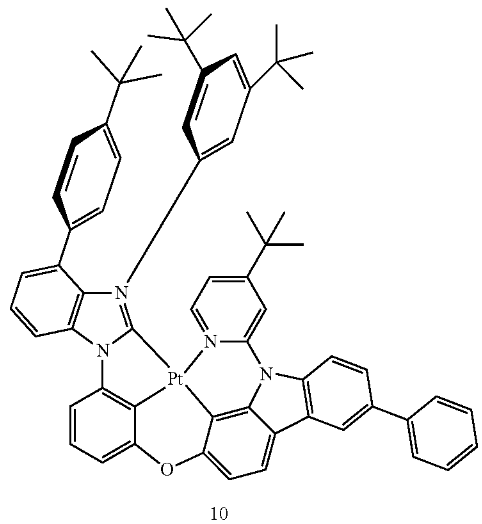

10

Synthesis of [Compound 10-B]

A reaction was carried out using Compound 2-A (10.0 g, 34.6 mmol), 4-tert-butylphenyl boronic acid (7.39 g, 41.5 mmol), $Pd(PPh_3)_4$ (2.00 g, 1.73 mmol), $K_2CO_3$ (7.17 g, 51.9 mmol), and 1,4-dioxane/$H_2O$ (160 mL/40 mL) under the same reaction conditions as those in Synthesis of [Compound 2-B]. The reaction product was purified through silica gel column chromatography to obtain 9.70 g (yield of 82%) of Compound 10-B.

HPLC-MS: 343.17 $[M+H]^+$

Synthesis of [Compound 10-D]

A reaction was carried out using Compound 10-B (7.80 g, 22.8 mmol), Compound 2-C (11.4 g, 25.1 mmol), CuI (1.74 g, 9.11 mmol), 2-picolinic acid (2.24 g, 18.2 mmol), $K_3PO_4$ (14.5 g, 68.3 mmol), and DMSO (100 mL) under the same reaction conditions as those in Synthesis of [Compound 2-D]. The reaction product was purified through silica gel column chromatography to obtain 5.0 g (yield of 31%) of Compound 10-D.

HPLC-MS: 717.36 $[M+H]^+$

Synthesis of [Compound 10-F]

A reaction was carried out using Compound 10-D (5.00 g, 6.97 mmol), Compound 2-E (12.2 g, 20.9 mmol), $Cu(OAc)_2$ (1.01 g, 5.58 mmol), and DMF (100 mL) under the same reaction conditions as those in Synthesis of [Compound 2-F]. The reaction product was purified through silica gel column chromatography to obtain 3.1 g (yield of 42%) of Compound 10-F.

HPLC-MS: 905.51 $[M\text{-}OTf]^+$

Synthesis of [Compound 10]

A reaction was carried out using Compound 10-F (3.10 g, 2.94 mmol), $Pt(COD)Cl_2$ (1.21 g, 3.23 mmol), NaOAc (0.723 g, 8.81 mmol), and DMF (60 mL) under the same reaction conditions as those in Synthesis of [Compound 2]. The reaction product was purified through silica gel column chromatography to obtain 1.4 g (yield of 43%) of [Compound 10].

HPLC-MS: 1098.46 $[M+H]^+$

Synthesis Example 3: Synthesis of Compound 74

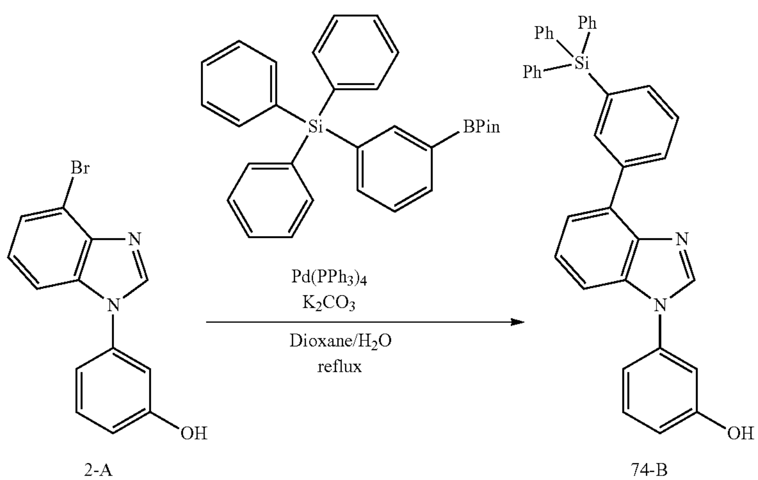

2-A

74-B

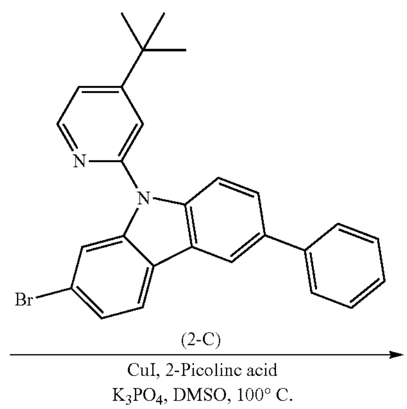

-continued

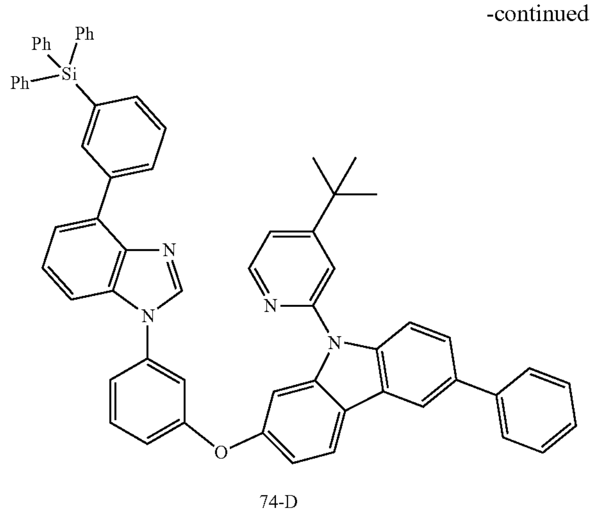

74-D

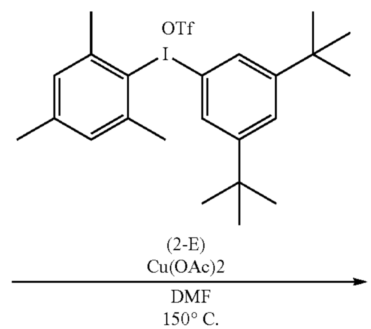

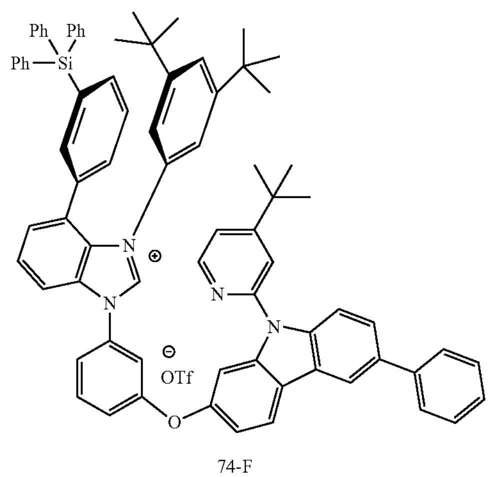

74-F

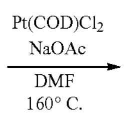

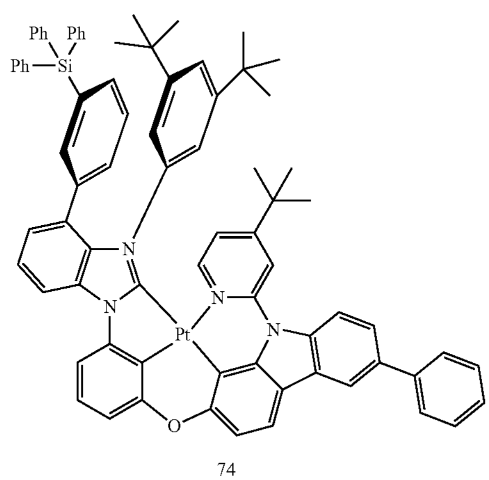

74

Synthesis of [Compound 74-B]

A reaction was carried out using Compound 2-A (4.0 g, 13.8 mmol), Compound 74-G (7.08 g, 16.6 mmol), $Pd(PPh_3)_4$ (1.60 g, 1.38 mmol), $K_2CO_3$ (5.74 g, 41.5 mmol), and 1,4-dioxane/$H_2O$ (90 mL/30 mL) under the same reaction conditions as those in Synthesis of [Compound 2-B]. The reaction product was purified through silica gel column chromatography to obtain 5.41 g (yield of 72%) of Compound 74-B.

HPLC-MS: 545.20 $[M+H]^+$

Synthesis of [Compound 74-D]

A reaction was carried out using Compound 74-B (5.41 g, 9.93 mmol), Compound 2-C (4.98 g, 10.9 mmol), CuI (0.57 g, 2.98 mmol), 2-picolinic acid (0.49 g, 3.97 mmol), $K_3PO_4$ (5.27 g, 24.8 mmol), and DMSO (70 mL) under the same reaction conditions as those in Synthesis of [Compound 2-D]. The reaction product was purified through silica gel column chromatography to obtain 4.74 g (yield of 52%) of Compound 74-D.

HPLC-MS: 919.38 $[M+H]^+$

Synthesis of [Compound 74-F]

A reaction was carried out using Compound 74-D (4.74 g, 5.16 mmol), Compound 2-E (9.04 g, 15.5 mmol), $Cu(OAc)_2$ (0.09 g, 0.52 mmol), and DMF (20 mL) under the same reaction conditions as those in Synthesis of [Compound 2-F]. The reaction product was purified through silica gel column chromatography to obtain 1.77 g (yield of 27%) of Compound 74-F.

HPLC-MS: 1107.53 $[M-OTf]^+$

Synthesis of [Compound 74]

A reaction was carried out using Compound 74-F (1.77 g, 1.41 mmol), $Pt(COD)Cl_2$ (0.58 g, 1.55 mmol), NaOAc (0.35 g, 4.22 mmol), and DMF (35 mL) under the same reaction conditions as those in Synthesis of [Compound 2]. The reaction product was purified through silica gel column chromatography to obtain 1.0 g (yield of 55%) of [Compound 74].

HPLC-MS: 1300.47 $[M+H]^+$

Synthesis Example 4: Synthesis of Compound 162

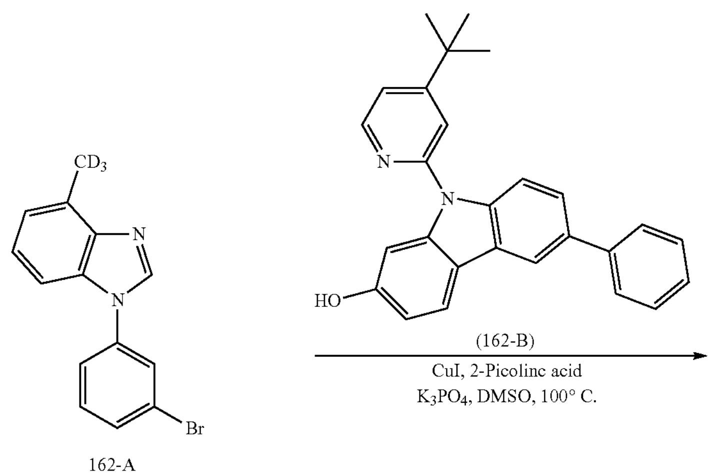

162-A

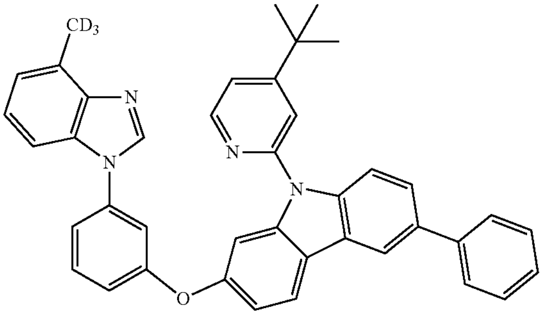

162-C

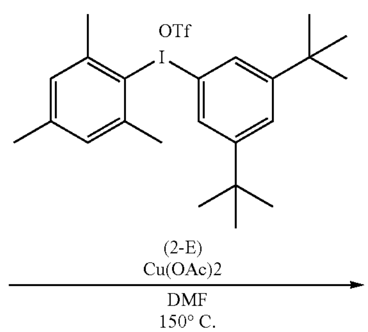

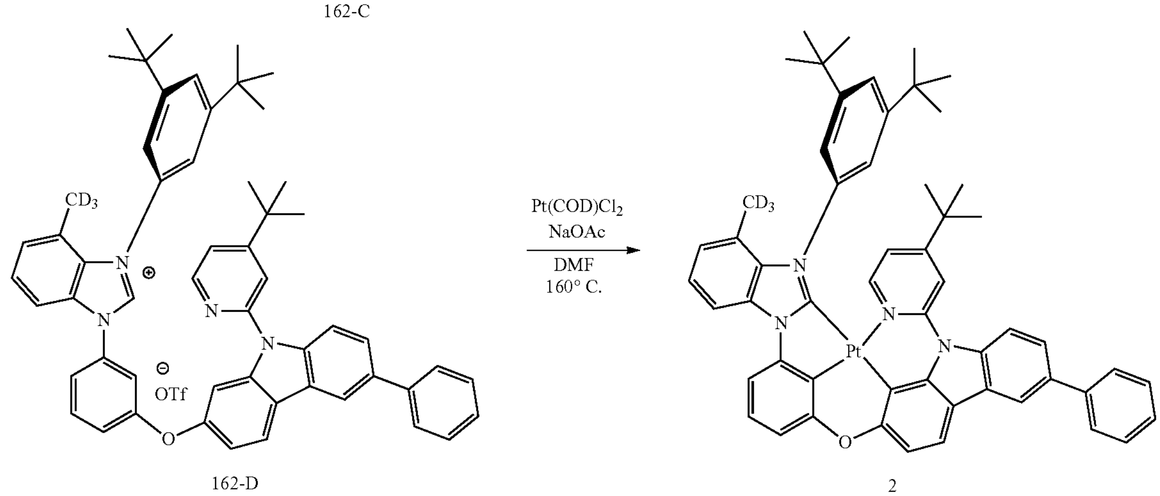

162-D

2

Synthesis of [Compound 162-C]

A reaction was carried out using Compound 162-A (5.00 g, 17.2 mmol), Compound 162-B (7.41 g, 18.9 mmol), CuI (0.818 g, 4.29 mmol), 2-picolinic acid (1.06 g, 8.59 mmol), $K_3PO_4$ (10.9 g, 51.5 mmol), and DMSO (150 mL) under the same reaction conditions as those in Synthesis of [Compound 2-D]. The reaction product was purified through silica gel column chromatography to obtain 4.8 g (yield of 46%) of Compound 162-C.

HPLC-MS: 602.26 $[M+H]^+$

Synthesis of [Compound 162-D]

A reaction was carried out using Compound 162-C (4.80 g, 7.96 mmol), Compound 2-E (6.98 g, 11.9 mmol), $Cu(OAc)_2$ (0.145 g, 0.80 mmol), and DMF (80 mL) under the same reaction conditions as those in Synthesis of [Compound 2-F]. The reaction product was purified through silica gel column chromatography to obtain 6.8 g (yield of 91%) of Compound 162-D.

HPLC-MS: 790.40 $[M-OTf]^+$

Synthesis of [Compound 162]
A reaction was carried out using Compound 162-D (6.80 g, 7.23 mmol), Pt(COD)$Cl_2$ (2.97 g, 7.95 mmol), NaOAc (1.78 g, 21.7 mmol), and DMF (150 mL) under the same reaction conditions as those in Synthesis of [Compound 2]. The reaction product was purified through silica gel column chromatography to obtain 3.2 g (yield of 45%) of [Compound 162].
HPLC-MS: 983.34 [M+H]$^+$
Synthesis Example 5: Synthesis of Compound 163
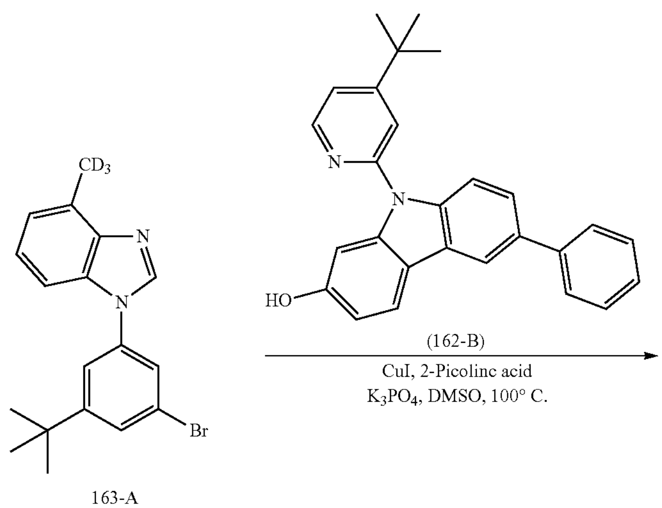
163-A
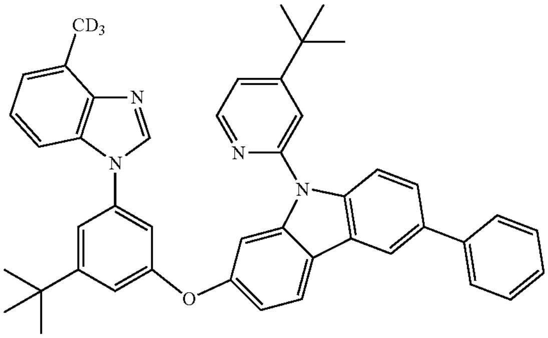
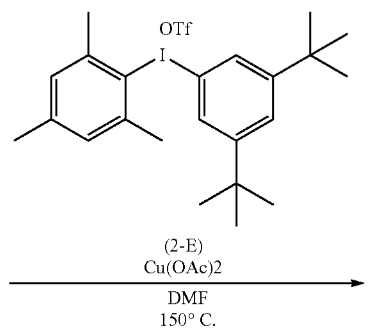
163-C
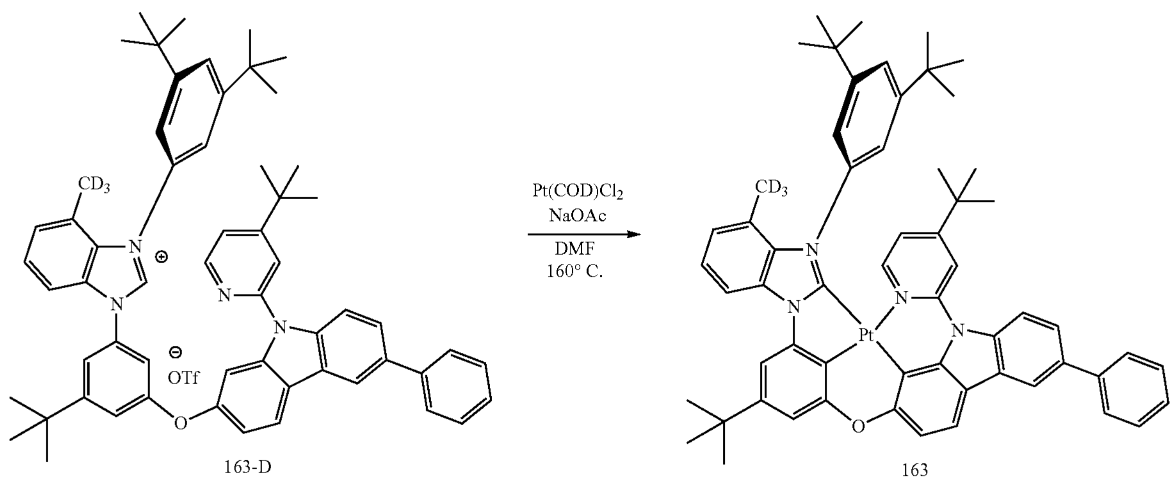
163-D
163

Synthesis of [Compound 163-C]

A reaction was carried out using Compound 163-A (8.80 g, 25.4 mmol), Compound 162-B (10.9 g, 27.9 mmol), CuI (1.21 g, 6.35 mmol), 2-picolinic acid (1.56 g, 12.7 mmol), $K_3PO_4$ (16.2 g, 76.2 mmol), and DMSO (175 mL) under the same reaction conditions as those in Synthesis of [Compound 2-D]. The reaction product was purified through silica gel column chromatography to obtain 6.8 g (yield of 41%) of Compound 163-C.

HPLC-MS: 658.26 $[M+H]^+$

Synthesis of [Compound 163-D]

A reaction was carried out using Compound 163-C (3.30 g, 5.02 mmol), Compound 2-E (4.40 g, 7.52 mmol), $Cu(OAc)_2$ (0.091 g, 0.50 mmol), and DMF (50 mL) under the same reaction conditions as those in Synthesis of [Compound 2-F]. The reaction product was purified through silica gel column chromatography to obtain 3.4 g (yield of 68%) of Compound 163-D.

HPLC-MS: 847.18 $[M-OTf]^+$

Synthesis of [Compound 163]

A reaction was carried out using Compound 163-D (3.40 g, 3.41 mmol), $Pt(COD)Cl_2$ (1.40 g, 3.75 mmol), NaOAc (0.84 g, 10.2 mmol), and DMF (75 mL) under the same reaction conditions as those in Synthesis of [Compound 2]. The reaction product was purified through silica gel column chromatography to obtain 2.2 g (yield of 62%) of [Compound 163].

HPLC-MS: 1039.33 $[M+H]^+$

Synthesis Example 6: Synthesis of Compound 254

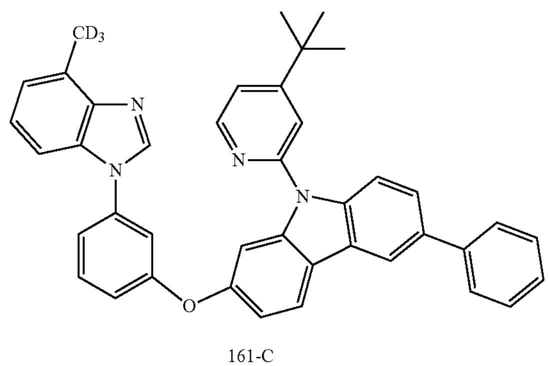

161-C

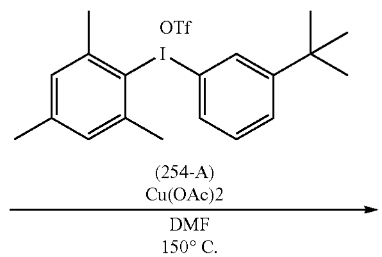

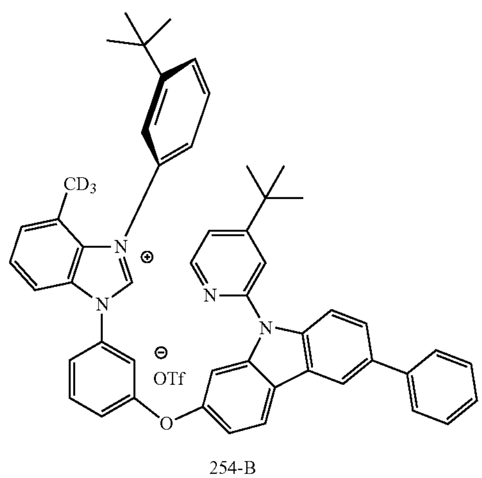

254-B

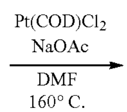

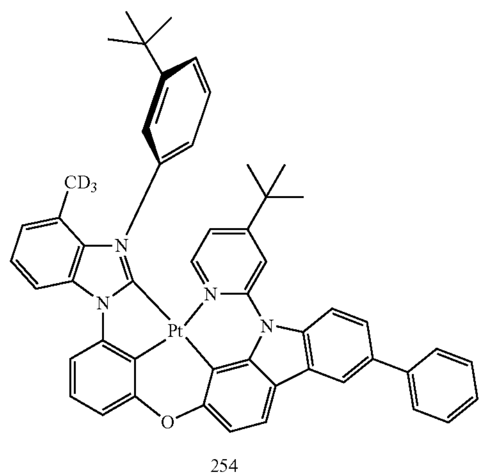

254

Synthesis of [Compound 254-B]

A reaction was carried out using Compound 161-C (5.00 g, 8.30 mmol), Compound 254-A (6.57 g, 12.4 mmol), $Cu(OAc)_2$ (0.151 g, 0.830 mmol), and DMF (100 mL) under the same reaction conditions as those in Synthesis of [Compound 2-F]. The reaction product was purified through silica gel column chromatography to obtain 6.2 g (yield of 84%) of Compound 254-B.

HPLC-MS: 734.32 $[M-OTf]^+$

Synthesis of [Compound 254]

A reaction was carried out using Compound 254-B (6.20 g, 7.01 mmol), $Pt(COD)Cl_2$ (2.88 g, 7.71 mmol), NaOAc (1.72 g, 21.0 mmol), and DMF (100 mL) under the same reaction conditions as those in Synthesis of [Compound 2]. The reaction product was purified through silica gel column chromatography to obtain 2.5 g (yield of 38%) of [Compound 254].

HPLC-MS: 927.24 $[M+H]^+$

Synthesis Example 7: Synthesis of Compound 265
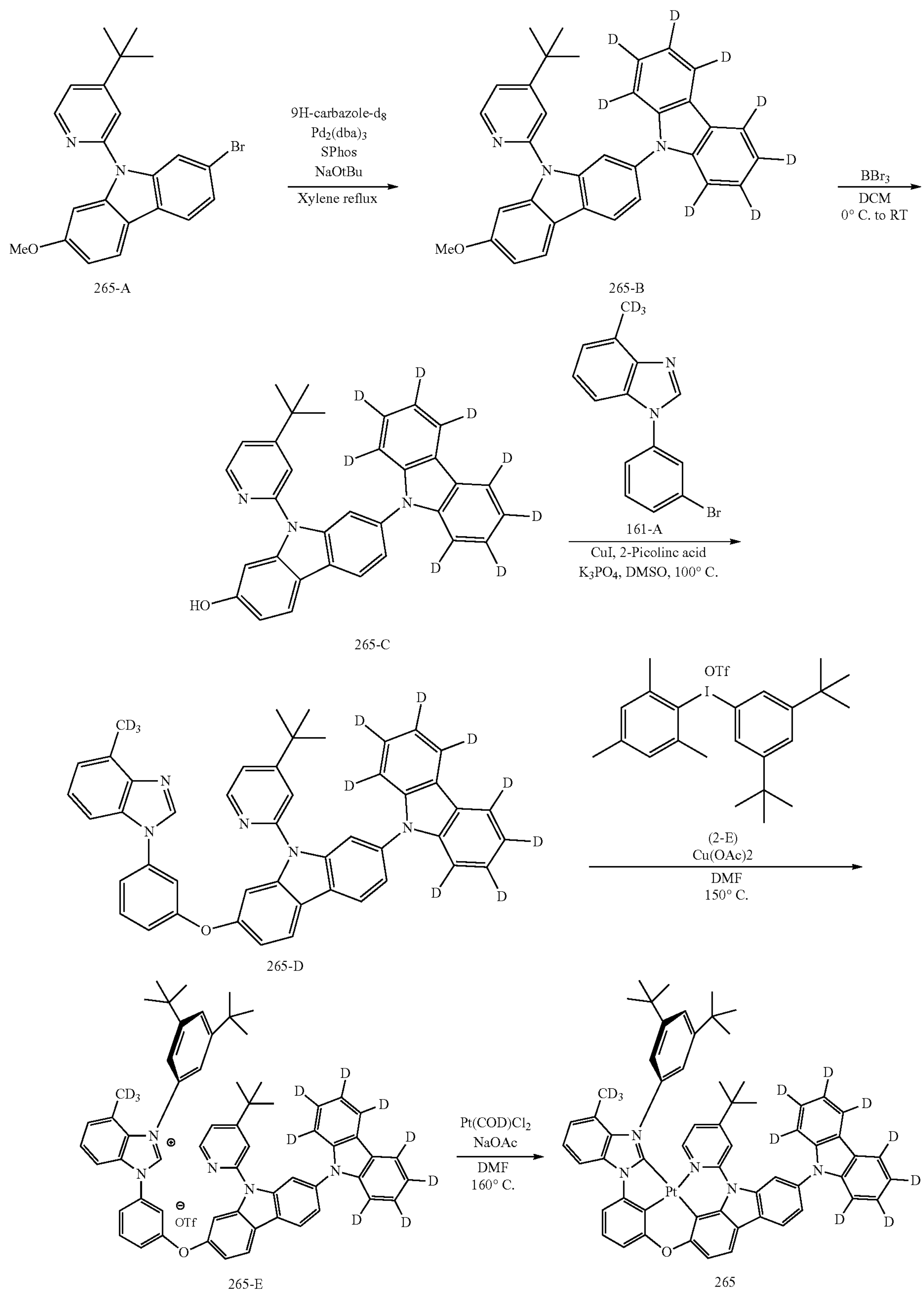
265-A
265-B
265-C
265-D
265-E
265

Synthesis of [Compound 265-B]

Compound 265-A (5.0 g, 12.2 mmol), 9H-carbazole-d8 (2.57 g, 14.7 mmol), $Pd_2(dba)_3$ (1.12 g, 1.22 mmol), SPhos (2.01 g, 4.89 mmol), and NaOtBu (1.53 g, 15.9 mmol) were placed in a round-bottom flask and then mixed with xylene (100 mL). The resultant reaction solution was stirred under reflux at 120° C. for 12 hours. After completion of the reaction, the temperature was lowered to room temperature, and then, ethyl acetate and a saturated aqueous ammonium chloride solution were added to the reaction solution. An organic solution layer was extracted therefrom using ethyl acetate, dried using anhydrous $MgSO_4$, and then filtered. The filtrate was concentrated and purified through silica gel column chromatography to obtain 4.4 g (yield of 72%) of Compound 265-B.

HPLC-MS: 504.03 $[M+H]^+$

Synthesis of [Compound 265-C]

Compound 265-B (4.41 g, 8.76 mmol) was dissolved in dichloromethane (50 mL) in a round-bottom flask, and then, the temperature was lowered to 0° C. Next, $BBr_3$ (1.69 mL, 17.5 mmol) was slowly added thereto, followed by 30 minutes of stirring. Next, the reaction product was heated to room temperature and then stirred for 1 hour. The reaction product was cooled back to 0° C., a saturated aqueous $NaHCO_3$ solution was slowly added thereto, followed by dilution with dichloromethane. An organic solution layer was extracted therefrom using dichloromethane, dried using anhydrous $MgSO_4$, and then filtered. The filtrate was concentrated and purified through silica gel column chromatography to obtain 3.9 g (yield of 91%) of Compound 265-C.

HPLC-MS: 489.22 [M]

Synthesis of [Compound 265-D]

A reaction was carried out using Compound 161-A (2.12 g, 7.28 mmol), Compound 265-C (3.92 g, 8.01 mmol), CuI (0.42 g, 2.18 mmol), 2-picolinic acid (0.36 g, 2.91 mmol), $K_3PO_4$ (3.86 g, 18.2 mmol), and DMSO (50 mL) under the same reaction conditions as those in Synthesis of [Compound 2-D]. The reaction product was purified through silica gel column chromatography to obtain 4.31 g (yield of 85%) of Compound 265-D.

HPLC-MS: 698.31 [M]

Synthesis of [Compound 265-E]

A reaction was carried out using Compound 265-D (4.31 g, 6.16 mmol), Compound 2-E (4.32 g, 7.39 mmol), $Cu(OAc)_2$ (0.11 g, 0.62 mmol), and DMF (25 mL) under the same reaction conditions as those in Synthesis of [Compound 2-F]. The reaction product was purified through silica gel column chromatography to obtain 5.67 g (yield of 89%) of Compound 265-E.

HPLC-MS: 887.45 $[M-OTf]^+$

Synthesis of [Compound 265]

A reaction was carried out using Compound 265-E (3.15 g, 3.03 mmol), $Pt(COD)Cl_2$ (1.25 g, 3.34 mmol), NaOAc (0.75 g, 9.10 mmol), and DMF (75 mL) under the same reaction conditions as those in Synthesis of [Compound 2]. The reaction product was purified through silica gel column chromatography to obtain 0.79 g (yield of 24%) of [Compound 265].

HPLC-MS: 1079.38 [M]

Synthesis Example 8: Synthesis of Compound 327

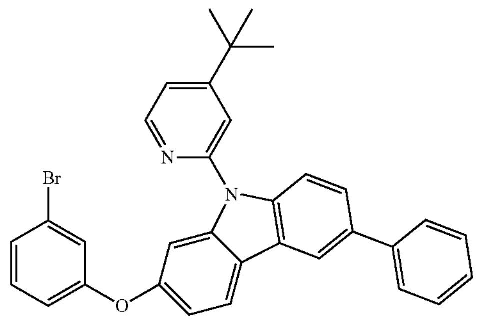

327-A

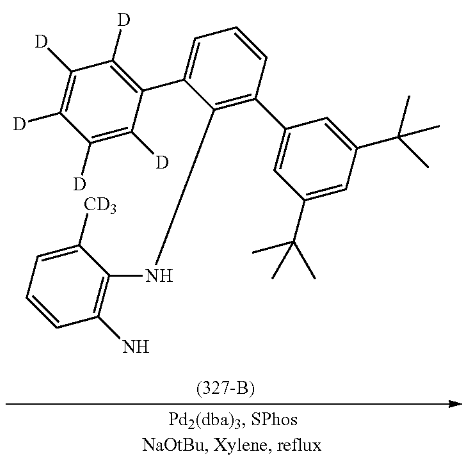

-continued

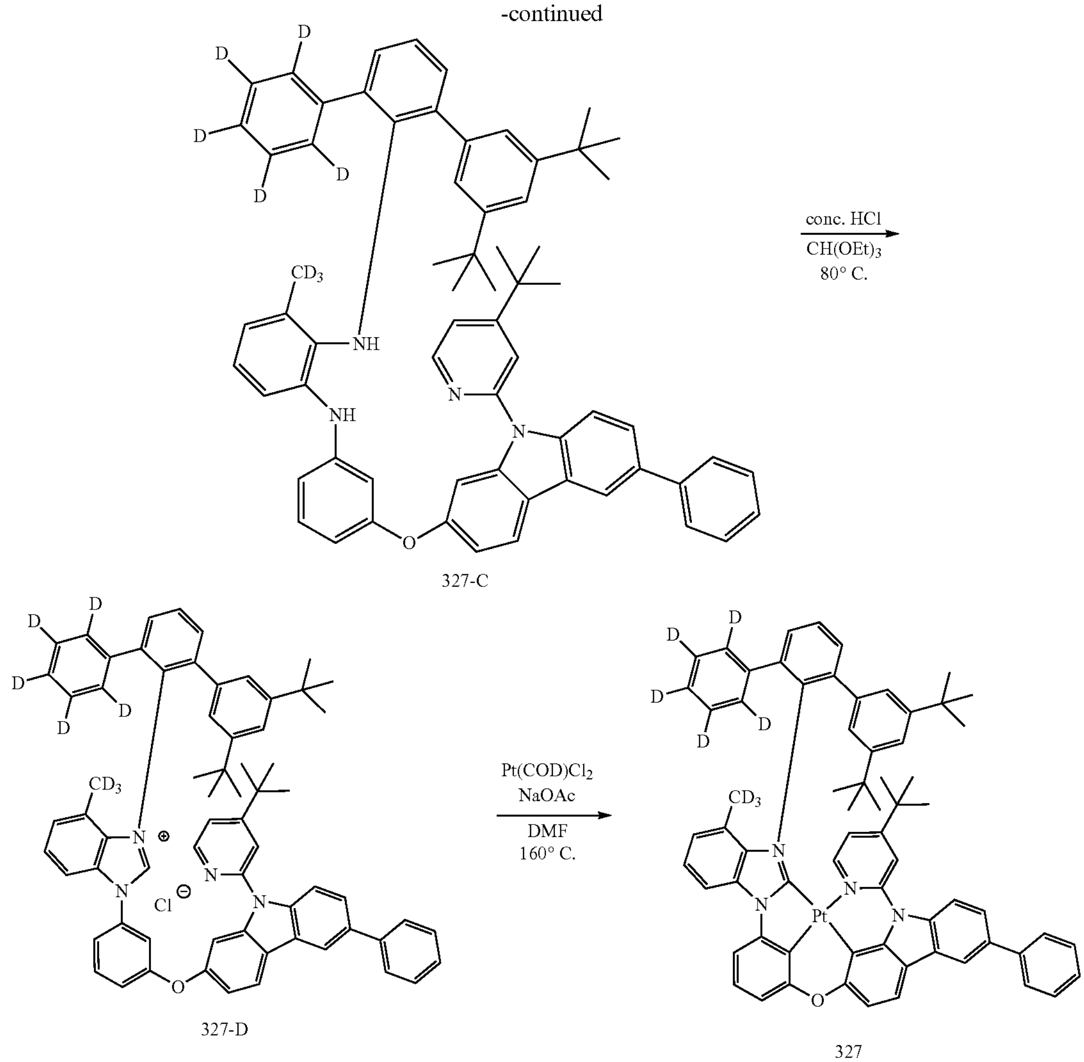

327-C

327-D

327

Synthesis of [Compound 327-C]

A reaction was carried out using Compound 327-A (8.3 g, 15.1 mmol), Compound 327-B (8.5 g, 18.2 mmol), $Pd_2(dba)_3$ (0.69 g, 0.76 mmol), SPhos (0.62 g, 1.51 mmol), NaOtBu (2.33 g, 24.2 mmol), and xylene (100 mL) in a round-bottom flask, under the same reaction conditions as those in Synthesis of [Compound 265-B]. The reaction product was purified through silica gel column chromatography to obtain 12.0 g (yield of 85%) of Compound 327-C.

HPLC-MS: 935.42 $[M-H]^-$

Synthesis of [Compound 327-D]

Compound 327-C (12.0 g, 12.8 mmol) was dissolved in $CH(OEt)_3$ (100 mL) in a round-bottom flask, and then, concentrated HCl (1.3 mL) was added thereto. The resultant reaction solution was stirred under reflux at 80° C. for 2 hours. After completion of the reaction, the temperature was lowered to room temperature, and then, the reaction product was concentrated under vacuum. The reaction product was purified through silica gel column chromatography to obtain 11.6 g (yield of 92%) of Compound 327-D.

Synthesis of [Compound 327]

A reaction was carried out using Compound 327-D (5.8 g, 5.91 mmol), $Pt(COD)Cl_2$ (2.43 g, 6.50 mmol), NaOAc (1.46 g, 17.7 mmol), and DMF (150 mL) under the same reaction conditions as those in Synthesis of [Compound 2]. The reaction product was purified through silica gel column chromatography to obtain 1.2 g (yield of 18%) of [Compound 327].

HPLC-MS: 1140.50 $[M+H]^+$

Figure 2:
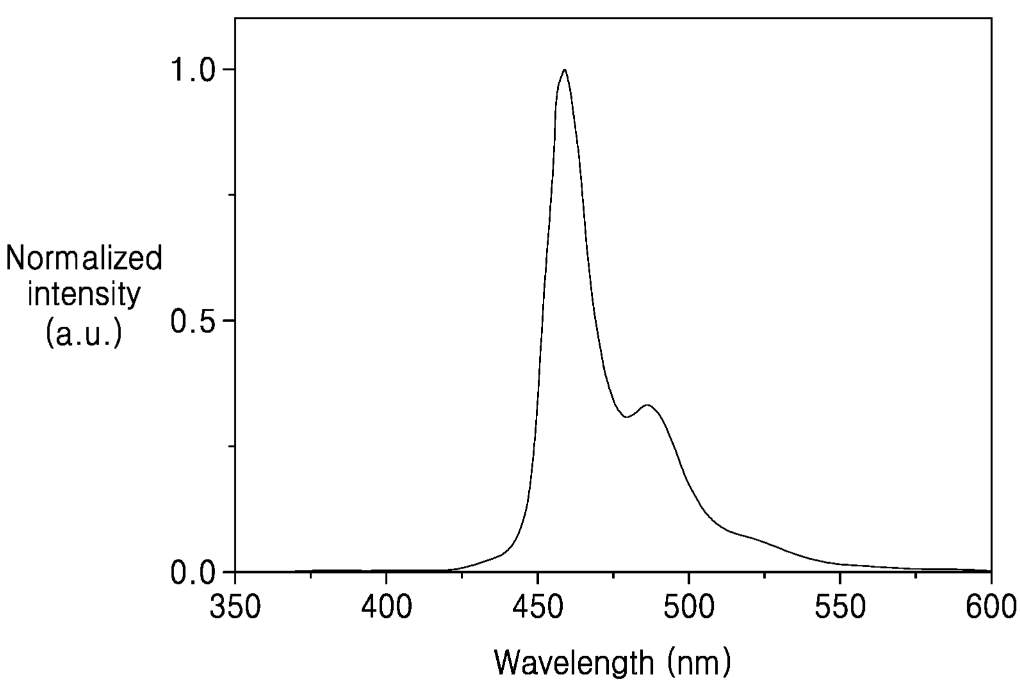
FIG. 2 shows a photoluminescence (PL) spectrum of Compound 2 according to an exemplary embodiment.
Figure 3:
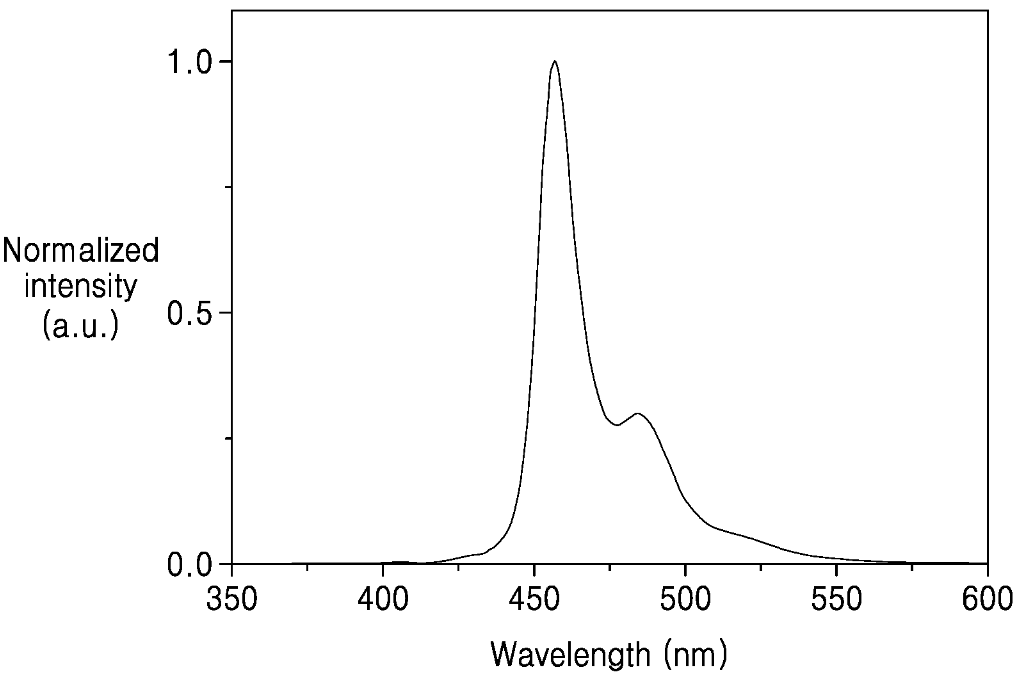
FIG. 3 shows a PL spectrum of Compound 162 according to an exemplary embodiment.
Figure 4:
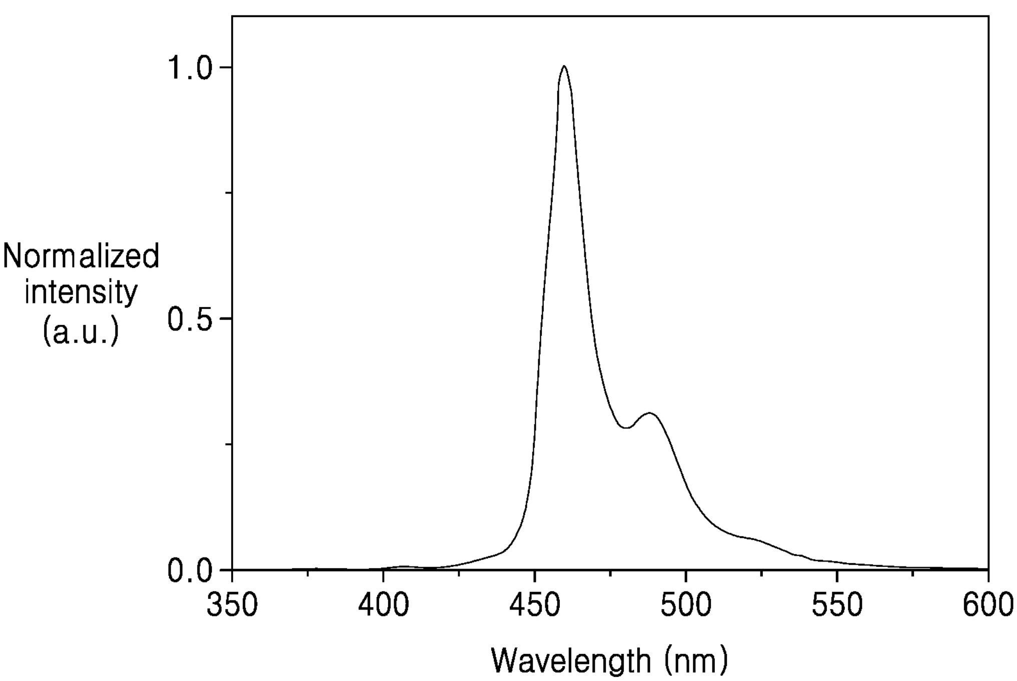
FIG. 4 shows a PL spectrum of Compound 327 according to an exemplary embodiment.

Photoluminescence (PL) spectra of Compounds 2, 162, and 327 synthesized according to Synthesis Examples 1, 4, and 8 were measured, and are shown in FIGS. 2, 3, and 4, respectively. The PL spectra were measured using $1\times10^{-4}$ M toluene solutions of Compounds 2, 162, and 327. The PL spectra of Compounds 2, 162, and 327 have maximum emission wavelengths at 459 nm, 457 nm, and 460 nm, respectively.

Evaluation Example 1: Evaluation of PL Spectrum

Compound 2 was diluted at a concentration of $1\times10^{-4}$ M in toluene, and then, the PL spectrum thereof was measured using a ISC PC1 spectrofluorometer having a Xenon lamp mounted thereon at room temperature. This process cycle was repeatedly performed on each of Compounds 10, 74, 162, 163, 254, 265, and 327 and Comparative Compounds $C_1$ and $C_2$ to measure the maximum PL emission wavelength, the PL emission wavelength of the second peak, and the second peak intensity of each compound, and results thereof are shown in Table 2.

TABLE 2

| Compound No. | Maximum PL emission wavelength ($\lambda_{max}$) (nm) | PL emission wavelength of $2^{nd}$ peak ($2^{nd}$ peak $\lambda$) ($2^{nd}$ peak $\lambda$) (nm) | $2^{nd}$ peak intensity | $2^{nd}$ peak intensity reduction rate (%) | FWHM (nm) |
|---|---|---|---|---|---|
| 2 | 459 | 486 | 0.322 | 22 | 17 |
| 10 | 459 | 486 | 0.329 | 20 | 17 |
| 74 | 459 | 486 | 0.328 | 20 | 18 |
| 162 | 457 | 485 | 0.298 | 27 | 17 |
| 163 | 460 | 488 | 0.368 | 10 | 18 |
| 254 | 456 | 482 | 0.336 | 18 | 19 |
| 265 | 461 | 486 | 0.328 | 20 | 19 |
| 327 | 460 | 488 | 0.310 | 25 | 16 |
| C1 | 458 | 485 | 0.379 | 8 | 19 |
| C2 | 458 | 482 | 0.411 | 0 (reference value) | 22 |

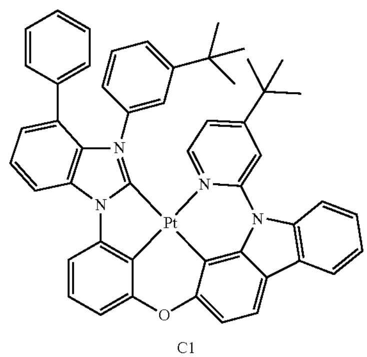

C1

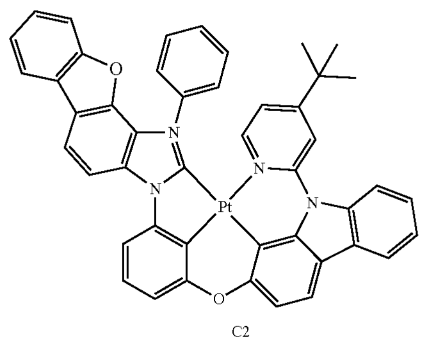

C2

As shown in Table 2, it can be seen that Compounds 2, 10, 74, 162, 163, 254, 265, and 327 according to embodiments each have reduced second peak intensity and FWHM, as compared with Comparative Compounds C1 and C2, while maintaining a deep-blue emission region, thereby having better color purity. For example, when the organometallic compound according to an embodiment is applied to an electronic device, for example, an organic light-emitting device, a CIE y coordinate may be improved by a cavity effect, and thus, for example, a small CIE y coordinate may be indicated, thereby realizing a deep blue color.

Example 1

An ITO glass substrate was cut to a size of 50 mm×50 mm×0.5 mm, sonicated in acetone isopropyl alcohol and pure water, each for 15 minutes, and then washed by exposure to UV ozone for 30 minutes.

Then, m-MTDATA was deposited on an ITO electrode (anode) on the glass substrate at a deposition rate of 1 Å/sec to form a hole injection layer having a thickness of 600 Å, and then, α-NPD was deposited on the hole injection layer at a deposition rate of 1 Å/sec to form a hole transport layer having a thickness of 250 Å.

Compound 2 (dopant) and CBP (host) were co-deposited on the hole transport layer at a deposition rate of 0.1 Å/sec and a deposition rate of 1 Å/sec, respectively, to form an emission layer having a thickness of 400 Å.

BAlq was deposited on the emission layer at a deposition rate of 1 Å/sec to form a hole blocking layer having a thickness of 50 Å, $Alq_3$ was deposited on the hole blocking layer to form an electron transport layer having a thickness of 300 Å, LiF was deposited on the electron transport layer to form an electron injection layer having a thickness of 10 Å, and then, Al was vacuum-deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+Compound 2 (10 wt %) (400 Å)/BAlq (50 Å)/$Alq_3$ (300 Å)/LiF (10 Å) /Al (1,200 Å).

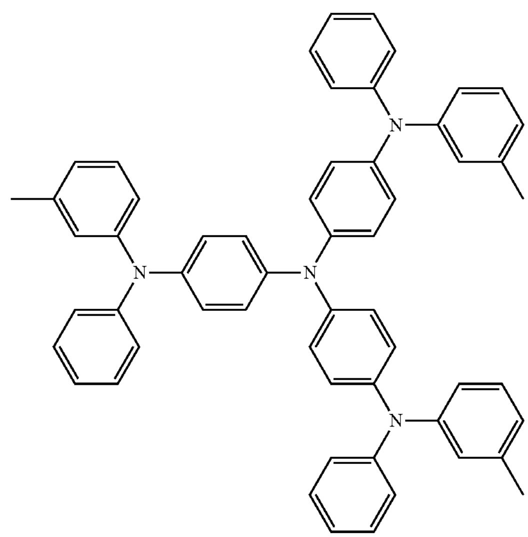

m-MTDATA

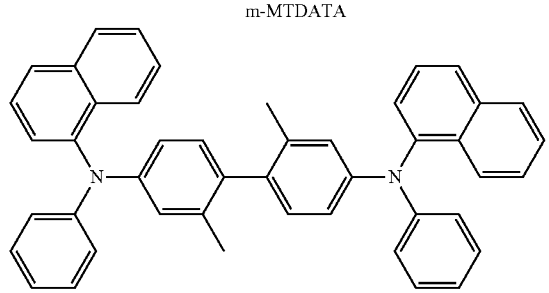

α-NPD

-continued

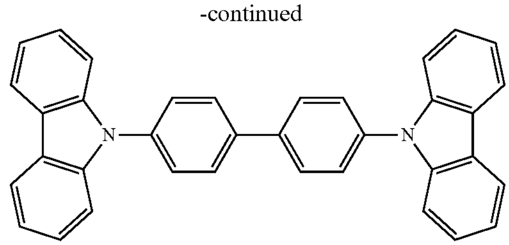

CBP

-continued

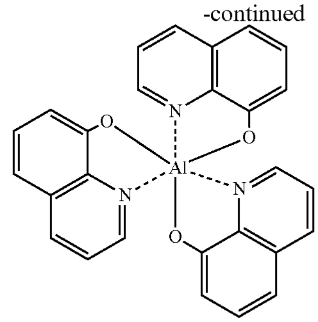

$Alq_3$

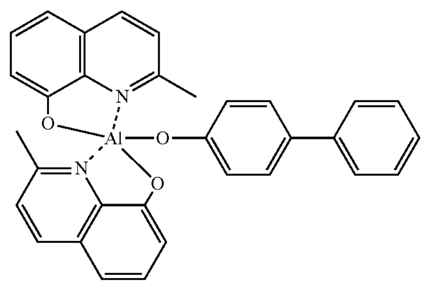

BAlq

Examples 2 to 7 and Comparative Examples 1 and 2

Organic light-emitting devices were manufactured in the same manner as in Example 1, except that Compounds shown in Table 3 were each used instead of Compound 2 as a dopant in forming an emission layer.

Evaluation Example 2: Evaluation of Characteristics of Organic Light-Emitting Devices For each of the organic light-emitting devices manufactured according to Examples 1 to 7 and Comparative Examples 1 and 2, the emission wavelength, maximum external quantum efficiency ($EQE_{max}$), and y color coordinate (CIEy) were measured using a current-voltmeter (Keithley 2400) and a luminance meter (Minolta Cs-1000A), and results thereof are shown in Table 3. The maximum external quantum efficiency is expressed as a relative value (%).

TABLE 3

| | | Solution PL | | Bottom emission | | |
|---|---|---|---|---|---|---|
| | Compound No. | Emission wavelength (nm) | $2^{nd}$ peak intensity | Emission wavelength (nm) | CIEy | $EQE_{max}$ (relative value, %) |
| Example 1 | 2 | 459 | 0.322 | 462 | 0.155 | 138 |
| Example 2 | 10 | 459 | 0.329 | 461 | 0.145 | 138 |
| Example 3 | 162 | 457 | 0.298 | 460 | 0.144 | 131 |
| Example 4 | 163 | 460 | 0.368 | 462 | 0.167 | 149 |
| Example 5 | 254 | 456 | 0.336 | 460 | 0.175 | 113 |
| Example 6 | 265 | 461 | 0.328 | 464 | 0.171 | 136 |
| Example 7 | 327 | 460 | 0.310 | 461 | 0.125 | 124 |
| Comparative Example 1 | C1 | 458 | 0.379 | 461 | 0.226 | 100 |
| Comparative Example 2 | C2 | 458 | 0.411 | 459 | 0.165 | 101 |

TABLE 3-continued
| | Solution PL | | Bottom emission | | |
|---|---|---|---|---|---|
| Compound No. | Emission wavelength (nm) | $2^{nd}$ peak intensity | Emission wavelength (nm) | CIEy | $EQE_{max}$ (relative value, %) |
| 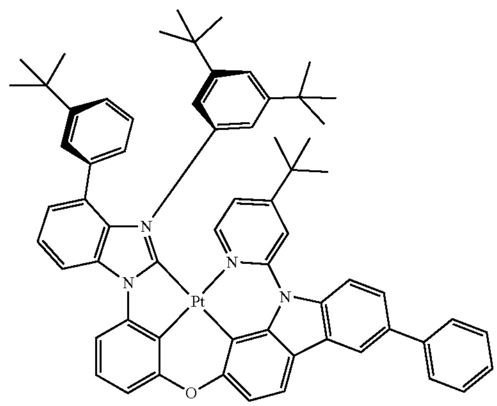 2 | | | | | |
| 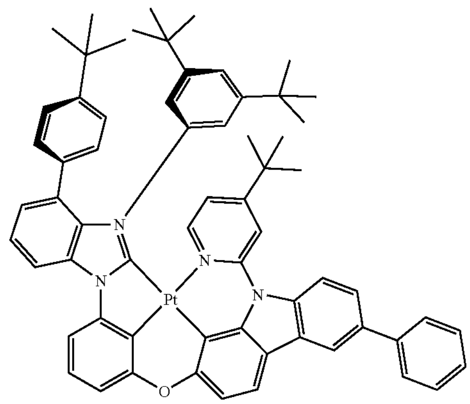 10 | | | | | |
| 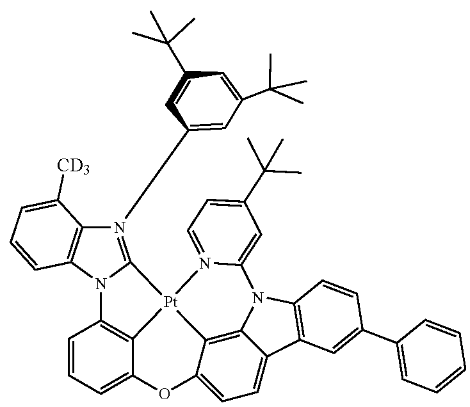 162 | | | | | |

TABLE 3-continued
| Compound No. | Solution PL | | Bottom emission | | |
|---|---|---|---|---|---|
| | Emission wavelength (nm) | $2^{nd}$ peak intensity | Emission wavelength (nm) | CIEy | $EQE_{max}$ (relative value, %) |
| 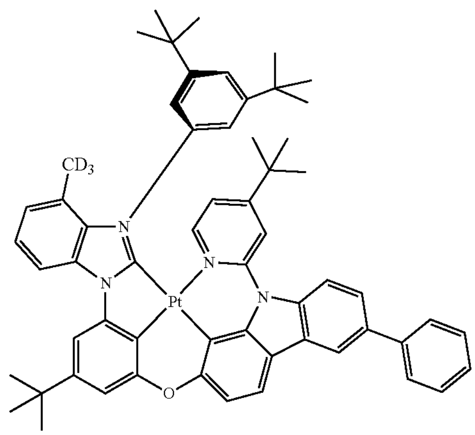 163 | | | | | |
| 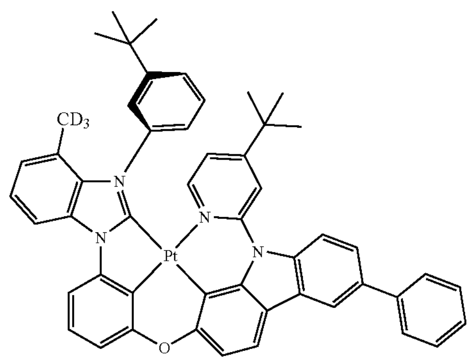 254 | | | | | |
| 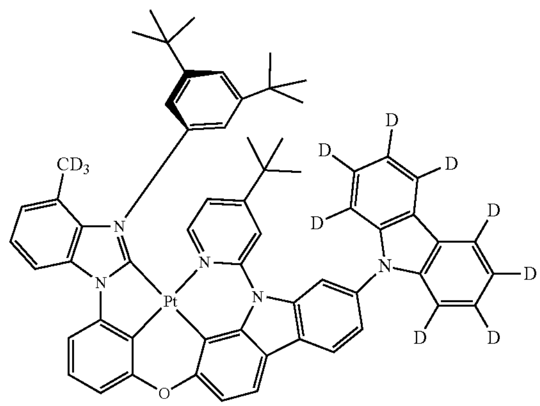 265 | | | | | |

TABLE 3-continued

| Compound No. | Solution PL Emission wavelength (nm) | Solution PL $2^{nd}$ peak intensity | Bottom emission Emission wavelength (nm) | Bottom emission CIEy | Bottom emission $EQE_{max}$ (relative value, %) |
|---|---|---|---|---|---|
| 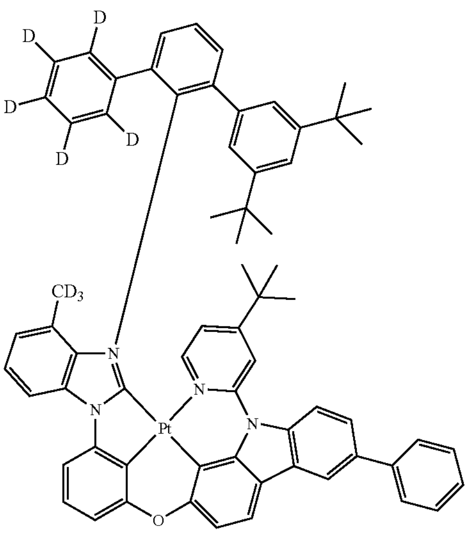 327 | | | | | |
| 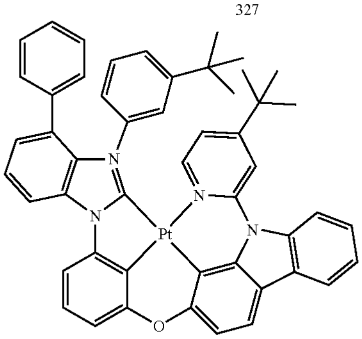 C1 | | | | | |
| 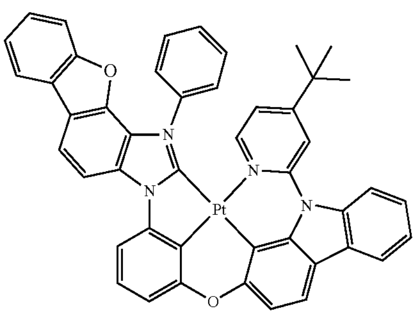 C2 | | | | | |

Referring to Table 3, it can be seen that the organic light-emitting devices of Examples 1 to 7 each have a smaller CIEy color coordinate than the organic light-emitting device of Comparative Example 1 and/or the organic light-emitting device of Comparative Example 2. Thus, it is possible to realize light in a deep-blue region, so that a display expressing a clearer blue color may be manufactured.

In addition, it can be seen that the organic light-emitting devices of Examples 1 to 7 each have an increase of 13% to 49% in maximum quantum efficiency ($EQE_{max}$), as compared with the organic light-emitting devices of Comparative Examples 1 and 2.

From the above, it can be seen that by using the compounds of the present disclosure, a deep-blue organic light-emitting device having high color purity and high efficiency may be realized.

The organometallic compound represented by Formula 1 may show an emission spectrum with small second peak intensity, and thus, an organic light-emitting device including the organometallic compound may have improved color purity, thereby realizing a deep blue color.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

Formula 1

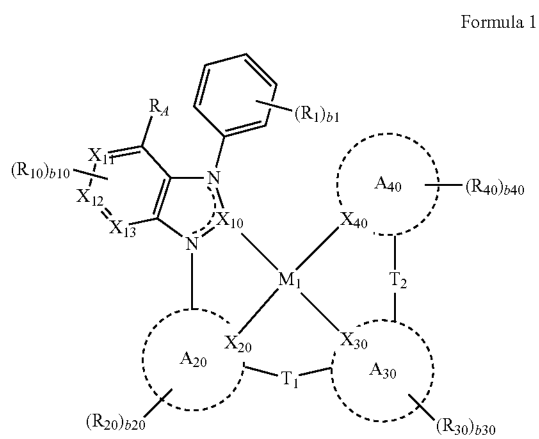

wherein, in Formula 1, $M_1$ is a first-row transition metal of the Periodic Table of Elements, a second-row transition metal of the Periodic Table of Elements, or a third-row transition metal of the Periodic Table of Elements, $X_{10}$ is C, $X_{11}$ to $X_{12}$, $X_{20}$, $X_{30}$, and $X_{40}$ are each independently C or N, $X_{13}$ is C, ring $A_{20}$, ring $A_{30}$, and ring $A_{40}$ are each independently a $C_5$-$C_{30}$ carbocyclic group or a $C_1$-$C_{30}$ heterocyclic group, $T_1$ and $T_2$ are each independently a single bond, *—N($R_{51}$)—*', *—B($R_{51}$)—*', *—P($R_{51}$)—*', *—C($R_{51}$)($R_{52}$)—*', *—Si($R_{51}$)($R_{52}$)—*', *—Ge($R_{51}$)($R_{52}$)—*', *—S—*', *—Se—*', *—O—*', *—C(=O)—*', *—S(=O)—*', *—S(=O)$_2$—*', *—C($R_{51}$)=C($R_{52}$)—*', *—C(=S)—*', or *—C≡C—*', $R_A$ is a substituted phenyl group, $R_1$, $R_{10}$, $R_{20}$, and $R_{40}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), $R_{30}$ are each independently a substituted or unsubstituted $C_6$-$C_{60}$ aryl group, a substituted or unsubstituted $C_1$-$C_{60}$ heteroaryl group, or —Si($Q_3$)($Q_4$)($Q_5$), two or more of $R_{10}$, $R_{20}$, $R_{30}$, $R_{40}$, $R_{51}$, and $R_{52}$ are optionally bonded together to form a substituted or unsubstituted $C_5$-$C_{30}$ carbocyclic group or a substituted or unsubstituted $C_1$-$C_{30}$ heterocyclic group, b1 is an integer from 1 to 5, b10 is an integer from 1 to 3, b20, b30, and b40 are each independently an integer from 1 to 10, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O) ($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(═O) ($Q_{28}$)($Q_{29}$), or any combination thereof;

—N($Q_{31}$)($Q_{32}$), —Si($Q_{33}$)($Q_{34}$)($Q_{35}$), —B($Q_{36}$)($Q_{37}$), or —P(═O) ($Q_{38}$)($Q_{39}$); or any combination thereof, and $Q_1$ to $Q_9$, $Q_{11}$ to $Q_{19}$, $Q_{21}$ to $Q_{29}$, and $Q_{31}$ to $Q_{39}$ are each independently: hydrogen;

deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof, a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof;

a $C_2$-$C_{60}$ alkenyl group; a $C_2$-$C_{60}$ alkynyl group; a $C_1$-$C_{60}$ alkoxy group; a $C_3$-$C_{10}$ cycloalkyl group;

a $C_1$-$C_{10}$ heterocycloalkyl group; a $C_3$-$C_{10}$ cycloalkenyl group; a $C_1$-$C_{10}$ heterocycloalkenyl group;

a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The organometallic compound of claim 1, wherein $M_1$ is platinum (Pt), palladium (Pd), or gold (Au).

3. The organometallic compound of claim 1, wherein a moiety represented by

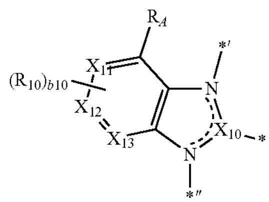

in Formula 1 is a group represented by one of Formulae A10(1) to A10(8):

A10(1)

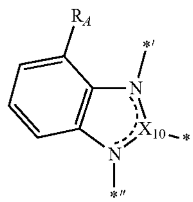

-continued

A10(2)

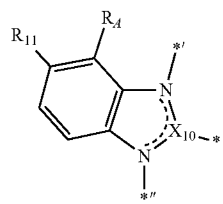

A10(3)

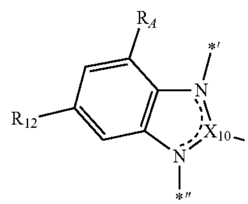

A10(4)

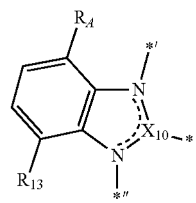

A10(5)

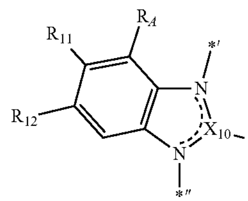

A10(6)

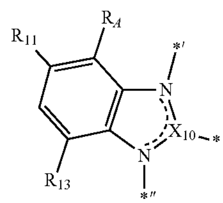

A10(7)

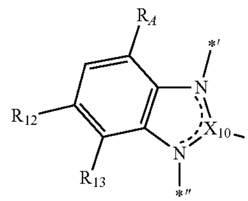

A10(8)

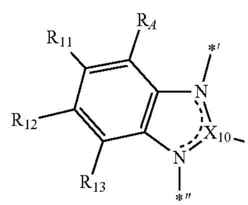

wherein, in Formulae A10(1) to A10(8), $X_{10}$ and $R_A$ are respectively the same as those described in claim 1, $R_{11}$ to $R_{13}$ are each the same as described in connection with $R_{10}$ in claim 1, and $R_{11}$ to $R_{13}$ are each not hydrogen,

* indicates a binding site to $M_1$ in Formula 1,

*' indicates a binding site to a phenyl group in Formula 1, and

*" indicates a binding site to ring $A_{20}$ in Formula 1.

4. The organometallic compound of claim 1, wherein ring $A_{20}$, ring $A_{30}$, and ring $A_{40}$ in Formula 1 are each independently a cyclopentane group, a cyclopentene group, a cyclohexane group, a cyclohexene group, a cyclohexadiene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a phosphole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

5. The organometallic compound of claim 1, wherein ring $A_{20}$ in Formula 1 is a group represented by one of Formulae A20(1) to A20(15):

A20(1)

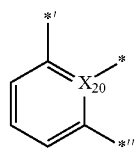

A20(2)

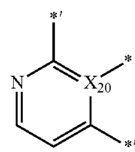

-continued

A20(3)

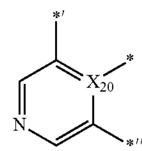

A20(4)

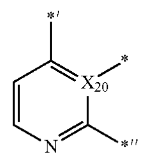

A20(5)

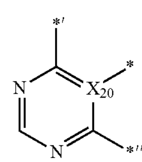

A20(6)

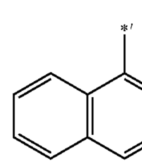

A20(7)

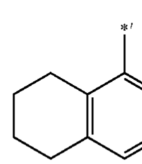

A20(8)

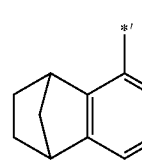

A20(9)

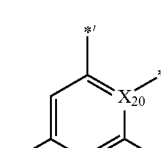

A20(10)

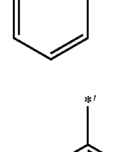

A20(11)

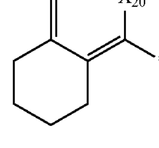

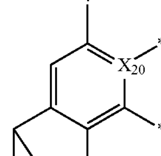

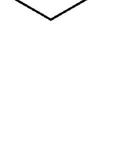

-continued

A20(12)

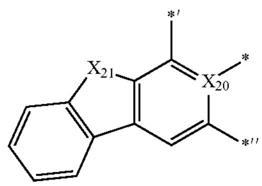

A20(13)

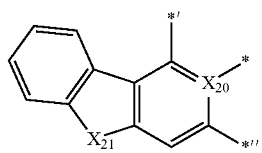

A20(14)

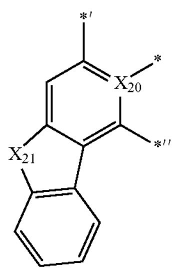

A20(15)

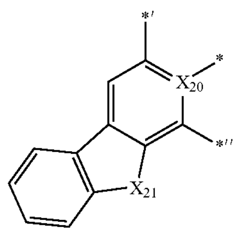

wherein, in Formulae A20(1) to A20(15), $X_{20}$ is C or N, $X_{21}$ is O, S, $N(R_{21})$, $C(R_{21})(R_{22})$, or $Si(R_{21})(R_{22})$, and $R_{21}$ and $R_{22}$ are each the same as described in connection with $R_{20}$ in claim 1,

* indicates a binding site to $M_1$ in Formula 1,

*' indicates a binding site to a N atom in Formula 1, and

*" indicates a binding site to Tin Formula 1.

6. The organometallic compound of claim 1, wherein ring $A_{30}$ in Formula 1 is a group represented by one of Formulae A30(1) to A30(12):

A30(1)

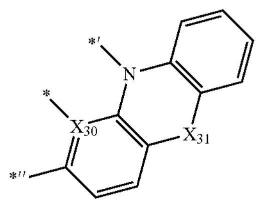

A30(2)

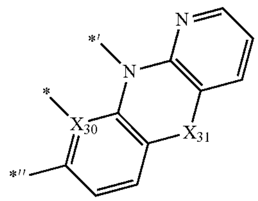

-continued

A30(3)

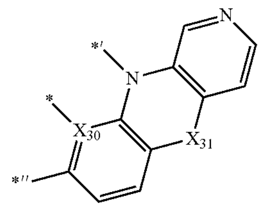

A30(4)

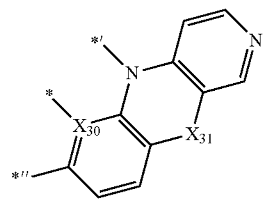

A30(5)

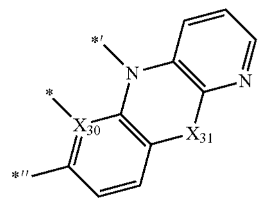

A30(6)

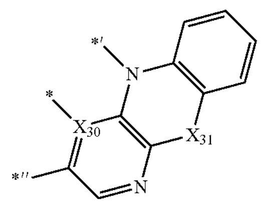

A30(7)

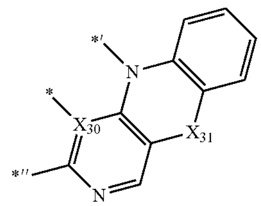

A30(8)

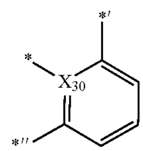

A30(9)

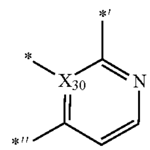

A30(10)

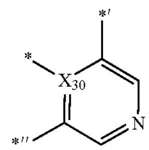

-continued

A30(11)

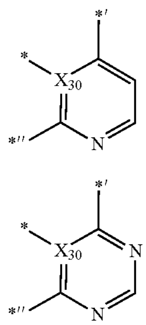

A30(12)

wherein, in Formulae A30(1) to A30(12), $X_{30}$ is C or N, $X_{31}$ is a single bond, O, S, $N(R_{31})$, $C(R_{31})(R_{32})$, or $Si(R_{31})(R_{32})$, and $R_{31}$ and $R_{32}$ are each the same as described in connection with $R_{30}$ in claim 1,

* indicates a binding site to $M_1$ in Formula 1,

*' indicates a binding site to $T_2$ in Formula 1, and

*" indicates a binding site to $T_1$ in Formula 1.

7. The organometallic compound of claim 1, wherein ring $A_{40}$ in Formula 1 is a group represented by one of Formulae A40(1) to A40(34):

A40(1)

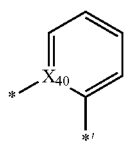

A40(2)

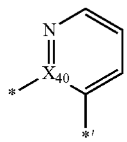

A40(3)

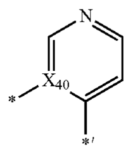

A40(4)

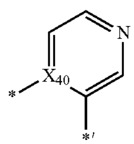

A40(5)

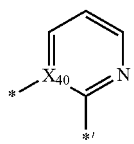

A40(6)

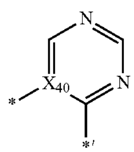

-continued

A40(7)

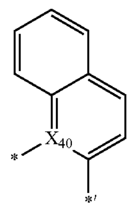

A40(8)

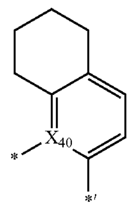

A40(9)

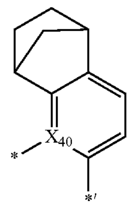

A40(10)

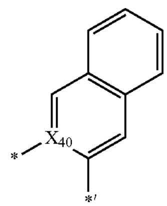

A40(11)

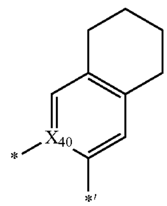

A40(12)

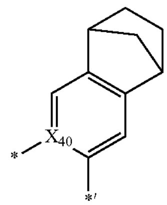

A40(13)

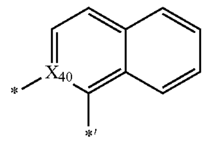

A40(14)

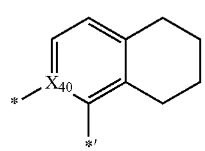

-continued
A40(15)
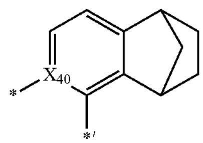
A40(16)
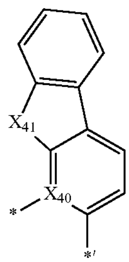
A40(17)
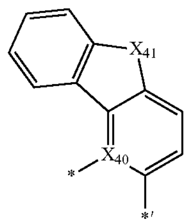
A40(18)
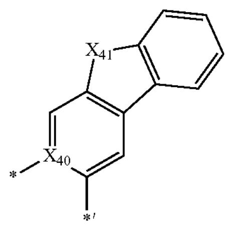
A40(19)
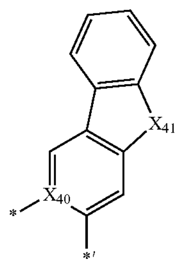
A40(20)
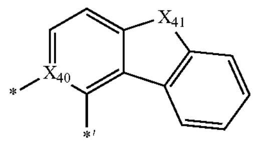
A40(21)
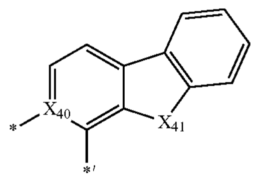
A40(22)
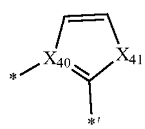
-continued
A40(23)
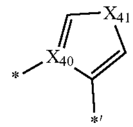
A40(24)
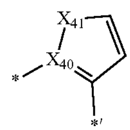
A40(25)
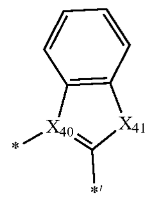
A40(26)
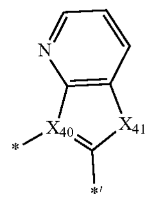
A40(27)
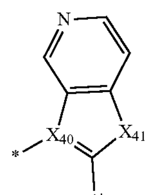
A40(28)
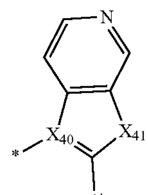
A40(29)
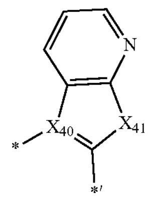
A40(30)
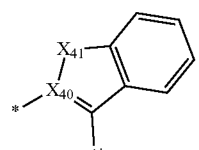
A40(31)
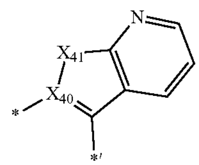

-continued

A40(32)

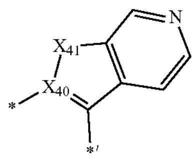

A40(33)

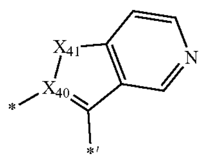

A40(34)

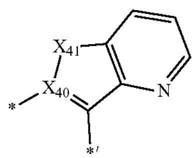

wherein, in Formulae A40(1) to A40(34), $X_{40}$ is C or N, $X_{41}$ is O, S, $N(R_{41})$, $C(R_{41})(R_{42})$, or $Si(R_{41})(R_{42})$, and $R_{41}$ and $R_{42}$ are each the same as described in connection with $R_{40}$ in claim 1,

*indicates a binding site to $M_1$ in Formula 1, and

*' indicates a binding site to $T_2$ in Formula 1.

8. The organometallic compound of claim 1, wherein, in Formula 1, $T_1$ is *—N($R_{51}$)—*', *—B($R_{51}$)—*', *—C($R_{51}$)($R_{52}$)—*', *—Si($R_{51}$)($R_{52}$)—*', *—Ge($R_{51}$)($R_{52}$)—*', *—S—*', or *—O—*', and $T_2$ is a single bond or *—N($R_{51}$)—*'.

9. The organometallic compound of claim 1, wherein $R_A$ in Formula 1 is:

a phenyl group substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_2O$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, $—Si(Q_{33})(Q_{34})(Q_{35})$, or any combination thereof;

$Q_{33}$ to $Q_{35}$ are each independently a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

10. The organometallic compound of claim 1, wherein $R_A$ in Formula 1 is:

a group represented by one of Formulae 2-1 to 2-19:

2-1

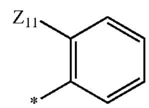

2-2

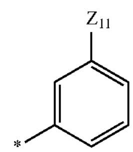

2-3

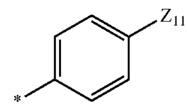

2-4

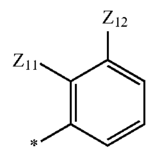

2-5

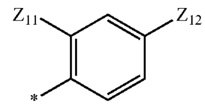

2-6

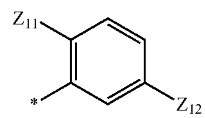

2-7

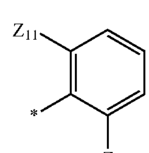

2-8

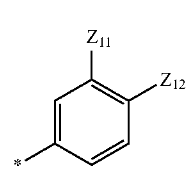

-continued 2-9

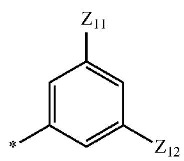

2-10

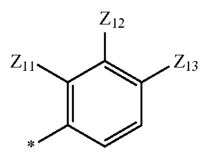

2-11

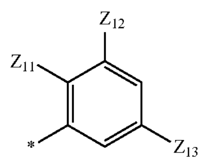

2-12

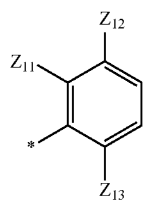

2-13

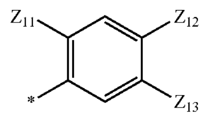

2-14

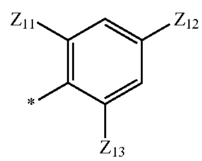

2-15

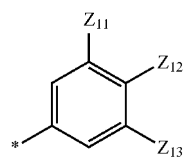

2-16

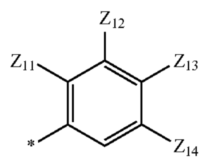

2-17

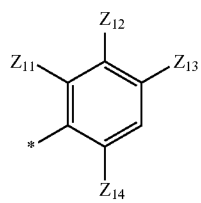

-continued 2-18

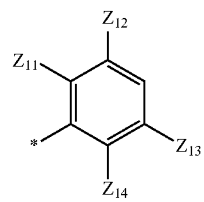

2-19

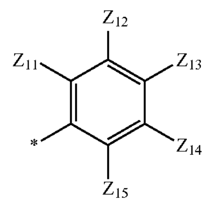

wherein, in Formulae 2-1 to 2-19, $Z_{11}$ to $Z_{15}$ are each independently deuterium, —F, —Cl, —Br, —I, —$CD_3$, a hydroxyl group, a cyano group, a nitro group, an amino group, a $C_1$-$C_{20}$ alkyl group, a $C_1$-$C_{20}$ alkoxy group, a cyclopentyl group, a cyclohexyl group, a phenyl group, a biphenyl group, a naphthyl group, a fluorenyl group, a pyridinyl group, a pyrazinyl group, a pyrimidinyl group, a pyridazinyl group, a carbazolyl group, a benzimidazolyl group, a benzofuranyl group, a benzothiophenyl group, a triazinyl group, a dibenzofuranyl group, a dibenzothiophenyl group, a dibenzosilolyl group, a benzocarbazolyl group, a dibenzocarbazolyl group, an azacarbazolyl group, an azadibenzofuranyl group, an azadibenzothiophenyl group, or —$Si(Q_{33})(Q_{34})(Q_{35})$, $Q_{33}$ to $Q_{35}$ are each independently a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof, and

* indicates a binding site to a neighboring atom.

11. The organometallic compound of claim 1, wherein a group represented by

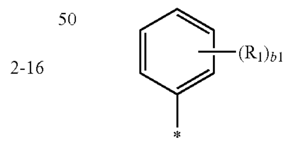

in Formula 1 is a group represented by one of Formulae 4-1 to 4-20:

4-1

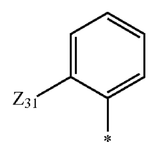

-continued
4-2
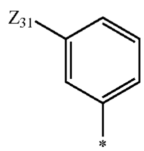
4-3
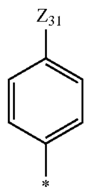
4-4
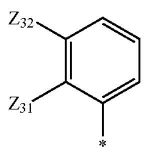
4-5
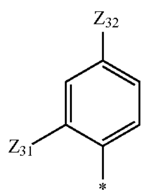
4-6
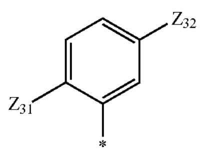
4-7
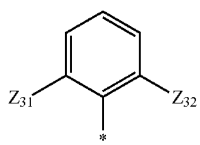
4-8
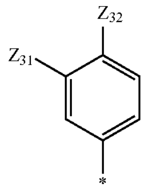
4-9
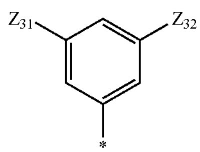
4-10
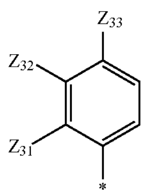
-continued
4-11
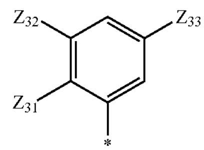
4-12
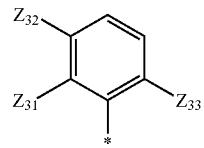
4-13
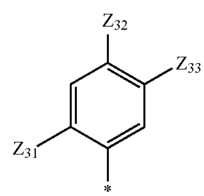
4-14
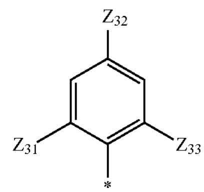
4-15
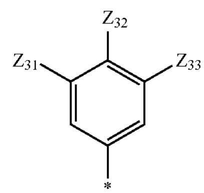
4-16
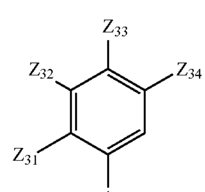
4-17
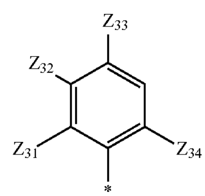
4-18
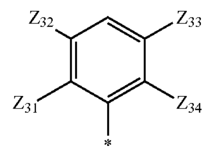

-continued 4-19

4-20

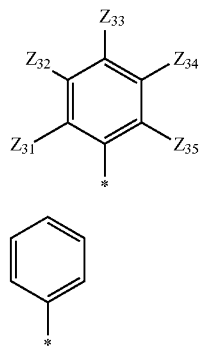

wherein, in Formulae 4-1 to 4-20, $Z_{31}$ to $Z_{35}$ are each the same as described in connection with $R_1$, $Z_{31}$ to $Z_{35}$ are each not hydrogen, and indicates a binding site to a neighboring atom.

12. The organometallic compound of claim 11, wherein $Z_{31}$ to $Z_{35}$ in Formulae 4-1 to 4-20 are each independently:

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, or a chrysenyl group; or a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, or a chrysenyl group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or any combination thereof.

13. The organometallic compound of claim 1, wherein the organometallic compound is represented by Formula 1A:

Formula 1A

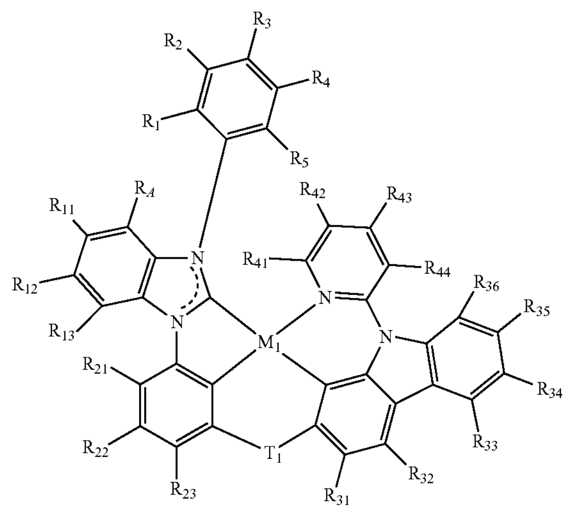

wherein, in Formula 1A, $M_1$, $T_1$, $R_A$, and $R_1$ are respectively the same as those described in claim 1, $R_2$ to $R_5$ are each independently the same as described in connection with $R_1$, $R_{11}$ to $R_{14}$ are each independently the same as described in connection with $R_{10}$, $R_{21}$ to $R_{23}$ are each independently the same as described in connection with $R_{20}$, $R_{31}$ to $R_{36}$ are each independently the same as described in connection with $R_{30}$, and $R_{41}$ to $R_{44}$ are each independently the same as described in connection with $R_{40}$.

14. The organometallic compound of claim 1, wherein the organometallic compound is selected from the following Compounds:

2
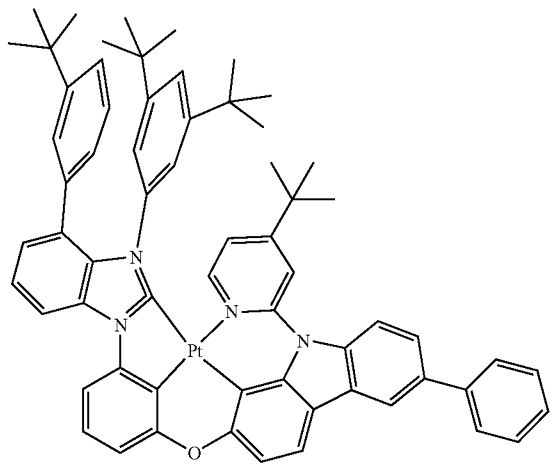
3
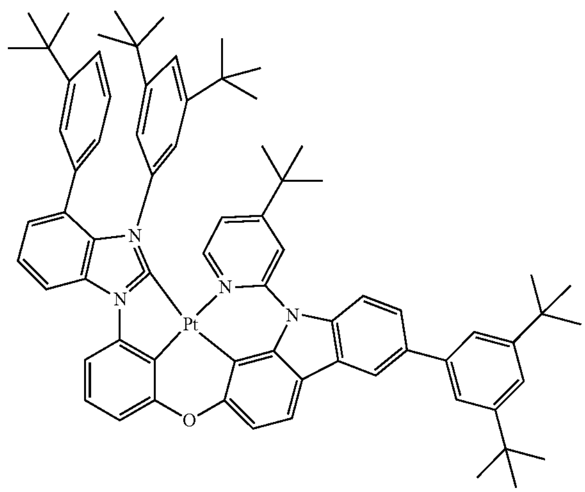
5
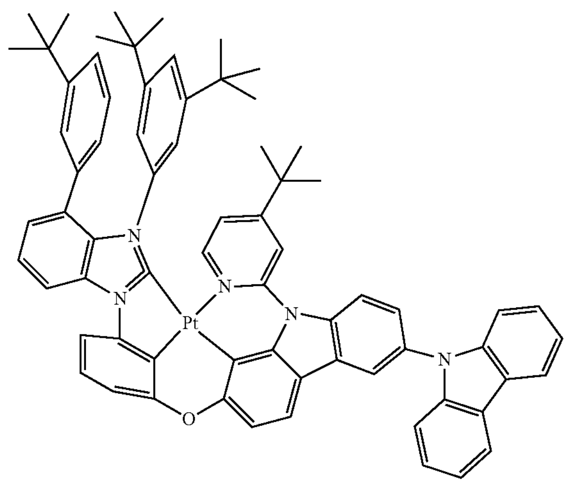

-continued
8
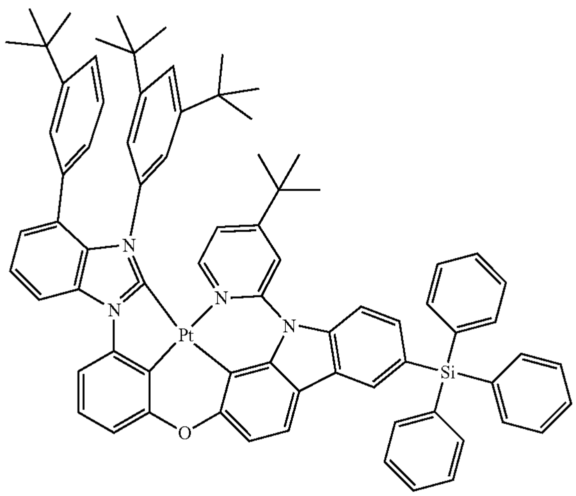
10
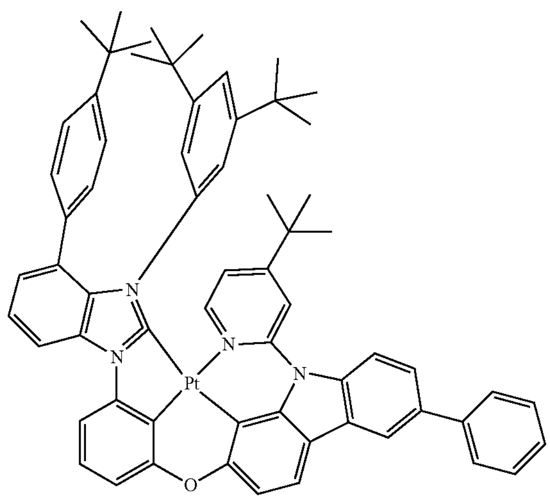
11
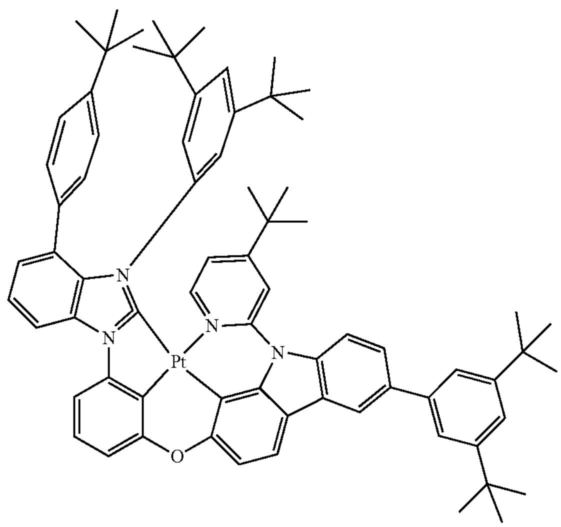

-continued
13
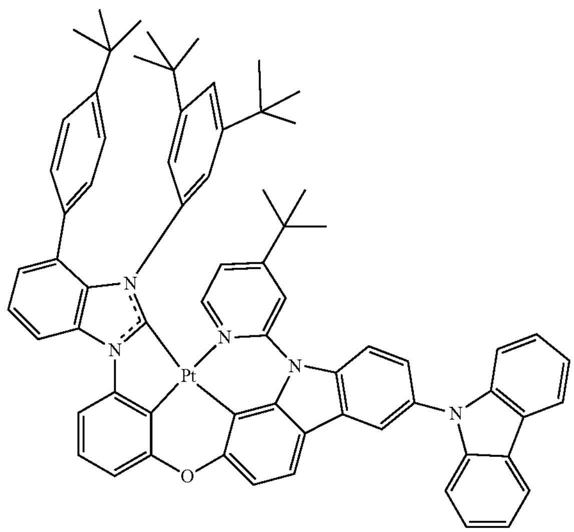
16
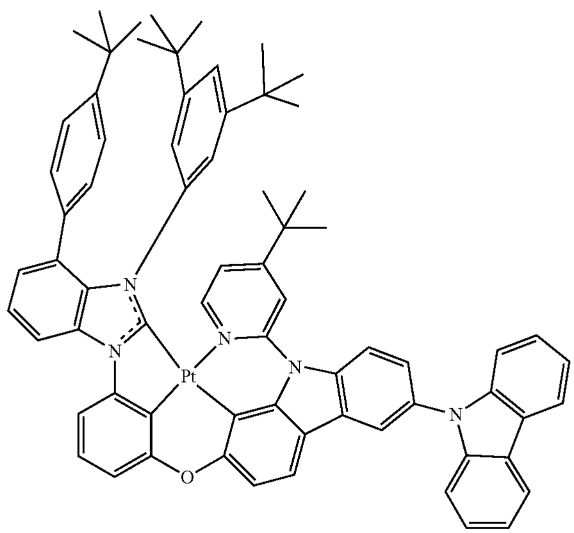
18
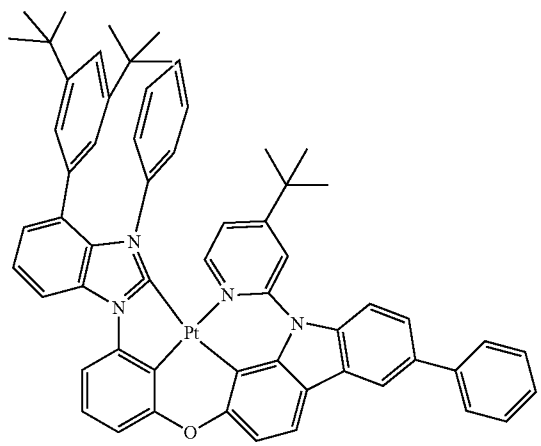

-continued
19
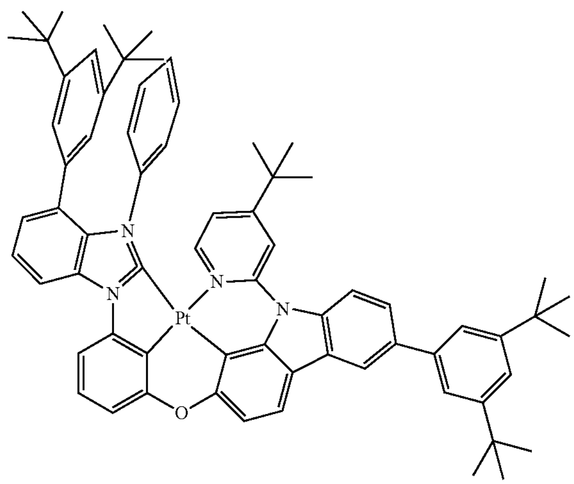
21
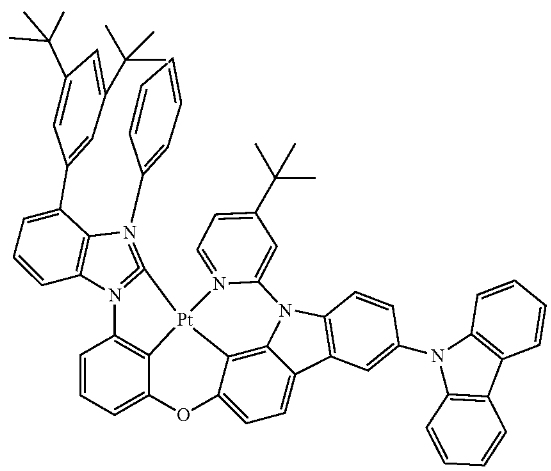
24
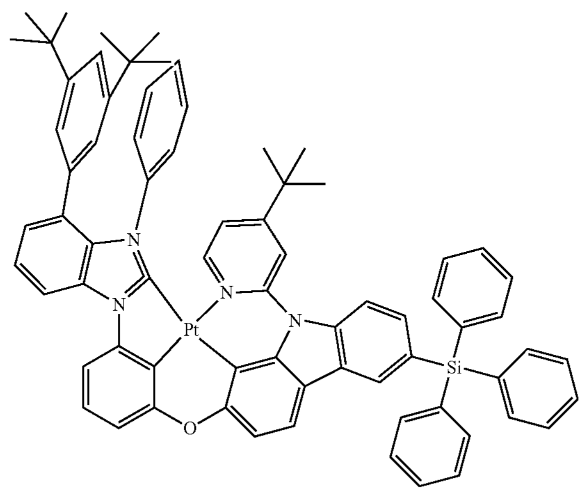

-continued
26
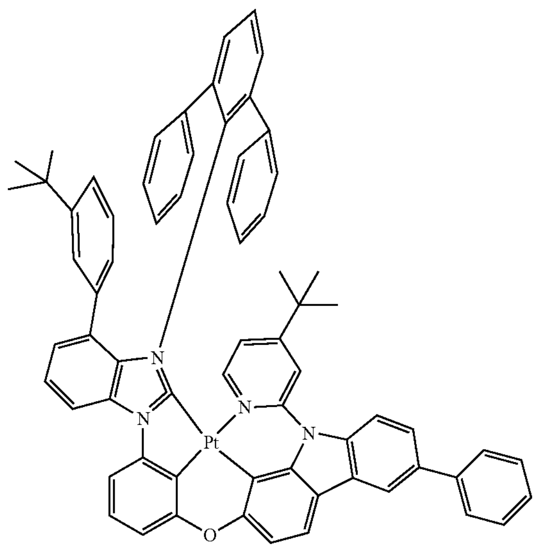
27
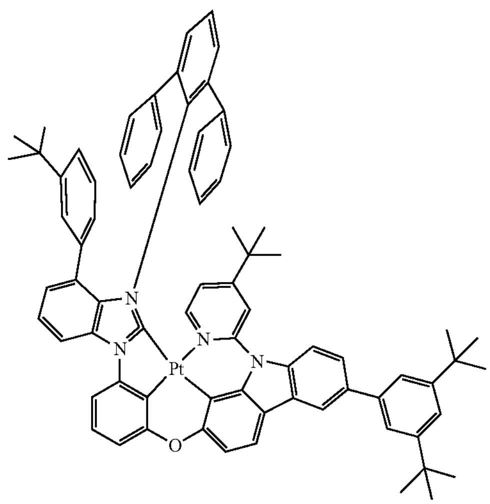

-continued
29
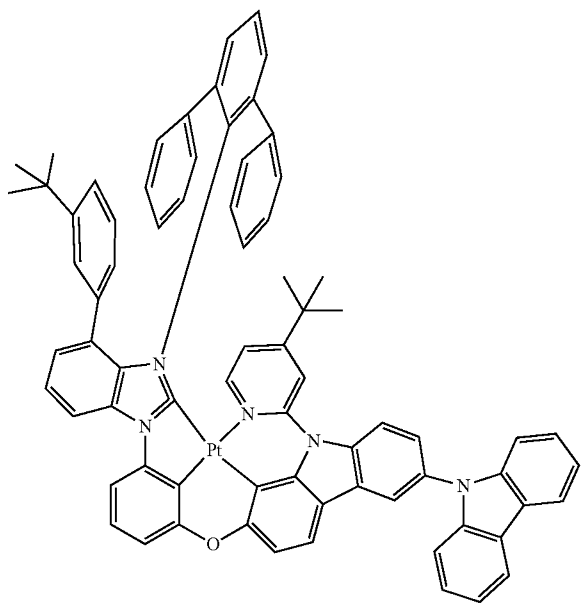
32
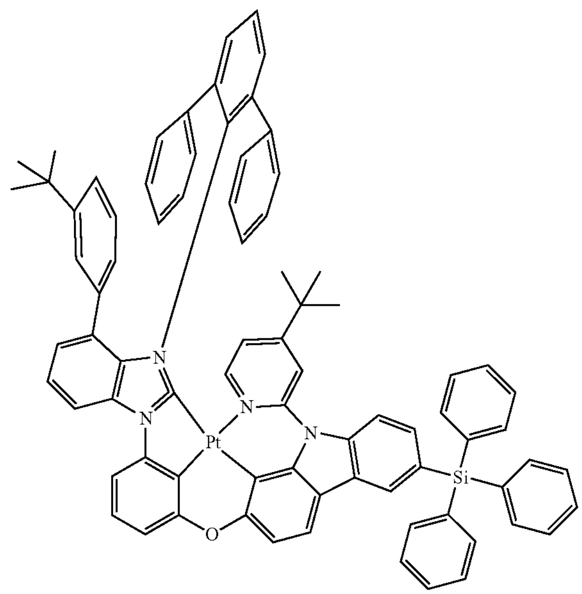

-continued
34
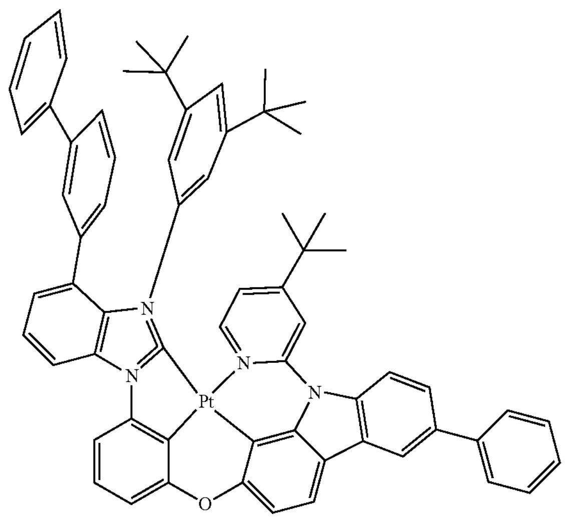
35
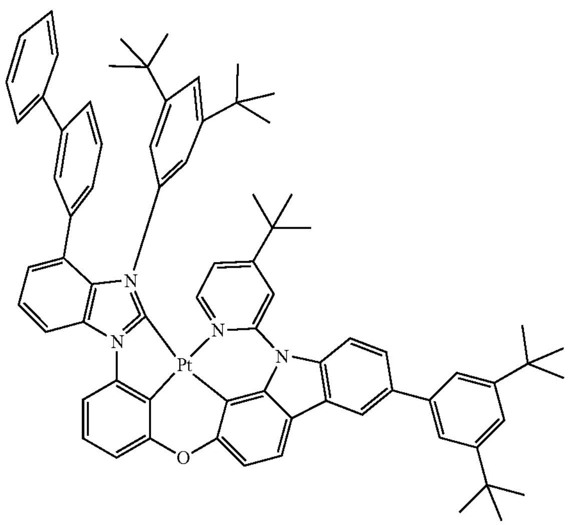
37
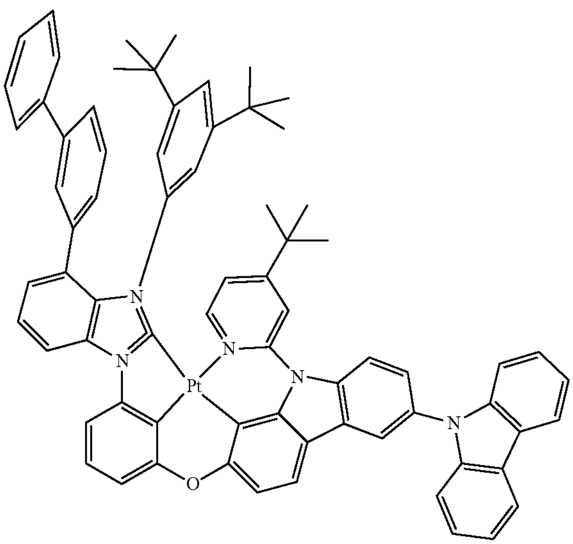

-continued
40
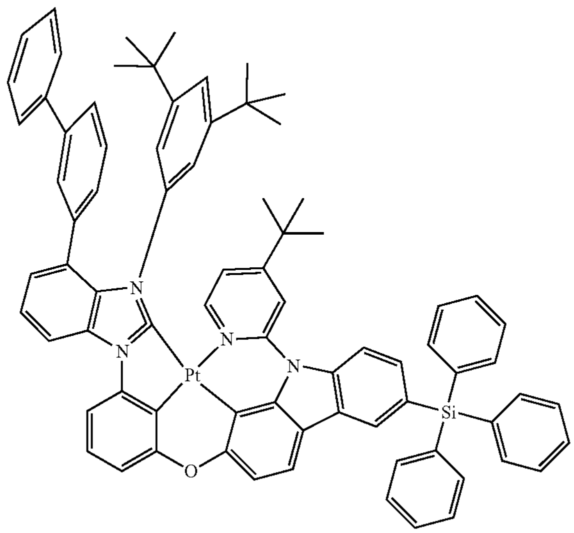
42
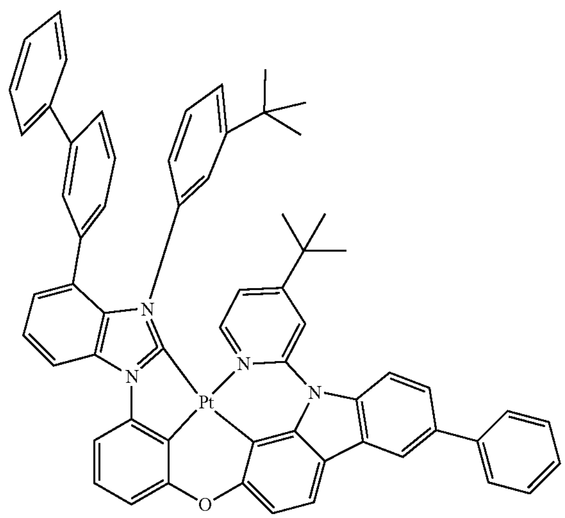
43
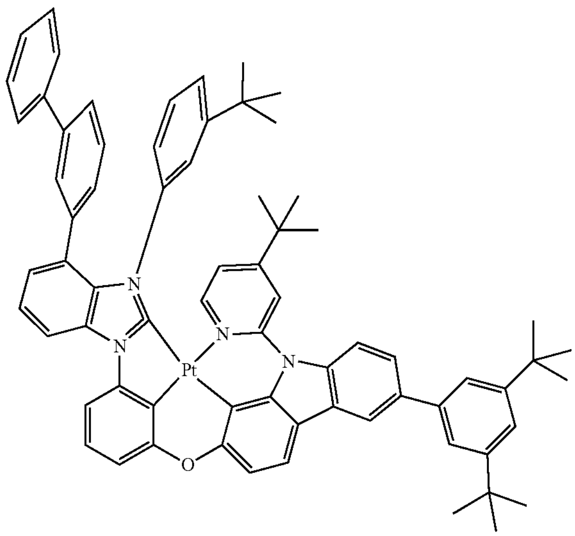

-continued
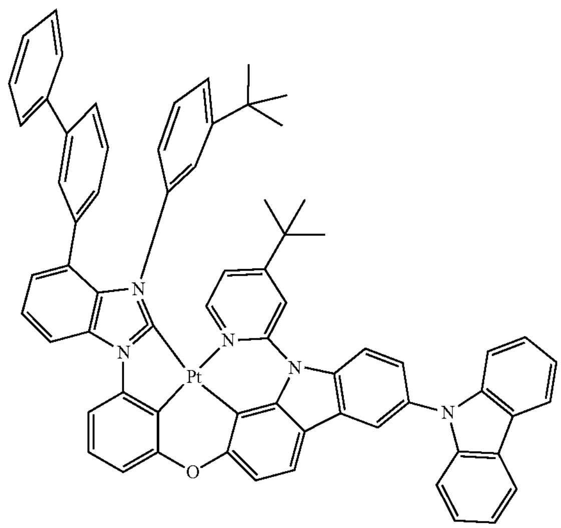
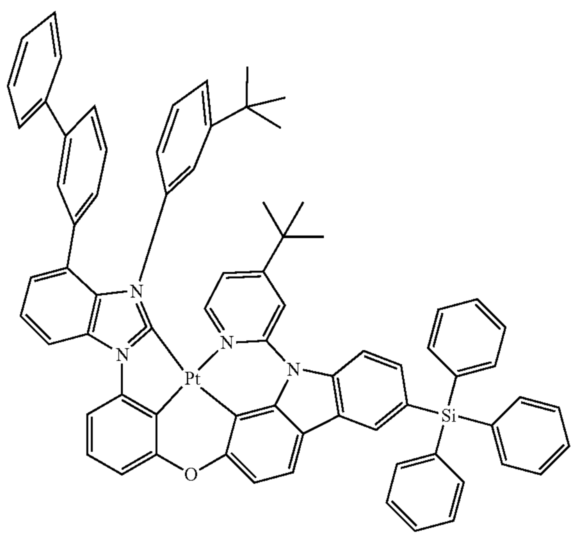
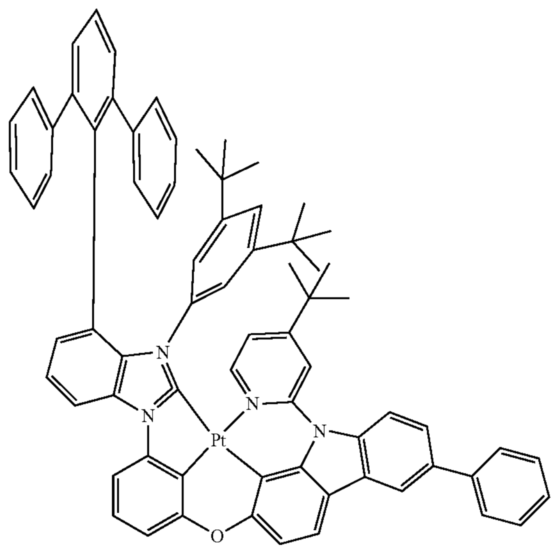

-continued
51
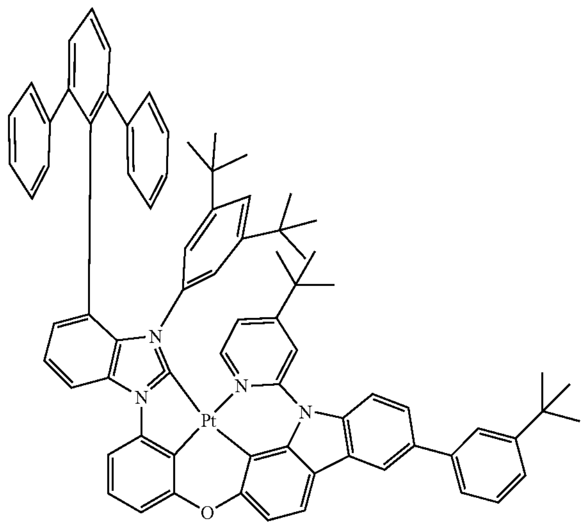
53
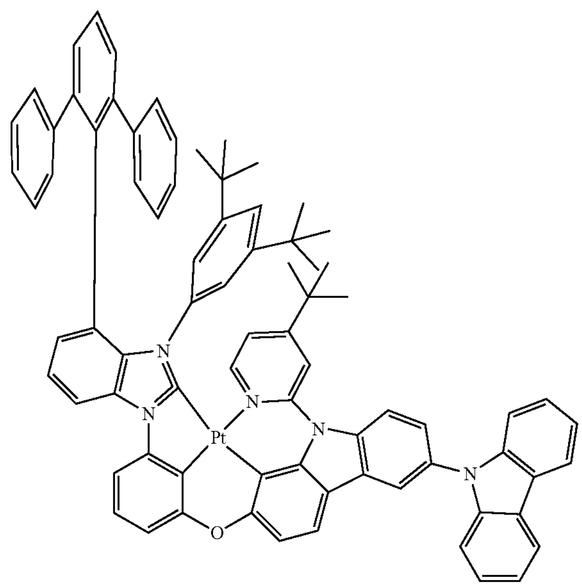

-continued
56
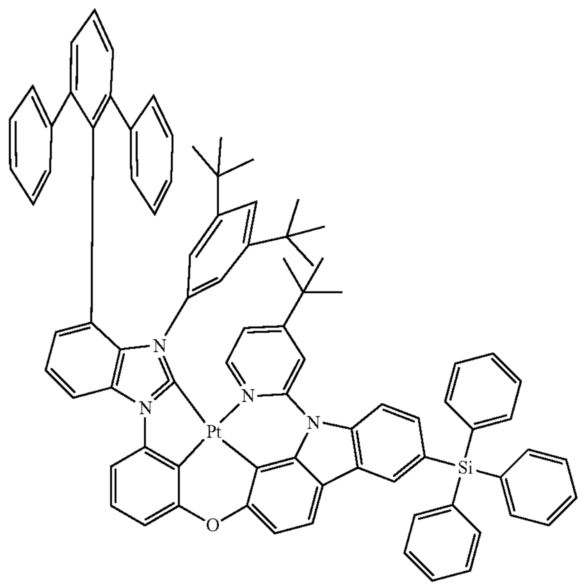
58
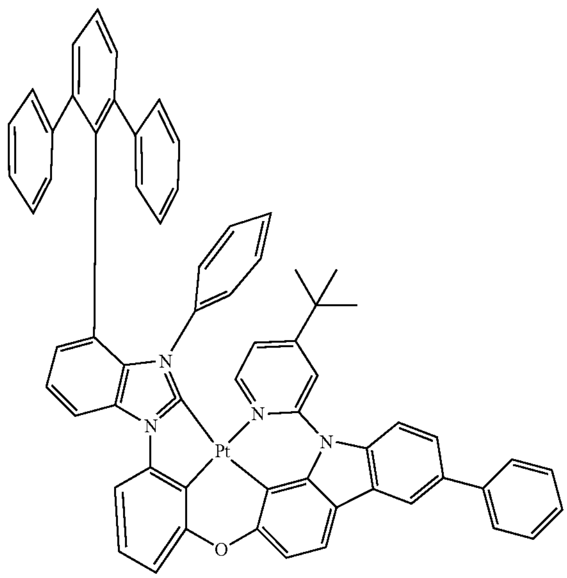

-continued
59
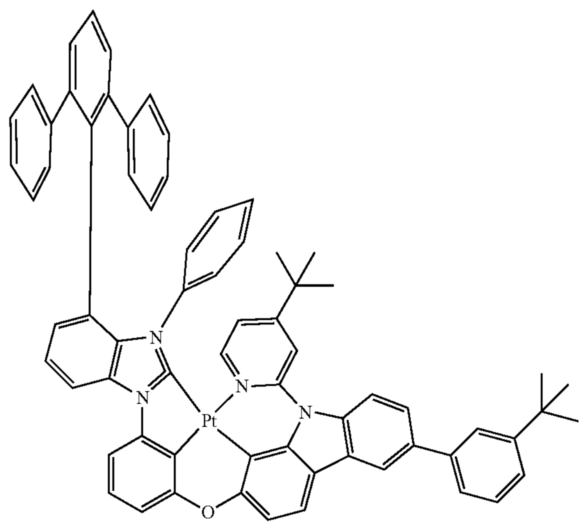
61
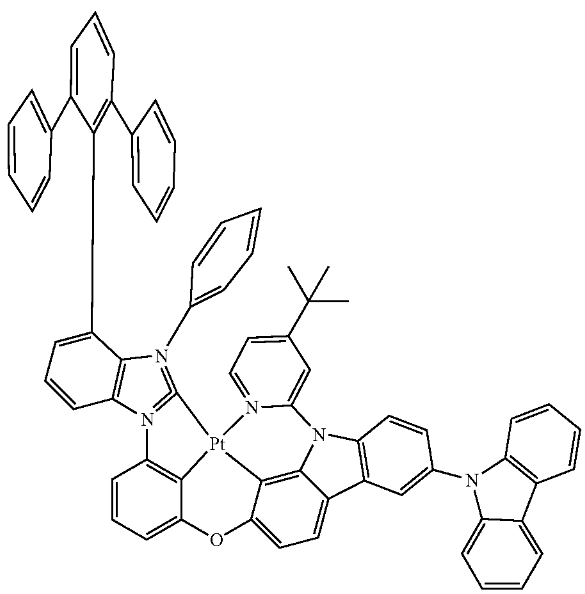

-continued
64
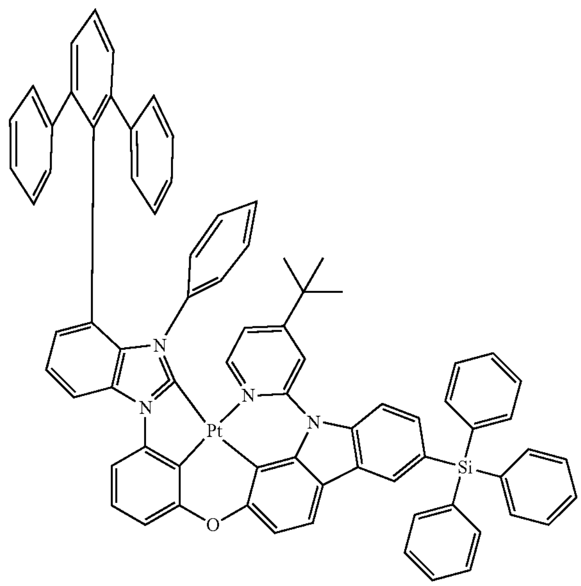
66
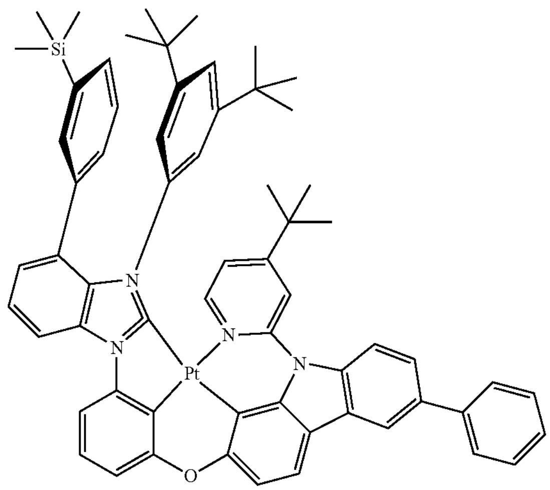
67
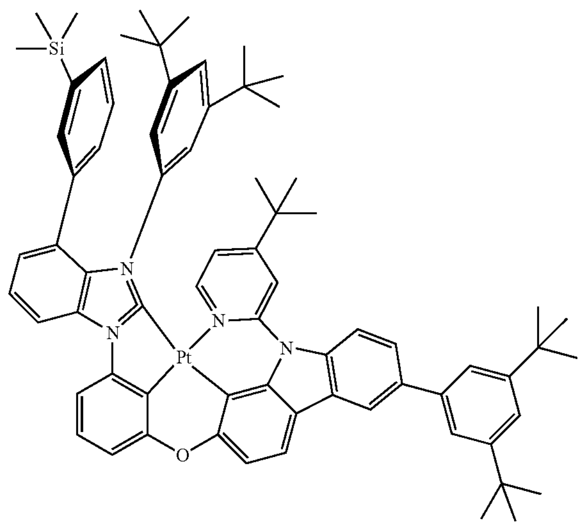

-continued
69
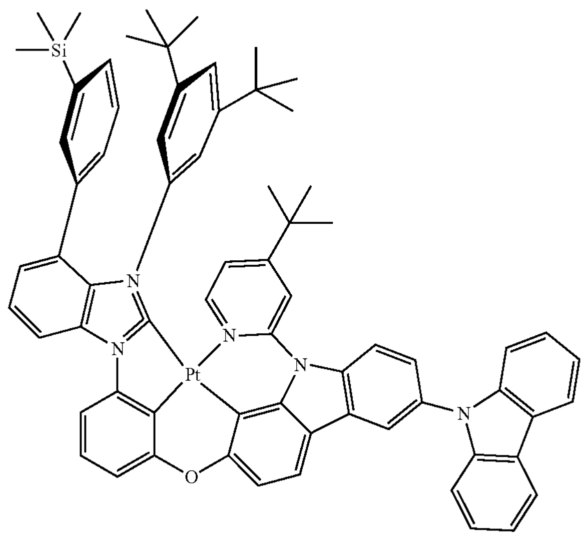
72
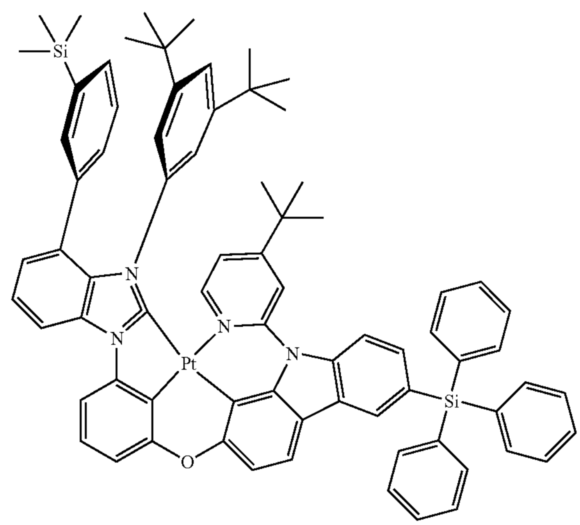
74
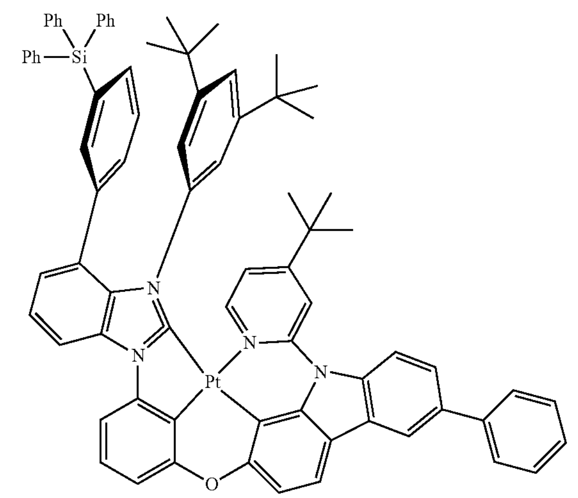

-continued
75
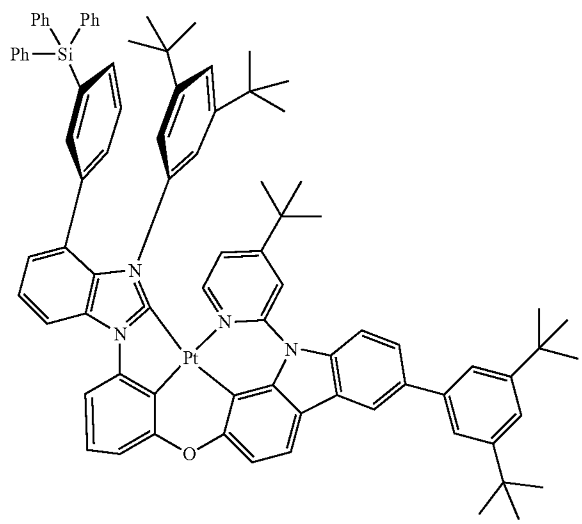
77
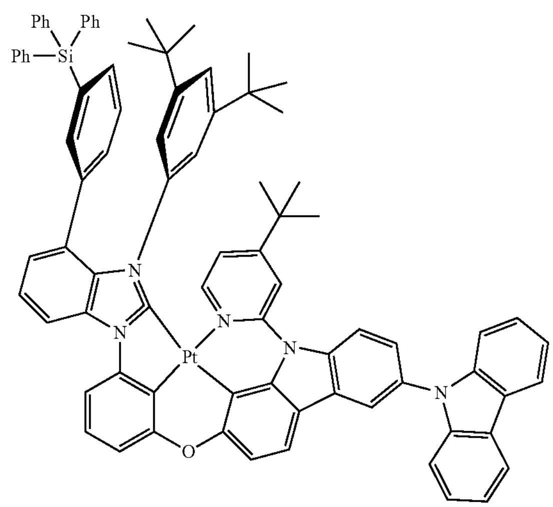
80
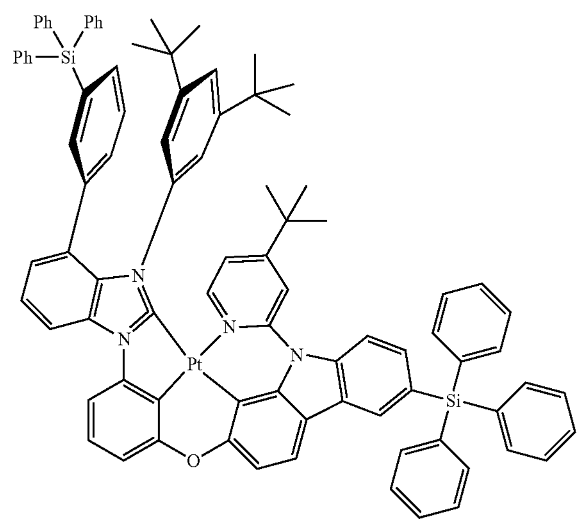

-continued
82
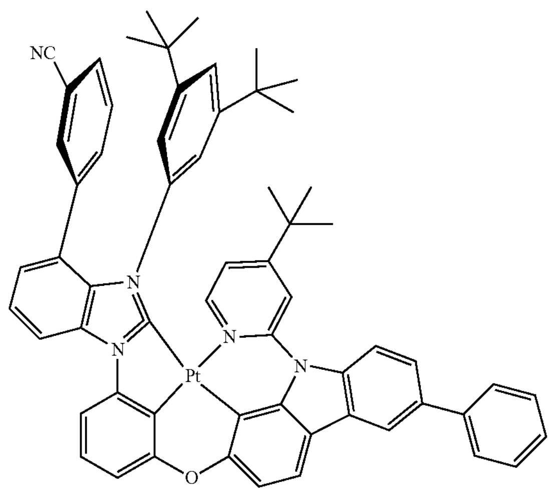
83
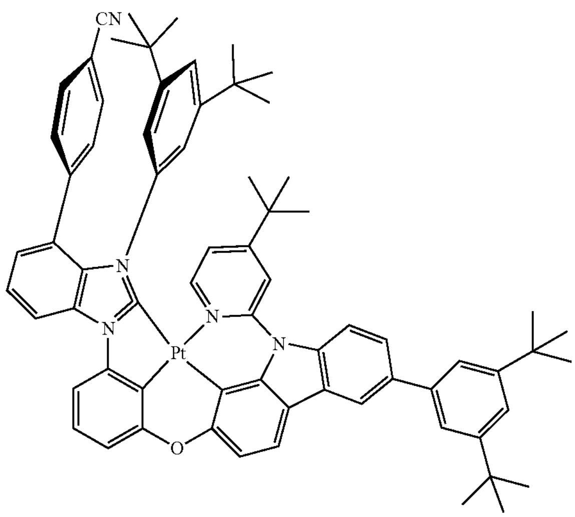
85
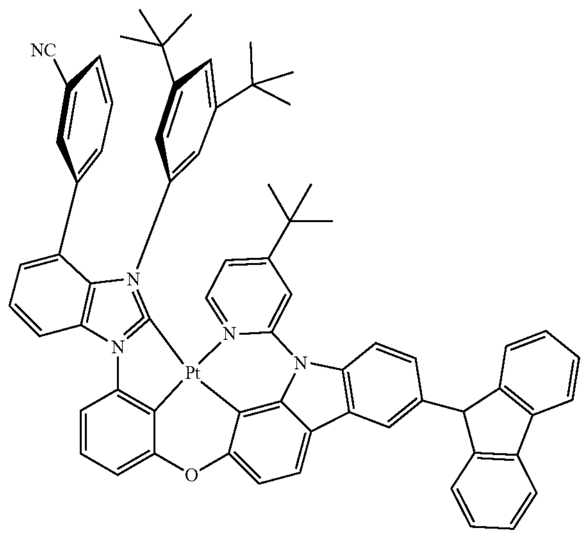

-continued
88
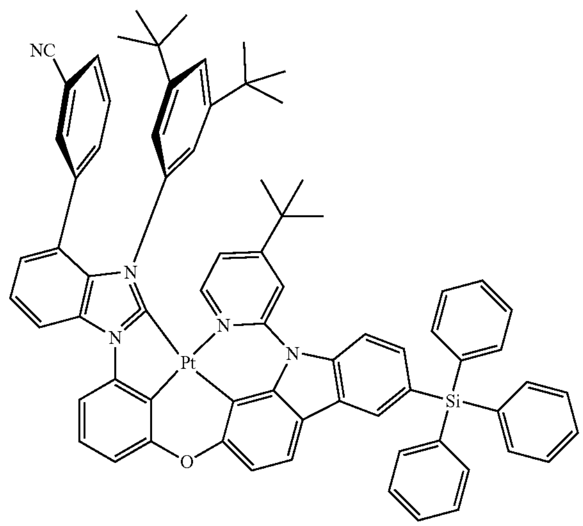
90
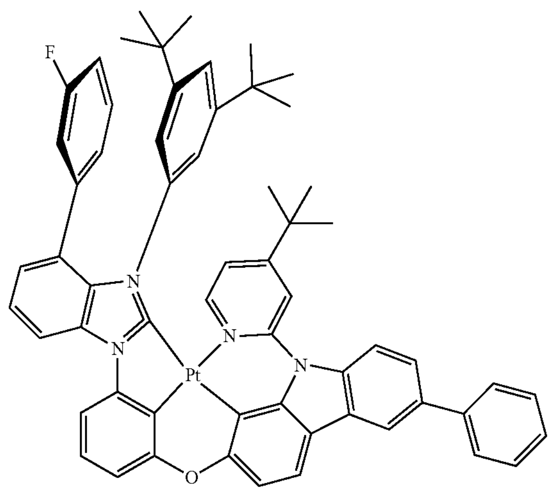
91
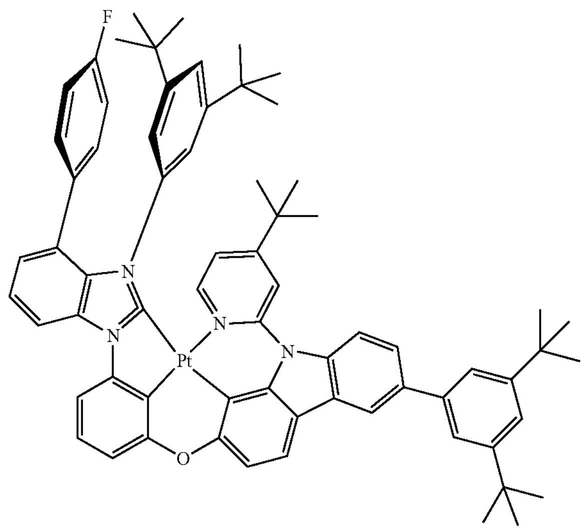

-continued
93
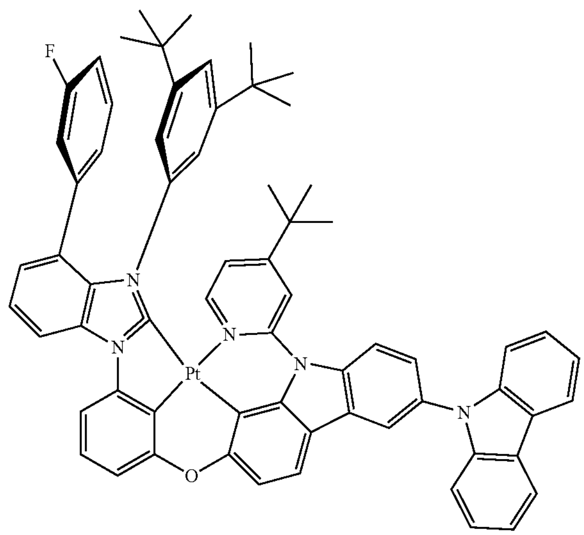
96
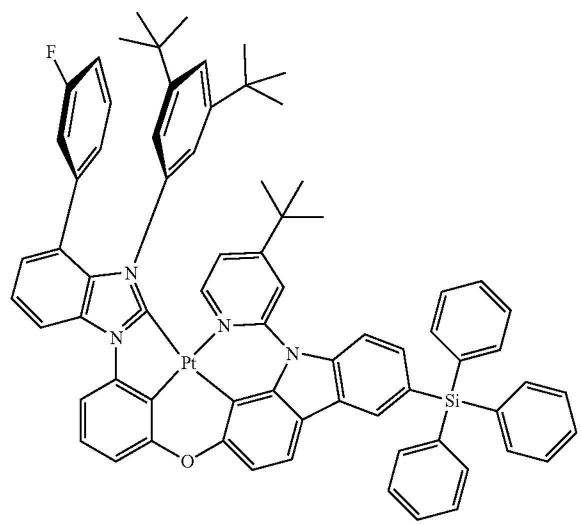
98
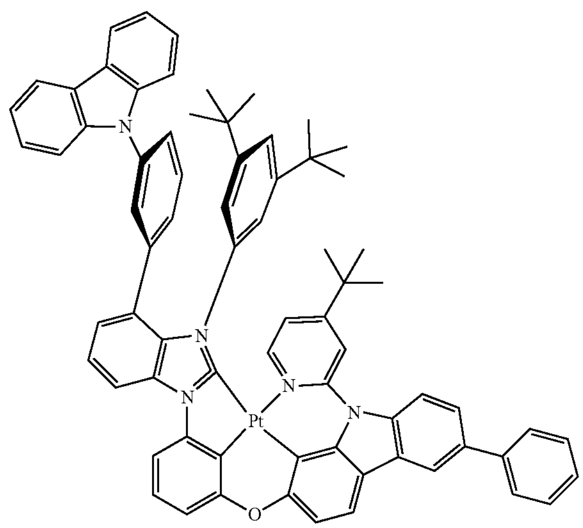

-continued
99
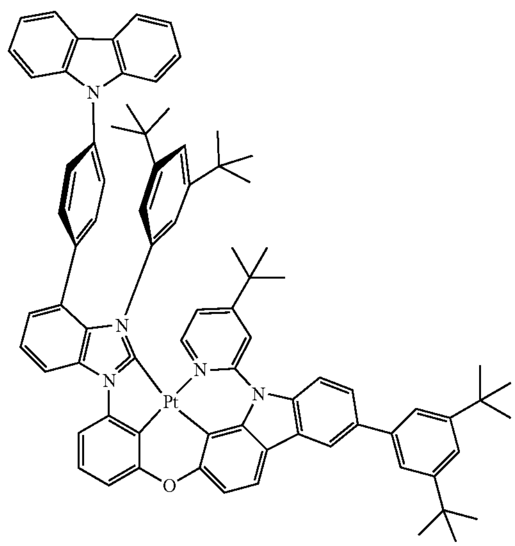
101
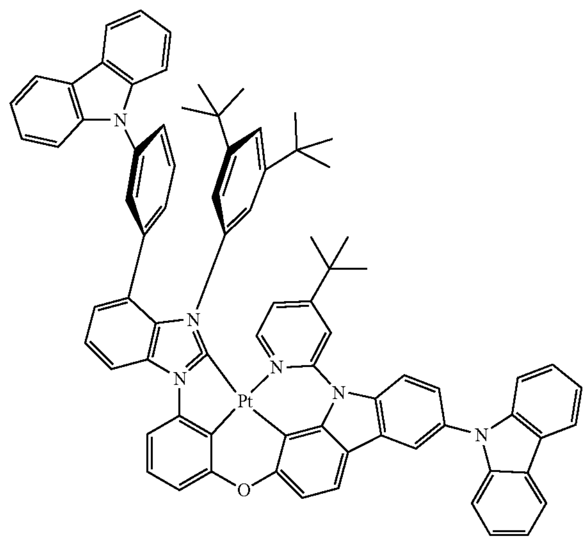

-continued
104
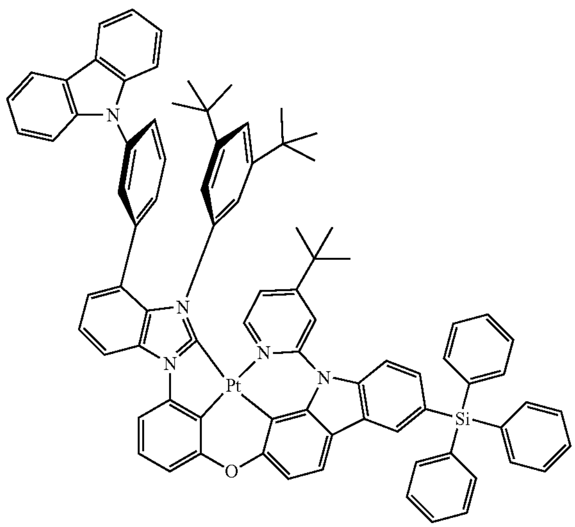
138
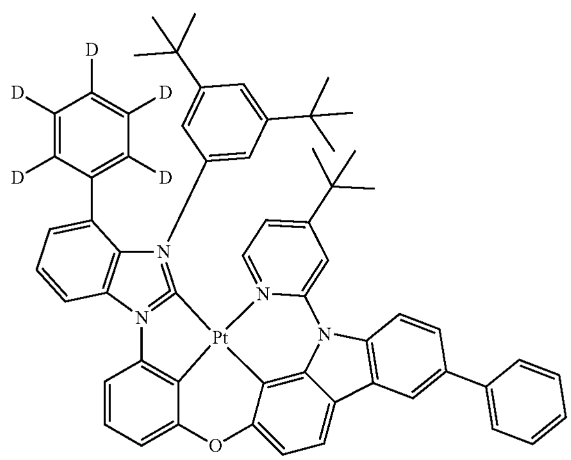
139
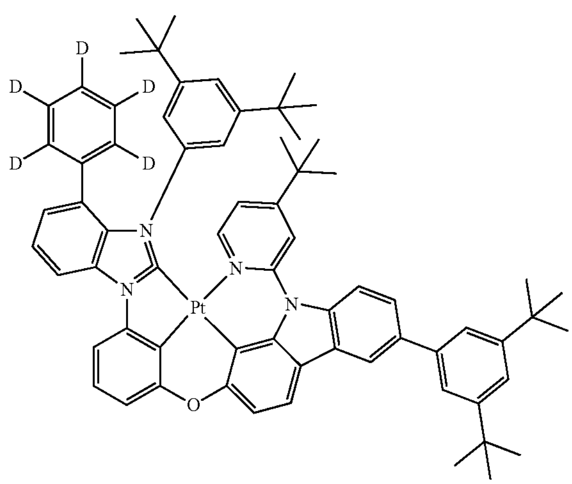
-continued
141
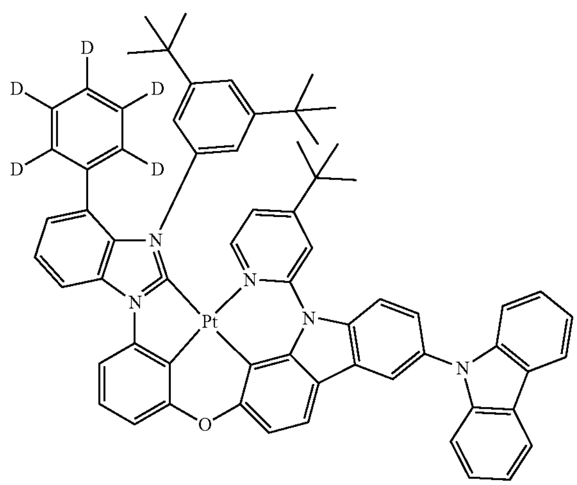
144
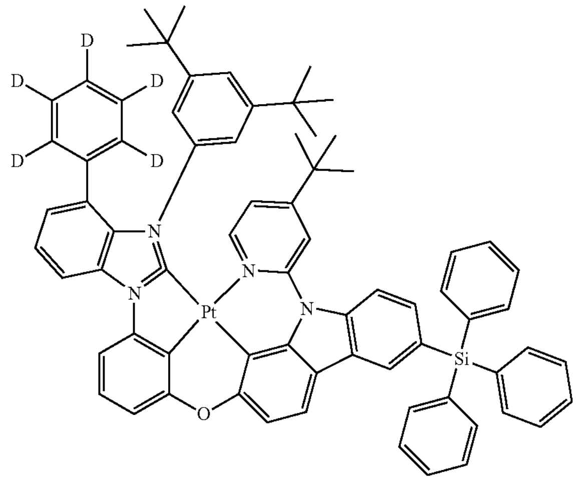

-continued
146
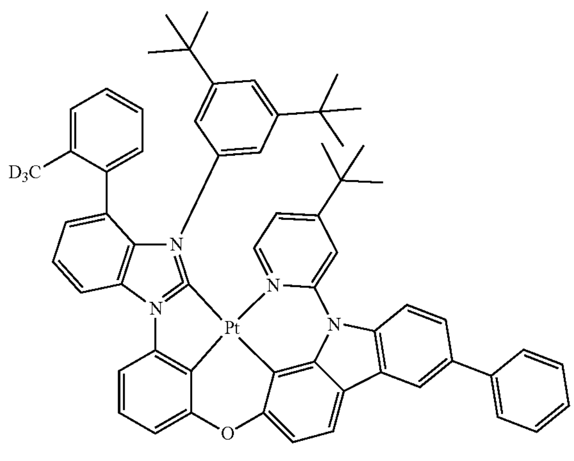
147
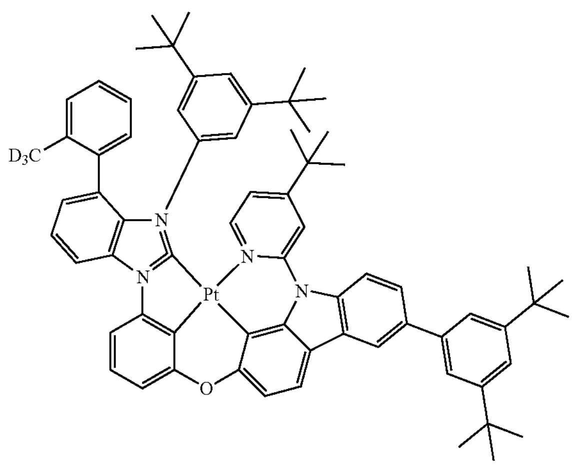
149
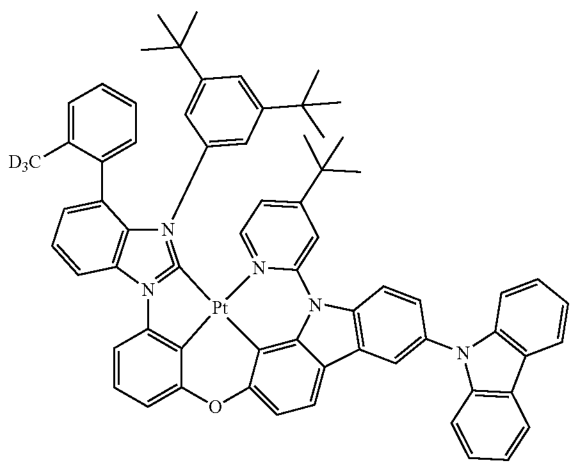
-continued
152
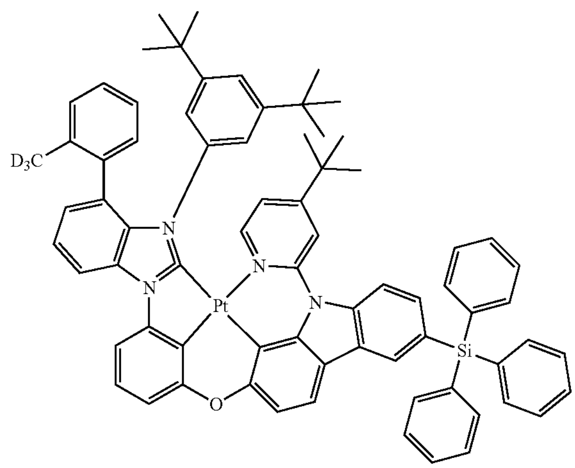
154
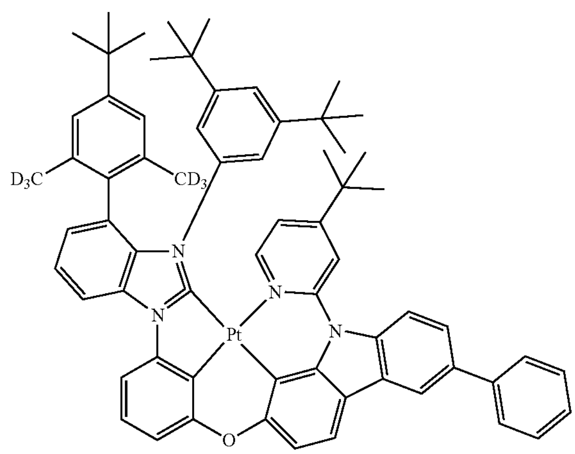
155
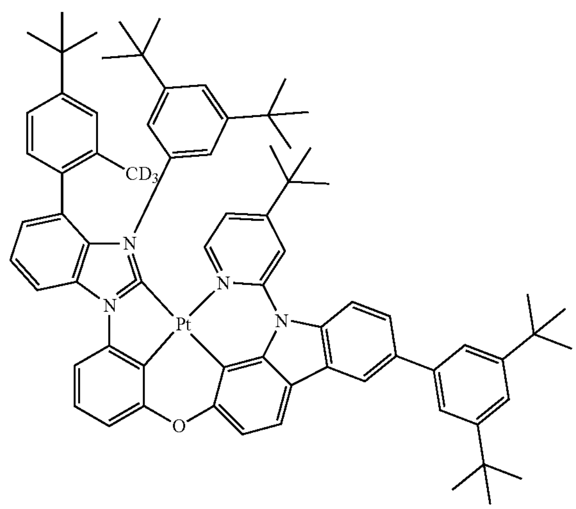

157
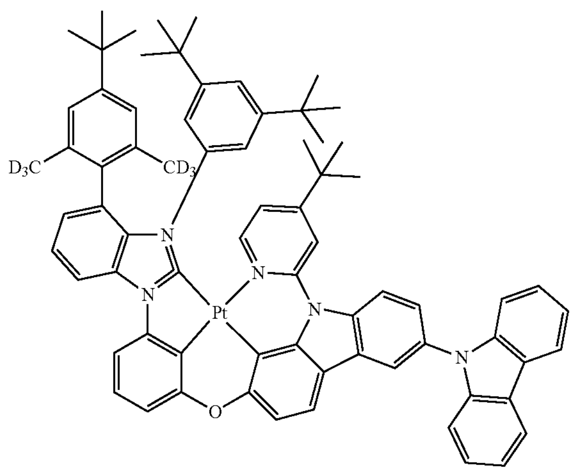
160
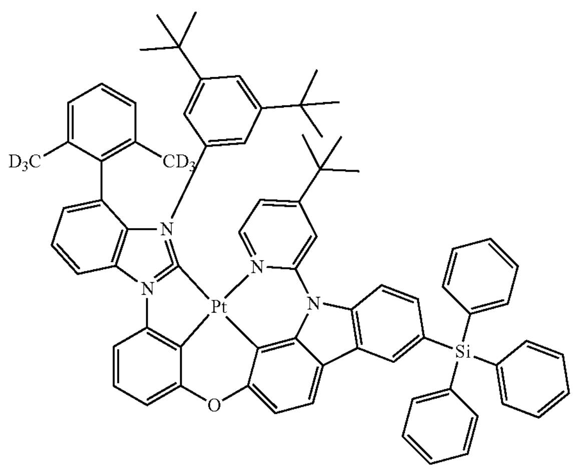
209
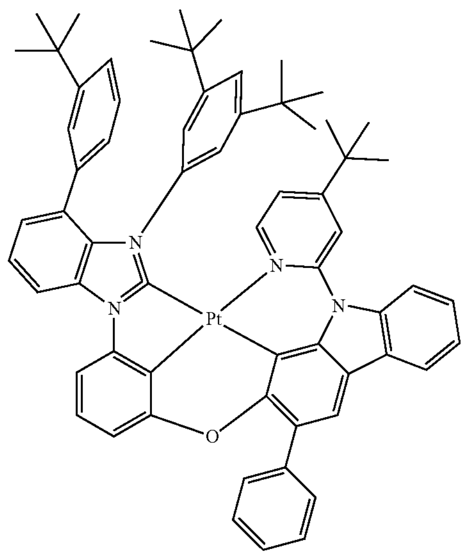
210
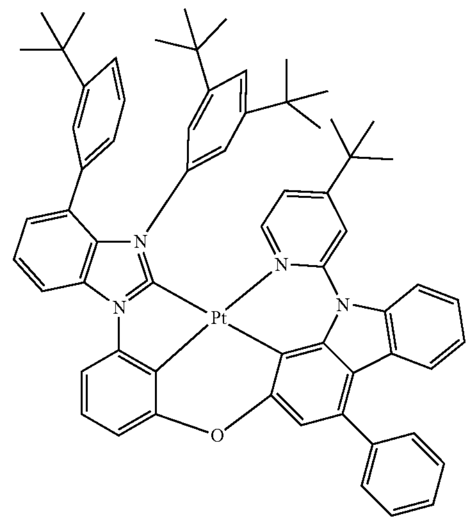
211
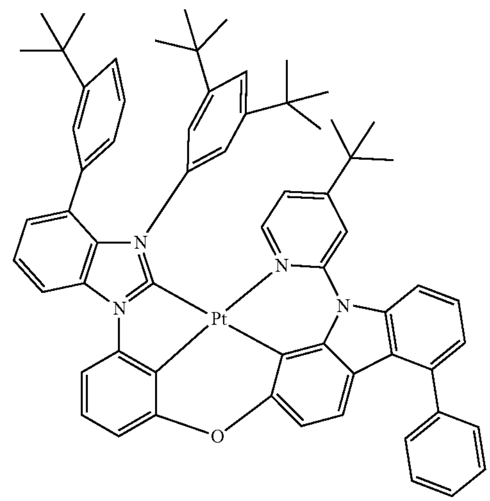
212
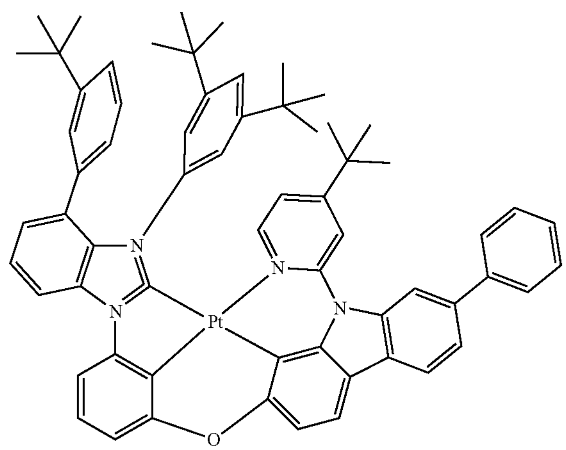

-continued
213
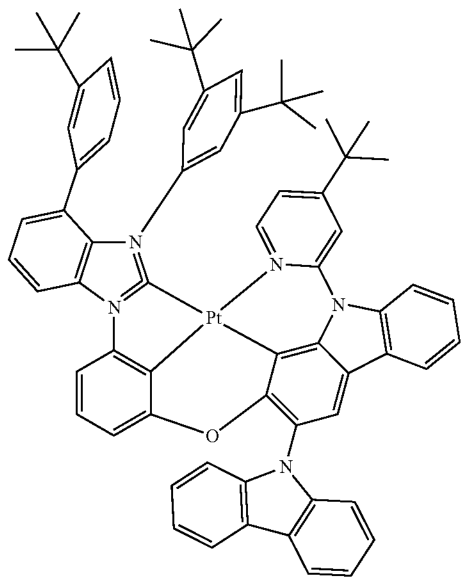
214
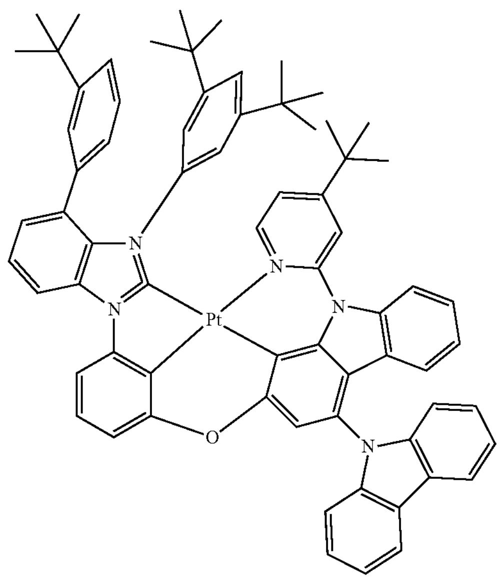
215
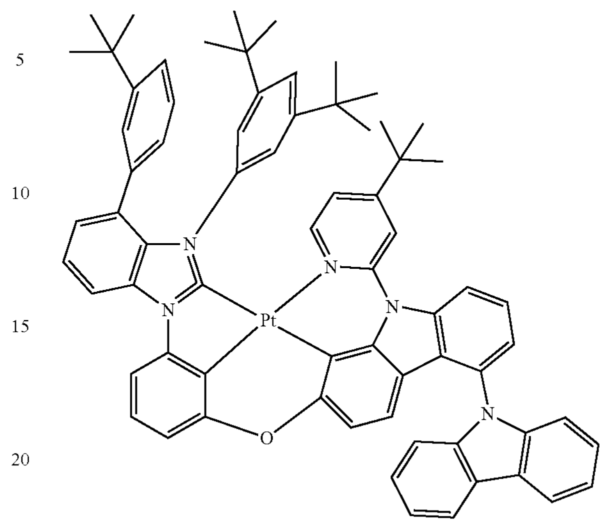
216
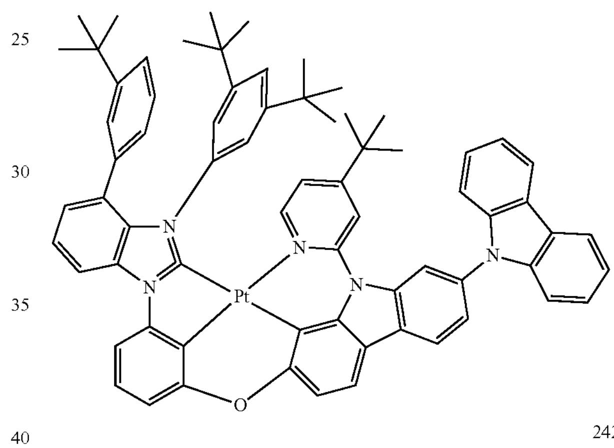
242
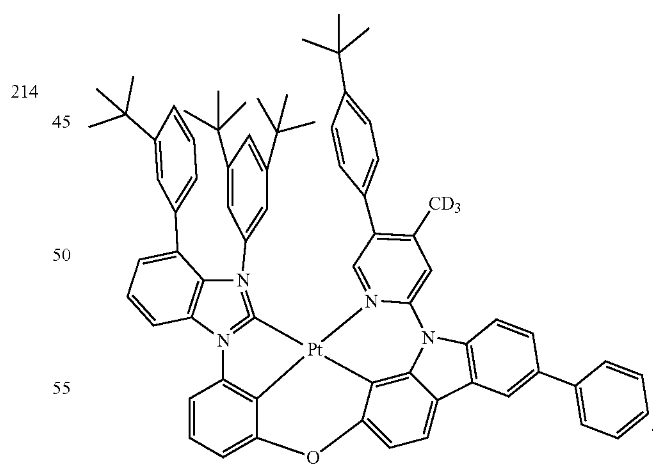
15. An organic light-emitting device comprising:
a first electrode;
a second electrode; and
an organic layer arranged between the first electrode and the second electrode and comprising an emission layer,
wherein the organic layer comprises at least one organometallic compound of claim 1.

16. The organic light-emitting device of claim 15, wherein the emission layer comprises the at least one organometallic compound.

17. The organic light-emitting device of claim 16, wherein the emission layer further comprises a host, and an amount of the host in the emission layer is greater than an amount of the at least one organometallic compound in the emission layer.

18. The organic light-emitting device of claim 16, wherein the emission layer emits blue light having a maximum emission wavelength in a range of about 410 nm to about 470 nm.

19. The organic light-emitting device of claim 15, wherein the first electrode is an anode, the second electrode is a cathode, the organic layer further comprises a hole transport region arranged between the first electrode and the emission layer and an electron transport region arranged between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

* * * * *